(12) United States Patent
Kim et al.

(10) Patent No.: US 11,355,492 B2
(45) Date of Patent: Jun. 7, 2022

(54) SEMICONDUCTOR DEVICE WITH CHAMFERED UPPER PORTIONS OF WORK FUNCTION LAYER

(71) Applicant: SAMSUNG ELECTRONICS CO., LTD., Suwon-si (KR)

(72) Inventors: Ju Youn Kim, Suwon-si (KR); Gi Gwan Park, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 351 days.

(21) Appl. No.: 16/117,065

(22) Filed: Aug. 30, 2018

(65) Prior Publication Data

US 2019/0019794 A1     Jan. 17, 2019

Related U.S. Application Data

(62) Division of application No. 15/413,680, filed on Jan. 24, 2017, now Pat. No. 10,068,901.

(30) Foreign Application Priority Data

Jan. 25, 2016  (KR) .......................... 10-2016-0008981
Mar. 10, 2016  (KR) .......................... 10-2016-0028719
(Continued)

(51) Int. Cl.
*H01L 27/088*     (2006.01)
*H01L 29/78*      (2006.01)
(Continued)

(52) U.S. Cl.
CPC .... *H01L 27/0886* (2013.01); *H01L 21/82345* (2013.01); *H01L 21/823431* (2013.01);
(Continued)

(58) Field of Classification Search
CPC .......... H01L 27/0886; H01L 29/42376; H01L 27/088; H01L 29/7854; H01L 28/00;
(Continued)

(56) References Cited

U.S. PATENT DOCUMENTS 9,502,416 B1     11/2016  Kim
9,530,778 B1 *   12/2016  Lin .................... H01L 29/511
(Continued)

FOREIGN PATENT DOCUMENTS

JP     2008-021903 A     1/2008
JP     2008-288402 A     11/2008
(Continued)

OTHER PUBLICATIONS

Xueli, Ma, et al., "The effects of process condition of top-TiN and TaN thickness on the effective work function of MOSCAP with high-k/metal gate stacks," Chinese Institute of Microelectronics, Journal of Semiconductors, vol. 35, No. 10, pp. 106002-3 (Oct. 2014).

*Primary Examiner* — Khaja Ahmad
*Assistant Examiner* — Pavel G Ivanov
(74) *Attorney, Agent, or Firm* — Lee IP Law, P.C.

(57) ABSTRACT

A semiconductor device including a substrate with a first region and a second region and first and second transistors in the first and second regions, respectively. The first transistor includes a first gate insulating layer on the substrate, a first etch-stop layer, and a first work function layer on the first etch-stop layer. The second transistor includes a second gate insulating layer on the substrate, a second etch-stop layer, and a second work function layer on the second etch-stop layer. At least one of the first and second work function layers is chamfered.

9 Claims, 88 Drawing Sheets

(30) Foreign Application Priority Data

Mar. 10, 2016 (KR) .................. 10-2016-0028822
Mar. 11, 2016 (KR) .................. 10-2016-0029542

(51) Int. Cl.
*H01L 49/02* (2006.01)
*H01L 29/423* (2006.01)
*H01L 21/8234* (2006.01)
*H01L 27/11* (2006.01)
*H01L 29/49* (2006.01)
*H01L 29/66* (2006.01)

(52) U.S. Cl.
CPC .... *H01L 21/823456* (2013.01); *H01L 27/088* (2013.01); *H01L 27/1104* (2013.01); *H01L 28/00* (2013.01); *H01L 29/42372* (2013.01); *H01L 29/42376* (2013.01); *H01L 29/4966* (2013.01); *H01L 29/66545* (2013.01); *H01L 29/7854* (2013.01)

(58) Field of Classification Search
CPC ....... H01L 21/823431; H01L 21/82345; H01L 21/823456; H01L 27/1104; H01L 29/42372; H01L 29/4966; H01L 29/66545
See application file for complete search history.

(56) References Cited

U.S. PATENT DOCUMENTS

| | | | |
|---|---|---|---|
| 2002/0008292 A1* | 1/2002 | Hu | H01L 21/28061 257/412 |
| 2014/0077281 A1* | 3/2014 | Won | H01L 21/28176 257/288 |
| 2015/0243563 A1 | 8/2015 | Lee et al. | |
| 2015/0243652 A1* | 8/2015 | Joshi | H01L 21/82345 257/392 |
| 2016/0071944 A1* | 3/2016 | Lu | H01L 29/42376 257/392 |
| 2017/0154972 A1* | 6/2017 | Hsieh | H01L 21/32139 |

FOREIGN PATENT DOCUMENTS

| | | |
|---|---|---|
| KR | 10-2005-0024099 A | 3/2005 |
| KR | 10-2008-0100537 A | 11/2008 |

* cited by examiner

SEMICONDUCTOR DEVICE WITH CHAMFERED UPPER PORTIONS OF WORK FUNCTION LAYER

CROSS-REFERENCE TO RELATED APPLICATIONS

This is a divisional application based on pending application Ser. No. 15/413,680, filed Jan. 24, 2017, the entire contents of which is hereby incorporated by reference.

Korean Patent Application No. 10-2016-0008981, filed on Jan. 25, 2016, in the Korean Intellectual Property Office, Korean Patent Application No. 10-2016-0028719, filed on Mar. 10, 2016, in the Korean Intellectual Property Office, Korean Patent Application No. 10-2016-0028822, filed on Mar. 10, 2016, in the Korean Intellectual Property Office, and Korean Patent Application No. 10-2016-0029542, filed on Mar. 11, 2016, in the Korean Intellectual Property Office, are incorporated by reference herein in their entirety.

BACKGROUND

1. Field

Embodiments relate to a semiconductor device and a method of fabricating the same.

2. Description of the Related Art

A semiconductor device may include transistors having different threshold voltages. Examples of transistors having different threshold voltages include a combination of a logic transistor and a static random access memory (SRAM) transistor or a dynamic random access memory (DRAM) transistor.

Meanwhile, various methods of controlling the threshold voltages of transistors included in a semiconductor device are being studied.

SUMMARY

Embodiments are directed to a semiconductor device including a substrate including a first region and a second region and first and second transistors in the first and second regions, respectively. The first transistor includes a first gate insulating layer on the substrate, a first lower TiN layer on and in contact with the first gate insulating layer, a first etch-stop layer on the first lower TiN layer and a first upper gate electrode on the first etch-stop layer. The second transistor includes a second gate insulating layer on the substrate, a second lower TiN layer on and in contact with the second gate insulating layer, a second etch-stop layer on the second lower TiN layer and a second upper gate electrode on the second etch-stop layer. A thickness of the first lower TiN layer is less than a thickness of the second lower TiN layer.

Embodiments are also directed to a semiconductor device including a substrate including first through fourth regions, and first through fourth transistors of the same conductivity type located in the first through fourth regions, respectively. The first transistor includes a first gate insulating layer on the substrate, a first lower TiN layer on and contacting the first gate insulating layer, a first etch-stop layer on the first lower TiN layer, and a first upper gate electrode including a first work-function control layer on and contacting the first etch-stop layer. The second transistor includes a second gate insulating layer on the substrate, a second lower TiN layer on and contacting the second gate insulating layer, a second etch-stop layer on the second lower TiN layer, and a second upper gate electrode including a second work function control layer on and contacting the second etch-stop layer. The third transistor includes a third gate insulating layer on the substrate, a third lower TiN layer on and contacting the third gate insulating layer, a third etch-stop layer on the third lower TiN layer, and a third upper gate electrode on the third etch-stop layer. The fourth transistor includes a fourth gate insulating layer on the substrate, a fourth lower TiN layer on and contacting the fourth gate insulating layer, a fourth etch-stop layer on the fourth lower TiN layer, and a fourth upper electrode on the fourth etch-stop layer. A thickness of the first work function control layer is substantially equal to a thickness of the second work function control layer. A thickness of the first lower TiN layer is substantially equal to a thickness of the third lower TiN layer, a thickness of the second lower TiN layer is substantially equal to a thickness of the fourth lower TiN layer. The thickness of the first lower TiN layer is greater than a thickness of the second lower TiN layer.

Embodiments are also directed to a semiconductor device including a substrate including a first region and a second region, and first and second transistors formed in the first and second regions, respectively. The first transistor includes a first fin pattern on the substrate, a first gate insulating layer on the first fin pattern, a first lower TiN layer on the first gate insulating layer to intersect the first fin pattern and contact the first gate insulating layer, a first TaN layer on the first lower TiN layer, a first TiAlC layer on the first TaN layer, and a first filling layer on the first TiAlC layer. The second transistor includes a second fin pattern on the substrate, a second gate insulating layer on the second fin pattern, a second lower TiN layer on the second gate insulating layer to intersect the second fin pattern and contact the second gate insulating layer, a second TaN layer on the second lower TiN layer, a second TiAlC layer on the second TaN layer, and a second filling layer on the second TiAlC layer. A thickness of the first lower TiN layer is less than a thickness of the second lower TiN layer.

Embodiments are also directed to a semiconductor device including a substrate including first through fourth regions, an interlayer insulating film on the substrate, the interlaying insulating film including first through fourth trenches in the first through fourth regions, respectively, and first through fourth transistors of the same conductivity type located in the first through fourth trenches, respectively, in the first through fourth regions. Each of the first through fourth transistor includes at least one insulating layer on a bottom and sides of a respective trench of the first through fourth trenches, a lower conductive layer on the insulating layer conforming to the bottom and sides of the trench, an etch-stop layer conforming to a bottom and sides of the lower conductive layer, a work function control layer conforming to a bottom and at least a portion of sides of the etch-stop layer, an insertion layer conforming to a bottom and sides of the work function control layer, and a filling layer filling a remaining space of the trench. In at least one of the first through fourth transistors, the work function control layer is chamfered.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
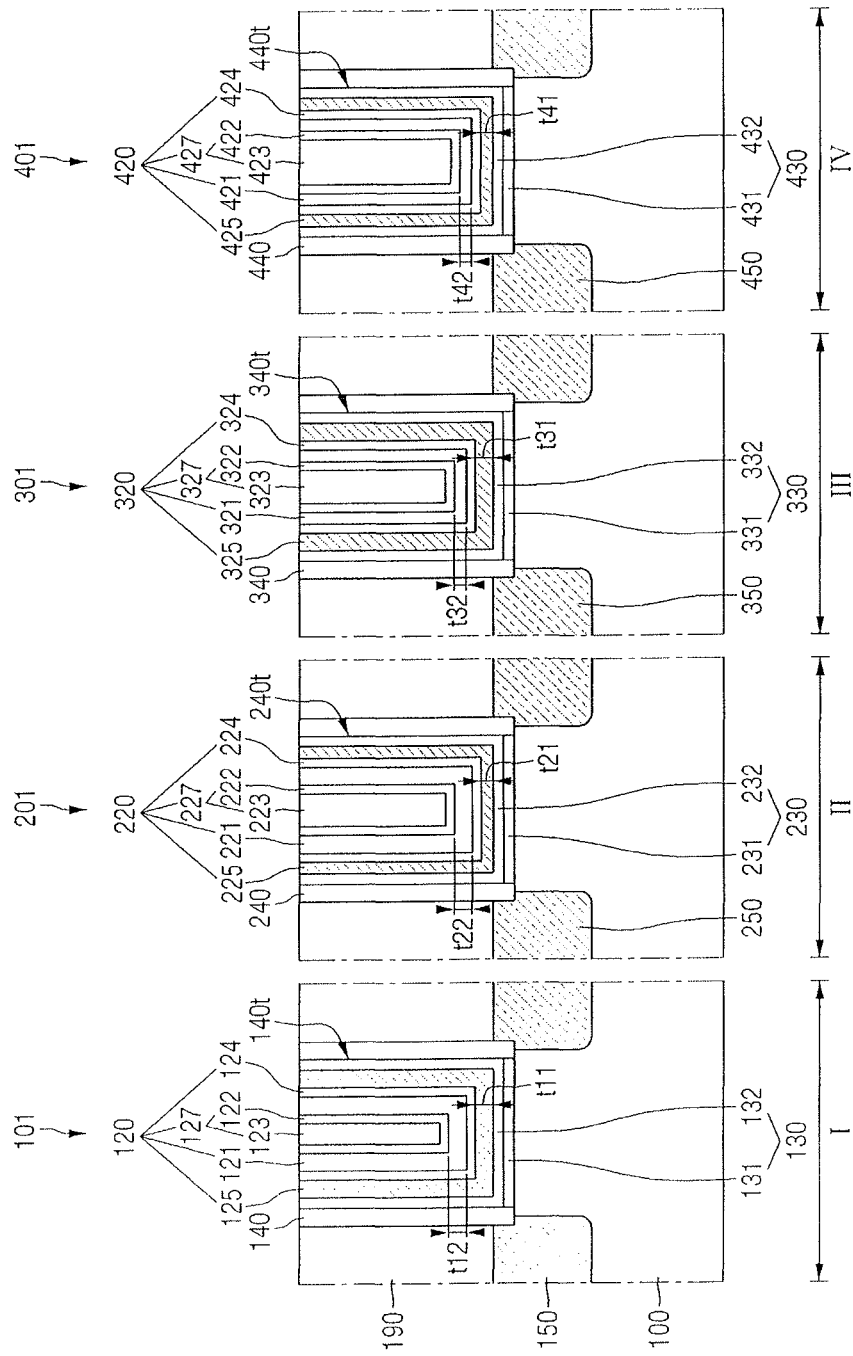
FIG. 1 illustrates a view of a semiconductor device according to some embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

Although the drawings relating to semiconductor devices according to some embodiments show a fin field effect transistor (FinFET) including a channel region of a fin pattern shape, in some implementations, the semiconductor devices according to some embodiments may also include a tunneling FET, a transistor including nanowires, a transistor including a nanosheet, or a three-dimensional (3D) transistor. In addition, the semiconductor devices according to some embodiments may include a bipolar junction transistor, a lateral double diffusion transistor (LDMOS), or the like.

FIG. 1 illustrates a view of a semiconductor device according to embodiments.

Referring to FIG. 1, the semiconductor device may include first through fourth transistors 101 through 401 formed on a substrate 100.

The substrate 100 may include first through fourth regions I through IV. The first through fourth regions I through IV may be separated from each other or may be connected to each other.

The first through fourth regions I through IV may be included in a portion that performs the same function, For example, in a logic region or an input/output (I/O) region. In some implementations, each of the first through fourth regions I through IV may be included in one of portions that perform different functions from each other, for example, one of a logic region, a static random access memory (SRAM) region and an I/O region.

In the semiconductor device according to some embodiments described with reference to FIG. 1, each of the first through fourth regions I through IV may be a region in which a p-channel metal oxide semiconductor (PMOS) is formed.

The substrate 100 may be a bulk silicon substrate or a silicon-on-insulator (SOI) substrate. In some implementations, the substrate 100 may be a silicon substrate or a substrate made of another material such as silicon germanium, silicon germanium-on-insulator (SGOI), indium antimonide, lead telluride, indium arsenide, indium phosphide, gallium arsenide or gallium antimonide.

In the following description, it is assumed, for ease of description, that the substrate 100 is a substrate containing silicon.

The first transistor 101 may be formed in the first region I, the second transistor 201 may be formed in the second region II, the third transistor 301 may be formed in the third region III, and the fourth transistor 401 may be formed in the fourth region IV.

Each of the first through fourth regions I through IV may be a region in which a PMOS is formed, and each of the first through fourth transistors 101 through 401 may be a p-type transistor.

The first transistor 101 may include a first gate insulating layer 130, a first gate electrode structure 120, first gate spacers 140, and first source/drain regions 150.

The second transistor 201 may include a second gate insulating layer 230, a second gate electrode structure 220, second gate spacers 240, and second source/drain regions 250.

The third transistor 301 may include a third gate insulating layer 330, a third gate electrode structure 320, third gate spacers 340, and third source/drain regions 350.

The fourth transistor 401 may include a fourth gate insulating layer 430, a fourth gate electrode structure 420, fourth gate spacers 440, and fourth source/drain regions 450.

Elements included in each of the first through fourth transistors 101 through 401 will be described in detail below.

An interlayer insulating film 190 may be formed on the substrate 100 of the first through fourth regions I through IV. The interlayer insulating film 190 may include first through fourth trenches 140t through 440t.

The first through fourth trenches 140t through 440t may correspond to the first through fourth regions I through IV, respectively. For example, the first trench 140t may be formed on the substrate 100 in the first region I, the second trench 240t may be formed on the substrate 100 in the second region II, the third trench 340t may be formed on the substrate 100 in the third region III, and the fourth trench 440t may be formed on the substrate 100 in the fourth region IV.

The interlayer insulating film 190 may include at least one of, for example, silicon oxide, silicon nitride, silicon oxynitride, and a low dielectric constant (low-k) material. Examples of the low-k material may include, for example, flowable oxide (FOX), tonen silazene (TOSZ), undoped silicate glass (USG), borosilicate glass (BSG), phosphosilicate glass (PSG), borophosphosilicate glass (BPSG), plasma enhanced tetraethylorthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutene (BCB), SiLK, a polyimide, a porous polymeric material, or combinations of the same The first gate spacers 140 may be formed on the substrate 100 of the first region I. The first gate spacers 140 may define the first trench 140t. The first trench 140t may have, for example, the first gate spacers 140 as its sidewalls and an upper surface of the substrate 100 as its bottom surface.

The second gate spacers 240 defining the second trench 240t may be formed on the substrate 100 of the second region II. The third gate spacers 340 defining the third trench 340t may be formed on the substrate 100 of the third region III. The fourth gate spacers 440 defining the fourth trench 440t may be formed on the substrate 100 of the fourth region IV.

Each of the first through fourth gate spacers 140 through 440 may include at least one of silicon nitride (SiN), silicon oxynitride (SiON), silicon oxide ($SiO_2$), silicon oxycarbonitride (SiOCN), and combinations of the same.

Although each of the first through fourth gate spacers 140 through 440 is illustrated as being a single layer, in some implementations, each of the first through fourth gate spacers 140 through 440 may not be a single layer. When each of the first through fourth gate spacers 140 through 440 includes a plurality of layers, at least one of the layers included in each of the first through fourth gate spacers 140 through 440 may include a low-k material such as silicon oxycarbonitride (SiOCN).

When each of the first through fourth gate spacers 140 through 440 includes a plurality of layers, at least one of the layers included in each of the first through fourth gate spacers 140 through 440 may be L-shaped.

In some cases, each of the first through fourth gate spacers 140 through 440 may serve as a guide for forming a self-aligned contact. Accordingly, each of the first through fourth gate spacers 140 through 440 may include a material having an etch selectivity with respect to the interlayer insulating film 190.

The first gate insulating layer 130 may be formed on the substrate 100 of the first region I. The first gate insulating layer 130 may extend along the sidewalls and bottom surface of the first trench 140t. The first gate insulating layer 130 may include a first interfacial layer 131 and a first high dielectric constant (high-k) insulating layer 132.

The first interfacial layer 131 may be formed on the substrate 100. The first interfacial layer 131 may be formed on the bottom surface of the first trench 140t.

The first high-k insulating layer 132 may be formed on the first interfacial layer 131. The first high-k insulating layer 132 may be formed along the bottom and sidewalls of the first trench 140t.

The second gate insulating layer 230 may be formed on the substrate 100 of the second region II. The second gate insulating layer 230 may extend along sidewalls and a bottom surface of the second trench 240t. The second gate insulating layer 230 may include a second interfacial layer 231 and a second high-k insulating layer 232.

The second interfacial layer 231 may be formed on the substrate 100. The second interfacial layer 231 may be formed on the bottom surface of the second trench 240t.

The second high-k insulating layer 232 may be formed on the second interfacial layer 231. The second high-k insulating layer 232 may be formed along the bottom surface and sidewalls of the second trench 240t.

The third gate insulating layer 330 may be formed on the substrate 100 of the third region III. The third gate insulating layer 330 may extend along sidewalls and a bottom surface of the third trench 340t. The third gate insulating layer 330 may include a third interfacial layer 331 and a third high-k insulating layer 332.

The third interfacial layer 331 may be formed on the substrate 100. The third interfacial layer 331 may be formed on the bottom surface of the third trench 340t.

The third high-k insulating layer 332 may be formed on the third interfacial layer 331. The third high-k insulating layer 332 may be formed along the bottom surface and sidewalls of the third trench 340t.

The fourth gate insulating layer 430 may be formed on the substrate 100 of the fourth region IV. The fourth gate insulating layer 430 may extend along sidewalls and a bottom surface of the fourth trench 440t. The fourth gate insulating layer 430 may include a fourth interfacial layer 431 and a fourth high-k insulating layer 432.

The fourth interfacial layer 431 may be formed on the substrate 100. The fourth interfacial layer 431 may be formed on the bottom surface of the fourth trench 440t.

The fourth high-k insulating layer 432 may be formed on the fourth interfacial layer 431. The fourth high-k insulating layer 432 may be formed along the bottom surface and sidewalls of the fourth trench 440t.

In some implementations, the first through fourth interfacial layers 131 through 431 may not be formed on the sidewalls of the first through fourth trenches 140t through 440t. In some implementations, the first through fourth interfacial layers 131 through 431 may also be formed on the sidewalls of the first through fourth trenches 140t through 440t, depending on a method of forming the first through fourth interfacial layers 131 through 431.

Each of the first through fourth interfacial layers 131 through 431 may include, for example, silicon oxide. In some implementations, each of the first through fourth interfacial layers 131 through 431 may include a different material depending on the type of the substrate 100 or the type of the first, second, third or fourth high-k insulating layer 132, 232, 332 or 432.

The first through fourth high-k insulating layers 132 through 432 may include one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

While the first through fourth high-k insulating layers 132 through 432 including oxides have mainly been described, in some implementations, the first through fourth high-k insulating layers 132 through 432 may also include, for example, one or more of nitrides of the above metallic materials (e.g., hafnium nitride) and oxynitrides (e.g., hafnium oxynitride) of the above metallic materials.

The first gate electrode structure 120 may be formed on the first gate insulating layer 130. The first gate electrode structure 120 may fill the first trench 140t.

The first gate electrode structure 120 may include a first lower conductive layer 125, a first etch-stop layer 124, a first work function control layer 121, a first insertion layer 122, and a first filling layer 123.

The first lower conductive layer 125 may be formed on the first gate insulating layer 130. The first lower conductive layer 125 may contact the first gate insulating layer 130.

The first lower conductive layer 125 may extend along the sidewalls and bottom surface of the first trench 140t. The first lower conductive layer 125 may be formed along the profile of the first gate insulating layer 130.

The first etch-stop layer 124 may be formed on the first lower conductive layer 125. The first etch-stop layer 124 may extend along the sidewalls and bottom surface of the first trench 140t. The first etch-stop layer 124 may be formed along the profile of the first lower conductive layer 125.

The first work function control layer 121 may be formed on the first etch-stop layer 124. The first work function control layer 121 may contact the first etch-stop layer 124.

The first work function control layer 121 may extend along the sidewalls and bottom surface of the first trench 140t. The first work function control layer 121 may be formed along the profile of the first etch-stop layer 124.

The first insertion layer 122 may be formed on the first work function control layer 121. The first insertion layer 122 may contact the first work function control layer 121.

The first insertion layer 122 may extend along the sidewalls and bottom surface of the first trench 140t. The first insertion layer 122 may be formed along the profile of the first work function control layer 121.

The first filling layer 123 may be formed on the first insertion layer 122. The first filling layer 123 may fill the remaining space of the first trench 140t in which the first lower conductive layer 125, the first etch-stop layer 124, the first work function control layer 121 and the first insertion layer 122 are formed.

The second gate electrode structure 220 may be formed on the second gate insulating layer 230. The second gate electrode structure 220 may fill the second trench 240t.

The second gate electrode structure 220 may include a second lower conductive layer 225, a second etch-stop layer 224, a second work function control layer 221, a second insertion layer 222, and a filling layer 223.

The second lower conductive layer 225 may be formed on the second gate insulating layer 230. The second lower conductive layer 225 may contact the second gate insulating layer 230.

The second lower conductive layer 225 may extend along the sidewalls and bottom surface of the second trench 240t. The second lower conductive layer 225 may be formed along the profile of the second gate insulating layer 230.

The second etch-stop layer 224 may be formed on the second lower conductive layer 225. The second etch-stop layer 224 may extend along the sidewalls and bottom surface of the second trench 240t. The second etch-stop layer 224 may be formed along the profile of the second lower conductive layer 225.

The second work function control layer 221 may be formed on the second etch-stop layer 224. The second work function control layer 221 may contact the second etch-stop layer 224.

The second work function control layer 221 may extend along the sidewalls and bottom surface of the second trench 240t. The second work function control layer 221 may be formed along the profile of the second etch-stop layer 224.

The second insertion layer 222 may be formed on the second work function control layer 221. The second insertion layer 222 may contact the second work function control layer 221.

The second insertion layer 222 may extend along the sidewalls and bottom surface of the second trench 240t. The second insertion layer 222 may be formed along the profile of the second work function control layer 221.

The second filling layer 223 may be formed on the second insertion layer 222. The second filling layer 223 may fill the remaining space of the second trench 240t in which the second lower conductive layer 225, the second etch-stop layer 224, the second work function control layer 221 and the second insertion layer 222 are formed.

The third gate electrode structure 320 may be formed on the third gate insulating layer 330. The third gate electrode structure 320 may fill the third trench 340t.

The third gate electrode structure 320 may include a third lower conductive layer 325, a third etch-stop layer 324, a third work function control layer 321, a third insertion layer 322, and a third filling layer 323.

The third lower conductive layer 325 may be formed on the third gate insulating layer 330. The third lower conductive layer 325 may contact the third gate insulating layer 330.

The third lower conductive layer 325 may extend along the sidewalls and bottom surface of the third trench 340t. The third lower conductive layer 325 may be formed along the profile of the third gate insulating layer 330.

The third etch-stop layer 324 may be formed on the third lower conductive layer 325. The third etch-stop layer 324 may extend along the sidewalls and bottom surface of the third trench 340t. The third etch-stop layer 324 may be formed along the profile of the third lower conductive layer 325.

The third work function control layer 321 may be formed on the third etch-stop layer 324. The third work function control layer 321 may contact the third etch-stop layer 324.

The third work function control layer 321 may extend along the sidewalls and bottom surface of the third trench 340t. The third work function control layer 321 may be formed along the profile of the third etch-stop layer 324.

The third insertion layer 322 may be formed on the third work function control layer 321. The third insertion layer 322 may contact the third work function control layer 321.

The third insertion layer 322 may extend along the sidewalls and bottom surface of the third trench 340t. The third insertion layer 322 may be formed along the profile of the third work function control layer 321.

The third filling layer 323 may be formed on the third insertion layer 322. The third filling layer 323 may fill the remaining space of the third trench 340t in which the third lower conductive layer 325, the third etch-stop layer 324, the third work function control layer 321, and the third insertion layer 322 are formed.

The fourth gate electrode structure 420 may be formed on the fourth gate insulating layer 430. The fourth gate electrode structure 420 may fill the fourth trench 440t.

The fourth gate electrode structure 420 may include a fourth lower conductive layer 425, a fourth etch-stop layer 424, a fourth work function control layer 421, a fourth insertion layer 422, and a fourth filling layer 423.

The fourth lower conductive layer 425 may be formed on the fourth gate insulating layer 430. The fourth lower conductive layer 425 may contact the fourth gate insulating layer 430.

The fourth lower conductive layer 425 may extend along the sidewalls and bottom surface of the fourth trench 440t. The fourth lower conductive layer 425 may be formed along the profile of the fourth gate insulating layer 430.

The fourth etch-stop layer 424 may be formed on the fourth lower conductive layer 425. The fourth etch-stop layer 424 may extend along the sidewalls and bottom surface of the fourth trench 440t. The fourth etch-stop layer 424 may be formed along the profile of the fourth lower conductive layer 425.

The fourth work function control layer 421 may be formed on the fourth etch-stop layer 424. The fourth work function control layer 421 may contact the fourth etch-stop layer 424.

The fourth work function control layer 421 may extend along the sidewalls and bottom surface of the fourth trench 440t. The fourth work function control layer 421 may be formed along the profile of the fourth etch-stop layer 424.

The fourth insertion layer 422 may be formed on the fourth work function control layer 421. The fourth insertion layer 422 may contact the fourth work function control layer 421.

The fourth insertion layer 422 may extend along the sidewalls and bottom surface of the fourth trench 440t. The fourth insertion layer 422 may be formed along the profile of the fourth work function control layer 421.

The fourth filling layer 423 may be formed on the fourth insertion layer 422. The fourth filling layer 423 may fill the remaining space of the fourth trench 440t in which the fourth lower conductive layer 425, the fourth etch-stop layer 424, the fourth work function control layer 421, and the fourth insertion layer 422 are formed.

A work function control layer, an insertion layer, and a filling layer formed on each etch-stop layer may be an upper gate electrode. Of these layers, the insertion layer and the filling layer may be an upper conductive layer. That is, the first through fourth gate electrode structures 120 through 420 respectively include first through fourth upper conductive layers 127 through 427, each including an insertion layer and a filling layer.

The first through fourth lower conductive layers 125 through 425 may include titanium nitride (TiN). The first through fourth lower conductive layers 125 through 425 may be referred to herein as first through fourth TiN layers.

The first through fourth etch-stop layers 124 through 424 may include the same material. For example, the first through fourth etch-stop layers 124 through 424 may be layers made of the same material.

The first through fourth etch-stop layers 124 through 424 may include, for example, tantalum nitride (TaN). The first through fourth etch-stop layers 124 through 424 may be formed at the same level. Here, the term "same level" indicates that the first through fourth etch-stop layers 124 through 424 are formed by the same fabrication process.

For example, the first through fourth etch-stop layers 124 through 424 may have substantially the same thickness.

The first through fourth work function control layers 121 through 421 may include the same material. For example, the first through fourth work function control layers 121 through 421 may be layers made of the same material.

The first through fourth work function control layers 121 through 421 may include, for example, TiN.

The first through fourth insertion layers 122 through 422 may include the same material. For example, the first through fourth insertion layers 122 through 422 may be layers made of the same material.

Here, the term "layers made of the same material" can be defined as follows. First, if each insertion layer is a single layer, the first through fourth insertion layers 122 through 422 may all be single layers made of the same material.

On the other hand, if each insertion layer includes a plurality of layers, for example, two layers, each of the first through fourth insertion layers 122 through 422 may have a multilayer structure in which a first layer made of material M and a second layer made of material N are sequentially stacked.

The first through fourth insertion layers 122 through 422 may include, for example, one of Ti, TiAl, TiAlN, TiAlC, and TiAlCN. The first through fourth insertion layers 122 through 422 may be formed at the same level.

For example, the first through fourth insertion layers 122 through 422 may have substantially the same thickness.

In the semiconductor device according to some embodiments, the first through fourth insertion layers 122 through 422 are described as layers containing TiAl.

The first through fourth filling layers 123 through 423 may include the same material. The first through fourth filling layers 123 through 423 may include at least one of, for example, W, Al, Co, Cu, Ru, Ni, Pt, Ni—Pt, and TiN.

Each of the first through fourth gate electrode structures 120 through 420 may have an uppermost surface in the same plane as an upper surface of the interlayer insulating film 190.

The first through fourth source/drain regions 150 through 450 may be formed adjacent to the first through fourth gate electrode structures 120 through 420.

Although each of the first through fourth source/drain regions 150 through 450 may include, for example, an epitaxial layer formed in the substrate 100. In some implementations, each of the first through fourth source/drain regions 150 through 450 may be an impurity region formed by implanting impurities into the substrate 100.

In some implementations, each of the first through fourth source/drain regions 150 through 450 may be an elevated source/drain region having an upper surface protruding above the upper surface of the substrate 100.

In the embodiment illustrated in FIG. 1, a thickness t11 of the first lower conductive layer 125 may be substantially equal to a thickness t31 of the third lower conductive layer 325. A thickness t21 of the second lower conductive layer 225 may be substantially equal to a thickness t41 of the fourth lower conductive layer 425.

The thickness t11 of the first lower conductive layer 125 may be greater than the thickness t21 of the second lower conductive layer 225.

In some implementations, a thickness t12 of the first work function control layer 121 may be substantially equal to a thickness t22 of the second work function control layer 221. A thickness t32 of the third work function control layer 321 may be substantially equal to a thickness t42 of the fourth work function control layer 421.

In some implementations, the thickness t12 of the first work function control layer 121 may be greater than the thickness t32 of the third work function control layer 321.

A thickness of a lower TiN layer and a thickness of a work function control layer may be different in each of the first through fourth transistors 101 through 401.

In the following description, unless otherwise specified, the thicknesses of the first through fourth work function control layers 121 through 421 and the thicknesses of the first through fourth lower conductive layers 125 through 425 are defined as thicknesses at the bottom surfaces of the first through fourth trenches 140t through 440t, respectively.

For example, the thickness t12 of the first work function control layer 121 may be the thickness of the first work function control layer 121 formed on the bottom surface of the first trench 140t, and the thickness t22 of the second work function control layer 221 may be the thickness of the second work function control layer 221 formed on the bottom surface of the second trench 240t. The thickness t32 of the third work function control layer 321 may be the thickness of the third work function control layer 321 formed on the bottom surface of the third trench 340t, and the thickness t42 of the fourth work function control layer 421 may be the thickness of the fourth work function control layer 421 formed on the bottom surface of the fourth trench 440t.

A threshold voltage of each of the first through fourth transistors 101 through 401 may be adjusted using a combination of the thickness of the lower conductive layer and the thickness of the work function control layer.

The respective threshold voltages of the first through fourth transistors 101 through 401 may be different from each other.

The threshold voltage of the second transistor 201 may be greater than the threshold voltage of the first transistor 101 and less than the threshold voltage of the third transistor 301. The threshold voltage of the third transistor 301 may be less than the threshold voltage of the fourth transistor 401.

Each of the first through fourth transistors 101 through 401 illustrated in FIG. 1 may be a p-type transistor. Accordingly, the fourth transistor 401 having the highest threshold voltage may be, for example, a p-type high voltage transistor.

The third transistor 301 may be a p-type regular voltage transistor, and the second transistor 201 may be a p-type low voltage transistor. The first transistor 101 having the lowest threshold voltage may be a p-type super low voltage transistor.

For example, in the case of the first transistor 101 and the second transistor 201, whose respective work function control layers have the same thickness and whose respective lower conductive layers have different thicknesses, the threshold voltage of the second transistor 201 whose lower conductive layer has a lesser thickness may be higher than the threshold voltage of the first transistor 101.

In the case of the first transistor 101 and the third transistor 301, whose respective lower conductive layers have the same thickness and whose respective work function control layers have different thicknesses, the threshold voltage of the third transistor 301 whose work function control layer has a lesser thickness may be higher than the threshold voltage of the first transistor 101.

Figure 2:
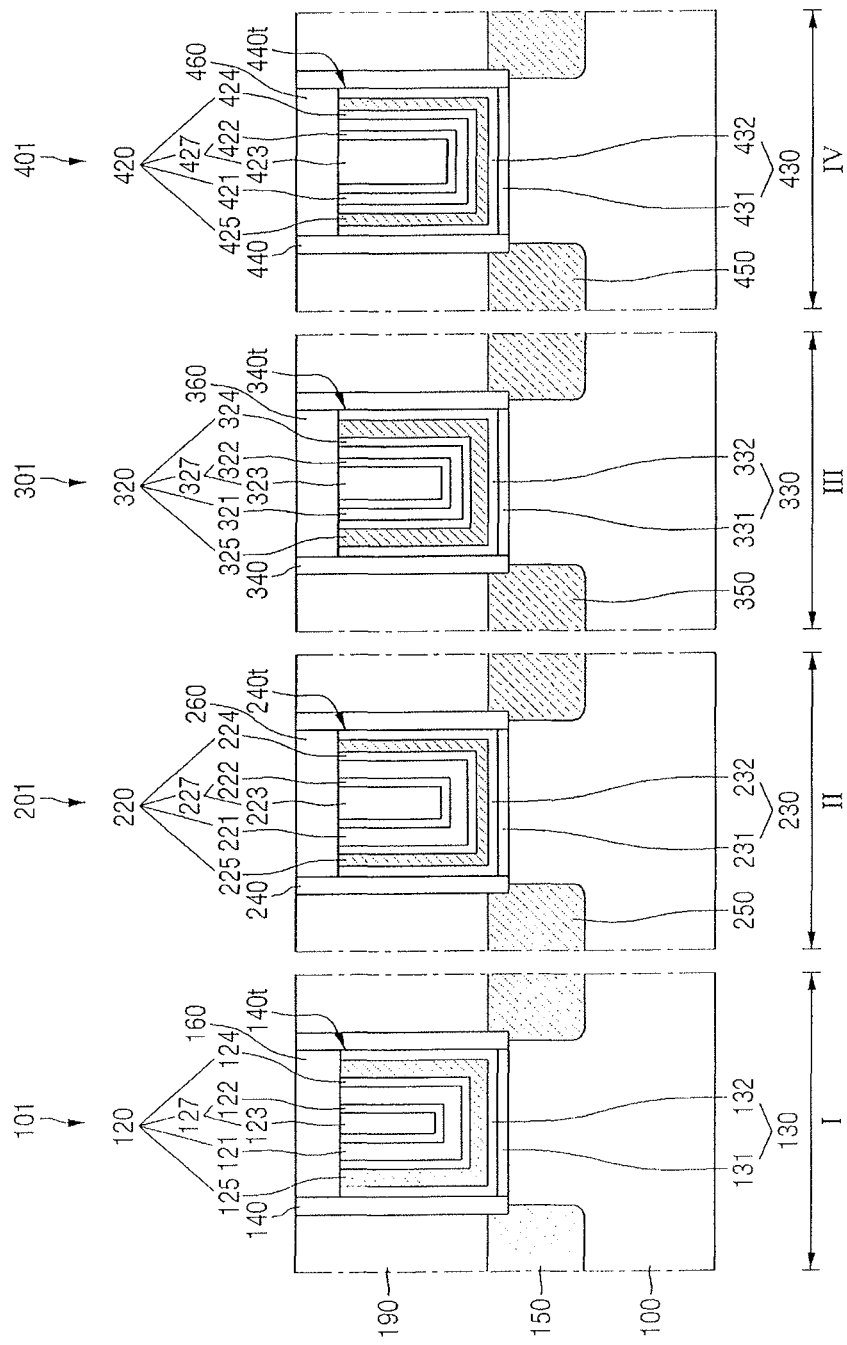
FIG. 2 illustrates a view of a semiconductor device according to some embodiments.

FIG. 2 illustrates a view of a semiconductor device according to embodiments. For ease of description, differences from the semiconductor device described above with reference to FIG. 1 will be mainly described.

Referring to FIG. 2, the semiconductor device may further include first through fourth capping patterns 160 through 460.

A first gate electrode structure 120 may fill part of a first trench 140t. An upper surface of a first gate electrode structure 120 may be closer to a substrate 100 than to an upper surface of an interlayer insulating film 190.

The first capping pattern 160 may be formed on the first gate electrode structure 120. For example, the first capping pattern 160 may be formed on a first upper conductive layer 127. The first capping pattern 160 may fill the remaining space of the first trench 140*t* filled with the first gate electrode structure 120.

A second gate electrode structure 220 may fill part of a second trench 240*t*. An upper surface of the second gate electrode structure 220 may be closer to the substrate 100 than the upper surface of the interlayer insulating film 190.

The second capping pattern 260 may be formed on the second gate electrode structure 220. The second capping pattern 260 may be formed on a second upper conductive layer 227. The second capping pattern 260 may fill the remaining space of the second trench 240*t* filled with the second gate electrode structure 220.

A third gate electrode structure 320 may fill part of a third trench 340*t*. An upper surface of the third gate electrode structure 320 may be closer to the substrate 100 than the upper surface of the interlayer insulating film 190.

The third capping pattern 360 may be formed on the third gate electrode structure 320. The third capping pattern 360 may be formed on a third upper conductive layer 327. The third capping pattern 360 may fill the remaining space of the third trench 340*t* filled with the third gate electrode structure 320.

A fourth gate electrode structure 420 may fill part of a fourth trench 440*t*. An upper surface of the fourth gate electrode structure 420 may be closer to the substrate 100 than the upper surface of the interlayer insulating film 190.

The fourth capping pattern 460 may be formed on the fourth gate electrode structure 420. The fourth capping pattern 460 may be formed on a fourth upper conductive layer 427. The fourth capping pattern 460 may fill the remaining space of the fourth trench 440*t* filled with the fourth gate electrode structure 420.

When the first through fourth capping patterns 160 through 460 partially fill the first through fourth trenches 140*t* through 440*t*, respectively, upper surfaces of the first through fourth capping patterns 160 through 460 may lie in the same plane with upper surfaces of first through fourth gate spacers 140 through 440 and the upper surface of the interlayer insulating film 190.

Each of the first through fourth capping patterns 160 through 460 may serve as a guide for forming a self-aligned contact. Therefore, each of the first through fourth capping patterns 160 through 460 may include a material having an etch selectivity with respect to the interlayer insulating film 190.

Each of the first through fourth capping patterns 160 through 460 may include at least one of silicon nitride (SiN), silicon oxynitride (SiON), silicon oxide ($SiO_2$), silicon carbonitride (SiCN), silicon oxycarbonitride (SiOCN), and combinations thereof.

In some implementations, a first gate insulating layer 130 may extend between the first gate spacers 140 and the first capping pattern 160. For example, a portion of the first gate insulating layer 130 may extend between an inner wall of each first gate spacer 140 and a sidewall of the first capping pattern 160 that faces the inner wall of the first gate spacer 140.

The degree to which each of second through fourth gate insulating layers 230 through 430 extends may be similar to the degree to which the first gate insulating layer 130 extends.

Figure 3:
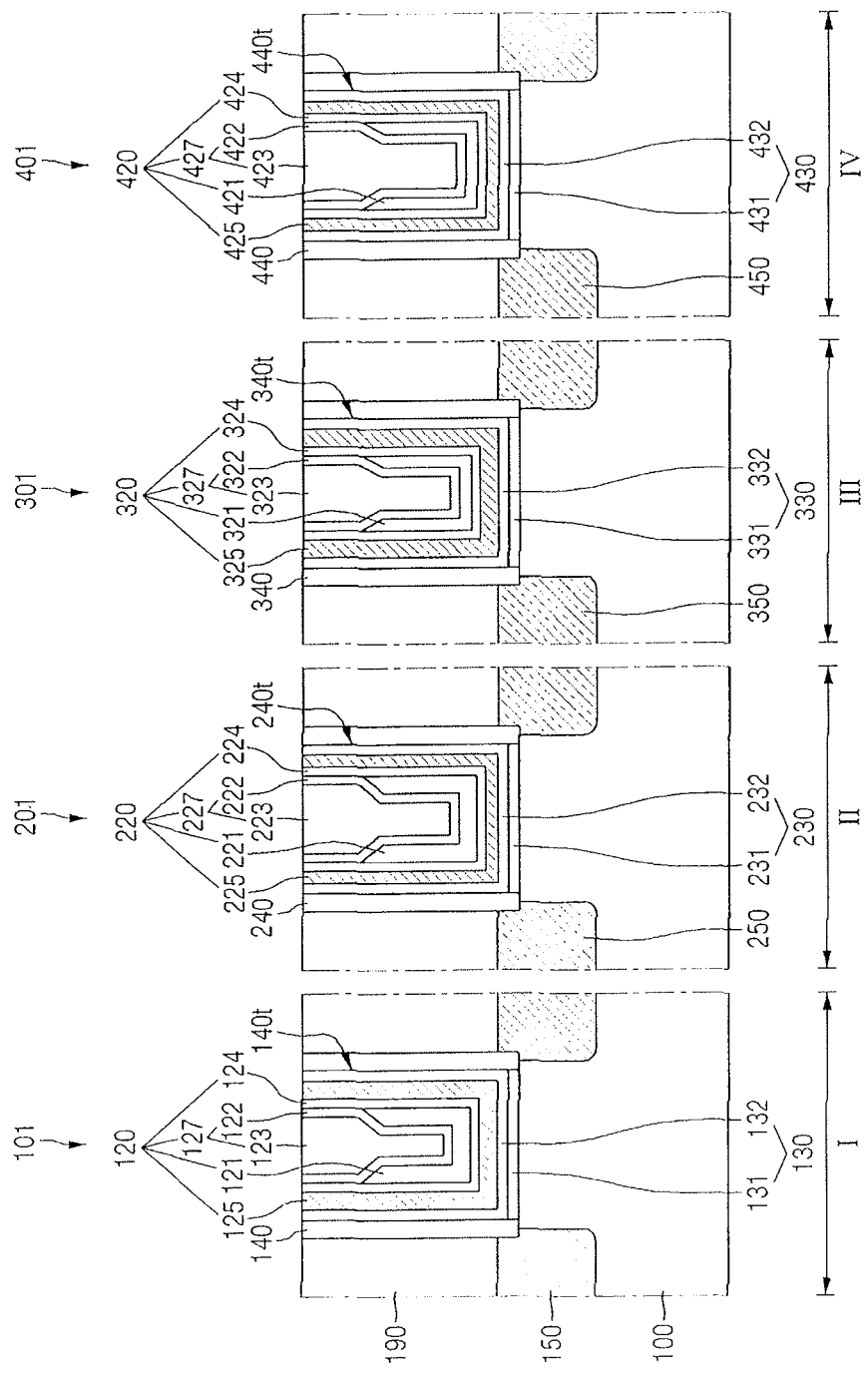
FIG. 3 illustrates a view of a semiconductor device according to some embodiments.

FIG. 3 illustrates a view of a semiconductor device according to embodiments. For ease of description, differences from the semiconductor device described above with reference to FIG. 1 will be mainly described.

Referring to FIG. 3, in the semiconductor device according to some embodiments, first through fourth work function control layers 121 through 421 may be chamfered.

An uppermost surface of the first work function control layer 121 may be lower than an uppermost surface of a first insertion layer 122 and an uppermost surface of a first filling layer 123 disposed on the first work function control layer 121. The first work function control layer 121 may not extend up to the top of sidewalls of the first trench 140*t*.

Here, the uppermost surface of the first work function control layer 121 may include both ends of the first work function control layer 121 extending along the sidewalls and a bottom surface of the first trench 140*t*.

On the portion of the sidewalls of the first trench 140*t* to which the first work function control layer 121 does not extend, the first insertion layer 122 and the first etch-stop layer 124 may contact each other.

An uppermost surface of the second work function control layer 221 may be lower than an uppermost surface of a second insertion layer 222 and an uppermost surface of a second filling layer 223 disposed on the second work function control layer 221. The second work function control layer 221 may not extend up to the top of sidewalls of a second trench 240*t*.

On the portion of the sidewalls of the second trench 240*t* to which the second work function control layer 221 does not extend, the second insertion layer 222 and the second etch-stop layer 224 may contact each other.

An uppermost surface of the third work function control layer 321 may be lower than an uppermost surface of a third insertion layer 322 and an uppermost surface of a third filling layer 323 on the third work function control layer 321. The third work function control layer 321 may not extend up to the top of sidewalls of a third trench 340*t*.

On the portion of the sidewalls of the third trench 340*t* to which the third work function control layer 321 does not extend, the third insertion layer 322 and a third etch-stop layer 324 may contact each other.

An uppermost surface of the fourth work function control layer 421 may be lower than an uppermost surface of a fourth insertion layer 422 and an uppermost surface of a fourth filling layer 423 on the fourth work function control layer 421. The fourth work function control layer 421 may not extend up to the top of sidewalls of a fourth trench 440*t*.

On the portion of the sidewalls of the fourth trench 440*t* to which the fourth work function control layer 421 does not extend, the fourth insertion layer 422 and a fourth etch-stop layer 424 may contact each other.

As shown in FIG. 3, the uppermost surfaces of the first through fourth work function control layers 121 through 421 may be inclined surfaces having acute angles to the sidewalls of the first through fourth trenches 140*t* through 440*t*, respectively.

In some implementations, the uppermost surfaces of the first through fourth work function control layers 121 through 421 may be flat surfaces having right angles to the sidewalls of the first through fourth trenches 140*t* through 440*t*, respectively.

In addition, as shown in FIG. 3, all of the first through fourth work function control layers 121 through 421 may be chamfered. In some implementations, only some of the first through fourth work function control layers 121 through 421 can be chamfered in consideration of the thickness of the work function control layer and the thickness of the lower conductive layer.

Figure 4:
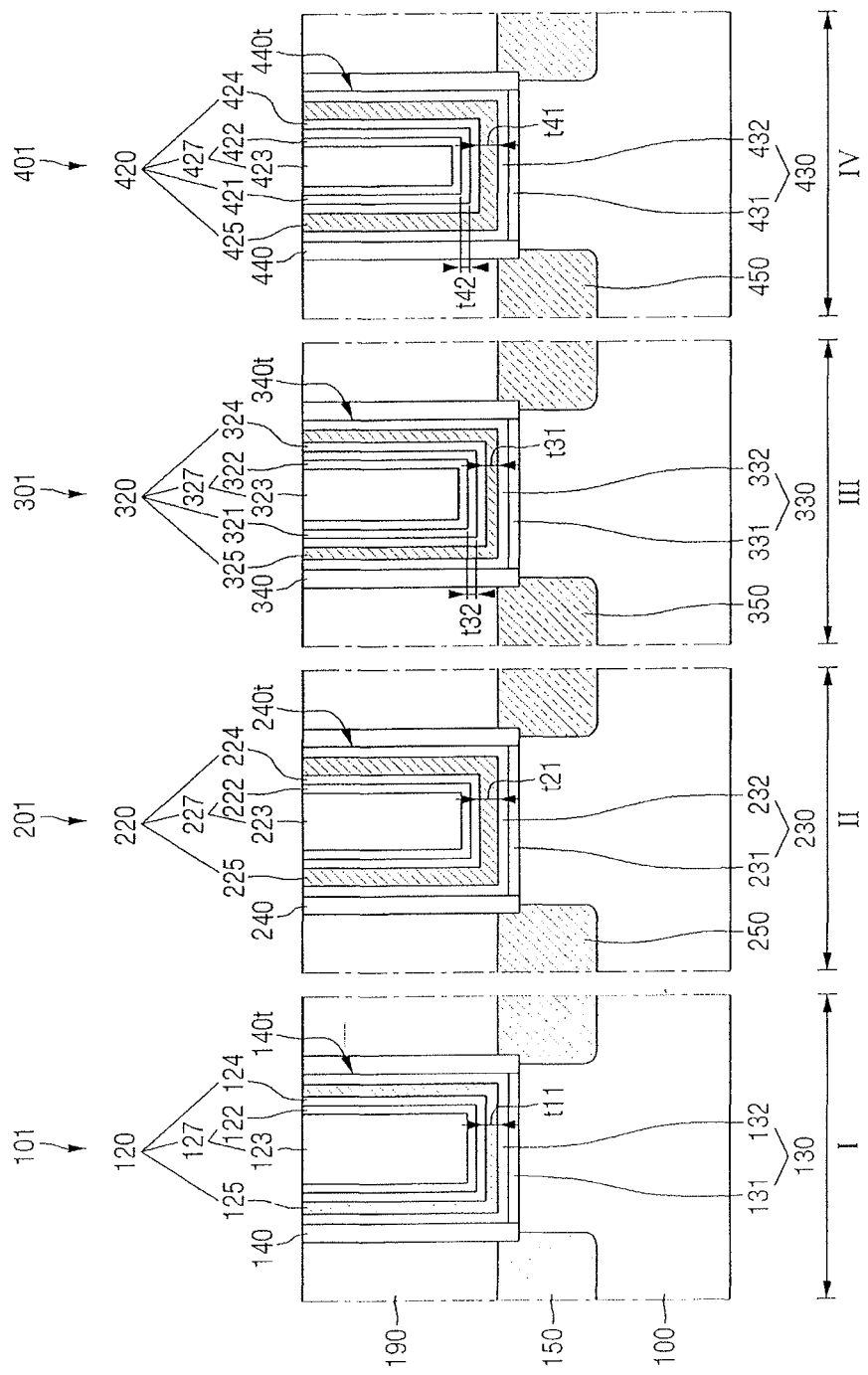
FIG. 4 illustrates a view of a semiconductor device according to some embodiments.

FIG. 4 illustrates a view of a semiconductor device according to embodiments. For ease of description, differences from the semiconductor device described above with reference to FIG. 1 will be mainly described.

Referring to FIG. 4, in the semiconductor device according to some embodiments, first through fourth regions I through IV may be regions in which n-channel metal oxide semiconductors (NMOSs) are formed.

For example, each of first through fourth transistors 101 through 401 may be an n-type transistor.

A first gate electrode structure 120 may include a first lower conductive layer 125, a first etch-stop layer 124, a first insertion layer 122, and a first filling layer 123.

The first insertion layer 122 may be formed on the first etch-stop layer 124. The first insertion layer 122 may contact the first etch-stop layer 124. The first insertion layer 122 may be formed along the profile of the first etch-stop layer 124.

A second gate electrode structure 220 may include a second lower conductive layer 225, a second etch-stop layer 224, a second insertion layer 222, and a second filling layer 223.

The second insertion layer 222 may be formed on the second etch-stop layer 224. The second insertion layer 222 may contact the second etch-stop layer 224. The second insertion layer 222 may be formed along the profile of the second etch-stop layer 224.

Unlike a third gate electrode structure 320 and a fourth gate electrode structure 420, the first gate electrode structure 120 and the second gate electrode structure 220 may not include a work function control layer, for example, a TiN layer.

In FIG. 4, a thickness t11 of the first lower conductive layer 125 may be substantially equal to a thickness t31 of a third lower conductive layer 325. In addition, a thickness t21 of the second lower conductive layer 225 may be substantially equal to a thickness t41 of a fourth lower conductive layer 425.

The thickness t11 of the first lower conductive layer 125 may be less than the thickness t21 of the second lower conductive layer 225.

In addition, a thickness t32 of a third work function control layer 321 may be substantially equal to a thickness t42 of a fourth work function control layer 421.

The thickness of the lower conductive layer and the presence or absence of the work function control layer may be different in each of the first through fourth transistors 101 through 401.

A threshold voltage of each of the first through fourth transistors 101 through 401 can be adjusted according to the thickness of the lower TiN layer and the presence or absence of the work function control layer.

The threshold voltages of the first through fourth transistors 101 through 401 may be different from each other.

The threshold voltage of the second transistor 201 may be higher than the threshold voltage of the first transistor 101 and less than the threshold voltage of the third transistor 301. In addition, the threshold voltage of the third transistor 301 may be less than the threshold voltage of the fourth transistor 401.

Each of the first through fourth transistors 101 through 401 illustrated in FIG. 4 may be an n-type transistor. Accordingly, the fourth transistor 401 having the largest threshold voltage may be, for example, an n-type high voltage transistor.

In addition, the third transistor 301 may be an n-type regular voltage transistor, and the second transistor 201 may be an n-type low voltage transistor. Also, the first transistor 101 having the lowest threshold voltage may be an n-type super low voltage transistor.

In the case of the first transistor 101 and the second transistor 201 which do not have a work function control layer and whose respective lower conductive layers have different thicknesses, the threshold voltage of the second transistor 201 whose lower conductive layer has a greater thickness may be higher than the threshold voltage of the first transistor 101.

Likewise, in the case of the third transistor 301 and the fourth transistor 401 whose respective work function control layers have the same thickness and whose respective lower conductive layers have different thicknesses, the threshold voltage of the fourth transistor 401 whose lower conductive layer has a greater thickness may be higher than the threshold voltage of the third transistor 301.

Furthermore, in the case of the first transistor 101 and the third transistor 301 whose respective lower conductive layers have the same thickness and which are different in terms of the presence or absence of the work function control layer, the threshold voltage of the third transistor 301 having the work function control layer may be higher than the threshold voltage of the first transistor 101.

Figure 5:
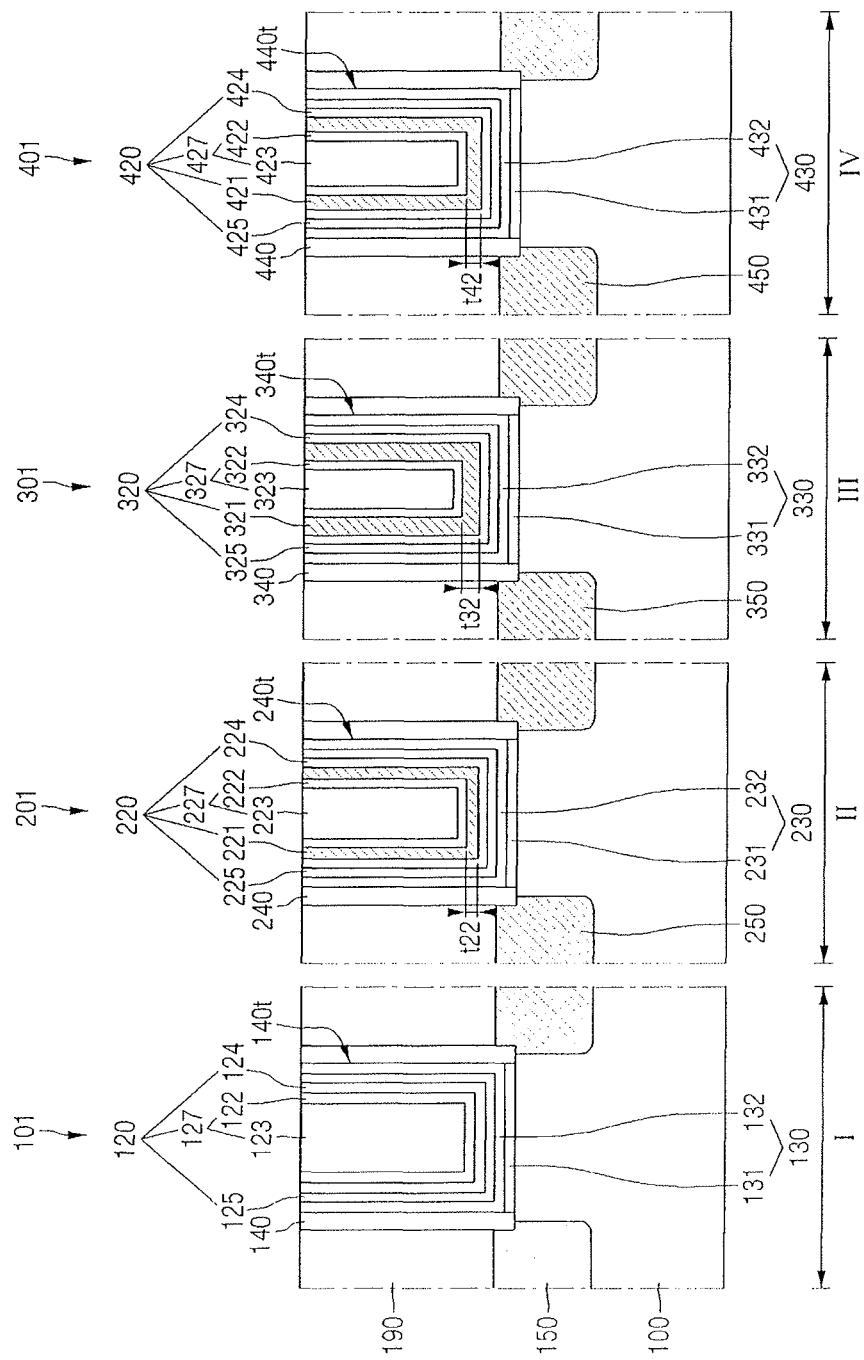
FIG. 5 illustrates a view of a semiconductor device according to some embodiments.

FIG. 5 illustrates a view of a semiconductor device according to embodiments. For ease of description, differences from the semiconductor device described above with reference to FIG. 1 will be mainly described.

Referring to FIG. 5, in the semiconductor device according to some embodiments, a first region I and a second region II may be regions in which NMOSs are formed, and a third region III and a fourth region IV may be regions in which PMOSs are formed.

For example, a first transistor 101 and a second transistor 201 may be n-type transistors, and a third transistor 301 and a fourth transistor 401 may be p-type transistors.

A first gate electrode structure 120 may include a first lower conductive layer 125, a first etch-stop layer 124, a first insertion layer 122, and a first filling layer 123.

The first insertion layer 122 may be formed on the first etch-stop layer 124. The first insertion layer 122 may contact the first etch-stop layer 124. The first insertion layer 122 may be formed along the profile of the first etch-stop layer 124.

For example, unlike second through fourth gate electrode structures 220 through 420, the first gate electrode structure 120 may not include a work function control layer, for example, a TiN layer.

In FIG. 5, the first through fourth lower conductive layers 125 through 425 may have the same or different thicknesses.

A thickness t42 of a fourth work function control layer 421 may be less than a thickness t32 of a third work function control layer 321 and greater than a thickness t22 of a second work function control layer 221.

A threshold voltage of the second transistor 201 including the second work function control layer 221 may be higher than a threshold voltage of the first transistor 101 without a work function control layer.

In the case of the n-type transistors, the threshold voltage of the second transistor 201 including a TiN layer between a TaN layer and a TiAlC layer may be higher than the threshold voltage of the first transistor 101, which does not include a TiN layer between a TaN layer and a TiAlC layer, regardless of the thickness of a lower TiN layer.

On the other hand, a threshold voltage of the third transistor 301 including the third work function control layer 321 may be less than a threshold voltage of the fourth transistor 401 including the fourth work function control layer 421.

In the case of the p-type transistors, the threshold voltage of the third transistor 301 including a thicker TiN layer between a TaN layer and a TiAlC layer may be less than the threshold voltage of the fourth transistor 401 including a thinner TiN layer between a TaN layer and a TiAlC layer, regardless of the thickness of a lower TiN layer.

Figure 6:
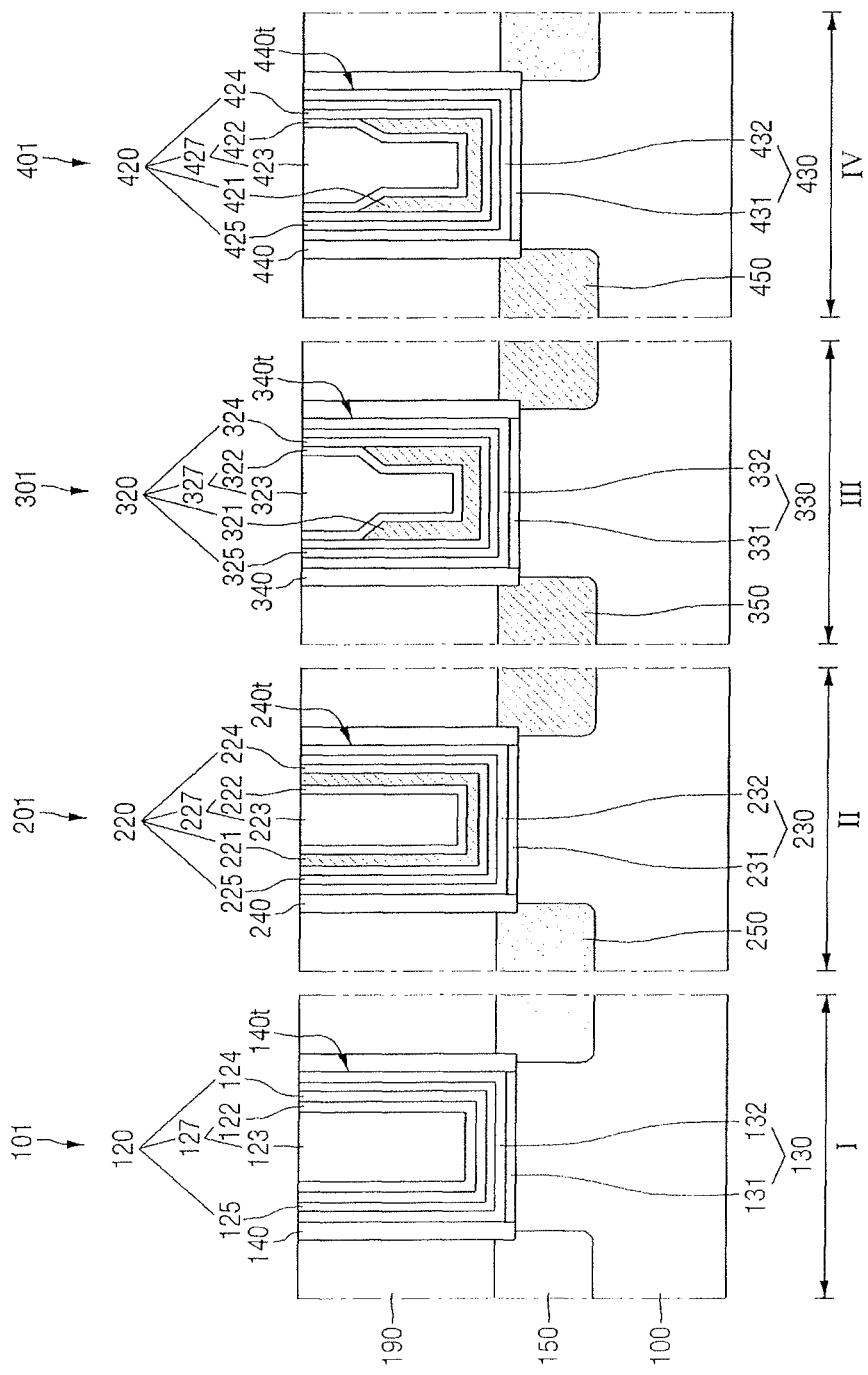
FIG. 6 illustrates a view of a semiconductor device according to some embodiments.

FIG. 6 illustrates a view of a semiconductor device according to embodiments. For ease of description, differences from the semiconductor device described above with reference to FIG. 5 will be mainly described.

Referring to FIG. 6, in the semiconductor device according to some embodiments, a third work function control layer 321 and a fourth work function control layer 421 may be chamfered.

For example, the third work function control layer 321 and the fourth work function control layer 421 included in gate electrode structures of p-type transistors may be chamfered.

An uppermost surface of the third work function control layer 321 may be lower than an uppermost surface of a third insertion layer 322 and an uppermost surface of a third filling layer 323 disposed on the third work function control layer 321. The third work function control layer 321 may not extend up to the top of sidewalls of a third trench 340*t*.

An uppermost surface of the fourth work function control layer 421 may be lower than an uppermost surface of a fourth insertion layer 422 and an uppermost surface of a fourth filling layer 423 disposed on the fourth work function control layer 421. The fourth work function control layer 421 may not extend up to the top of sidewalls of a fourth trench 440*t*.

In FIG. 6, the third work function control layer 321 and the fourth work function control layer 421 included in the gate electrode structures of the p-type transistors are chamfered, as examples.

Figure 7:
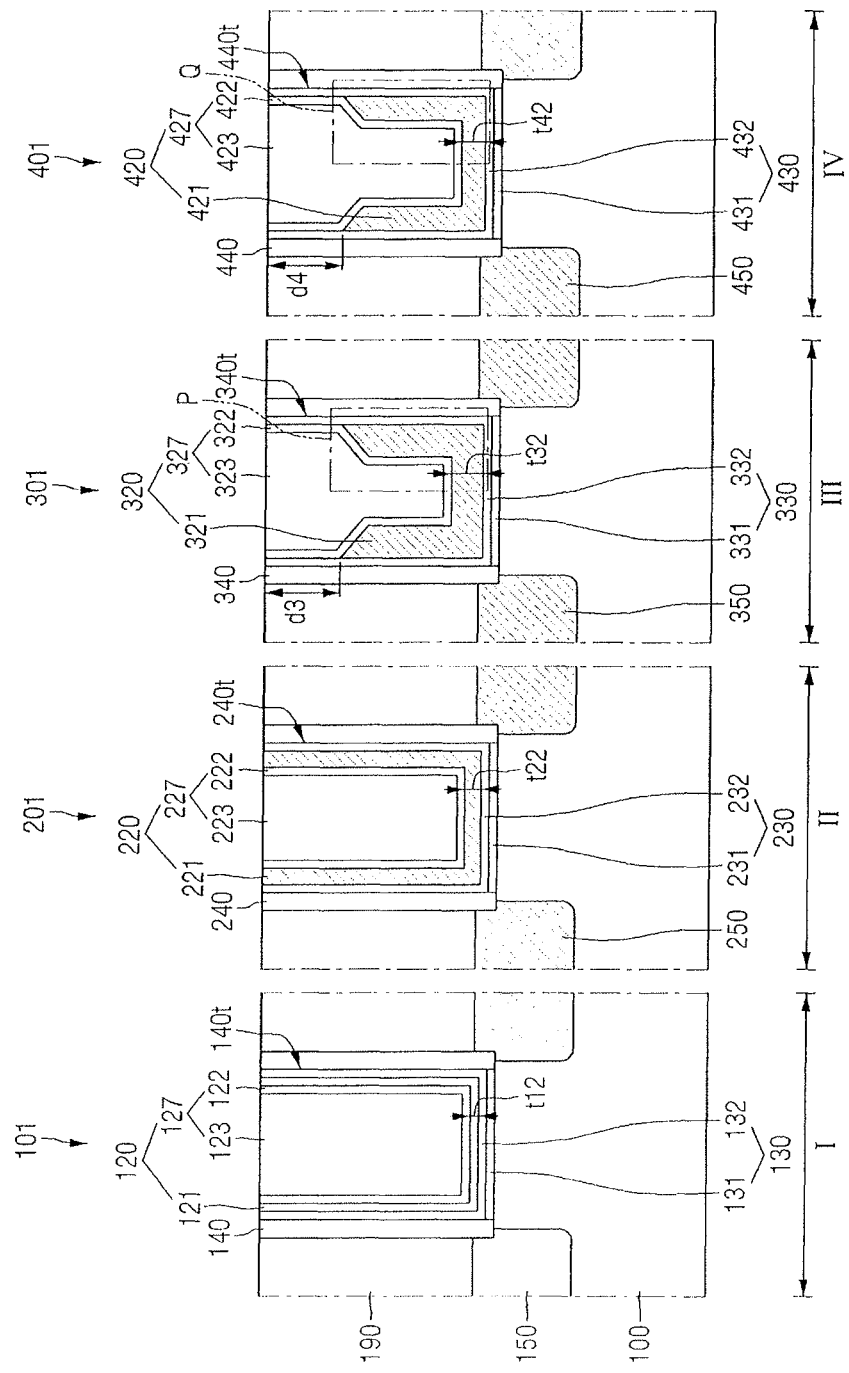
FIG. 7 illustrates a view of a semiconductor device according to some embodiments.
Figure 8:
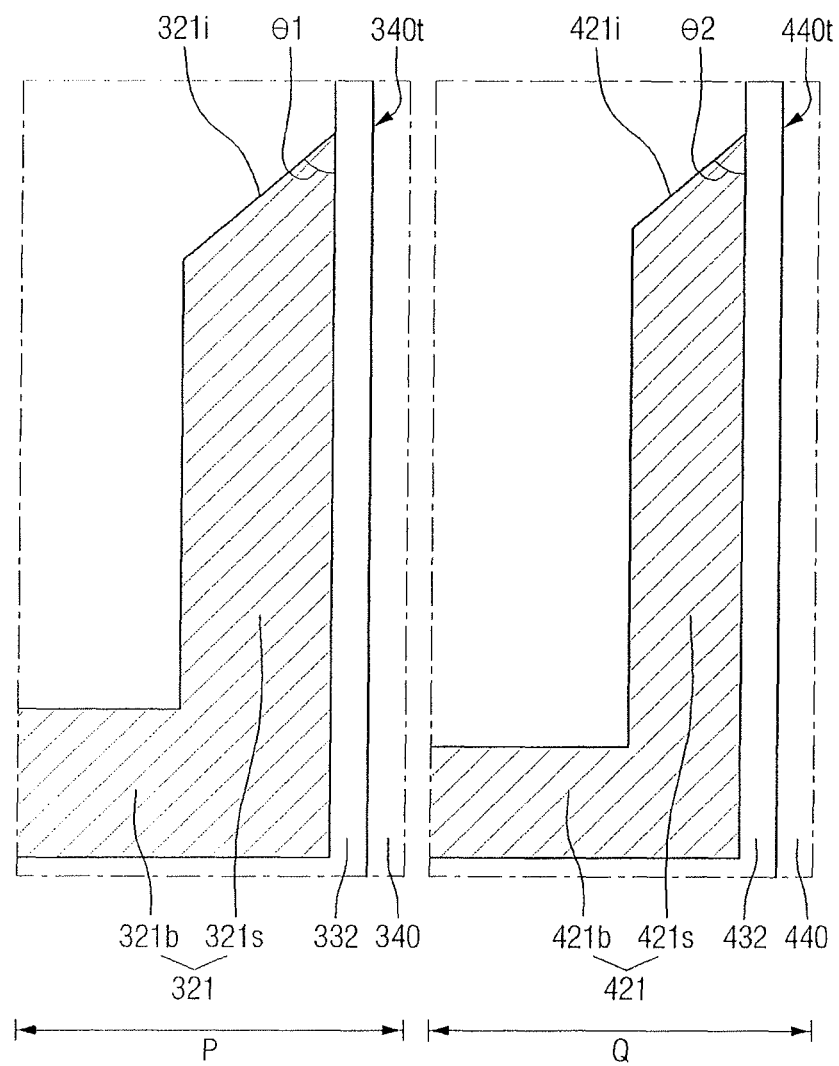
FIG. 8 illustrates an enlarged view of portions P and Q of FIG. 7.

FIG. 7 illustrates a view of a semiconductor device according to embodiments. FIG. 8 illustrates an enlarged view of portions P and Q of FIG. 7. For ease of description, differences from the semiconductor device described above with reference to FIG. 1 will be mainly described.

For reference, only a work function control layer of each gate electrode structure, excluding an insertion layer and a filling layer, is illustrated in FIG. 8.

Referring to FIGS. 7 and 8, in the semiconductor device according to some embodiments, first through fourth gate electrode structures 120 through 420 may not include first through fourth lower conductive layers 125 through 425 and first through fourth etch-stop layers 124 through 424.

A first region I and a second region II may be regions in which NMOSs are formed, and a third region III and a fourth region IV may be regions in which PMOSs are formed.

The first gate electrode structure 120 may include a first work function control layer 121 and a first upper conductive layer 127. The first upper conductive layer 127 may include a first insertion layer 122 and a first filling layer 123.

The first work function control layer 121 may be formed on a first gate insulating layer 130. The first work function control layer 121 may contact the first gate insulating layer 130. The first work function control layer 121 may be formed along the profile of the first gate insulating layer 130.

A height of an uppermost surface of the first work function control layer 121 may be substantially equal to a height of an uppermost surface of the first insertion layer 122 and a height of an uppermost surface of the first filling layer 123 disposed on the first work function control layer 121. The first work function control layer 121 may extend up to the top of sidewalls of a first trench 140*t*. The uppermost surface of the first work function control layer 121 may include both ends of the first work function control layer 121 extending along the sidewalls and a bottom surface of the first trench 140*t*.

In this embodiment, the first upper conductive layer 127 may not cover the uppermost surface of the first work function control layer 121.

The second gate electrode structure 220 may include a second work function control layer 221 and a second upper conductive layer 227. The second upper conductive layer 227 may include a second insertion layer 222 and a second filling layer 223.

The second work function control layer 221 may be formed on a second gate insulating layer 230. The second work function control layer 221 may contact the second gate insulating layer 230. The second work function control layer 221 may be formed along the profile of the second gate insulating layer 230.

A height of an uppermost surface of the second work function control layer 221 may be substantially equal to a height of an uppermost surface of the second insertion layer 222 and a height of an uppermost surface of the second filling layer 223 disposed on the second work function control layer 221. The second work function control layer 221 may extend up to the top of sidewalls of a second trench 240*t*.

In this embodiment, the second upper conductive layer 227 may not cover the uppermost surface of the second work function control layer 221.

The third gate electrode structure 320 may include a third work function control layer 321 and a third upper conductive layer 327. The third upper conductive layer 327 may include a third insertion layer 322 and a third filling layer 323.

The third work function control layer 321 may be formed on a third gate insulating layer 330. The third work function control layer 321 may contact the third gate insulating layer 330.

The third work function control layer 321 may extend along part of sidewalls of a third trench 340*t* and a bottom surface of the third trench 340*t*. The third work function control layer 321 may not extend up to the top of the sidewalls of the third trench 340*t*.

For example, the third work function control layer 321 may not be formed on part of the third gate insulating layer 330 formed on the sidewalls of the third trench 340*t*. The third work function control layer 321 may be formed along the profile of the third gate insulating layer 330.

When the third work function control layer 321 is not formed on part of the sidewalls of the third trench 340*t*, the third insertion layer 322 may be formed along the profile of the third work function control layer 321 and the third gate insulating layer 330.

For example, on portion of the sidewalls of the third trench 340*t* to which the third work function control layer 321 does not extend, the third insertion layer 322 and the third gate insulating layer 330 may contact each other.

An uppermost surface of the third work function control layer 321 may be lower than an uppermost surface of the third insertion layer 322 and an uppermost surface of the third filling layer 323.

The third upper conductive layer 327 may cover the uppermost surface of the third work function control layer 321. For example, the third insertion layer 322 and the third filling layer 323 may cover the uppermost surface of the third work function control layer 321.

The fourth gate electrode structure 420 may include a fourth work function control layer 421 and a fourth upper conductive layer 427. The fourth upper conductive layer 427 may include a fourth insertion layer 422 and a fourth filling layer 423.

The fourth work function control layer 421 may be formed on a fourth gate insulating layer 430. The fourth work function control layer 421 may contact the fourth gate insulating layer 430.

The fourth work function control layer 421 may extend along part of sidewalls of a fourth trench 440t and a bottom surface of the fourth trench 440t. The fourth work function control layer 421 may not extend to the top of the sidewalls of the fourth trench 440t.

For example, the fourth work function control layer 421 may not be formed on part of the fourth gate insulating layer 430 formed on the sidewalls of the fourth trench 440t. The fourth work function control layer 421 may be formed along the profile of the fourth gate insulating layer 430.

When the fourth work function control layer 421 is not formed on part of the sidewalls of the fourth trench 440t, the fourth insertion layer 422 may be formed along the profile of the fourth work function control layer 421 and the profile of the fourth gate insulating layer 430.

On the portions of the sidewalls of the fourth trench 440t to which the fourth work function control layer 421 does not extend, the fourth insertion layer 422 and the fourth gate insulating layer 430 may contact each other. An uppermost surface of the fourth work function control layer 421 may be lower than an uppermost surface of the fourth insertion layer 422 and an uppermost surface of the fourth filling layer 423.

The fourth upper conductive layer 427 may cover the uppermost surface of the fourth work function control layer 421. For example, the fourth insertion layer 422 and the fourth filling layer 423 may cover the uppermost surface of the fourth work function control layer 421.

The third work function control layer 321 and the fourth work function control layer 421 may be chamfered. The shapes of the third work function control layer 321 and the fourth work function control layer 421 will be described in detail below.

In FIG. 7, a depth d3 from an upper surface of an interlayer insulating film 190 to the third work function control layer 321 may be substantially equal to a depth d4 from the upper surface of the interlayer insulating film 190 to the fourth work function control layer 421.

In FIG. 7, a thickness t12 of the first work function control layer 121, a thickness t22 of the second work function control layer 221, a thickness t32 of the third work function control layer 321, and a thickness t42 of the fourth work function control layer 421 may be different from each other.

For example, the thickness t22 of the second work function control layer 221 may be greater than the thickness t12 of the first work function control layer 121 and less than the thickness t42 of the fourth work function control layer 421. The thickness t32 of the third work function control layer 321 may be greater than the thickness t42 of the fourth work function control layer 421. For example, the third work function control layer 321 may be thickest among the first through fourth work function control layers 121 through 421.

In the semiconductor device according to some embodiments, a threshold voltage of a first transistor 101 may be lower than a threshold voltage of a second transistor 201.

In the case of the n-type transistors, the threshold voltage of the second transistor 201 including the second work function control layer 221, which is thicker than the first work function control layer 121, may be higher than the threshold voltage of the first transistor 101 including the first work function control layer 121.

In addition, a threshold voltage of a third transistor 301 may be lower than a threshold voltage of a fourth transistor 401.

For example, in the case of the p-type transistors, the threshold voltage of the third transistor 301 including the third work function control layer 321, which is thicker than the fourth work function control layer 421, may be smaller than the threshold voltage of the fourth transistor 401 including the fourth work function control layer 421.

In FIG. 8, the third work function control layer 321 includes a third inclined surface 321i having an acute angle $\theta 1$ with respect to a sidewall of the third trench 340t. For example, the third work function control layer 321 extending along the sidewall of the third trench 340t my have the third inclined surface 321i having the acute angle $\theta 1$ with respect to the sidewall of the third trench 340t.

In addition, the fourth work function control layer 421 may include a fourth inclined surface 421i having an acute angle $\theta 2$ with respect to a sidewall of the fourth trench 440t.

Here, the acute angles $\theta 1$ and $\theta 2$ indicate that angles measured in a clockwise direction with respect to the sidewalls of the third and fourth trenches 340t and 440t do not exceed 90 degrees.

In some implementations, the first work function control layer 121 and the second work function control layer 221 may not include inclined surfaces having acute angles to the sidewalls of the first trench 140t and the second trench 240t.

In FIG. 8, the acute angle $\theta 1$ of the third inclined surface 321i and the acute angle $\theta 2$ of the fourth inclined surface 421i are shown as being substantially equal. In some implementations, the acute angle $\theta 1$ of the third inclined surface 321i and the acute angle $\theta 2$ of the fourth inclined surface 421i may be different from each other. For example, the acute angle $\theta 2$ of the fourth inclined surface 421i may be greater than the acute angle $\theta 1$ of the third inclined surface 321i, or the acute angle $\theta 2$ of the fourth inclined surface 421i may be smaller than the acute angle $\theta 1$ of the third inclined surface 321i.

In FIG. 8, the third inclined surface 321i of the third work function control layer 321 may be the uppermost surface of the third work function control layer 321, and the fourth inclined surface 421i of the fourth work function control layer 421 may be the uppermost surface of the fourth work function control layer 421.

A distance from an upper surface of the substrate 100 to the third inclined surface 321i of the third work function control layer 321 and a distance from the upper surface of the substrate 100 to the fourth inclined surface 421i of the fourth work function control layer 421 may be less than a distance from the upper surface of the substrate 100 to the upper surface of the interlayer insulating film 190.

The above shapes of the third work function control layer 321 and the fourth work function control layer 421 may improve the gap-fill characteristics of the third upper conductive layer 327 and the fourth upper conductive layer 427.

For example, as the size of a semiconductor device becomes ever smaller, various elements (e.g., transistors) included in the semiconductor device also become smaller. Accordingly, the first through fourth trenches 140t through 440t, in each of which a plurality of functional layer patterns for forming a transistor are formed, become narrower.

Unlike the illustration in the drawings, if both ends of the thick third and fourth work function control layers 321 and 421 extend up to the top of the sidewalls of the third and fourth trenches 340t and 440t, the entrance of the third and fourth trenches 340t and 440t, in which the third and fourth upper conductive layers 327 and 427 are to be formed, may become narrower.

In this case, the metal-fill characteristics of the third and fourth upper conductive layers 327 and 427 may deteriorate.

For this reason, the uppermost surfaces of the third and fourth work function control layers 321 and 421 may not be extended up to the top of the sidewalls of the third and fourth trenches 340t and 440t as illustrated in FIG. 7. This may allow the third and fourth upper conductive layers 327 and 427 to have entrance areas sufficient to form the third and fourth upper conductive layers 327 and 427 reliably in a subsequent process.

In FIG. 8, the third work function control layer 321 may include a bottom portion 321b formed on the bottom surface of the third trench 340t and a sidewall portion 321s formed on the sidewalls of the third trench 340t.

The sidewall portion 321s of the third work function control layer 321 may protrude from the bottom portion 321b of the third work function control layer 321.

Similarly, the fourth work function control layer 421 may include a bottom portion 421b formed on the bottom surface of the fourth trench 440t and a sidewall portion 421s formed on the sidewalls of the fourth trench 440t.

The sidewall portion 421s of the fourth work function control layer 421 may protrude from the bottom portion 421b of the fourth work function control layer 421.

The sidewall portion 321s of the third work function control layer 321 may include the uppermost surface of the third work function control layer 321, and the sidewall portion 421s of the fourth work function control layer 421 may include the uppermost surface of the fourth work function control layer 421.

The sidewall portion 321s of the third work function control layer 321 may include the third inclined surface 321i having the acute angle θ1, and the sidewall portion 421s of the fourth work function control layer 421 may include the fourth inclined surface 421i having the acute angle θ2.

The thickness t32 of the third work function control layer 321 may include the thickness of the bottom portion 321b of the third work function control layer 321, and the thickness t42 of the fourth work function control layer 421 may include the thickness of the bottom portion 421b of the fourth work function control layer 421.

In FIG. 7, the third work function control layer 321 and the fourth work function control layer 421 are all chamfered, as an example. In some implementations, one of the third work function control layer 321 and the fourth work function control layer 421 may be chamfered, and the other one may extend up to the top of the sidewalls of a corresponding trench, like the first and second work function control layers 121 and 221.

For example, the third work function control layer 321 thicker than the fourth work function control layer 421 may be chamfered, and the fourth work function control layer 421 may extend up to the top of the sidewalls of the fourth trench 440t.

Figure 9:
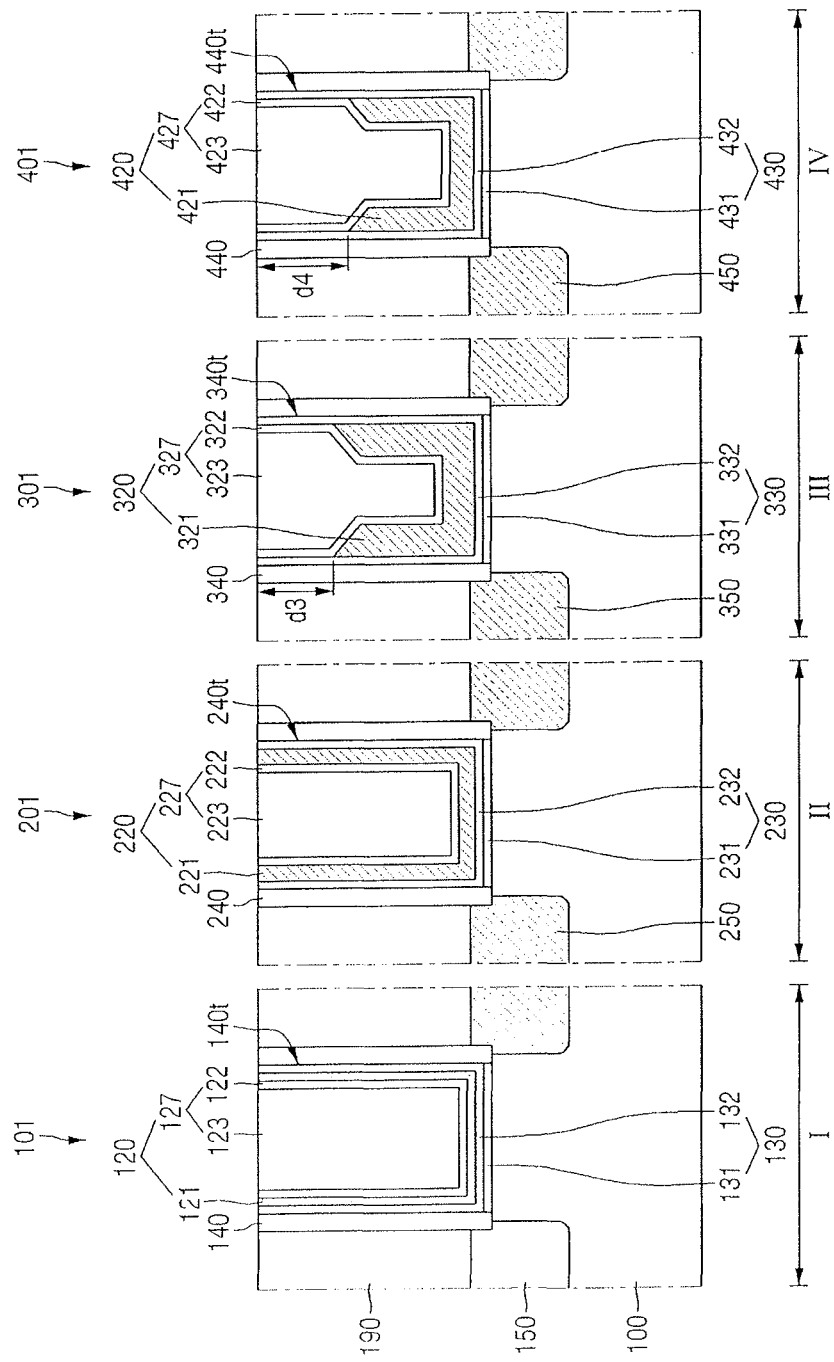
FIGS. 9 through 12 respectively illustrate views of semiconductor devices according to some embodiments.

FIG. 9 illustrates a view of a semiconductor device according to embodiments. For ease of description, differences from the semiconductor device described above with reference to FIGS. 7 and 8 will be mainly described.

Referring to FIG. 9, in the semiconductor device according to some embodiments, a depth d3 from an upper surface of an interlayer insulating film 190 to a third work function control layer 321 may be different from a depth d4 from the upper surface of the interlayer insulating film 190 to a fourth work function control layer 421.

For example, the depth d3 from the upper surface of the interlayer insulating film 190 to the third work function control layer 321 may be less than the depth d4 from the upper surface of the interlayer insulating film 190 to the fourth work function control layer 421.

A distance between third gate spacers 340 may be equal to a distance between fourth gate spacers 440.

When the third work function control layer 321 is thicker than the fourth work function control layer 421, a distance between portions of the third work function control layer 321 formed on sidewalls of a third trench 340t may be less than a distance between portions of the fourth work function control layer 421 formed on sidewalls of a fourth trench 440t.

In the process of chamfering a work function control layer, a distance between portions of the work function control layer formed on sidewalls of a trench may affect the position of an uppermost surface of the chamfered work function control layer.

Figure 10:
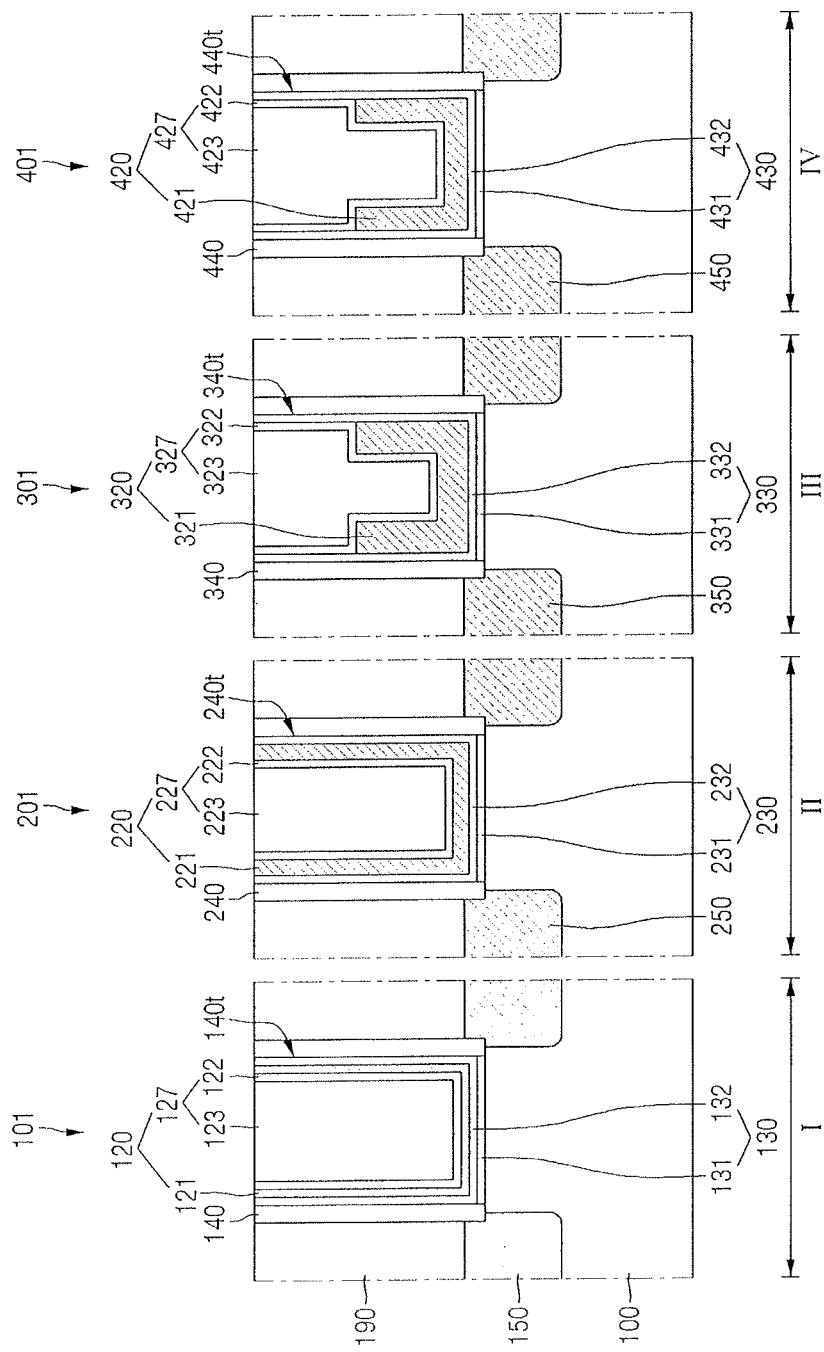

FIG. 10 illustrates a view of a semiconductor device according to embodiments. For ease of description, differences from the semiconductor device described above with reference to FIGS. 7 and 8 will be mainly described.

Referring to FIG. 10, in the semiconductor device according to some embodiments, an uppermost surface of a third work function control layer 321 may not include an inclined surface having an acute angle with respect to sidewalls of a third trench 340t.

An uppermost surface of a fourth work function control layer 421 may not include an inclined surface having an acute angle with respect to sidewalls of a fourth trench 440t.

The uppermost surface of the third work function control layer 321 may be a flat surface having a right angle with respect to the sidewalls of the third trench 340t. Similarly, the uppermost surface of the fourth work function control layer 421 may be a flat surface having a right angle with respect to the sidewalls of the fourth trench 440t.

Figure 11:
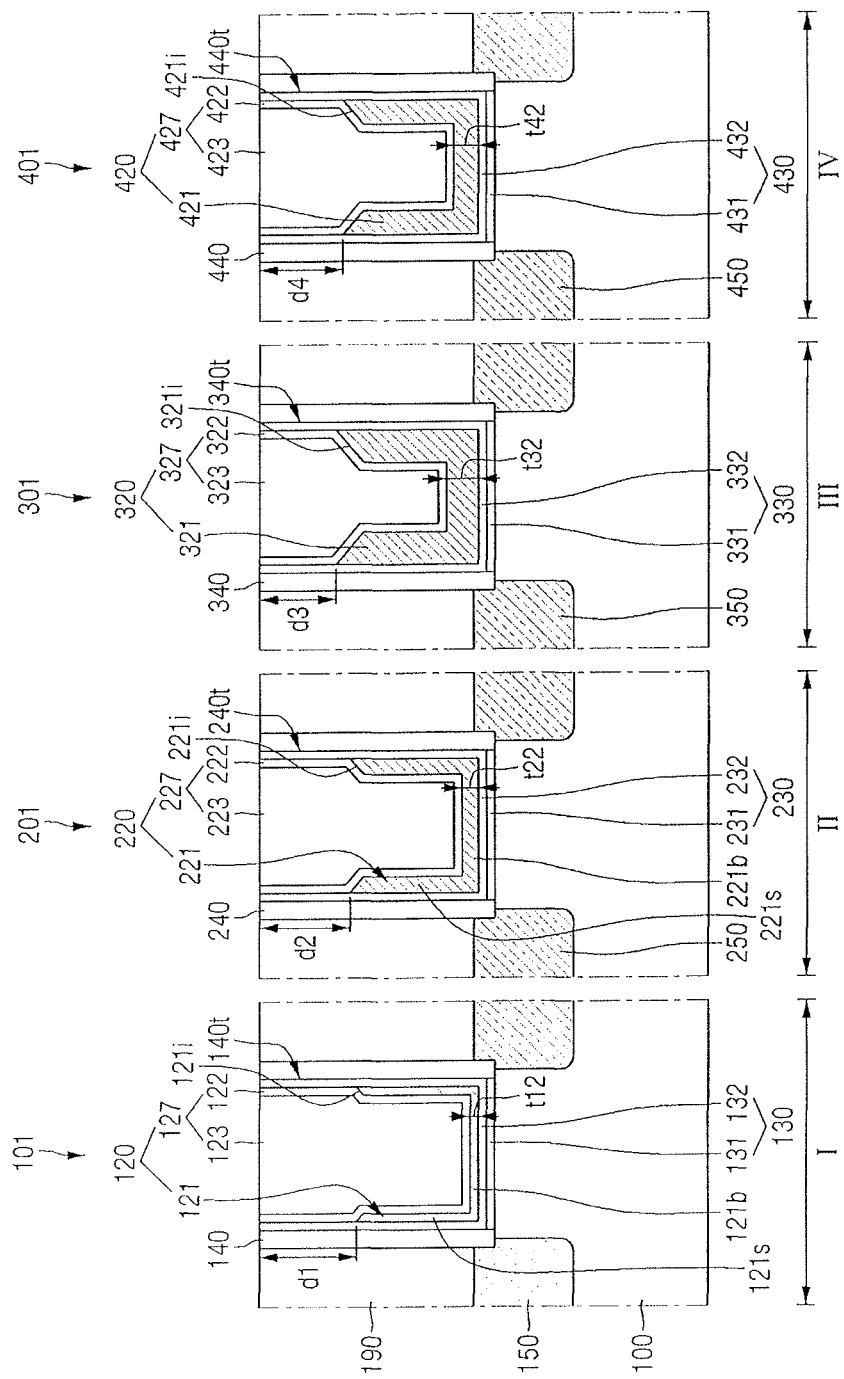

FIG. 11 illustrates a view of a semiconductor device according to embodiments. For ease of description, differences from the semiconductor device described above with reference to FIGS. 7 and 8 will be mainly described.

Referring to FIG. 11, in the semiconductor device according to some embodiments, a first work function control layer 121 and a second work function control layer 221 may be chamfered.

The first work function control layer 121 may extend along part of sidewalls of a first trench 140t and a bottom surface of the first trench 140t. The first work function control layer 121 may not extend up to the top of the sidewalls of the first trench 140t.

For example, the first work function control layer 121 may not be formed on part of a first gate insulating layer 130 formed on the sidewalls of the first trench 140l.

When the first work function control layer 121 is not formed on part of the sidewalls of the first trench 140t, a first insertion layer 122 may be formed along the profile of the first work function control layer 121 and the profile of the first gate insulating layer 130.

On the portion of the sidewalls of the first trench 140t to which the first work function control layer 121 does not extend, the first insertion layer 122 and the first gate insulating layer 130 may contact each other.

An uppermost surface of the first work function control layer 121 may be lower than an uppermost surface of the first insertion layer 122 and an uppermost surface of a first filling layer 123.

Therefore, a first upper conductive layer 127 may cover the uppermost surface of the first work function control layer 121. The first insertion layer 122 and the first filling layer 123 may cover the uppermost surface of the first work function control layer 121.

The second work function control layer 221 may extend along part of sidewalls of a second trench 240t and a bottom surface of the second trench 240t. The second work function control layer 221 may not extend up to the top of the sidewalls of the second trench 240t.

For example, the second work function control layer 221 may not be formed on part of a second gate insulating layer 230 formed on the sidewalls of the second trench 240t.

Since the second work function control layer 221 is not formed on part of the sidewalls of the second trench 240t, a second insertion layer 222 may be formed along the profile of the second work function control layer 221 and the profile of the second gate insulating layer 230.

On the portion of the sidewalls of the second trench 240t to which the second work function control layer 221 does not extend, the second insertion layer 222 and the second gate insulating layer 230 may contact each other.

An uppermost surface of the second work function control layer 221 may be lower than an uppermost surface of the second insertion layer 222 and an uppermost surface of a second filling layer 223.

A second upper conductive layer 227 may cover the uppermost surface of the second work function control layer 221. The second insertion layer 222 and the second filling layer 223 may cover the uppermost surface of the second work function control layer 221.

For example, the first work function control layer 121 may include a first inclined surface 121i having an acute angle with respect to the sidewalls of the first trench 140t. In addition, the second work function control layer 221 may include a second inclined surface 221i having an acute angle with respect to the sidewalls of the second trench 240t.

The first work function control layer 121 extending along the sidewalls of the first trench 140t may include the first inclined surface 121i having an acute angle with respect to the sidewalls of the first trench 140t. The second work function control layer 221 extending along the sidewalls of the second trench 240t may include the second inclined surface 221i having an acute angle with respect to the sidewalls of the second trench 240t.

The first inclined surface 121i of the first work function control layer 121 may be the uppermost surface of the first work function control layer 121. The second inclined surface 221i of the second work function control layer 221 may be the uppermost surface of the second work function control layer 221.

A distance from a substrate 100 to the first inclined surface 121i of the first work function control layer 121 and a distance from the substrate 100 to the second inclined surface 221i of the second work function control layer 221 are less than a distance from the substrate 100 to an upper surface of an interlayer insulating film 190.

In another implementation, the first work function control layer 121 may include a bottom portion 121b formed on the bottom surface of the first trench 140t and a sidewall portion 121s formed on the sidewalls of the first trench 140t. The second work function control layer 221 may include a bottom portion 221b formed on the bottom surface of the second trench 240t and a sidewall portion 221s formed on the sidewalls of the second trench 240t.

The sidewall portion 121s of the first work function control layer 121 may protrude from the bottom portion 121b of the first work function control layer 121. The sidewall portion 221s of the second work function control layer 221 may protrude from the bottom portion 221b of the second work function control layer 221.

The sidewall portion 121s of the first work function control layer 121 may include the uppermost surface of the first work function control layer 121. The sidewall portion 221s of the second work function control layer 221 may include the uppermost surface of the second work function control layer 221.

The sidewall portion 121s of the first work function control layer 121 may include the first inclined face 121i having an acute angle. The sidewall portion 221s of the second work function control layer 221 may include the second inclined surface 221i having an acute angle.

In FIG. 11, both the first work function control layer 121 and the second work function control layer 221 are chamfered. In some implementations, one of the first work function control layer 121 and the second work function control layer 221 may be chamfered, and the other one may extend up to the top of the sidewalls of a corresponding trench.

In FIG. 11, a depth d2 from the upper surface of the interlayer insulating film 190 to the second work function control layer 221 is smaller than a depth d1 from the upper surface of the interlayer insulating film 190 to the first work function control layer 121 and is greater than a depth d4 from the upper surface of the interlayer insulating film 190 to a fourth work function control layer 421, In some implementations, a depth d3 from the upper surface of the interlayer insulating film 190 to a third work function control layer 321 may be less than the depth d4 from the upper surface of the interlayer insulating film 190 to the fourth work function control layer 421.

In some implementations, the depth d2 from the upper surface of the interlayer insulating film 190 to the second work function control layer 221 may be substantially equal to the depth d1 from the upper surface of the interlayer insulating film 190 to the first work function control layer 121, and the depth d3 from the upper surface of the interlayer insulating film 190 to the third work function control layer 321 may be substantially equal to the depth d4 from the upper surface of the interlayer insulating film 190 to the fourth work function control layer 421. In addition, the depth d2 from the upper surface of the interlayer insulating film 190 to the second work function control layer 221 may be substantially equal to the depth d4 from the upper surface of the interlayer insulating film 190 to the fourth work function control layer 421.

Figure 12:
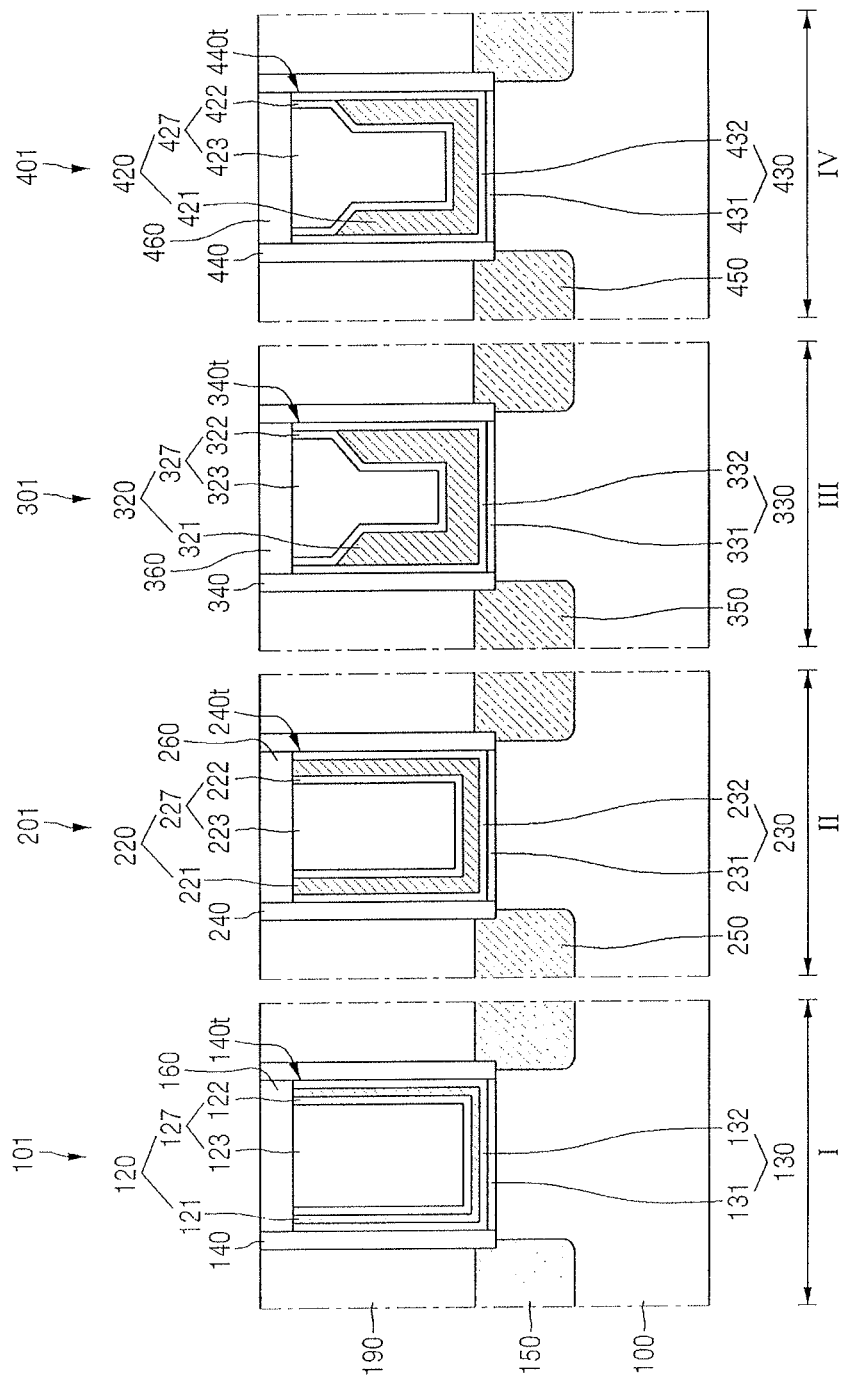

FIG. 12 illustrates a view of a semiconductor device according to embodiments. For ease of description, differences from the semiconductor device described above with reference to FIGS. 7 and 8 will be mainly described.

Referring to FIG. 12, the semiconductor device according to some embodiments may further include first through fourth capping patterns 160 through 460.

First through fourth gate electrode structures 120 through 420 may partially fill first through fourth trenches 140t through 440t, respectively. Upper surfaces of the first through fourth gate electrode structures 120 through 420 may be closer to a substrate 100 than an upper surface of an interlayer insulating film 190.

Figure 13:
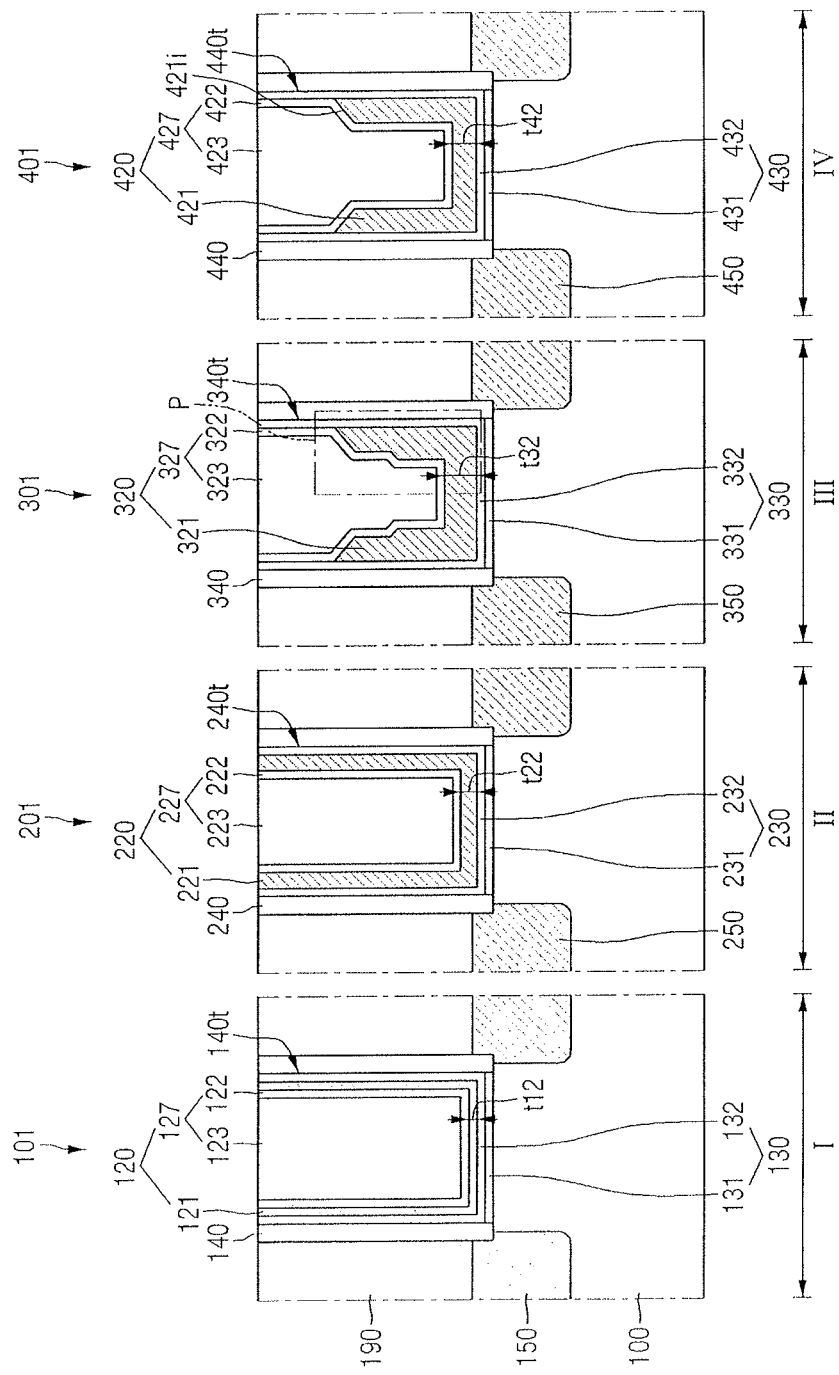
FIG. 13 illustrates a view of a semiconductor device according to some embodiments.
Figure 14:
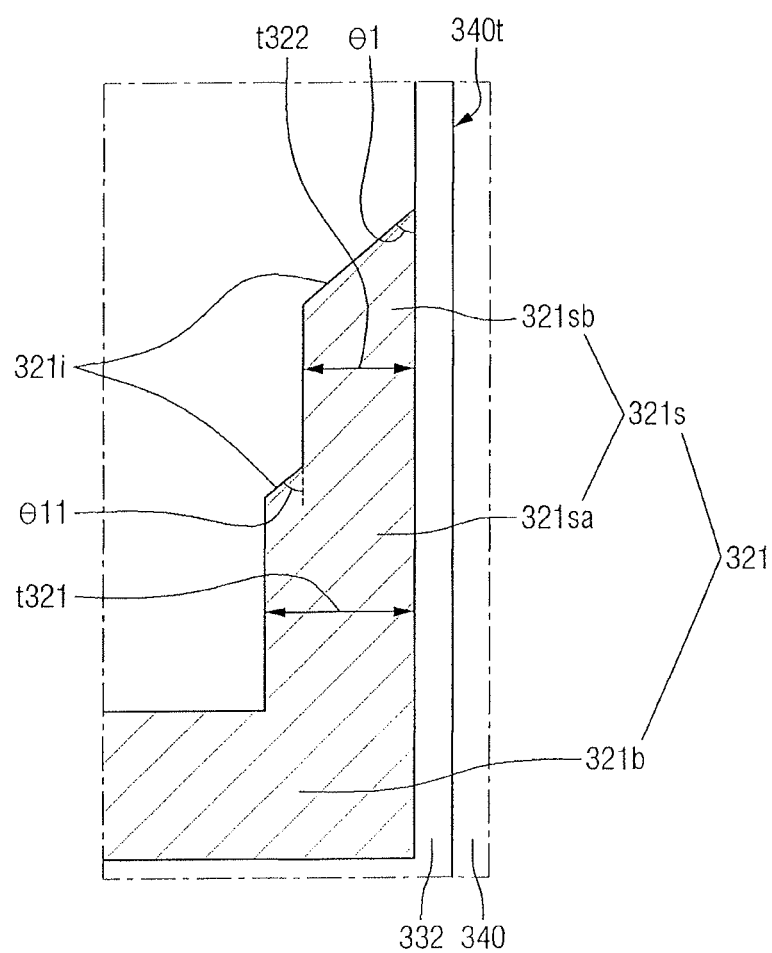
FIG. 14 illustrates an enlarged view of a portion P of FIG. 13.

FIG. 13 illustrates a view of a semiconductor device according to embodiments. FIG. 14 is an enlarged view of a portion P of FIG. 13. For ease of description, differences from the semiconductor device described above with reference to FIGS. 7 and 8 will be mainly described.

Referring to FIGS. 13 and 14, in the semiconductor device according to some embodiments, a sidewall portion 321s of a third work function control layer 321 may include a first portion 321sa on a bottom portion 321b of the third work function control layer 321 and a second portion 321sb.

The second portion 321sb of the sidewall portion 321s of the third work function control layer 321 may be located farther away from an upper surface of a substrate 100 than the first portion 321sa of the sidewall portion 321s of the third work function control layer 321.

A width t322 of the second portion 321sb of the sidewall portion 321s of the third work function control layer 321 may be different from a width t321 of the first portion 321sa of the sidewall portion 321s of the third work function control layer 321.

For example, the width t321 of the first portion 321sa of the sidewall portion 321s of the third work function control layer 321 may be greater than the width t322 of the second portion 321sb of the sidewall portion 321s of the third work function control layer 321.

In addition, the width t321 of the first portion 321sa of the sidewall portion 321s of the third work function control layer 321 may be substantially equal to a thickness t32 of the third work function control layer 321. For example, the width t322 of the second portion 321sb of the sidewall portion 321s of the third work function control layer 321 may be smaller than the thickness t32 of the third work function control layer 321.

The third work function control layer 321 may include a plurality of third inclined surfaces 321i having acute angles with respect to a sidewall of a third trench 340t. For example, the third work function control layer 321 extending along a sidewall of the third trench 340t may include a plurality of third inclined surfaces 321i having acute angles with respect to the sidewall of the third trench 340t.

Unlike the third work function control layer 321, a fourth work function control layer 421 extending along a sidewall of a fourth trench 440t may include one fourth inclined surface 421i having an acute angle with respect to the sidewall of the fourth trench 440t.

For example, the number of inclined surfaces included in the third work function control layer 321 extending along a sidewall of the third trench 340t may be different from the number of inclined surfaces included in the fourth work function control layer 421 extending along a sidewall of the fourth trench 440t.

For example, when the number of chamfering processes applied to the third work function control layer 321 is different from the number of chamfering processes applied to the fourth work function control layer 421, there may be a difference in shape between the third work function control layer 321 and the fourth work function control layer 421.

In FIG. 14, the first portion 321sa of the sidewall portion 321s of the third work function control layer 321 may be connected to the second portion 321sb of the sidewall portion 321s of the third work function control layer 321 by a third inclined surface 321i having an acute angle θ11 with respect to a sidewall of the third trench 340.

More specifically, the first portion 321sa of the sidewall portion 321s of the third work function control layer 321 may include a first sidewall that contacts a third gate insulating layer 330 and a second sidewall that faces a third insertion layer 322. The second portion 321sb of the sidewall portion 321s of the third work function control layer 321 may include a third sidewall that contacts the third gate insulating layer 330 and a fourth sidewall that faces the third insertion layer 322.

The second sidewall of the first portion 321sa of the sidewall portion 321s of the third work function control layer 321 may be connected to the fourth sidewall of the second portion 321sb of the sidewall portion 321s of the third work function control layer 321 by the third inclined surface 321i having the acute angle θ11 with respect to the sidewall of the third trench 340t.

A third inclined surface 321i of the third work function control layer 321 may be an uppermost surface of the third work function control layer 321. The fourth inclined surface 421i of the fourth work function control layer 421 may be an uppermost surface of the fourth work function control layer 421.

In FIG. 14, an acute angle θ1 of the third inclined surface 321i, which is the uppermost surface of the third work function control layer 321, may be equal to or different from the acute angle θ11 of the third inclined surface 321i, which connects the first portion 321sa of the sidewall portion 321s of the third work function control layer 321 and the second portions 321sb of the sidewall portion 321s of the third work function control layer 321.

Further, a connection portion of the second sidewall of the first portion 321sa of the sidewall portion 321s of the third work function control layer 321 with the third inclined surface 321i having the acute angle θ11 may be rounded. In addition, a connection portion of the fourth sidewall of the second portion 321sb of the sidewall portion 321s of the third work function control layer 321 with the third inclined surface 321i having the acute angle θ11 may be rounded.

Figure 15:
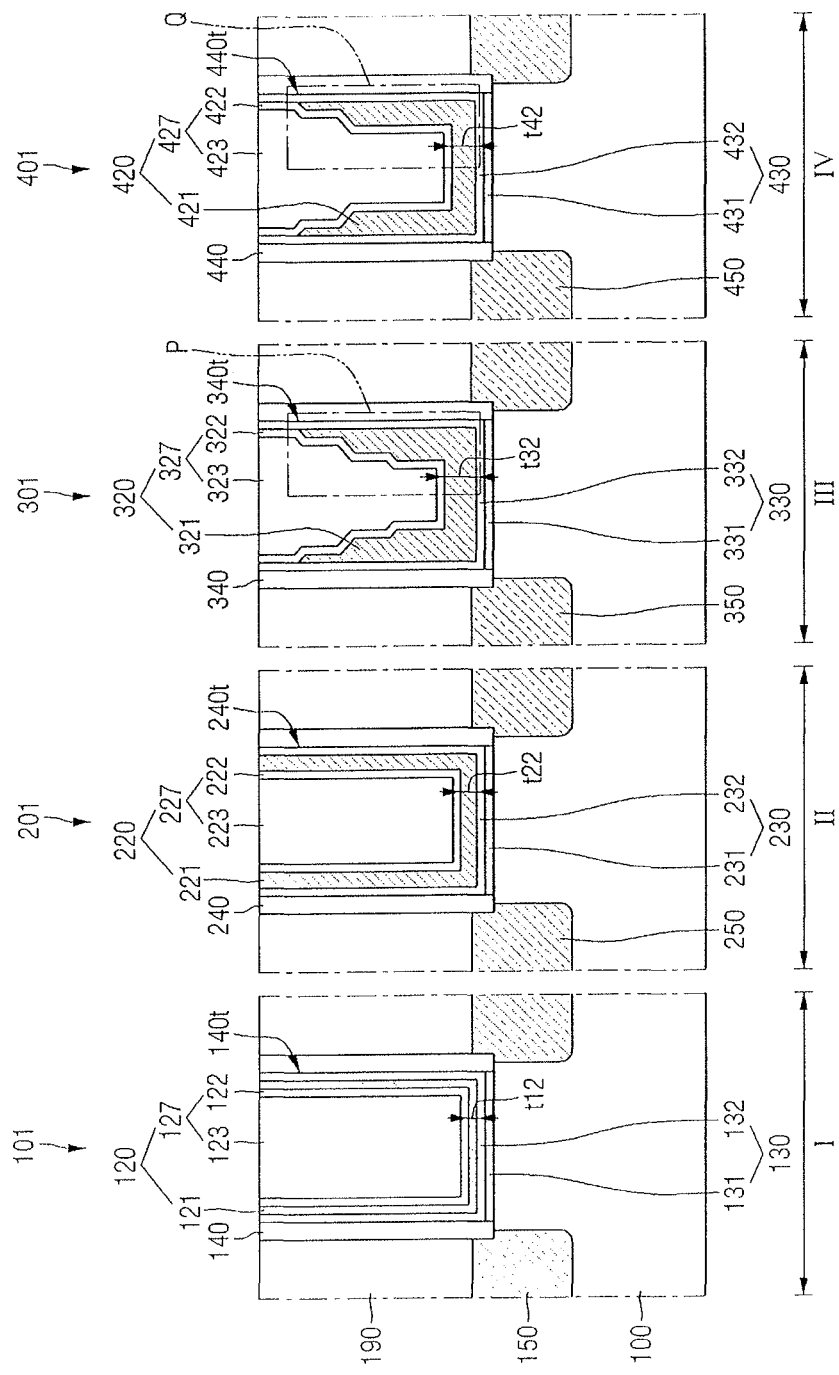
FIG. 15 illustrates a view of a semiconductor device according to some embodiments.
Figure 16:
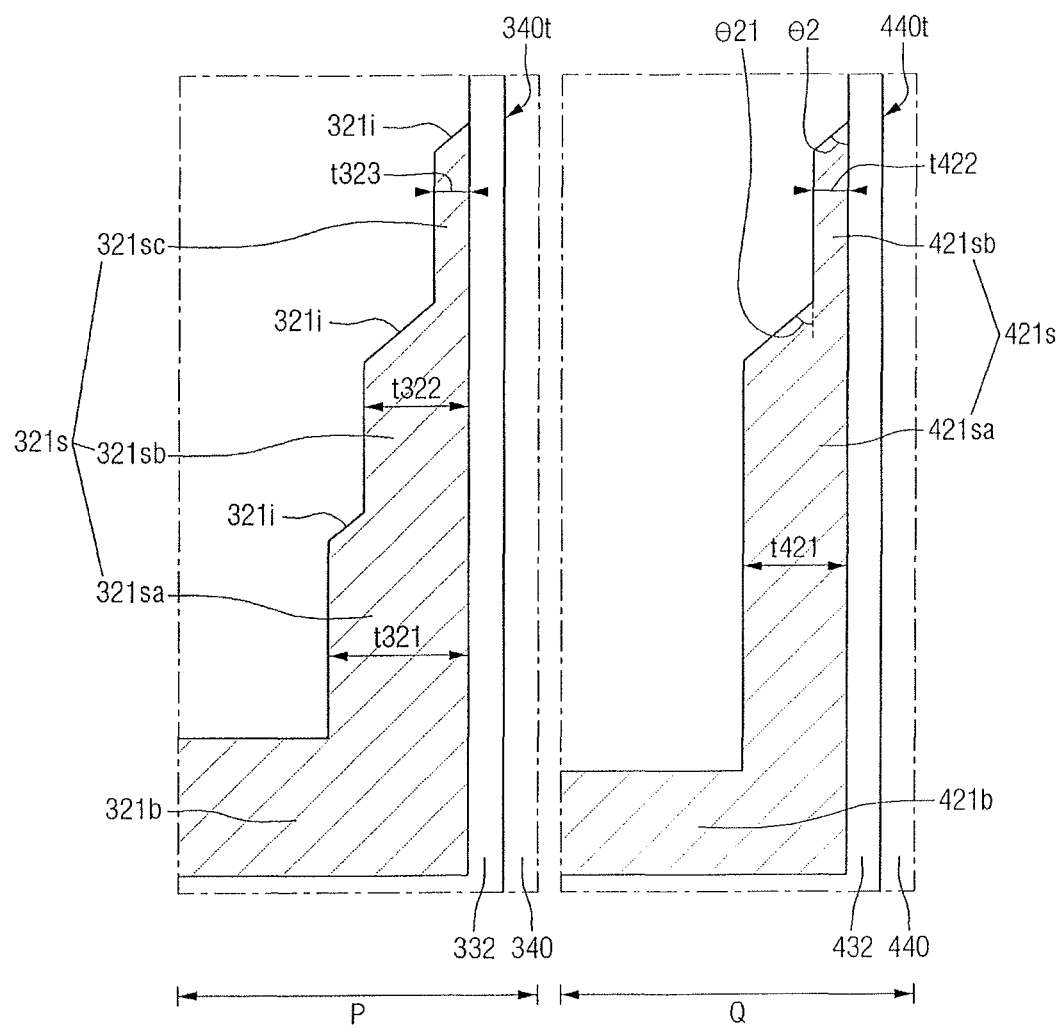
FIG. 16 illustrates an enlarged view of portions P and Q of FIG. 15.

FIG. 15 illustrates a view of a semiconductor device according to embodiments. FIG. 16 illustrates an enlarged view of portions P and Q of FIG. 15. For ease of description, differences from the semiconductor device described above with reference to FIGS. 13 and 14 will be mainly described.

Referring to FIGS. 15 and 16, in the semiconductor device according to some embodiments, a sidewall portion 321s of a third work function control layer 321 may include a first portion 321sa on a bottom portion 321b of the third work function control layer 321, a second portion 321sb, and a third portion 321sc.

The second portion 321sb of the sidewall portion 321s of the third work function control layer 321 may be located farther away from an upper surface of a substrate 100 than the first portion 321sa of the sidewall portion 321s of the third work function control layer 321. In addition, the second portion 321sb of the sidewall portion 321s of the third work function control layer 321 may be located closer to the upper surface of the substrate 100 than the third portion 321sc of the sidewall portion 321s of the third work function control layer 321.

A width t321 of the first portion 321sa of the sidewall portion 321s of the third work function control layer 321 may be greater than a width t322 of the second portion 321sb of the sidewall portion 321s of the third work function control layer 321. The width t322 of the second portion 321sb of the sidewall portion 321s of the third work function control layer 321 may be greater than a width t323 of the third portion 321sc of the sidewall portion 321s of the third work function control layer 321.

A sidewall portion 421s of a fourth work function control layer 421 may include a first portion 421sa on a bottom portion 421b of the fourth work function control layer 421 and a second portion 421sb.

The second portion 421sb of the sidewall portion 421s of the fourth work function control layer 421 may be located farther away from the upper surface of the substrate 100 than the first portion 421sa of the sidewall portion 421s of the fourth work function control layer 421.

A width t421 of the first portion 421sa of the sidewall portion 421s of the fourth work function control layer 421 may be greater than a width t422 of the second portion 421sb of the sidewall portion 421s of the fourth work function control layer 421.

In addition, the width t421 of the first portion 421sa of the sidewall portion 421s of the fourth work function control layer 421 may be substantially equal to a thickness t42 of the fourth work function control layer 421. For example, the width t422 of the second portion 421sb of the sidewall portion 421s of the fourth work function control layer 421 may be smaller than the thickness t42 of the fourth work function control layer 421.

The third work function control layer 321 extending along a sidewall of a third trench 340t may include a plurality of third inclined surfaces 321i having acute angles with respect to the sidewall of the third trench 340t. In addition, the fourth work function control layer 421 extending along a sidewall of a fourth trench 440t may include a plurality of fourth inclined surfaces 421i having acute angles with respect to the sidewall of the fourth trench 440t.

In FIG. 16, the number of inclined surfaces included in the third work function control layer 321 extending along a sidewall of the third trench 340t may be different from the number of inclined surfaces included in the fourth work function control layer 421 extending along a sidewall of the fourth trench 440t.

A sidewall of the first portion 321sa of the sidewall portion 321s of the third work function control layer 321 which faces a third insertion layer 322 may be connected to a sidewall of the second portion 321sb of the sidewall portion 321s of the third work function control layer 321 which faces a third insertion layer 322 by a third inclined surface 321i having an acute angle to a sidewall of the third trench 340t.

Further, a sidewall of the second portion 321sb of the sidewall portion 321s of the third work function control layer 321 which faces the third insertion layer 322 may be connected to a sidewall of the third portion 321sc of the sidewall portion 321s of the third work function control layer 321 which faces the third insertion layer 322 by a third inclined surface 321i having an acute angle to the sidewall of the third trench 340t.

In FIG. 16, the first portion 421sa of the sidewall portion 421s of the fourth work function control layer 421 may be connected to the second portion 421sb of the sidewall portion 421s of the fourth work function control layer 421 by a fourth inclined surface 421i having an acute angle θ21 with respect to a sidewall of the fourth trench 440t.

For example, the first portion 421sa of the sidewall portion 421s of the fourth work function control layer 421 may include a fifth sidewall that contacts a fourth gate insulating layer 430 and a sixth sidewall that faces a fourth insertion layer 422. The second portion 421sb of the sidewall portion 421s of the fourth work function control layer 421 may include a seventh sidewall that contacts the fourth gate insulating layer 430 and an eighth sidewall that faces the fourth insertion layer 422.

The sixth sidewall of the first portion 421sa of the sidewall portion 421s of the fourth work function control layer 421 may be connected to the eighth sidewall of the second portion 421sb of the sidewall portion 421s of the fourth work function control layer 421 by the fourth inclined surface 421i having the acute angle θ21 with respect to the sidewall of the fourth trench 440t.

In FIG. 16, an acute angle θ2 of a fourth inclined surface 421i, which is an uppermost surface of the fourth work function control layer 421, may be equal to or different from the acute angle θ21 of the fourth inclined surface 421i, which connects the first portion 421sa of the sidewall portion 421s of the fourth work function control layer 421 and the second portion 421sb of the sidewall portion 421s of the fourth work function control layer 421.

Further, a connection portion of the sixth sidewall of the first portion 421sa of the sidewall portion 421s of the fourth work function control layer 421 with the fourth inclined surface 421i having the acute angle θ21 may be rounded. In addition, a connection portion of the eighth sidewall of the second portion 421sb of the sidewall portion 421s of the fourth work function control layer 421 with the fourth inclined surface 421i having the acute angle θ21 may be rounded.

Figure 17:
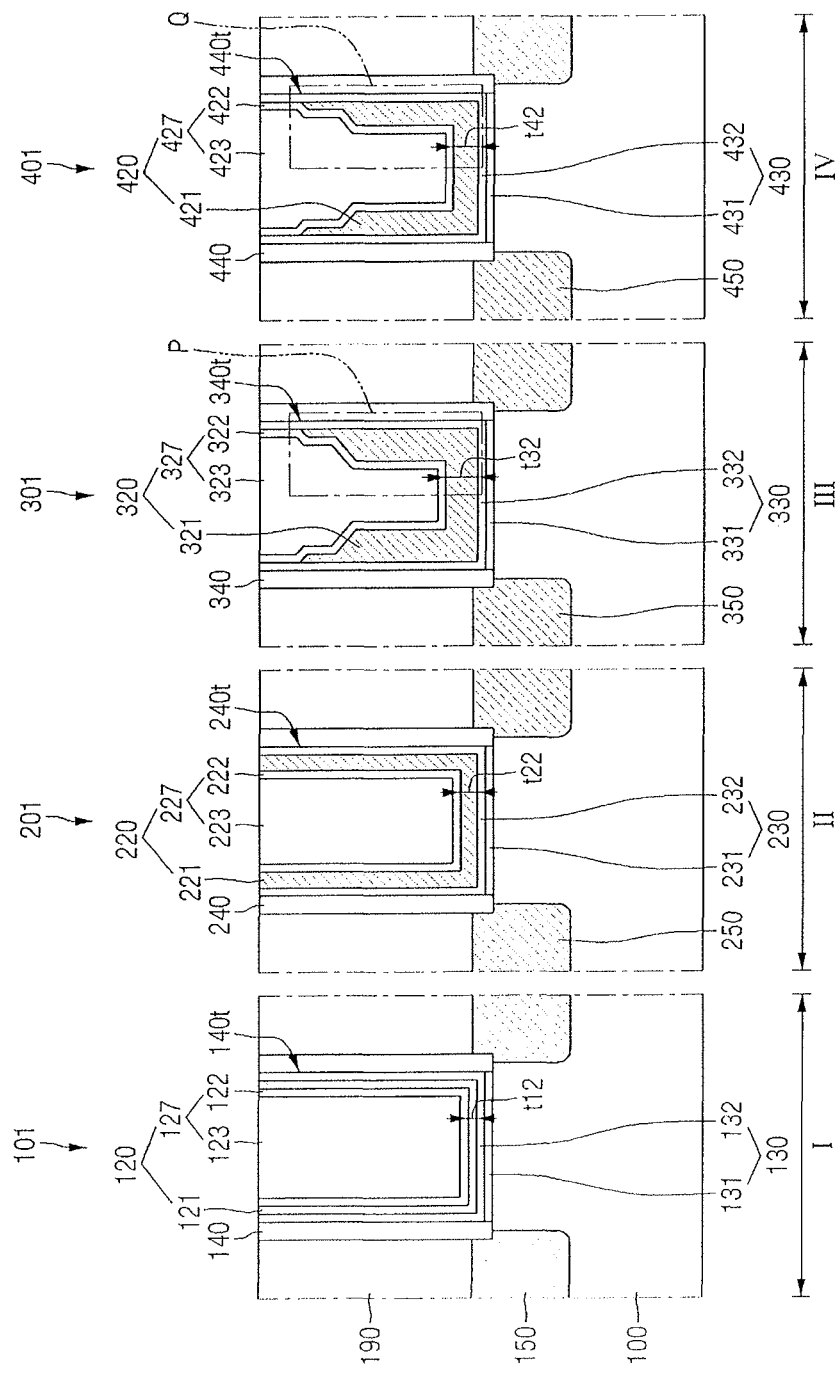
FIG. 17 illustrates a view of a semiconductor device according to some embodiments.
Figure 18:
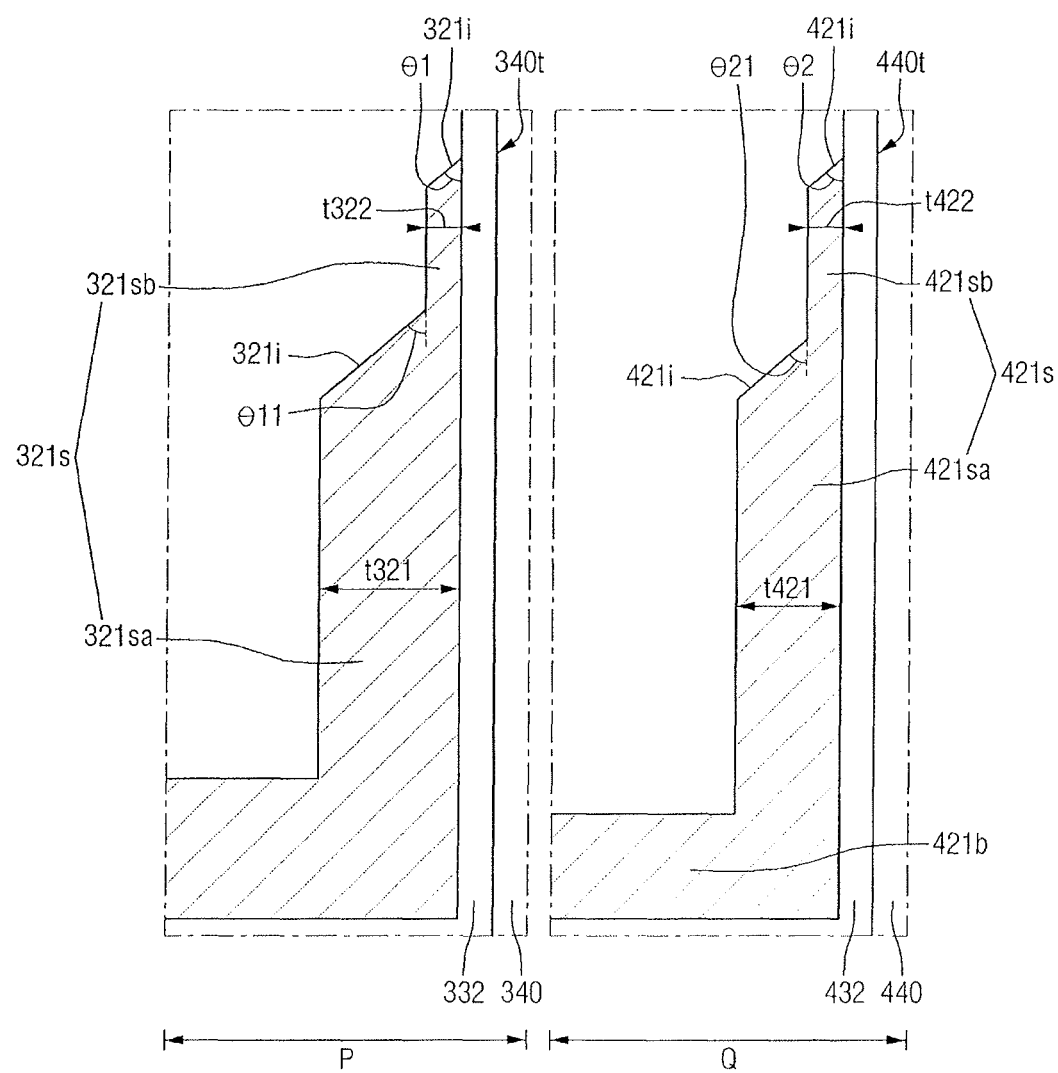
FIG. 18 illustrates an enlarged view of portions P and Q of FIG. 17.

FIG. 17 illustrates a view of a semiconductor device according to embodiments. FIG. 18 illustrates an enlarged view of portions P and Q of FIG. 17. For ease of description, differences from the semiconductor device described above with reference to FIGS. 13 and 14 will be mainly described.

Referring to FIGS. 17 and 18, in the semiconductor device according to some embodiments, a sidewall portion 421s of a fourth work function control layer 421 may include a first portion 421sa on a bottom portion 421b of the fourth work function control layer 421 and a second portion 421sb.

The second portion 421sb of the sidewall portion 421s of the fourth work function control layer 421 may be located farther away from an upper surface of a substrate 100 than the first portion 421sa of the sidewall portion 421s of the fourth work function control layer 421.

A width t421 of the first portion 421sa of the sidewall portion 421s of the fourth work function control layer 421 may be greater than a width t422 of the second portion 421sb of the sidewall portion 421s of the fourth work function control layer 421. The width t421 of the first portion 421sa of the sidewall portion 421s of the fourth work function control layer 421 may be substantially equal to a thickness t42 of the fourth work function control layer 421.

The fourth work function control layer 421 may include a plurality of fourth inclined surfaces 421i having acute angles with respect to a sidewall of a fourth trench 440t. For example, the fourth work function control layer 421 extending along a sidewall of the fourth trench 440t may include a plurality of fourth inclined surfaces 421i having acute angles with respect to the sidewall of the fourth trench 440t.

The number of inclined surfaces included in a third work function control layer 321 extending along a sidewall of a third trench 340t may be equal to the number of inclined surfaces included in the fourth work function control layer 421 extending along a sidewall of the fourth trench 440t.

When the number of chamfering processes applied to the third work function control layer 321 is equal to the number of chamfering processes applied to the fourth work function control layer 421, the number of the inclined surfaces included in the third work function control layer 321 may be equal to the number of inclined surfaces included in the fourth work function control layer 421.

Figure 19A:
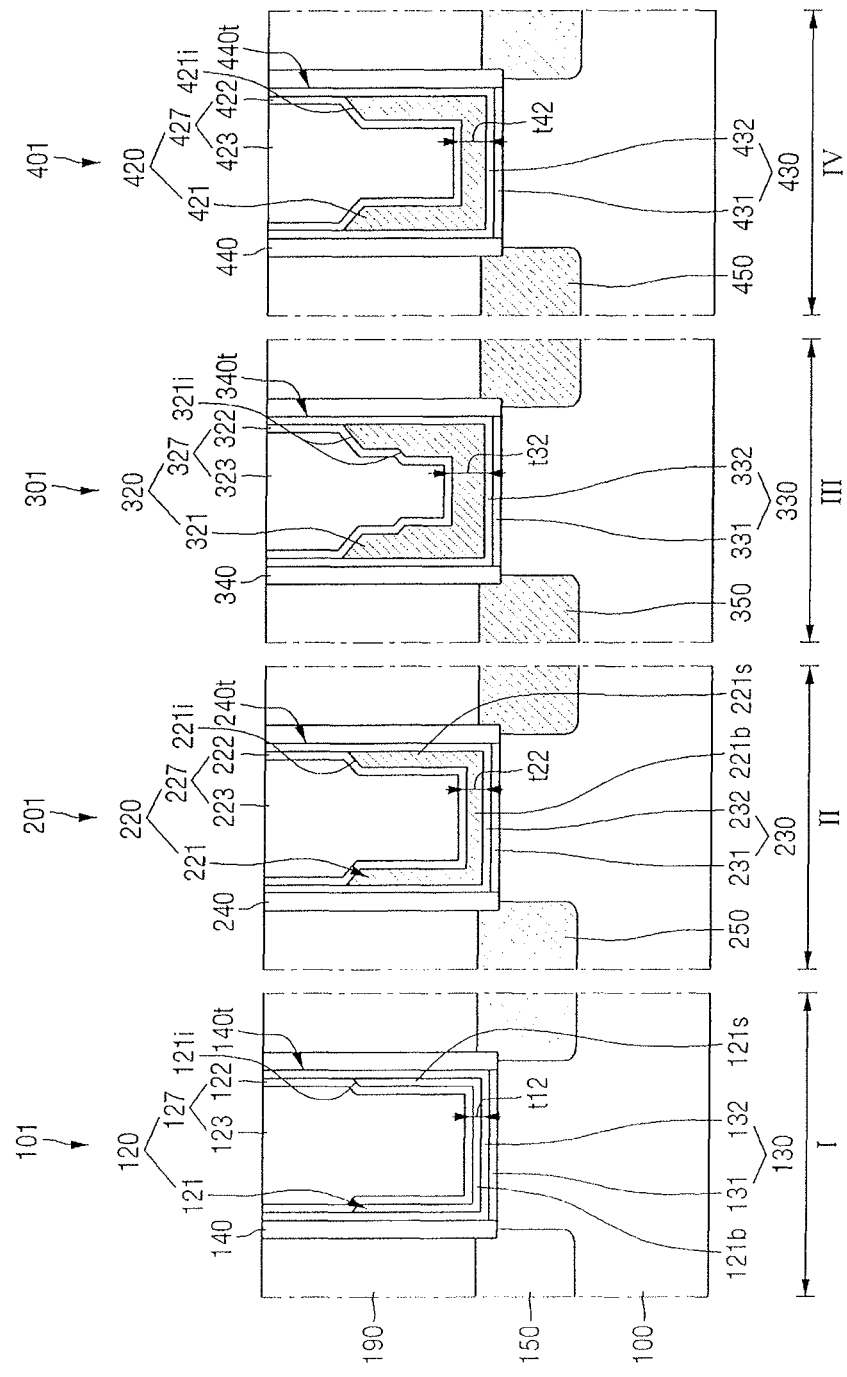
FIGS. 19A and 19B respectively illustrate views of semiconductor devices according to some embodiments.

FIG. 19A illustrate a view of a semiconductor device according to embodiments. For ease of description, differences from the semiconductor device described above with reference to FIGS. 13 and 14 will be mainly described.

Referring to FIG. 19A, in the semiconductor device according to some embodiments, a first work function control layer 121 and a second work function control layer 221 may be chamfered.

The first work function control layer 121 may not extend up to the top of sidewalls of a first trench 140t. The first work function control layer 121 may not be formed on part of a first gate insulating layer 130 formed on the sidewalls of the first trench 140t.

On portions of the sidewalls of the first trench 140t to which the first work function control layer 121 does not extend, a first insertion layer 122 and the first gate insulating layer 130 may contact each other. The first work function control layer 121 may include a first inclined surface 121i having an acute angle with respect to the sidewalls of the first trench 140t.

The second work function control layer 221 may not extend up to the top of sidewalls of a second trench 240t. The second work function control layer 221 may not be formed on part of a second gate insulating layer 230 formed on the sidewalls of the second trench 240t.

On portions of the sidewalls of the second trench 240t to which the second work function control layer 221 does not extend, a second insertion layer 222 and the second gate insulating layer 230 may contact each other. The second work function control layer 221 may include a second inclined surface 221i having an acute angle with respect to the sidewalls of the second trench 240t.

The first inclined surface 121i of the first work function control layer 121 may be an uppermost surface of the first work function control layer 121, and the second inclined surface 221i of the second work function control layer 221 may be an uppermost surface of the second work function control layer 221.

The first work function control layer 121 may include a bottom portion 121b formed on a bottom surface of the first trench 140t and a sidewall portion 121s formed on the sidewalls of the first trench 140t. The second work function control layer 221 may include a bottom portion 221b formed on a bottom surface of the second trench 240t and a sidewall portion 221s formed on the sidewalls of the second trench 240t.

The sidewall portion 121s of the first work function control layer 121 may include the first inclined face 121i having an acute angle, and the sidewall portion 221s of the second work function control layer 221 may include the second inclined surface 221i having an acute angle.

The first work function control layer 121 extending along a sidewall of the first trench 140t may include one first inclined surface 121i having an acute angle with respect to the sidewall of the first trench 140t. In addition, the second work function control layer 221 extending along a sidewall of the second trench 240t may include one second inclined surface 221i having an acute angle with respect to the sidewall of the second trench 240t.

The number of inclined surfaces included in the third work function control layer 321 extending along a sidewall of a third trench 340t may be different from the number of inclined surfaces included in the first work function control layer 121 extending along a sidewall of the first trench 140t and the number of inclined surfaces included in the second work function control layer 221 extending along a sidewall of the second trench 240t.

Figure 19B:
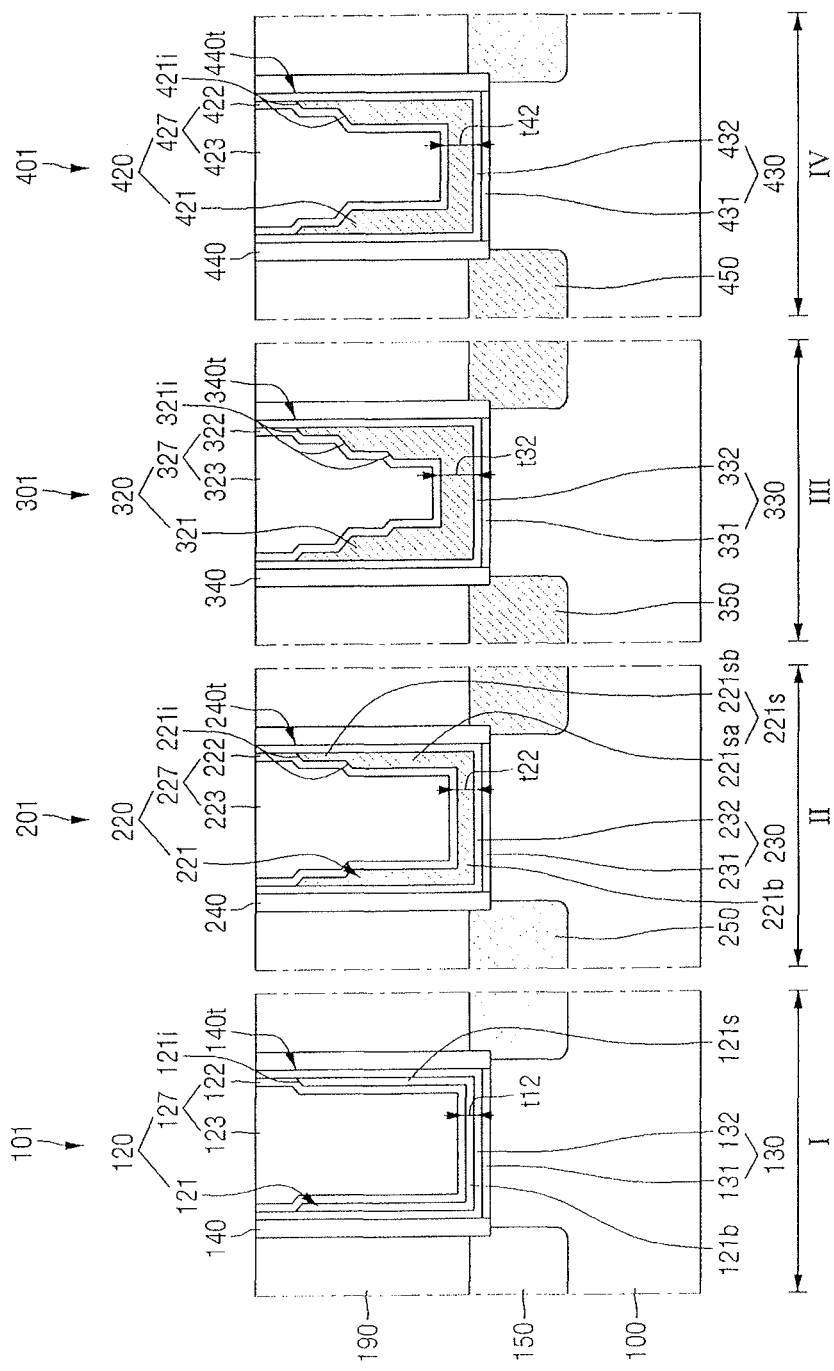

FIG. 19B illustrates a view of a semiconductor device according to embodiments. For ease of description, differences from the semiconductor device described above with reference to FIGS. 15 and 16 will be mainly described.

Referring to FIG. 19B, in the semiconductor device according to some embodiments, a first work function control layer 121 may include a first inclined surface 121i, and a second work function control layer 221 may include a plurality of second inclined surfaces 221i.

The first inclined surface 121i of the first work function control layer 121 may be an uppermost surface of the first work function control layer 121. One of the second inclined surfaces 221i of the second work function control layer 221 may be an uppermost surface of the second work function control layer 221.

A first upper conductive layer 127 may cover the uppermost surface of the first work function control layer 121, and a second upper conductive layer 227 may cover the uppermost surface of the second work function control layer 221.

The first work function control layer 121 may include a bottom portion 121b formed on a bottom surface of a first trench 140t and a sidewall portion 121s formed on sidewalls of the first trench 140t. The second work function control layer 221 may include a bottom portion 221b formed on a bottom surface of a second trench 240t and a sidewall portion 221s formed on sidewalls of the second trench 240t.

The sidewall portion 221s of the second work function control layer 221 may include a first portion 221sa on the bottom portion 221b of the second work function control layer 221 and a second portion 221sb.

The second portion 221sb of the sidewall portion 221s of the second work function control layer 221 is located farther away from an upper surface of a substrate 100 than the first portion 221sa of the sidewall portion 221s of the second work function control layer 221.

The first portion 221sa of the sidewall portion 221s of the second work function control layer 221 may be wider than the second portion 221sb of the sidewall portion 221s of the second work function control layer 221.

The second work function control layer 221 extending along a sidewall of the second trench 240t may include a plurality of second inclined surfaces 221i having acute angles with respect to the sidewall of the second trench 240t.

A sidewall of the first portion 221sa of the sidewall portion 221s of the second work function control layer 221 which faces a second insertion layer 222 may be connected to a sidewall of the second portion 221sb of the sidewall portion 221s of the second work function control layer 221 which faces a second insertion layer 222 by a second inclined surface 221i having an acute angle with respect to the sidewall of the second trench 240t.

In FIG. 19B, the number of inclined surfaces included in a fourth work function control layer 421 extending along a sidewall of a fourth trench 440t may be equal to the number of inclined surfaces included in the second work function control layer 221 extending along a sidewall of the second trench 240t.

In addition, the number of inclined surfaces included in the fourth work function control layer 421 extending along a sidewall of the fourth trench 440t may be less than the number of inclined surfaces included in a third work function control layer 321 extending along a sidewall of a third trench 340t.

The number of inclined surfaces included in the second work function control layer 221 extending along a sidewall of the second trench 240t may be greater than the number of inclined surfaces included in the first work function control layer 221 extending along a sidewall of the first trench 140t.

Figure 20:
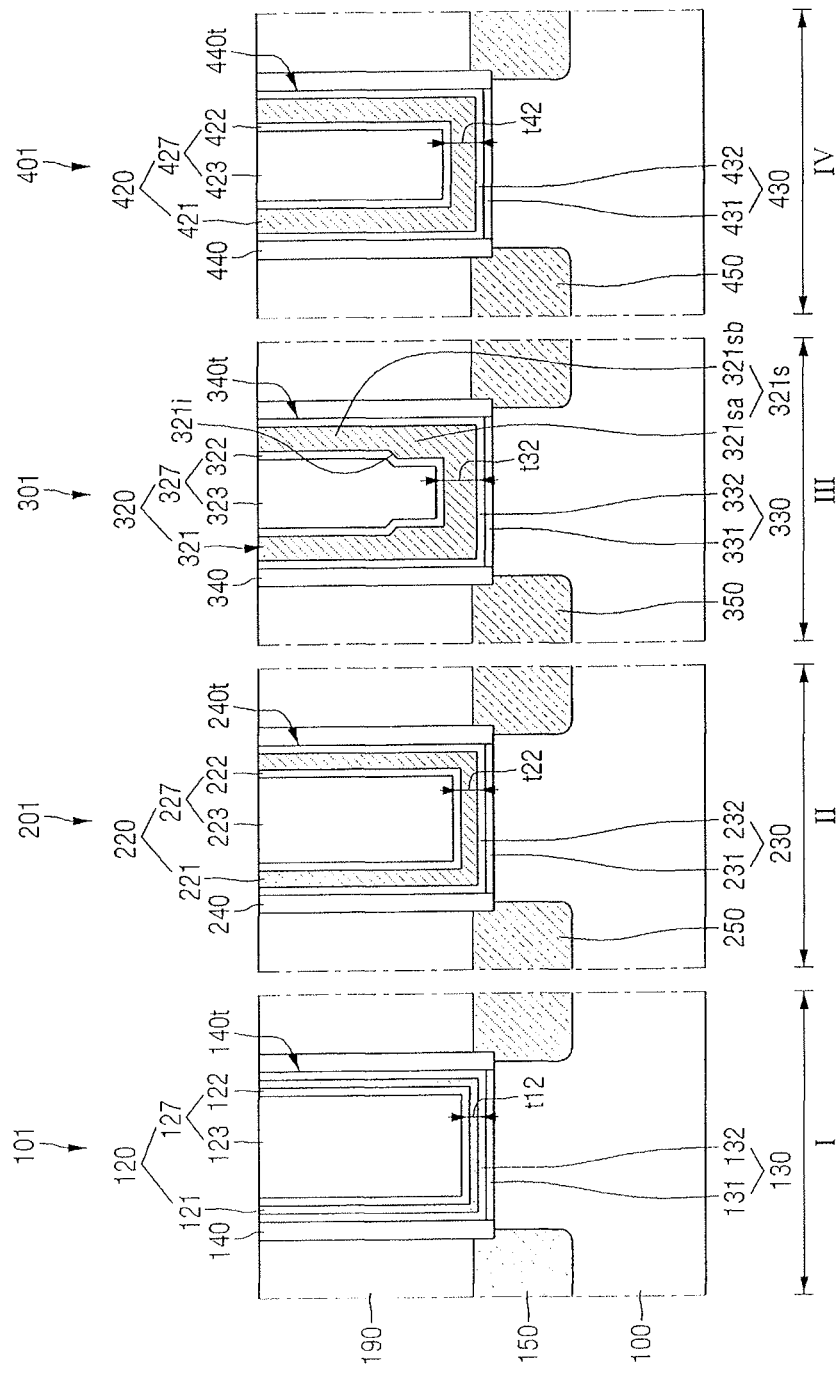
FIGS. 20 through 24 respectively illustrate views of semiconductor devices according to some embodiments.

FIG. 20 illustrates a view of a semiconductor device according to embodiments. For ease of description, differences from the semiconductor device described above with reference to FIGS. 7 and 8 will be mainly described.

Referring to FIG. 20, in the semiconductor device according to some embodiments, a third upper conductive layer 327 may not cover an uppermost surface of a third work function control layer 321. A fourth upper conductive layer 427 may not cover an uppermost surface of a fourth work function control layer 421.

A height of the uppermost surface of the third work function control layer 321 may be substantially equal to a height of an uppermost surface of a third insertion layer 322 and a height of an uppermost surface of a third filling layer 323. The third work function control layer 321 may extend up to the top of sidewalls of a third trench 340t.

The third work function control layer 321 may include a third inclined surface 321i having an acute angle with respect to the sidewalls of the third trench 340t. However, the uppermost surface of the third work function control layer 321 may not be an inclined surface having an acute angle to the sidewalls of the third trench 340t.

A sidewall portion 321s of the third work function control layer 321 may include a first portion 321sa on a bottom portion 321b (see FIG. 8) of the third work function control layer 321 and a second portion 321sb. The second portion 321sb of the sidewall portion 321s of the third work function control layer 321 may be located farther away from an upper surface of a substrate 100 than the first portion 321sa of the sidewall portion 321s of the third work function control layer 321.

The first portion 321sa of the sidewall portion 321s of the third work function control layer 321 may be wider than the second portion 321sb of the sidewall portion 321s of the third work function control layer 321.

A sidewall of the first portion 321sa of the sidewall portion 321s of the third work function control layer 321 which faces the third insertion layer 322 may be connected to a sidewall of the second portion 321sb of the sidewall portion 321s of the third work function control layer 321 which faces the third insertion layer 322 by a third inclined surface 321i having an acute angle with respect to a sidewall of the third trench 340t.

A height of the uppermost surface of the fourth work function control layer 421 may be substantially equal to a height of an uppermost surface of a fourth insertion layer 422 and a height of an uppermost surface of a fourth filling layer 423. The fourth work function control layer 421 may extend up to the top of sidewalls of a fourth trench 440t.

The fourth work function control layer 421 may not include an inclined surface having an acute angle with respect to the sidewalls of the fourth trench 440t.

While the third work function control layer 321 includes the third inclined face 321i having an acute angle with respect to the sidewalls of the third trench 340t, each of a first work function control layer 121, a second work function control layer 221 and the fourth work function control layer 421 may not include an inclined surface having an acute angle with respect to the sidewalls of a corresponding trench.

Figure 21:
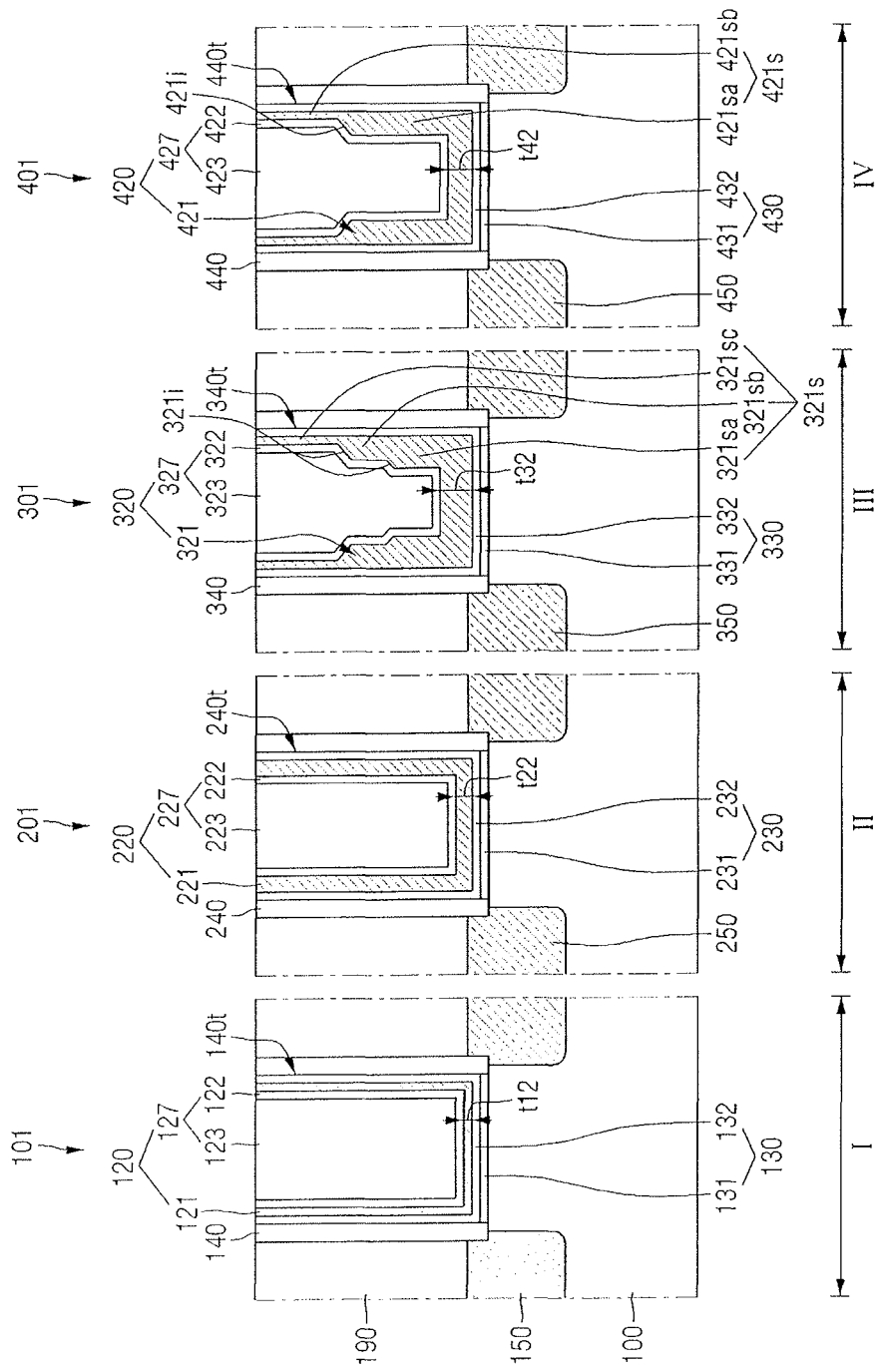

FIG. 21 illustrates a view of a semiconductor device according to embodiments. For ease of description, differences from the semiconductor device described above with reference to FIG. 20 will be mainly described.

Referring to FIG. 21, in the semiconductor device according to some embodiments, a sidewall portion 321s of a third work function control layer 321 may include a first portion 321sa, a second portion 321sb, and a third portion 321sc.

The second portion 321sb of the sidewall portion 321s of the third work function control layer 321 may be located farther away from an upper surface of a substrate 100 than the first portion 321sa of the sidewall portion 321s of the third work function control layer 321. In addition, the second portion 321sb of the sidewall portion 321s of the third work function control layer 321 may be located closer to the upper surface of the substrate 100 than the third portion 321sc of the sidewall portion 321s of the third work function control layer 321.

The first portion 321sa of the sidewall portion 321s of the third work function control layer 321 may be wider than the second portion 321sb of the sidewall portion 321s of the third work function control layer 321. The second portion 321sb of the sidewall portion 321s of the third work function control layer 321 may be wider than the third portion 321sc of the sidewall portion 321s of the third work function control layer 321.

A sidewall portion 421s of the fourth work function control layer 421 may include a first portion 421sa on a bottom portion 421b (see FIG. 8) of the fourth work function control layer 421 and a second portion 421sb.

The second portion 421sb of the sidewall portion 421s of the fourth work function control layer 421 may be located farther away from the upper surface of the substrate 100 than the first portion 421sa of the sidewall portion 421s of the fourth work function control layer 421.

A width t421 of the first portion 421sa of the sidewall portion 421s of the fourth work function control layer 421 may be greater than a width t422 of the second portion 421sb of the sidewall portion 421s of the fourth work function control layer 421.

The fourth work function control layer 421 may include a fourth inclined surface 421i having an acute angle with respect to sidewalls of a fourth trench 440t. An uppermost surface of the fourth work function control layer 421 may not be an inclined surface having an acute angle with respect to the sidewalls of the fourth trench 440t.

A sidewall of the first portion 321sa of the sidewall portion 321s of the third work function control layer 321, which faces a third insertion layer 322, may be connected to a sidewall of the second portion 321sb of the sidewall portion 321s of the third work function control layer 321, which faces a third insertion layer 322, by a third inclined surface 321i having an acute angle with respect to a sidewall of a third trench 340t.

In addition, a sidewall of the second portion 321sb of the sidewall portion 321s of the third work function control layer 321, which faces the third insertion layer 322, may be connected to a sidewall of the third portion 321sc of the sidewall portion 321s of the third work function control layer 321, which faces a third insertion layer 322, by a third inclined surface 321i having an acute angle to the sidewall of the third trench 340t.

Further, a sidewall of the first portion 421sa of the sidewall portion 421s of the fourth work function control layer 421, which faces a fourth insertion layer 422, may be connected to a sidewall of the second portion 421sb of the sidewall portion 421s of the fourth work function control layer 421, which faces a fourth insertion layer 422, by the fourth inclined surface 421i having an acute angle with respect to a sidewall of the fourth trench 440t.

The number of inclined surfaces included in the third work function control layer 321 extending along a sidewall of the third trench 340t may be greater than the number of inclined surfaces included in the fourth work function control layer 421 extending along a sidewall of the fourth trench 440t.

Figure 22:
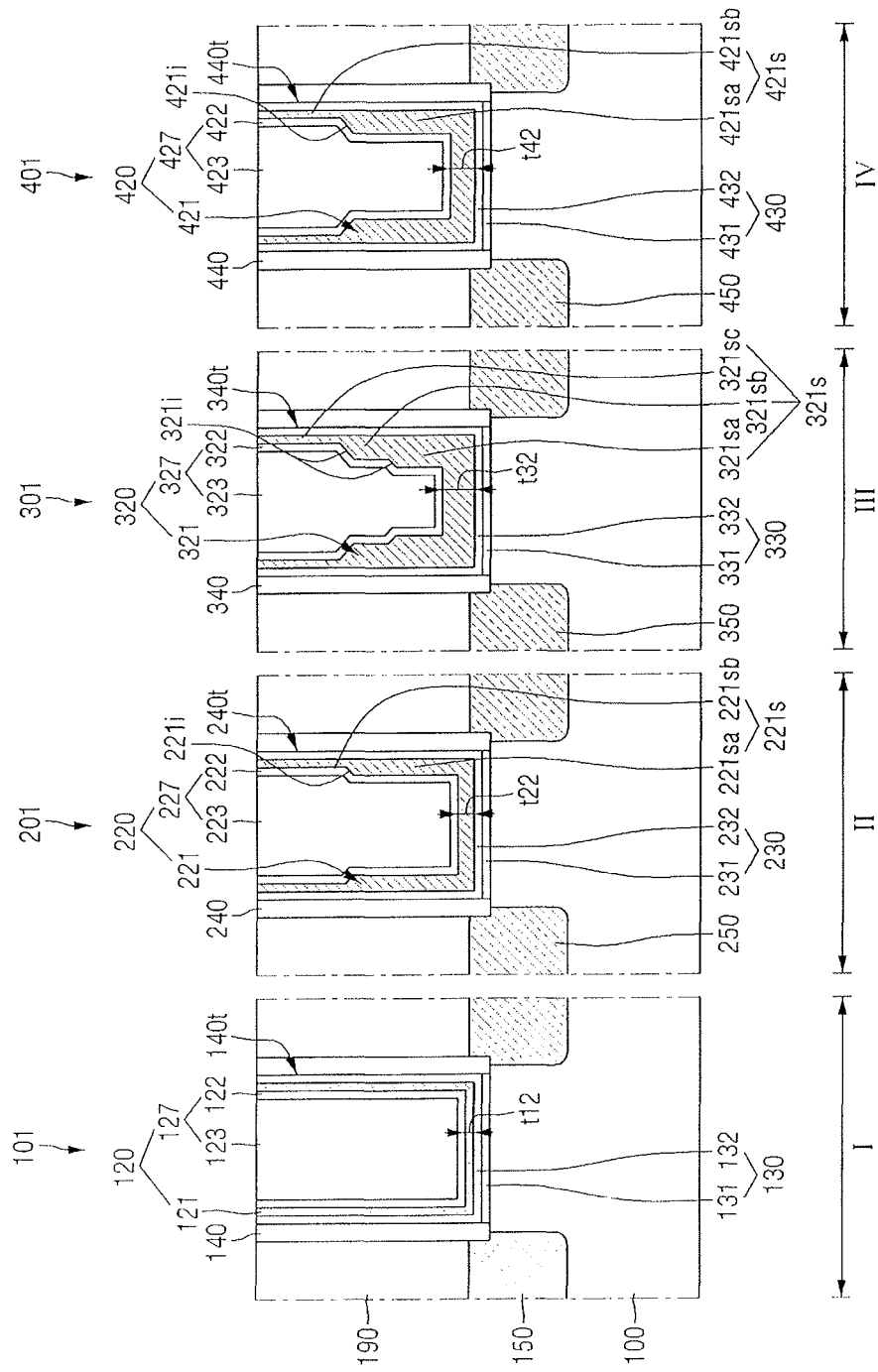

FIG. 22 illustrates a view of a semiconductor device according to embodiments. For ease of description, differences from the semiconductor device described above with reference to FIG. 21 will be mainly described.

Referring to FIG. 22, in the semiconductor device according to some embodiments, a sidewall portion 221s of a second work function control layer 221 may include a first portion 221sa on the second work function control layer 221 formed on a bottom surface of a second trench 240t and a second portion 221sb.

The second portion 221sb of the sidewall portion 221s of the second work function control layer 221 may be located farther away from an upper surface of a substrate 100 than the first portion 221sa of the sidewall portion 221s of the second work function control layer 221.

The first portion 221sa of the sidewall portion 221s of the second work function control layer 221 may be wider than the second portion 221sb of the sidewall portion 221s of the second work function control layer 221.

The second work function control layer 221 may include a second inclined surface 221i having an acute angle with respect to the sidewalls of the second trench 240t. However, an uppermost surface of the second work function control layer 221 may not be an inclined surface having an acute angle to the sidewalls of the second trench 240t.

A sidewall of the first portion 221sa of the sidewall portion 221s of the second work function control layer 221, which faces a second insertion layer 222, may be connected to a sidewall of the second portion 221sb of the sidewall portion 221s of the second work function control layer 221, which faces a second insertion layer 222, by the second inclined surface 221i having an acute angle with respect to a sidewall of the second trench 240t.

The number of inclined surfaces included in the second work function control layer 221 extending along a sidewall of the second trench 240t may be equal to the number of inclined surfaces included in a fourth work function control layer 421 extending along a sidewall of a fourth trench 440t.

Figure 23:
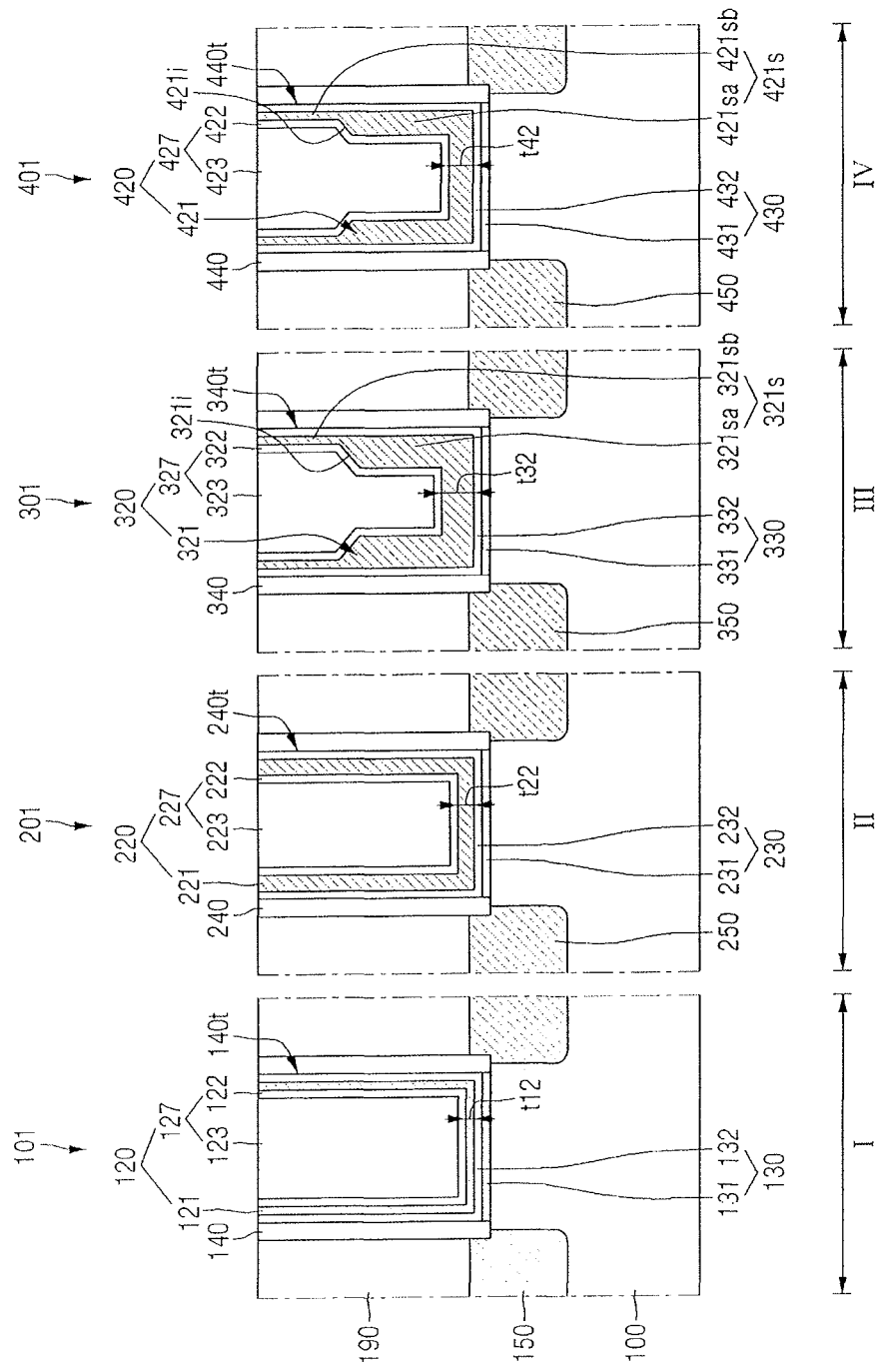

FIG. 23 illustrates a view of a semiconductor device according to embodiments. For ease of description, differences from the semiconductor device described above with reference to FIG. 20 will be mainly described.

Referring to FIG. 23, in the semiconductor device according to some embodiments, a sidewall portion 421s of a fourth work function control layer 421 may include a first portion 421sa on a bottom portion 421b (see FIG. 8) of the fourth work function control layer 421 and a second portion 421sb.

The second portion 421sb of the sidewall portion 421s of the fourth work function control layer 421 may be located farther from an upper surface of a substrate 100 than the first portion 421sa of the sidewall portion 421s of the fourth work function control layer 421.

The first portion 421sa of the sidewall portion 421s of the fourth work function control layer 421 may be wider than the second portion 421sb of the sidewall portion 421s of the fourth work function control layer 421.

The fourth work function control layer 421 extending along a sidewall of a fourth trench 440t may include a fourth inclined surface 421i having an acute angle with respect to the sidewall of the fourth trench 440t. An uppermost surface of the fourth work function control layer 421 may not be an inclined surface having an acute angle with respect to the sidewall of the fourth trench 440t.

The number of inclined surfaces included in a third work function control layer 321 extending along a sidewall of a third trench 340t may be equal to the number of inclined surfaces included in the fourth work function control layer 421 extending along a sidewall of the fourth trench 440t.

Figure 24:
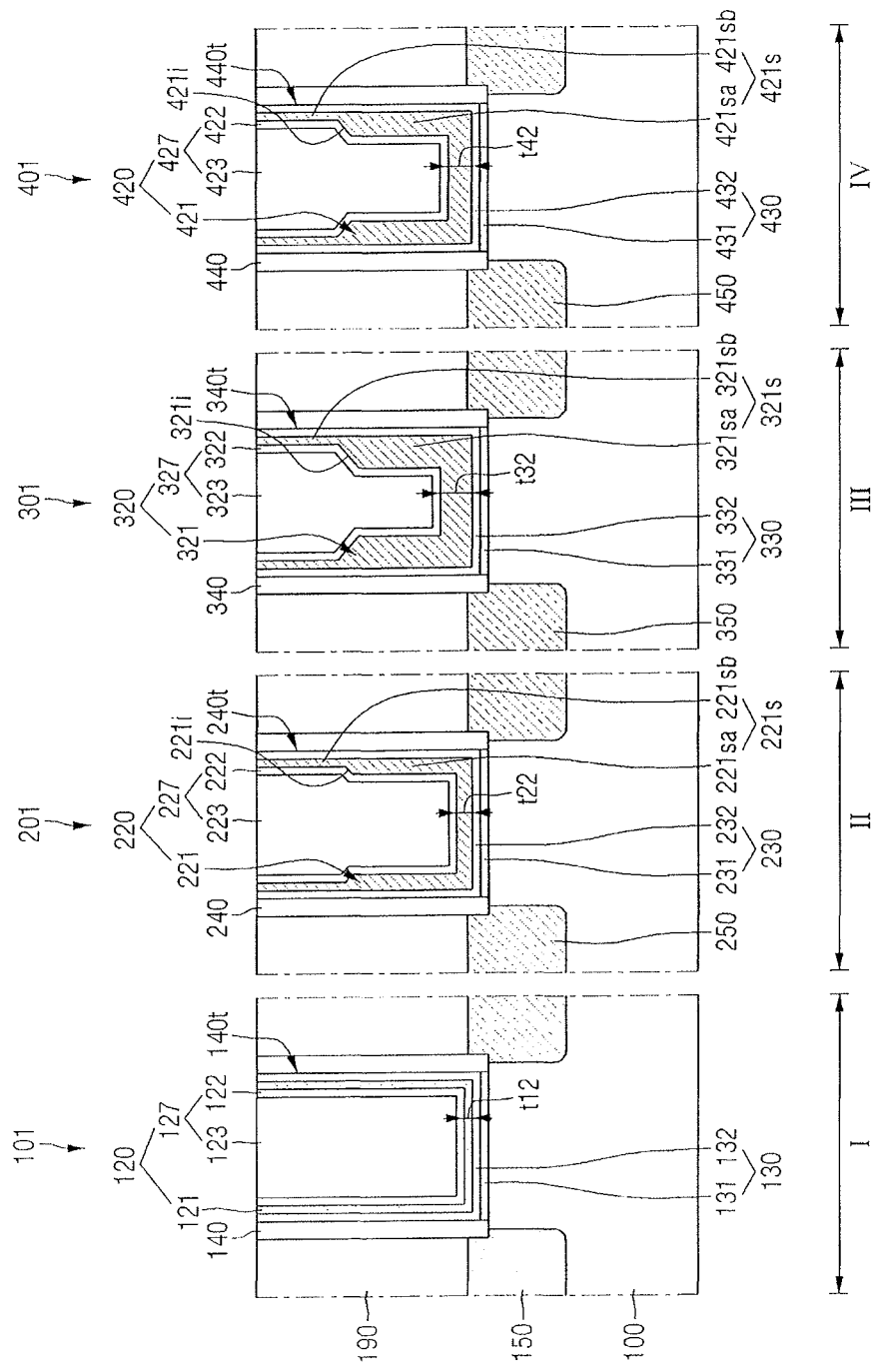

FIG. 24 illustrates a view of a semiconductor device according to embodiments. For ease of description, differences from the semiconductor device described above with reference to FIG. 23 will be mainly described.

Referring to FIG. 24, in the semiconductor device according to some embodiments, a sidewall portion 221s of a second work function control layer 221 may include a first portion 221sa on the second work function control layer 221 formed on a bottom surface of a second trench 240t and a second portion 221sb.

The second work function control layer 221 may include a second inclined surface 221i having an acute angle with respect to sidewalls of the second trench 240t. An uppermost surface of the second work function control layer 221 may not be an inclined surface having an acute angle to the sidewalls of the second trench 240t.

A sidewall of the first portion 221sa of the sidewall portion 221s of the second work function control layer 221, which faces a second insertion layer 222, may be connected to a sidewall of the second portion 221sb of the sidewall portion 221s of the second work function control layer 221, which faces a second insertion layer 222, by the second inclined surface 221i having an acute angle with respect to a sidewall of the second trench 240t.

The number of inclined surfaces included in the second work function control layer 221 extending along a sidewall of the second trench 240t may be equal to the number of inclined surfaces included in a third work function control layer 321 extending along a sidewall of a third trench 340t and may be equal to the number of inclined surfaces included in a fourth work function control layer 421 extending along a sidewall of a fourth trench 440t.

Figure 25:
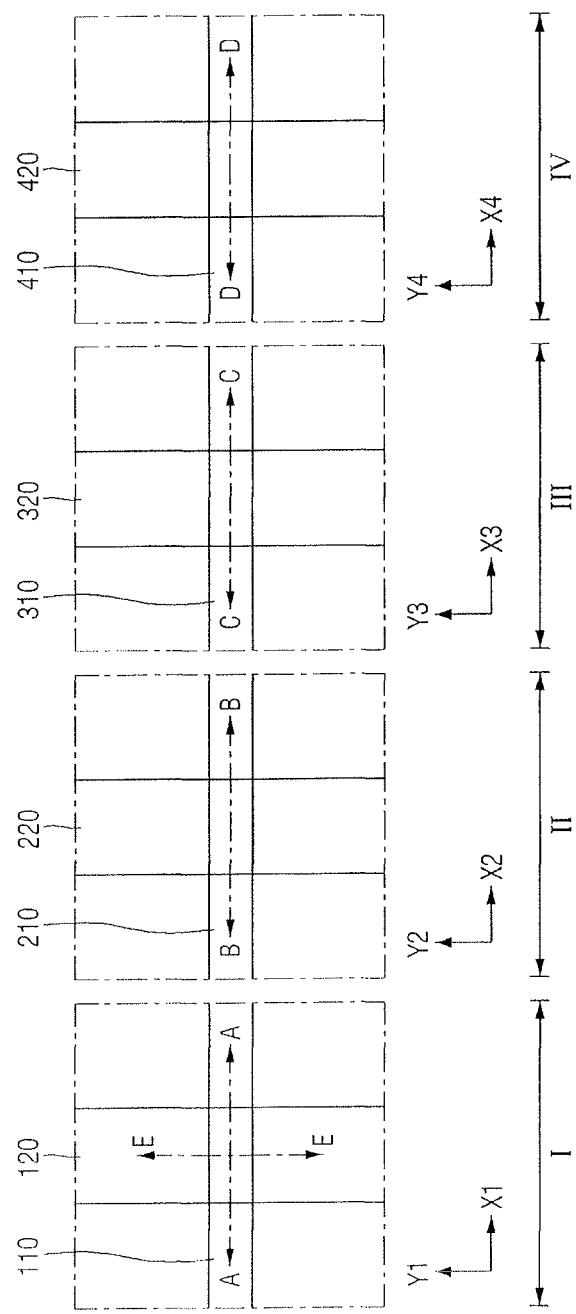
FIG. 25 illustrates a layout view of a semiconductor device according to some embodiments.
Figure 26:
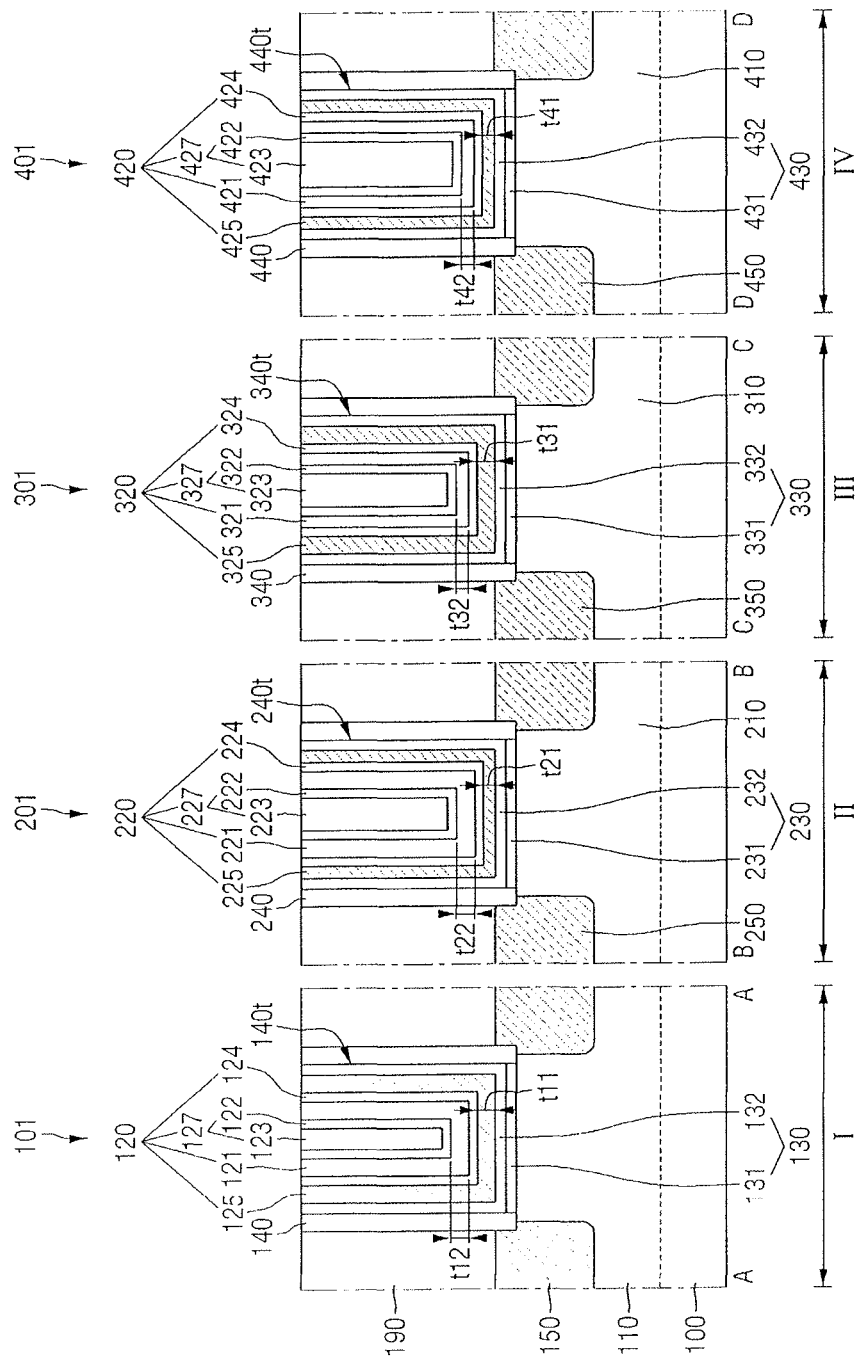
FIG. 26 illustrates a cross-sectional view taken along the lines A-A, B-B, C-C and D-D of FIG. 25.
Figure 27A:
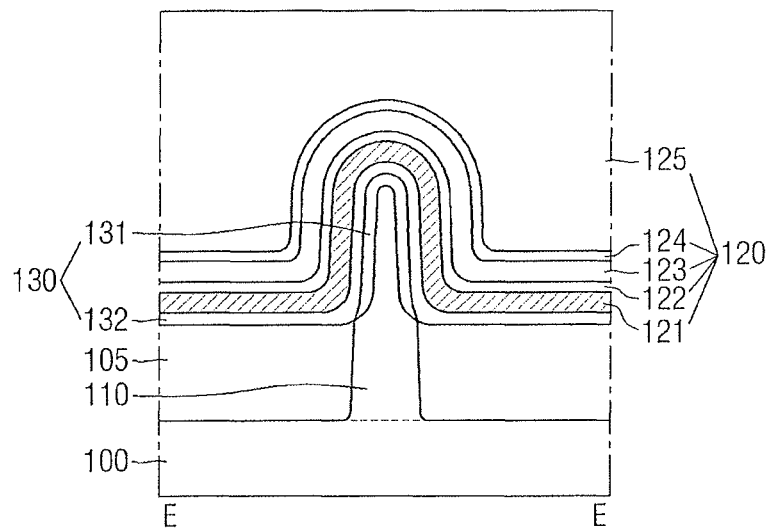
FIGS. 27A through 27C illustrate cross-sectional views taken along the line E-E of FIG. 25.
Figure 27B:
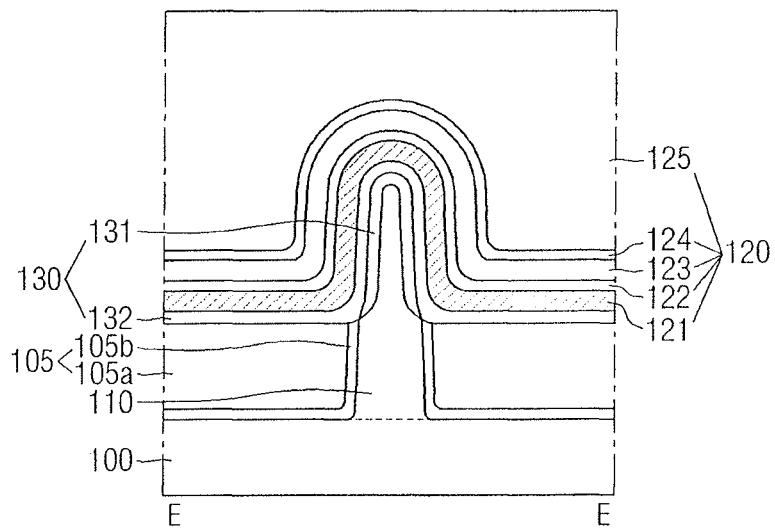
Figure 27C:
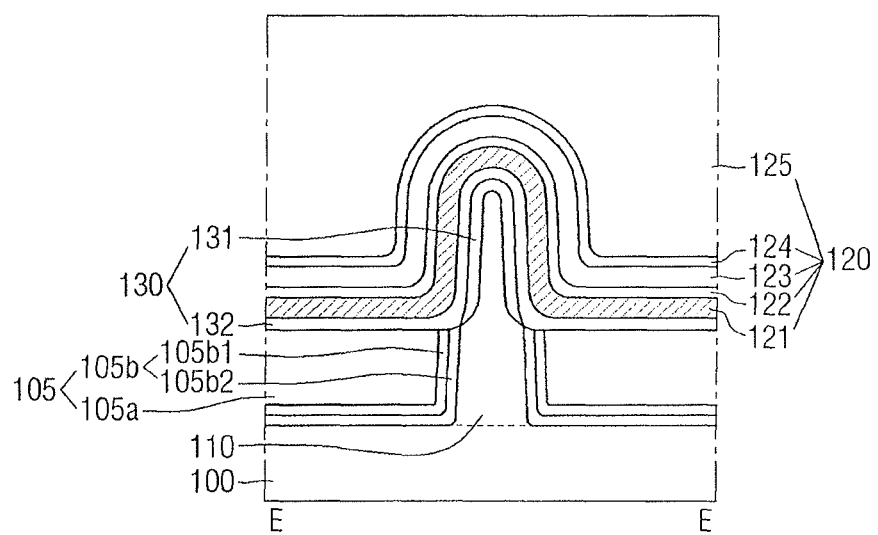

FIG. 25 illustrates a layout view of a semiconductor device according to embodiments. FIG. 26 illustrates a cross-sectional view taken along the lines A-A, B-B, C-C and D-D of FIG. 25. FIGS. 27A through 27C illustrate cross-sectional views taken along the line E-E of FIG. 25. For ease of description, differences from the semiconductor device described above with reference to FIG. 1 will be mainly described.

For reference, FIG. 26 may be substantially similar to FIG. 1 except for fin patterns. Therefore, a description of elements and features identical to those of FIG. 1 will be given briefly or omitted. However, FIG. 26 can also be substantially similar to FIGS. 2 and 3 except for including fin patterns.

FIGS. 27A through 27C show cross-sectional views of a first region I in a gate direction Y1. However, it is to be understood that cross-sectional views of second through fourth regions II through IV in the gate direction may be similar to FIGS. 27A through 27C.

Referring to FIGS. 25 to 27C, in the semiconductor device according to some embodiments, each of first through fourth transistors 101 through 401 may be a p-type fin transistor.

The first through fourth transistors 101 through 401 may include first through fourth fin patterns 110 through 410, respectively.

The first fin pattern 110 may be formed in the first region I, the second fin pattern 210 may be formed in the second region II, the third fin pattern 310 may be formed in the third region III, and the fourth fin pattern 410 may be formed in the fourth region IV.

Each of the first through fourth fin patterns 110 through 410 may protrude from a substrate 100.

The first fin pattern 110 may extend along a first direction X1. The second fin pattern 210 may extend along a second direction X2. The third fin pattern 310 may extend along a third direction X3. The fourth fin pattern 410 may extend along a fourth direction X4.

The first through fourth fin patterns 110 through 410 may be part of the substrate 100 or may include an epitaxial layer grown from the substrate 100.

Each of the first through fourth fin patterns 110 through 410 may include an elemental semiconductor material such as silicon or germanium. In addition, each of the first through fourth fin patterns 110 through 410 may include a compound semiconductor such as a group IV-IV compound semiconductor or a group III-V compound semiconductor.

For example, the group IV-IV compound semiconductor that forms each of the first through fourth fin patterns 110 through 410 may be, e.g., a binary or ternary compound including two or more of carbon (C), silicon (Si), germanium (Ge) and tin (Sn) or a compound obtained by doping the binary or ternary compound with a group IV element.

The group III-V compound semiconductor that forms each of the first through fourth fin patterns 110 through 410 may be, e.g., a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

In the semiconductor device according to some embodiments, the first through fourth fin patterns 110 through 410 are each described as a silicon fin pattern.

For example, when a first field insulating layer 105 partially covers side surfaces of the first fin pattern 110, the first fin pattern 110 may protrude above the first field insulating layer 105 formed on the substrate 100.

The first field insulating layer 105 may include, for example, an oxide layer, a nitride layer, an oxynitride layer, or a combination of the same.

In FIG. 27B, unlike in FIG. 27A, the first field insulating layer 105 may include a field liner 105b and a field filling layer 105a.

The field liner 105b may be formed between the field filling layer 105a and the first fin pattern 110 and between the field filling layer 105a and the substrate 100.

The field liner 105b may include at least one of, for example, polysilicon, amorphous silicon, silicon oxynitride, silicon nitride, and silicon oxide.

In addition, in FIG. 27C, the field liner 105b may include a first liner layer 105b2 and a second liner layer 105b1.

The first liner layer 105b2 may be formed along a lower portion of the first fin pattern 110 and an upper surface of the substrate 100.

The second liner layer 105b1 may be formed on the first liner layer 105b2. The second liner layer 105b1 may be formed along the first liner layer 105b2.

The first liner layer 105b2 may include, for example, polysilicon or amorphous silicon. The second liner layer 105b1 may include, for example, silicon oxide.

First gate spacers 140 may be formed on the first fin pattern 110 protruding above the first field insulating layer 105. The first gate spacers 140 may extend along a fifth direction Y1 and may intersect the first fin pattern 110.

A first trench 140t may be defined by the first gate spacers 140. Accordingly, the first trench 140t may extend along the fifth direction Y1.

Similarly, second gate spacers 240 may be formed on the second fin pattern 210 and may extend in a sixth direction Y2. Third gate spacer 340 may be formed on the third fin pattern 310 and may extend in a seventh direction Y3. Fourth gate spacers 440 may be formed on the fourth fin pattern 410 and may extend in an eighth direction Y4.

A first gate insulating layer 130 may be formed on the first field insulating layer 105 and the first fin pattern 110. The first gate insulating layer 130 may be formed along an upper surface of the first field insulating layer 105 and the profile of the first fin pattern 110.

A first interfacial layer 131 may be formed on the first fin pattern 110. The first interfacial layer 131 may be formed along the profile of the first fin pattern 110 protruding above the upper surface of the first field insulating layer 105.

Although the first interfacial layer 131 is shown as being not formed on the upper surface of the first field insulating layer 105, depending on a method of forming the first interfacial layer 131, the first interfacial layer 131 may also be formed along the upper surface of the first field insulating layer 105.

A first high-k insulating layer 132 may be formed on the first interfacial layer 131 and along the profile of the first fin pattern 110 and the upper surface of the first field insulating layer 105.

A description of second through fourth gate insulating layers 230 through 430 may be substantially the same as that of the first gate insulating layer 130 and thus will not be repeated.

A first gate electrode structure 120 may be formed on the first gate insulating layer 130 and may intersect the first fin pattern 110. The first gate electrode structure 120 may be formed in the first trench 140t. Accordingly, the first gate electrode structure may extend in the fifth direction Y1.

A first lower conductive layer 125, a first etch-stop layer 124, a first work function control layer 121 and a first insertion layer 122 may be formed along the profile of the first gate insulating layer 130.

A second gate electrode structure 220 may be formed on the second gate insulating layer 230 and may intersect the second fin pattern 210. The second gate electrode structure 220 may be formed in a second trench 240t. Accordingly, the second gate electrode structure 220 may extend in the sixth direction Y2.

A third gate electrode structure 320 may be formed on the third gate insulating layer 330 and may intersect the third fin pattern 310. The third gate electrode structure 320 may be formed in the third trench 340t. Accordingly, the third gate electrode structure 320 may extend in the seventh direction Y3.

A fourth gate electrode structure 420 may be formed on the fourth gate insulating layer 430 and may intersect the fourth fin pattern 410. The fourth gate electrode structure 420 may be formed in a fourth trench 440t. Accordingly, the fourth gate electrode structure may extend in the eighth direction Y4.

A description of a lower conductive layer, an etch-stop layer, a work function control layer and an insertion layer included in each of the second through fourth gate electrode structures 220 through 420 may be substantially similar to that of the first lower conductive layer 125, the first etch-stop layer 124, the first work function control layer 121, and the first insertion layer 122.

First source/drain regions 150 may be formed in the first fin pattern 110, second source/drain regions 250 may be formed in the second fin pattern 210, third source/drain regions 350 may be formed in the third fin pattern 310, and fourth source/drain regions 450 may be formed in the fourth fin pattern 410.

As shown in FIG. 26, a thickness t11 of the first lower conductive layer 125 may be substantially equal to a thickness t31 of a third lower conductive layer 325. A thickness t21 of a second lower conductive layer 225 may be substantially equal to a thickness t41 of a fourth lower conductive layer 425.

The thickness t11 of the first lower conductive layer 125 may be greater than the thickness t21 of the second lower conductive layer 225.

Further, a thickness t12 of the first work function control layer 121 may be substantially equal to a thickness t22 of a second work function control layer 221. A thickness t32 of a third work function control layer 321 may be substantially equal to a thickness t42 of a fourth work function control layer 421.

In some implementations, the thickness t12 of the first work function control layer 121 may be greater than the thickness t32 of the third work function control layer 321.

A threshold voltage of the second transistor 201 may be higher than a threshold voltage of the first transistor 101 and lower than a threshold voltage of the third transistor 301. The threshold voltage of the third transistor 301 may be lower than a threshold voltage of the fourth transistor 401.

Figure 28:
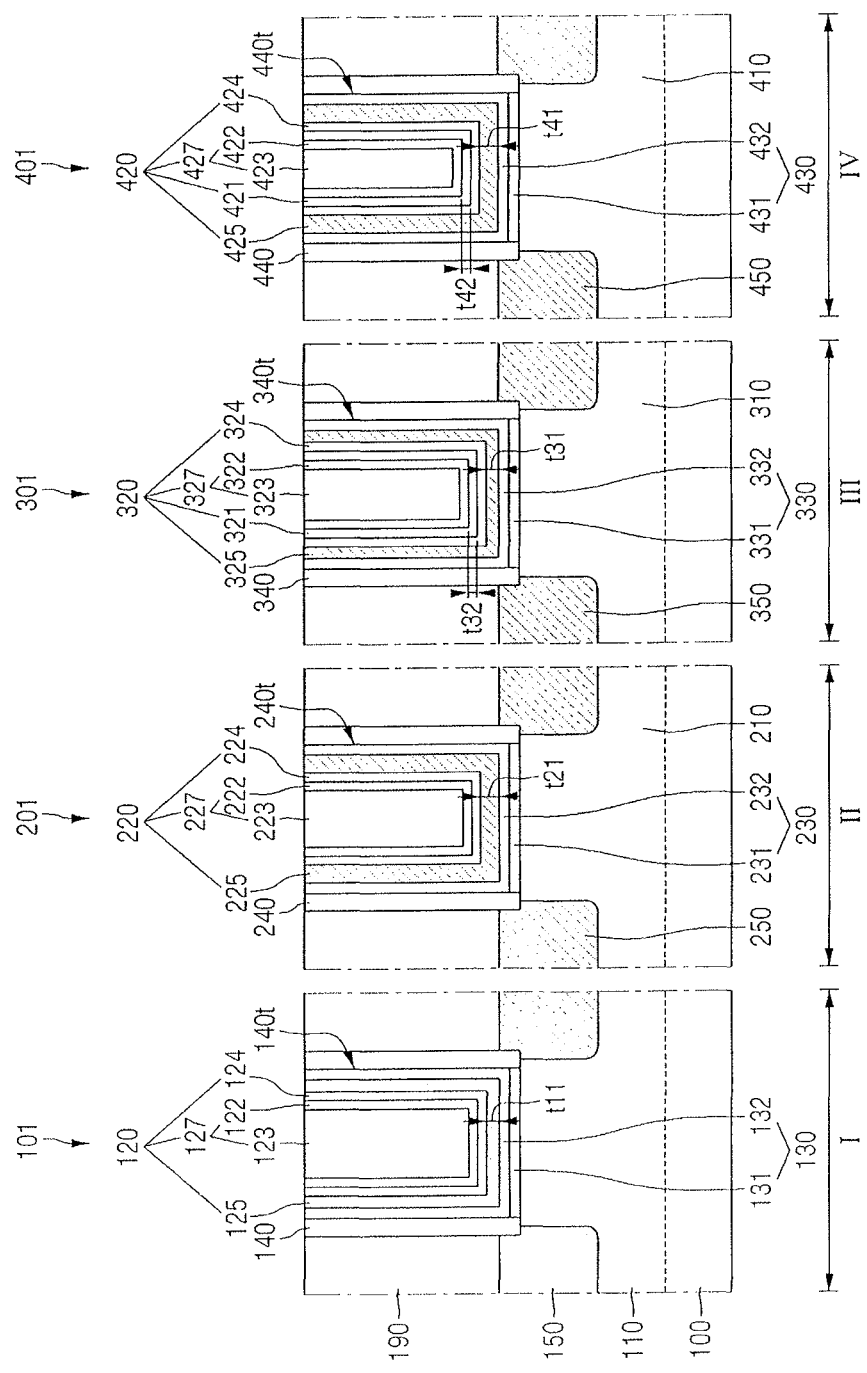
FIG. 28 illustrates a view of a semiconductor device according to some embodiments.

FIG. 28 illustrates a view of a semiconductor device according to embodiments. For ease of description, differences from the semiconductor device described above with reference to FIGS. 25 through 27C will be mainly described.

For reference, FIG. 28 may be substantially similar to FIG. 4 except for fin patterns. Therefore, a description of elements and features identical to those of FIG. 4 will be given briefly or omitted.

Referring to FIG. 28, in the semiconductor device according to some embodiments, each of first through fourth transistors 101 through 401 may be an n-type fin transistor.

A first gate electrode structure 120 may include a first lower conductive layer 125, a first etch-stop layer 124, a first insertion layer 122, and a first filling layer 123.

The first insertion layer 122 may be formed on the first etch-stop layer 124. The first insertion layer 122 may contact the first etch-stop layer 124. The first insertion layer 122 may be formed along the profile of the first etch-stop layer 124.

A second gate electrode structure 220 may include a second lower conductive layer 225, a second etch-stop layer 224, a second insertion layer 222, and a second filling layer 223.

The second insertion layer 222 may be formed on the second etch-stop layer 224. The second insertion layer 222 may contact the second etch-stop layer 224. The second insertion layer 222 may be formed along the profile of the second etch-stop layer 224.

Unlike a third gate electrode structure 320 and a fourth gate electrode structure 420, the first gate electrode structure 120 and the second gate electrode structure 220 may not include a work function control layer, for example, a TiN layer.

A thickness t11 of the first lower conductive layer 125 may be substantially equal to a thickness t31 of a third lower conductive layer 325. A thickness t21 of the second lower conductive layer 225 may be substantially equal to a thickness t41 of a fourth lower conductive layer 425.

The thickness t11 of the first lower conductive layer 125 may be less than the thickness t21 of the second lower conductive layer 225.

A thickness t32 of a third work function control layer 321 may be substantially equal to a thickness t42 of a fourth work function control layer 421.

A threshold voltage of the second transistor 201 may be higher than a threshold voltage of the first transistor 101 and lower than a threshold voltage of the third transistor 301. In addition, the threshold voltage of the third transistor 301 may be lower than a threshold voltage of the fourth transistor 401.

Each of the first through fourth transistors 101 through 401 described with reference to FIGS. 5 through 24 may also include a fin pattern.

Figure 29:
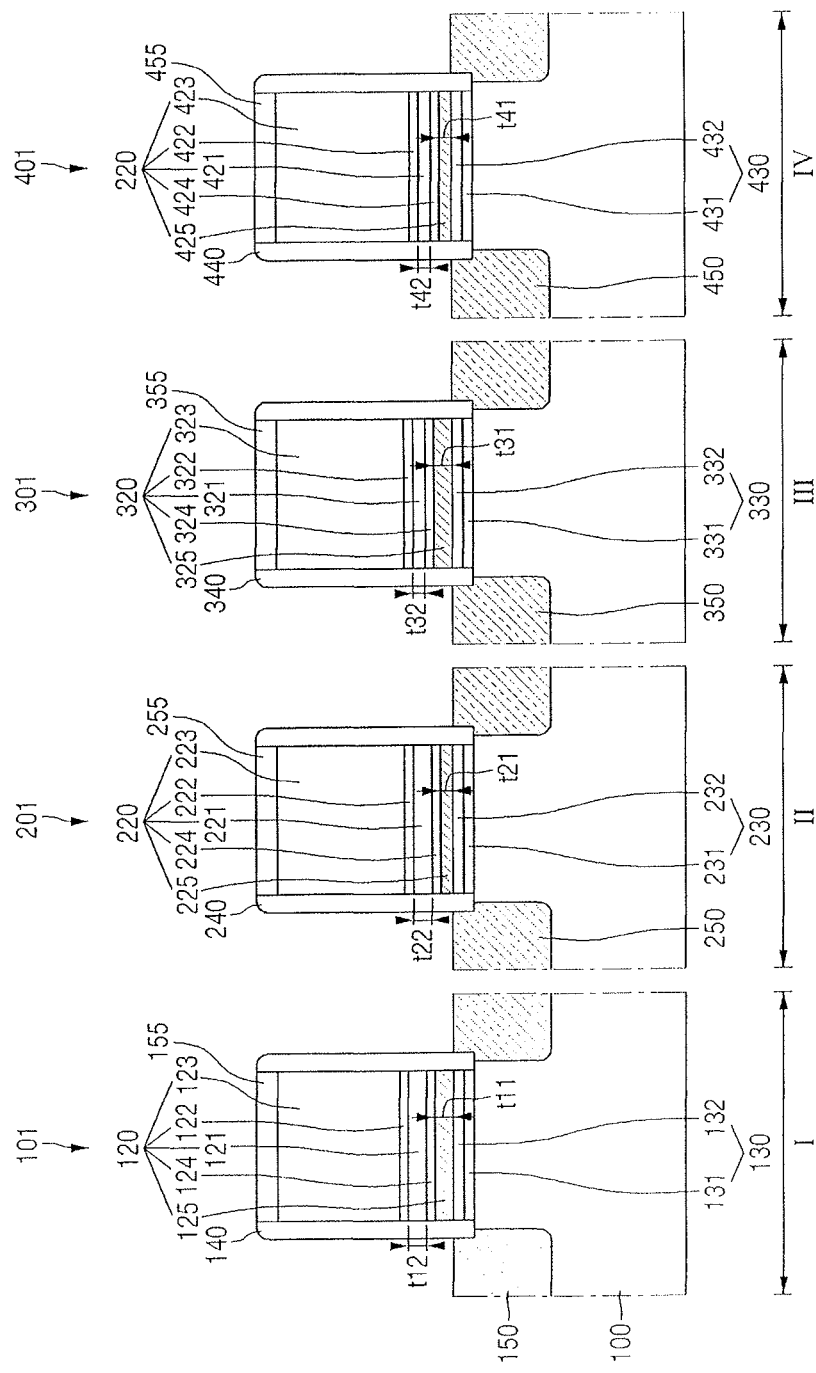
FIG. 29 illustrates a view of a semiconductor device according to some embodiments.

FIG. 29 illustrates a view of a semiconductor device according to embodiments. For ease of description, differences from the semiconductor device described above with reference to FIG. 1 will be mainly described.

Referring to FIG. 29, in the semiconductor device according to some embodiments, a first high-k insulating layer 132 may not include a portion extending between a first gate electrode structure 120 and first gate spacers 140.

In addition, in the first gate electrode structure 120, a first lower conductive layer 125, a first etch-stop layer 124, a first work function control layer 121, and a first insertion layer 122 may not include portions extending along inner walls of the first gate spacers 140.

A description of second through fourth high-k insulating layers 232 through 432 may be substantially similar to that of the first high-k insulating layer 132.

In addition, a description of a lower conductive layer, an etch-stop layer, a work function control layer, and an insertion layer included in each of the second through fourth electrode structures 220 through 420 may be similar to that of the first lower conductive layer 125, the first etch-stop layer 124, the first work function control layer 121, and the first insertion layer 122.

In FIG. 29, a thickness t11 of the first lower conductive layer 125 may be substantially equal to a thickness t31 of a third lower conductive layer 325. A thickness t21 of a second lower conductive layer 225 may be substantially equal to a thickness t41 of a fourth lower conductive layer 425.

The thickness t11 of the first lower conductive layer 125 may be greater than the thickness t21 of the second lower conductive layer 225.

Further, a thickness t12 of the first work function control layer 121 may be substantially equal to a thickness t22 of a second work function control layer 221. In addition, a thickness t32 of a third work function control layer 321 may be substantially equal to a thickness t42 of a fourth work function control layer 421.

The thickness t12 of the first work function control layer 121 may be greater than the thickness t32 of the third work function control layer 321.

In FIG. 29, first through fourth gate hard masks 155, 255, 355, 455 are formed on the first through fourth gate electrode structures 120 through 420, as an example.

Figure 30:
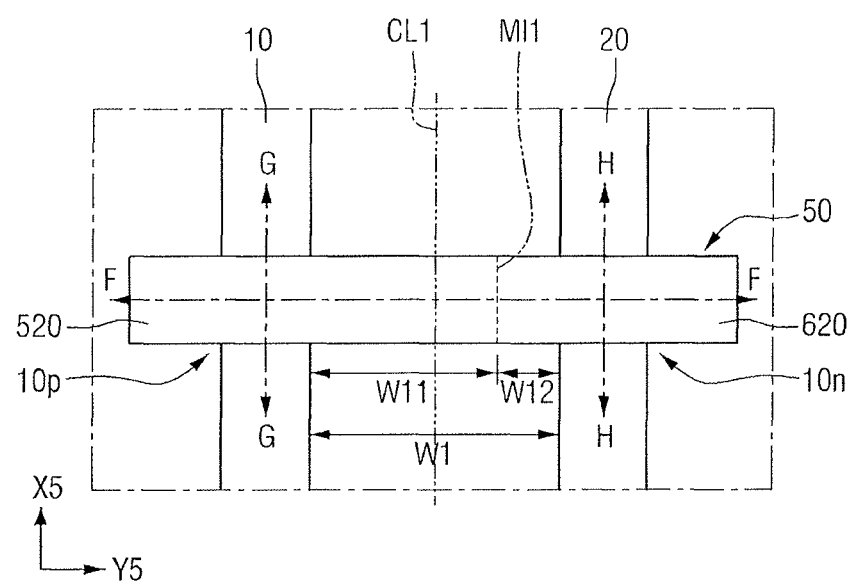
FIG. 30 illustrates a plan view of a semiconductor device according to some embodiments.
Figure 31A:
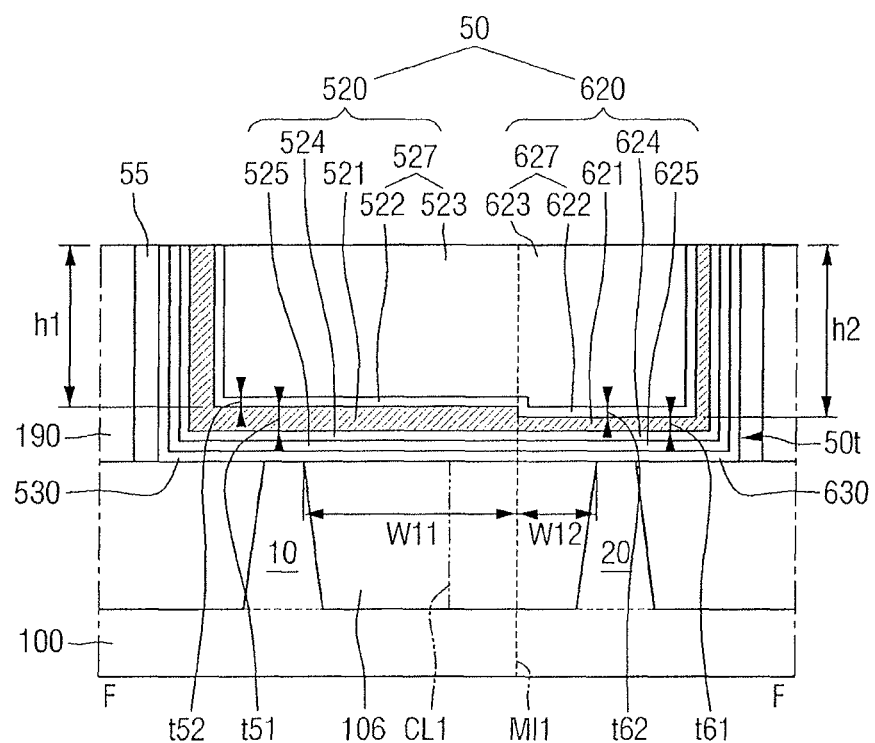
FIGS. 31A and 31B illustrate cross-sectional views taken along the line F-F of FIG. 30.
Figure 31B:
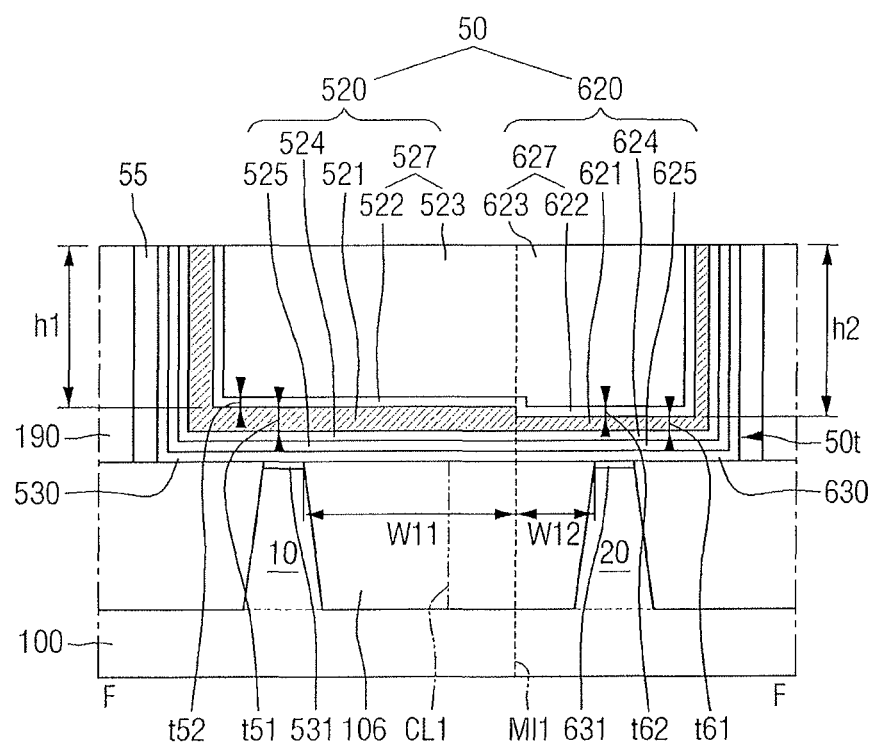
Figure 32A:
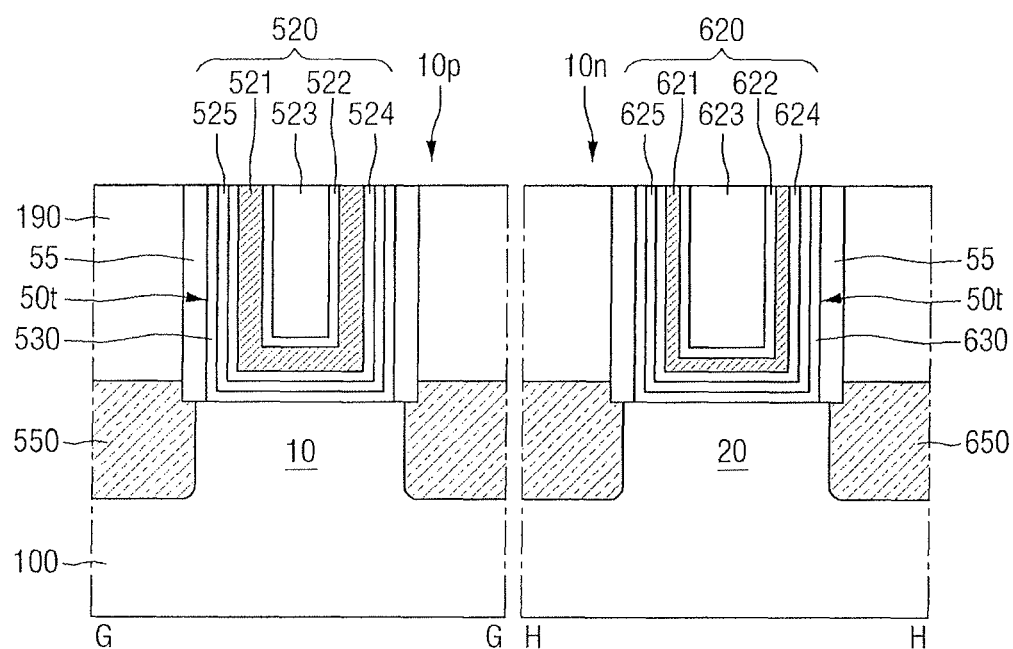
FIGS. 32A and 32B illustrate cross-sectional views taken along the lines G-G and H-H of FIG. 30.
Figure 32B:
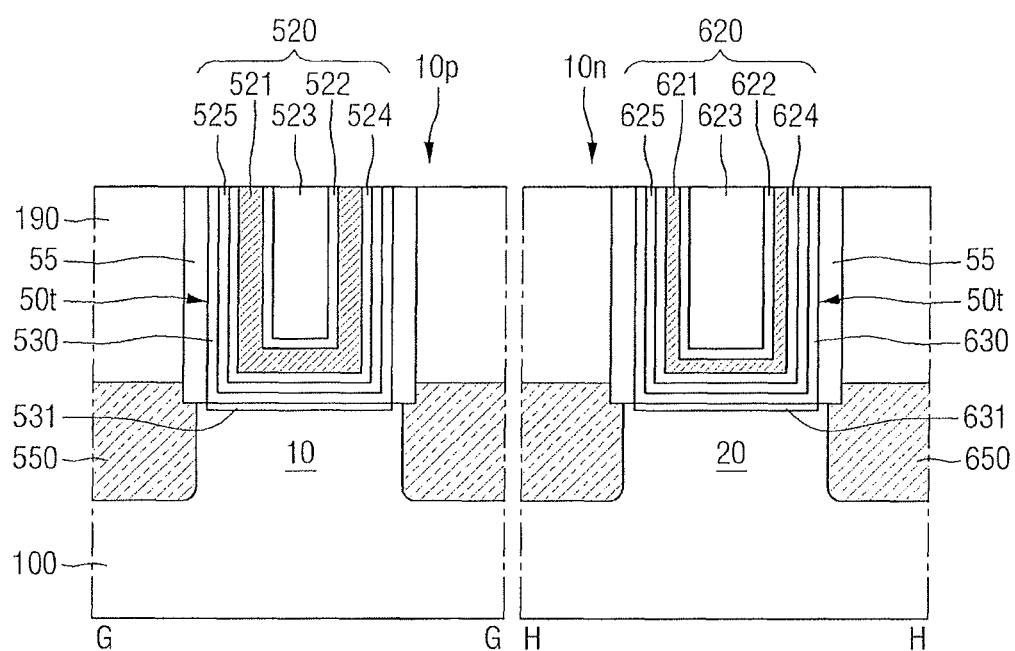

FIG. 30 illustrates a plan view of a semiconductor device according to embodiments. FIGS. 31A and 31B illustrate cross-sectional views taken along the line F-F of FIG. 30. FIGS. 32A and 32B illustrate cross-sectional views taken along the lines G-G and H-H of FIG. 30.

For reference, FIG. 30 schematically illustrates only a first active region 10, a second active region 20, and a fifth gate electrode structure 50 for ease of description.

Referring to FIGS. 30 through 32B, the semiconductor device according to some embodiments includes a substrate 100 that includes the first active region 10, the second active region 20 and a second field insulating layer 106 and the fifth gate electrode structure 50 which crosses the first active region 10, the second active region 20 and the second field insulating layer 106.

The first active region 10 and the second active region 20 may be defined by the second field insulating layer 106. The first active region 10 and the second active region 20 may be spatially separated but adjacent to each other.

Each of the first active region 10 and the second active region 20 may be shaped as a rectangle extending in a ninth direction X5, as an example. The first active region 10 and the second active region 20 may be arranged side by side so as to be adjacent to each other in a long-side direction.

The first active region 10 may be a region in which a PMOS is formed. The second active region 20 may be a region in which an NMOS is formed. For example, the first active region 10 may be a region in which a pull-up transistor of an SRAM is formed, and the second active region 20 may be a region in which a pull-down transistor or a pass transistor of the SRAM is formed.

For example, when a gate voltage is applied by one gate electrode structure, adjacent PMOS and NMOS regions may become the first active region 10 and the second active region 20.

In the semiconductor device according to some embodiments, the first active region 10 and the second active region 20 are described as being formed in an SRAM region.

The second field insulating layer 106 may surround the first active region 10 and the second active region 20. In some implementations, the second field insulating layer 106 may be a portion located between the first active region 10 and the second active region 20.

The second field insulating layer 106 may be disposed between the first active region 10 and the second active region 20 and may be in direct contact with the first active region 10 and the second active region 20.

For example, the second field insulating layer 106 may be in direct contact with the first active region 10 and the second active region 20 in the absence of another active region between the first active region 10 and the second active region 20.

The second field insulating layer 106 may further include at least one field liner layer formed between the first active region 10 and the second field insulating layer 106 and between the second active region 20 and the second field insulating layer 106.

A width of the second field insulating layer 106 located between the first active region 10 and the second active region 20 may be a first width W1. In addition, the second field insulating layer 106 may include a first center line CL1 located at the same distance from the first active region 10 and the second active region 20.

A distance from the first center line CL1 to the first active region 10 may be the same as a distance from the first center line CL1 to the second active region 20 and may be half the width W1 of the second field insulating layer 106. The first center line CL1 of the second field insulating layer 106 may extend parallel to the first active region 10 and the second active region 20.

The fifth gate electrode structure 50 may be formed on the substrate 100. The fifth gate electrode structure 50 may cross the first active region 10, the second active region 20, and the second field insulating layer 106. The fifth gate electrode structure 50 may extend in a tenth direction Y5.

The fifth gate electrode structure 50 may include a first gate electrode 520 and a second gate electrode 620. The first gate electrode 520 and the second gate electrode 620 may be in contact with each other, for example, in direct contact with each other.

The first gate electrode 520 may be a p-type metallic gate electrode and may be formed on the first active region 10 and the second field insulating layer 106. The second gate electrode 620 may be an n-type metallic gate electrode and may be formed on the second active region 20 and the second field insulating layer 106.

A fifth transistor 10p may be formed in a region in which the first active region 10 and the fifth gate electrode structure 50 intersect each other. A sixth transistor 10n may be formed in a region in which the second active region 20 and the fifth gate electrode structure 50 intersect each other. The fifth transistor 10p may be a p-type transistor, and the sixth transistor 10n may be an n-type transistor.

For example, the fifth transistor 10p and the sixth transistor 10n of different conductivity types may share the fifth gate electrode structure 50.

The first gate electrode 520 may extend onto the second field insulating layer 106. The first gate electrode 520 may overlap not only the first active region 10 but also a portion of the second field insulating layer 106.

The second gate electrode 620 may be in direct contact with the first gate electrode 520. The second gate electrode 620 may overlap not only the second active region 20 but also the other portion of the second field insulating layer 106 that is not overlapped by the first gate electrode 520.

The fifth gate electrode structure 50 may include a first contact surface MI1 at which the first gate electrode 520 and the second gate electrode 620 contact each other. The first contact surface MI1 at which the first gate electrode 520 and the second gate electrode 620 contact each other may be located on the second field insulating layer 106.

The first contact surface MI1 between the first gate electrode 520 and the second gate electrode 620 may not coincide with the first center line CL1 of the second field insulating layer 106. For example, the first contact surface MI1 between the first gate electrode 520 and the second gate electrode 620 may be closer to the second active region 20 than to the first active region 10 or may be closer to the first active region 10 than to the second active region 20.

In the semiconductor device according to some embodiments described with reference to FIG. 30, the first contact surface MI1 between the first gate electrode 520 and the second gate electrode 620 may be located closer to the second active region 20 than to the first active region 10.

In FIG. 30, the first active region 10, the first center line CL1, the first contact surface MI1 and the second active region 20 may be arranged sequentially in this order such that the second gate electrode 620 does not overlap the first center line CL1 of the second field insulating layer 106. The first contact surface MI1 may be located between the second active region 20 and the first center line CL1 of the second field insulating layer 106.

The first active region 10 may include a channel region of a p-type transistor. The second active region 20 may include a channel region of an n-type transistor. The first contact surface MI1 between the first gate electrode 520 and the second gate electrode 620 may be closer to the second active region 20 than to the first active region 10. Accordingly, the first contact surface MI1 may be closer to the channel region of the n-type transistor than to the channel region of the p-type transistor.

A width of a portion of the first gate electrode 520 that extends on the second field insulating layer 106 may be a first overlapping width W11. For example, the width of the first gate electrode 520 from the first contact surface MI1 to a boundary of the first active region 10 may be the first overlapping width W11.

A width of a portion of the second gate electrode 620 that extends on the second field insulating layer 106 may be a second overlapping width W12. The width of the second gate electrode 620 from the first contact surface MI1 to a boundary of the second active region 20 may be the second overlapping width W12.

The first contact surface MI1 between the first gate electrode 520 and the second gate electrode 620 may not coincide with the first center line CL1 of the second field insulating layer 106. Accordingly, the first overlapping width W11 may be different from the second overlapping width W12.

In the semiconductor devices according to some embodiments described with reference to FIG. 30, the first overlapping width W11 may be larger than the second overlapping width W12 because the first contact surface MI1 between the first gate electrode 520 and the second gate electrode 620 may be located closer to the second active region 20 than to the first active region 10.

The width W11 of the first gate electrode 520 overlapping the second field insulating layer 106 may be greater than the width W12 of the second gate electrode 620 overlapping the second field insulating layer 106.

The first gate electrode 520 and the second gate electrode 620 may be in direct contact with each other. Accordingly, the sum of the width W11 of the first gate electrode 520 overlapping the second field insulating layer 106 and the width W12 of the second gate electrode 620 overlapping the second field insulating layer 106 may be equal to the width W1 of the second field insulating layer 106.

The structures of the first gate electrode 520 and the second gate electrode 620 will be described in detail below.

An interlayer insulating film 190 may be formed on the substrate 100. The interlayer insulating film 190 may include a fifth trench 50t.

The fifth trench 50t may cross the first active region 10, the second field insulating layer 106, and the second active region 20. For example, the fifth trench 50t may intersect the first active region 10 and the second active region 20. The fifth trench 50t may extend in the tenth direction Y5.

Fifth gate spacers 55 may be formed on the substrate 100. The fifth gate spacers 55 may define the fifth trench 50t. The fifth gate spacers 55 may be formed on sidewalls of the fifth gate electrode structure 50.

The fifth gate electrode structure 50 may extend in the tenth direction Y5. Accordingly, the fifth gate electrode structure 50 may include long sides extending in the tenth direction Y5 and short sides extending in the ninth direction X5.

In FIGS. 31A through 32B, the fifth gate spacers 55 may be formed on sidewalls including the long sides of the fifth gate electrode structure 50 and sidewalls including the short sides of the fifth gate electrode structure 50. In some implementations, the fifth gate spacers 55 may be formed on the sidewalls including the long sides of the fifth gate electrode structure 50 but may not be formed on the sidewalls including the short sides of the fifth gate electrode structure 50.

In some implementations, thicknesses of the fifth gate spacers 55 formed on the sidewalls including the long sides of the fifth gate electrode structure 50 may be different from thicknesses of the fifth gate spacers 50 formed on the sidewalls including the short sides of the fifth gate electrode structure 50.

A fifth gate insulating layer 530 and a sixth gate insulating layer 630 may be formed on the substrate 100. The fifth gate insulating layer 530 may be formed on the first active region 10 and the second field insulating layer 106. The sixth gate insulating layer 630 may be formed on the second active region 20 and the second field insulating layer 106.

The fifth gate insulating layer 530 and the sixth gate insulating layer 630 may extend along sidewalls and a bottom surface of the fifth trench 50t. The fifth and sixth gate insulating layers 530 and 630 extending along the bottom surface of the fifth trench 50t may traverse the first active region 10, the second field insulating layer 106, and the second active region 20.

The fifth gate insulating layer 530 and the sixth gate insulating layer 630 may be separated by the first contact surface MI1 of the fifth gate electrode structure 50. The fifth gate insulating layer 530 and the sixth gate insulating layer 630 may be formed at a same level.

Each of the fifth gate insulating layer 530 and the sixth gate insulating layer 630 may include a high-k insulating layer.

In FIGS. 31B and 32B, a fifth interfacial layer 531 and a sixth interfacial layer 631 may be formed between the fifth gate insulating layer 530 and the first active region 10 and between the sixth gate insulating layer 630 and the second active region 20, respectively.

In FIGS. 31B and 32B, upper surfaces of the fifth and sixth interfacial layers 531 and 631 may lie in a same plane as an upper surface of the second field insulating layer 106, as an example.

The fifth gate electrode structure 50 may be formed on the fifth gate insulating layer 530 and the sixth gate insulating layer 630. The fifth gate insulating layer 530 and the sixth gate insulating layer 630 may be formed between the fifth gate electrode structure 50 and the substrate 100. The fifth gate insulating layer 530 and the sixth gate insulating layer 630 may be formed under the fifth gate electrode structure 50.

The fifth gate electrode structure 50 may fill the fifth trench 50t. An upper surface of the fifth gate electrode structure 50 may lie in a same plane as upper surfaces of the fifth gate spacers 55 and an upper surface of the interlayer insulating film 190.

The first gate electrode 520 may include a fifth lower conductive layer 525, a fifth etch-stop layer 524, a fifth work function control layer 521, a fifth insertion layer 522, and a fifth filling layer 523 formed sequentially on the fifth gate insulating layer 530.

The second gate electrode 620 may include a sixth lower conductive layer 625, a sixth etch-stop layer 624, a sixth work function control layer 621, a sixth insertion layer 622, and a sixth filling layer 623 formed sequentially on the sixth gate insulating layer 630.

The fifth lower conductive layer 525 and the sixth lower conductive layer 625 may be formed on the fifth gate insulating layer 530 and the sixth gate insulating layer 630. The fifth lower conductive layer 525 may contact the fifth gate insulating layer 530, and the sixth lower conductive layer 625 may contact the sixth gate insulating layer 630.

The fifth lower conductive layer 525 may be formed on the first active region 10 and the second field insulating layer 106. The sixth lower conductive layer 625 may be formed on the second active region 20 and the second field insulating layer 106.

The fifth lower conductive layer 525 and the sixth lower conductive layer 625 may extend along the sidewalls and bottom surface of the fifth trench 50t. The fifth lower conductive layer 525 may extend along the profile of the fifth gate insulating layer 530. The sixth lower conductive layer 625 may extend along the profile of the sixth gate insulating layer 630.

The fifth lower conductive layer 525 and the sixth lower conductive layer 625 may be separated by the first contact surface MI1 of the fifth gate electrode structure 50.

The fifth lower conductive layer 525 and the sixth lower conductive layer 625 may include the same material. The fifth lower conductive layer 525 and the sixth lower conductive layer 625 may include, for example, TiN.

The fifth etch-stop layer 524 and the sixth etch-stop layer 624 may be formed on the fifth lower conductive layer 525 and the sixth lower conductive layer 625. The fifth etch-stop layer 524 may be formed on the first active region 10 and the second field insulating layer 106. The sixth etch-stop layer 624 may be formed on the second active region 20 and the second field insulating layer 106.

The fifth etch-stop layer 524 and the sixth etch-stop layer 624 may extend along the sidewalls and bottom surface of the fifth trench 50t. The fifth etch-stop layer 524 may extend along the profile of the fifth lower conductive layer 525, and the sixth etch-stop layer 624 may extend along the profile of the sixth lower conductive layer 625.

The fifth etch-stop layer 524 and the sixth etch-stop layer 624 may be separated by the first contact surface MI1 of the fifth gate electrode structure 50. The fifth etch-stop layer 524 and the sixth etch-stop layer 624 may be formed at a same level. A thickness of the fifth etch-stop layer 524 on the first active region 10 may be, for example, substantially equal to a thickness of the sixth etch-stop layer 624 on the second active region 20.

The fifth etch-stop layer 524 and the sixth etch-stop layer 624 may include the same material. The fifth etch-stop layer 524 and the sixth etch-stop layer 624 may include, for example, TaN.

The fifth work function control layer 521 and the sixth work function control layer 621 may be formed on the fifth etch-stop layer 524 and the sixth etch-stop layer 624. The fifth work function control layer 521 may contact the fifth etch-stop layer 524. The sixth work function control layer 621 may contact the sixth etch-stop layer 624.

The fifth work function control layer 521 may be formed on the first active region 10 and the second field insulating layer 106. The sixth work function control layer 621 may be formed on the second active region 20 and the second field insulating layer 106. The fifth work function control layer 521 and the sixth work function control layer 621 may be in direct contact with each other.

The fifth work function control layer 521 and the sixth work function control layer 621 may extend along the sidewalls and bottom surface of the fifth trench 50t. The fifth work function control layer 521 may extend along the profile of the fifth gate insulating layer 530 and the fifth etch-stop layer 524, and the sixth work function control layer 621 may extend along the profile of the sixth gate insulating layer 630 and the sixth etch-stop layer 624.

The fifth work function control layer 521 and the sixth work function control layer 621 may include the same material. For example, the fifth work function control layer 521 and the sixth work function control layer 621 may be the same material layer. The fifth work function control layer 521 and the sixth work function control layer 621 may include, for example, TiN.

A thickness t51 of the fifth work function control layer 521 may be different from a thickness t61 of the sixth work function control layer 621. For example, the thickness t51 of the fifth work function control layer 521 may be greater than the thickness t61 of the sixth work function control layer 621.

The thickness t51 of the fifth work function control layer 521 included in a p-type gate electrode may be greater than the thickness t61 of the six work function control layer 621 included in an n-type gate electrode. For example, the thickness t51 of the fifth work function control layer 521 may be a thickness on the first active region 10, and the thickness t61 of the sixth work function control layer 621 may be a thickness on the second active region 20.

The first contact surface MI1 between the first gate electrode 520 and the second gate electrode 620 may be defined between the fifth and sixth work function control layers 521 and 621 having different thicknesses. For example, if the fifth gate electrode structure 50 were to be cut along a normal to the substrate 100 based on a boundary between the fifth work function control layer 521 and the sixth work function control layer 621 extending on the second field insulating layer 106, the first contact surface MI1 between the first gate electrode 520 and the second gate electrode 620 would be formed.

The first contact surface MI1 between the first gate electrode 520 and the second gate electrode 620 may be defined as the boundary between the fifth work function control layer 521 and the sixth work function control layer 621. Accordingly, the width W11 by which the fifth work function control layer 521 and the second field insulating layer 106 overlap each other may be different from the width W12 by which the sixth work function control layer 621 and the second field insulating layer 106 overlap each other.

In FIGS. 30 through 31B, the first contact surface MI1 between the first gate electrode 520 and the second gate electrode 620 is located closer to the second active region 20 than to the first active region 10. Therefore, the width W11 by which the fifth work function control layer 521 and the second field insulating layer 106 overlap each other may be greater than the width W12 by which the sixth work function control layer 621 and the second field insulating layer 106 overlap each other.

The first active region 10, the first center line CL1, the first contact surface MI1 and the second active region 20 may be arranged sequentially in this order. Accordingly, the sixth work function control layer 621 may not overlap the first center line CL1 of the second field insulating layer 106.

The fifth insertion layer 522 and the sixth insertion layer 622 may be formed on the fifth work function control layer 521 and the sixth work function control layer 621. The fifth insertion layer 522 and the sixth insertion layer 622 may be in direct contact with each other.

The fifth insertion layer 522 may be formed on the first active region 10 and the second field insulating layer 106. The sixth insertion layer 622 may be formed on the second active region 20 and the second field insulating layer 106.

The fifth insertion layer 522 and the sixth insertion layer 622 may extend along the sidewalls and bottom surface of the fifth trench 50t. The fifth insertion layer 522 and the sixth insertion layer 522 may extend along the profile of the fifth and sixth work function control layers 521 and 621 which are in direct contact with each other.

The fifth insertion layer 522 and the sixth insertion layer 622 may be separated by the first contact surface MI1 of the fifth gate electrode structure 50. The fifth insertion layer 522 and the sixth insertion layer 622 may be formed at the same level.

A thickness t52 of the fifth insertion layer 522 may be substantially equal to a thickness t62 of the sixth insertion layer 622. The thickness t52 of the fifth insertion layer 522 may be a thickness on the first active region 10, and the thickness t62 of the sixth insertion layer 622 may be a thickness on the second active region 20.

The fifth insertion layer 522 and the sixth insertion layer 622 may include the same material. The fifth insertion layer 522 and the sixth insertion layer 622 may include, for example, one of Ti, TiAl, TiAlN, TiAlC, and TiAlCN.

In the semiconductor device according to some embodiments, the fifth insertion layer 522 and the sixth insertion layer 622 may be described as layers containing TiAl.

The fifth and sixth filling layers 523 and 623 may be formed on the fifth and sixth insertion layers 522 and 622. The fifth filling layer 523 and the sixth filling layer 623 may be in direct contact with each other.

The fifth filling layer 523 may be formed on the first active region 10 and the second field insulating layer 106. The sixth filling layer 623 may be formed on the second active region 20 and the second field insulating layer 106.

The fifth filling layer 523 and the sixth filling layer 623 may be separated by the first contact surface MI1 of the fifth gate electrode structure 50. The fifth filling layer 523 and the sixth filling layer 623 may be formed on the same level.

The fifth filling layer 523 and the sixth filling layer 623 may include the same material. The fifth and sixth filling layers 523 and 623 may include at least one of W, Al, Co, Cu, Ru, Ni, Pt, Ni—Pt, and TiN.

The fifth insertion layer 522 and the fifth filling layer 523 disposed on the fifth work function control layer 521 may be a fifth upper conductive layer 527, and the sixth insertion layer 622 and the sixth filling layer 623 disposed on the sixth work function control layer 621 may be a sixth upper conductive layer 627.

A thickness h1 of the fifth upper conductive layer 527 may be a distance from the upper surface of the interlayer insulating film 190 to the fifth work function control layer 521 on the bottom surface of the fifth trench 50t, and a thickness h2 of the sixth upper conductive layer 627 may be a distance from the upper surface of the interlayer insulating film 190 to the sixth work function control layer 621 on the bottom surface of the fifth trench 50t.

The thickness h1 of the fifth upper conductive layer 527 may be different from the thickness h2 of the sixth upper conductive layer 627 on the second field insulating layer 106. For example, the thickness h1 of the fifth upper conductive layer 527 may be less than the thickness h2 of the sixth upper conductive layer 627.

Fifth source/drain regions 550 may respectively be formed on both sides of the first gate electrode 520, and sixth source/drain regions 650 may respectively be formed on both sides of the second gate electrode 620.

Although the fifth source/drain regions 550 and the sixth source/drain regions 650 are shown as including an epitaxial layer formed in the substrate 100, in some embodiments, the fifth source/drain regions 550 and the sixth source/drain regions 650 may be impurity regions formed by implanting impurities into the substrate 100.

In addition, the fifth source/drain regions 550 and the sixth source/drain regions 650 may be elevated source/drain regions having upper surfaces protruding above an upper surface of the substrate 100.

Figure 33:
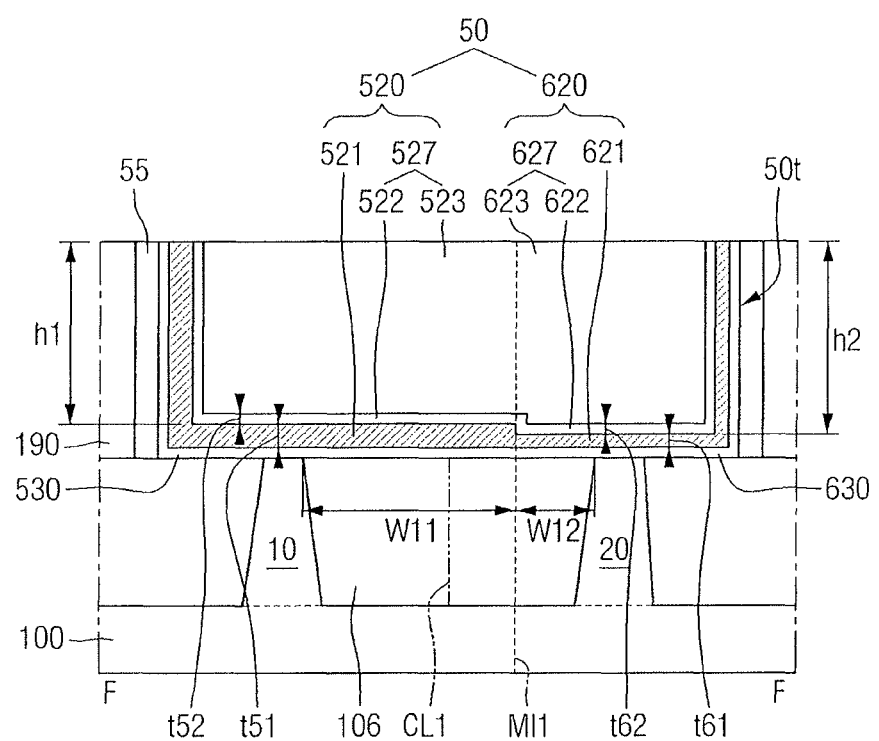
FIGS. 33 and 34 illustrate views of a semiconductor device according to some embodiments.
Figure 34:
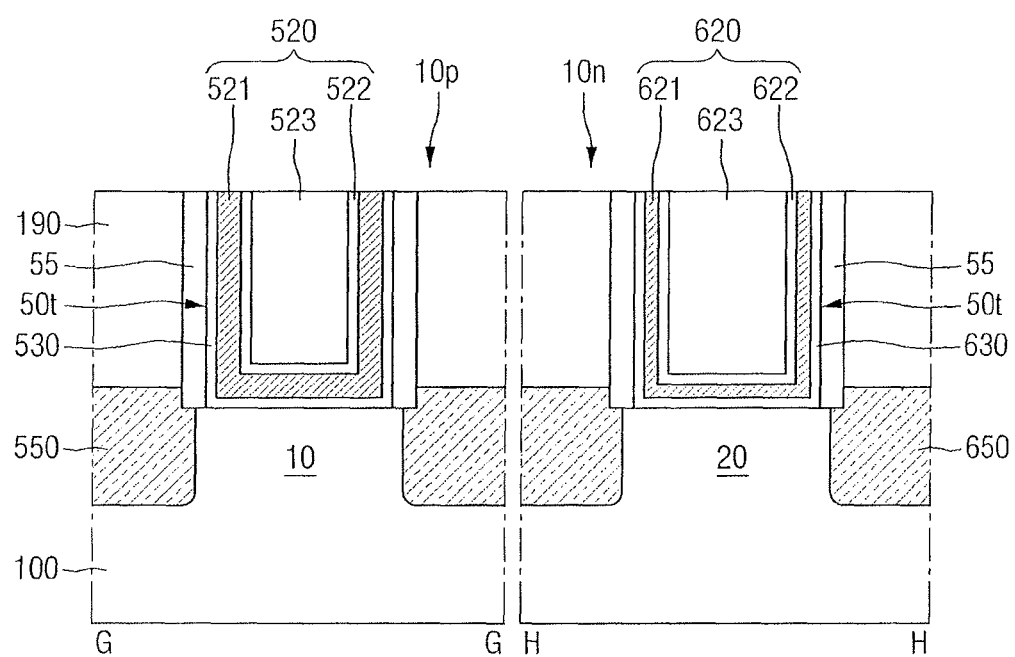

FIGS. 33 and 34 illustrate views of a semiconductor device according to embodiments. For ease of description, differences from the semiconductor device described above with reference to FIGS. 30 through 32B will be mainly described.

For reference, FIG. 33 illustrates a cross-sectional view taken along the line F-F of FIG. 30, and FIG. 34 illustrates a cross-sectional view taken along the lines G-G and H-H of FIG. 30.

Referring to FIGS. 33 and 34, in the semiconductor device according to some embodiments, a fifth work function control layer 521 may contact a fifth gate insulating layer 530, and a sixth work function control layer 621 may contact a sixth gate insulating layer 630.

A first gate electrode 520 may include the fifth work function control layer 521, a fifth insertion layer 522, and a fifth filling layer 523 formed sequentially on the fifth gate insulating layer 530.

A second gate electrode 620 may include the sixth work function control layer 621, a sixth insertion layer 622 and a sixth filling layer 623 formed sequentially on the sixth gate insulating layer 630.

A conductive layer may not be interposed between the fifth gate insulating layer 530 and the fifth work function control layer 521. Similarly, a conductive layer may not be interposed between the sixth gate insulating layer 630 and the sixth work function control layer 621.

Figure 35:
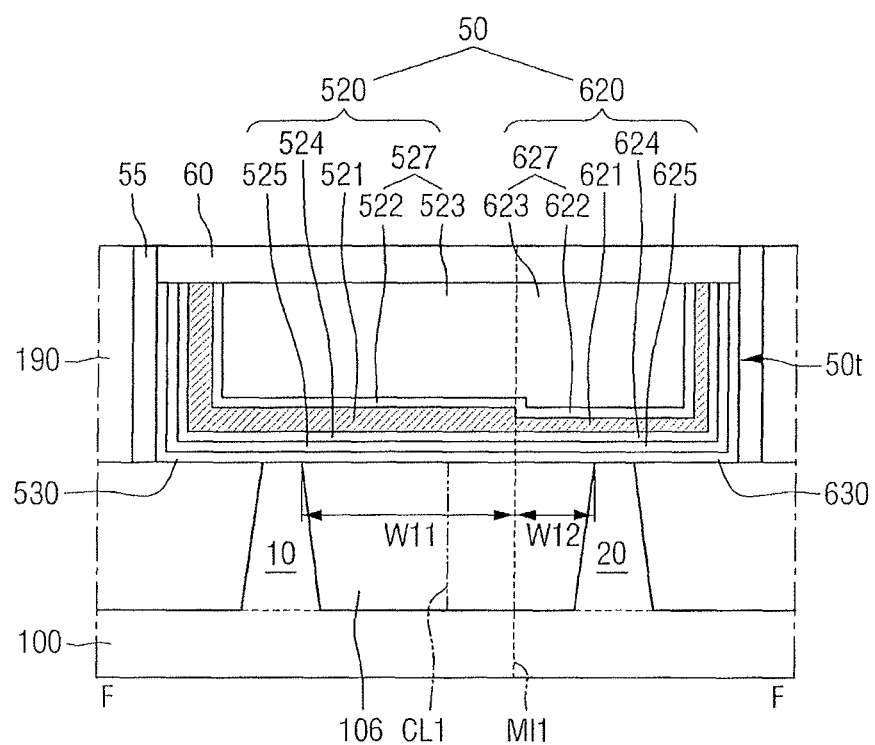
FIGS. 35 and 36 respectively illustrate views of semiconductor devices according to some embodiments.

FIG. 35 illustrates a view of a semiconductor device according to embodiments. For ease of description, differences from the semiconductor device described above with reference to FIGS. 30 through 32B will be mainly described.

Referring to FIG. 35, the semiconductor device according to some embodiments may further include a fifth capping pattern 60.

A fifth gate electrode structure 50 may partially fill a fifth trench 50t. The fifth capping pattern 60 may be formed on the fifth gate electrode structure 50.

Figure 36:
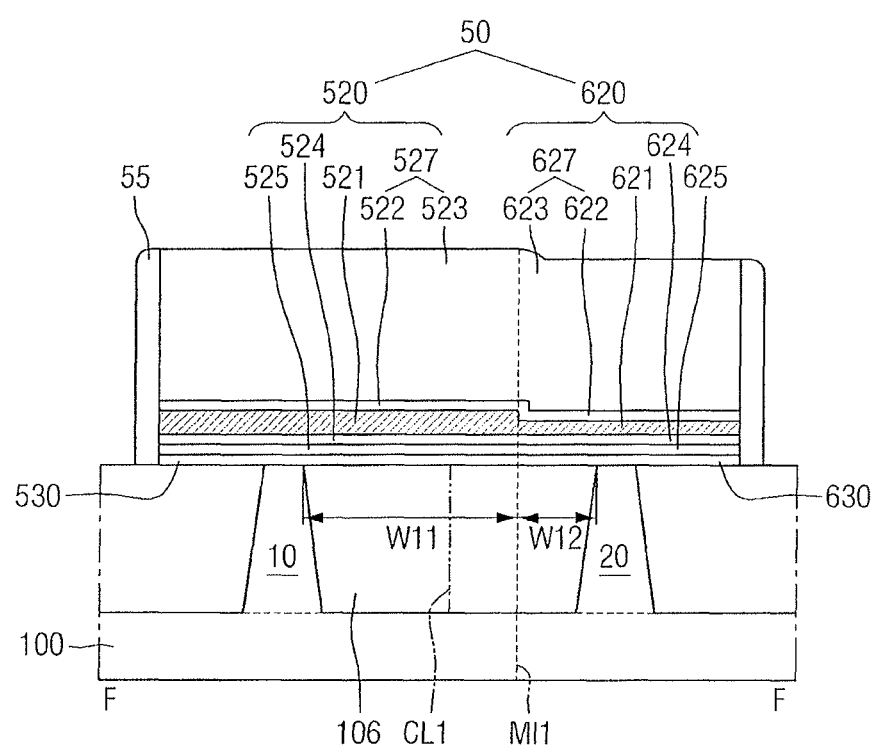

FIG. 36 illustrates a view of a semiconductor device according to embodiments. For ease of description, differences from the semiconductor device described above with reference to FIGS. 30 through 32B will be mainly described.

Referring to FIG. 36, a fifth gate insulating layer 530 and a sixth gate insulating layer 630 may include portions extending between a fifth gate electrode structure 50 and fifth gate spacers 55.

In addition, in a first gate electrode 520, a fifth lower conductive layer 525, a fifth etch-stop layer 524, a fifth work function control layer 521, and a fifth insertion layer 522 may not include portions extending along an inner wall of a fifth gate spacer 55.

Similarly, in a second gate electrode 620, a sixth lower conductive layer 625, a sixth etch-stop layer 624, a sixth work function control layer 621, and a sixth insertion layer 622 may not include portions extending along an inner wall of a fifth gate spacer 55.

Figure 37:
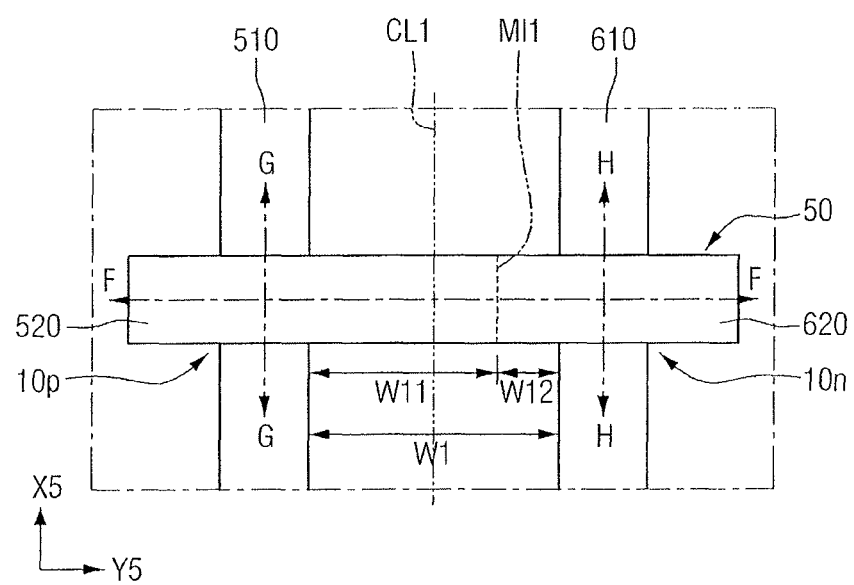
FIG. 37 illustrates a plan view of a semiconductor device according to some embodiments.
Figure 38:
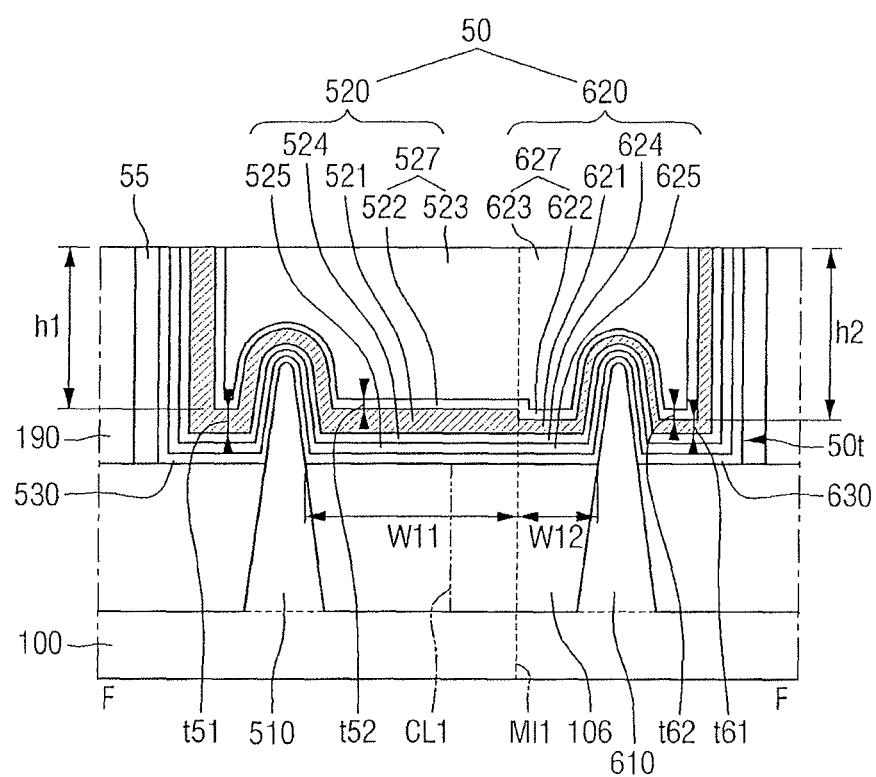
FIG. 38 illustrates a cross-sectional view taken along the line F-F of FIG. 37.

FIG. 37 illustrates a plan view of a semiconductor device according to embodiments. FIG. 38 illustrates a cross-sectional view taken along the line F-F of FIG. 37. For ease of description, differences from the semiconductor device described above with reference to FIGS. 30 through 32B will be mainly described.

For reference, FIG. 38 may be substantially the same as FIG. 31 except for including fin patterns. Therefore, a description of elements and features identical to those of FIG. 31 will not be repeated or will be given briefly. For example, a fifth fin pattern 510 may correspond to a first active region 10, and a sixth fin pattern 610 may correspond to a second active region 20.

In FIG. 37, a cross-sectional view taken along the fifth fin pattern 510 and the sixth fin pattern 610 may be substantially the same as in FIG. 32A except for including fin patterns.

For ease of description, FIG. 37 schematically illustrates only the fifth fin pattern 510, the sixth fin pattern 610, and a fifth gate electrode structure 50.

Referring to FIGS. 37 and 38, the semiconductor device according to some embodiments includes the fifth fin pattern 510, the sixth fin pattern 610 disposed adjacent to the fifth fin pattern 510, a second field insulating layer 106 located between the fifth fin pattern 510 and the sixth fin pattern 610, and the fifth gate electrode structure 50 crossing the fifth fin pattern 510, the second field insulating layer 106 and the sixth fin pattern 610.

The fifth fin pattern 510 and the sixth fin pattern 610 may protrude from a substrate 100. The fifth fin pattern 510 and the sixth fin pattern 610 may extend in a ninth direction X5.

The fifth fin pattern 510 may be a region in which a PMOS is formed. The sixth fin type pattern 610 may be a region in which an NMOS is formed. For example, the fifth fin pattern 510 and the sixth fin pattern 610 may be formed in an SRAM region.

The fifth fin pattern 510 and the sixth fin pattern 610 may be part of the substrate 100 or may include an epitaxial layer grown from the substrate 100.

Each of the fifth fin pattern 510 and sixth fin pattern 610 may include an elemental semiconductor material such as silicon or germanium. In addition, each of the fifth fin pattern 510 and the sixth fin pattern 610 may include a compound semiconductor such as a group IV-IV compound semiconductor or a group III-V compound semiconductor.

The second field insulating layer 106 may partially cover sidewalls of the fifth fin pattern 510 and sidewalls of the sixth fin pattern 610. Accordingly, the fifth fin pattern 510 and the sixth fin pattern 610 may protrude above an upper surface of the second field insulating layer 106 formed on the substrate 100.

The fifth fin pattern 510 and the sixth fin pattern 610 may be defined by the second field insulating layer 106. The fifth fin pattern 510 and the sixth fin pattern 610 may be spatially separated but adjacent to each other.

The second field insulating layer 106 may be disposed between the fifth and the sixth fin patterns 510 and 610 and may be in direct contact with the fifth and the sixth fin patterns 510 and 610.

The second field insulating layer 106 may be in direct contact with the fifth and the sixth fin patterns 510 and 610 in the absence of a fin pattern that protrudes above the upper surface of the second field insulating layer 106 between the fifth and sixth fin patterns 510 and 610.

In some implementations, the second field insulating layer 106 may further include at least one field liner layer between the fifth fin pattern 510 and the second field insulating layer 106 and between the sixth fin pattern 610 and the second field insulating layer 106.

A distance from a first center line CL1 to the fifth fin pattern 510 may be equal to a distance from the first center line CL1 to the sixth fin pattern 610.

The fifth gate electrode structure 50 may cross the fifth fin pattern 510, the sixth fin pattern 610, and the second field insulating layer 106. The fifth gate electrode structure 50 may extend in a tenth direction Y5.

A first gate electrode 520 may be formed on the fifth fin pattern 510 and the second field insulating layer 106. A second gate electrode 620 may be formed on the sixth fin pattern 610 and the second field insulating layer 106.

A fifth transistor 10p formed in a region where the fifth fin pattern 510 and the fifth gate electrode structure 50 intersect each other may be a p-type fin transistor. A sixth transistor 10n formed in a region where the sixth fin pattern 610 and the fifth gate electrode structure 50 intersect each other may be an n-type fin transistor.

A first contact surface MI1 between the first gate electrode 520 and the second gate electrode 620 may be closer to the sixth fin pattern 610 than to the fifth fin pattern 510 or may be closer to the fifth fin pattern 510 than to the sixth fin pattern 610.

In the semiconductor device according to the embodiment described with reference to FIG. 37, the first contact surface MI1 between the first gate electrode 520 and the second gate electrode 620 may be located closer to the sixth fin pattern 610 than to the fifth fin pattern 510.

Accordingly, a width W11 of the first gate electrode 520 overlapping the second field insulating layer 106 may be greater than a width W12 of the second gate electrode 620 overlapping the second field insulating layer 106.

A fifth trench 50*t* defined by fifth gate spacers 55 may traverse the fifth fin pattern 510, the second field insulating layer 106, and the sixth fin pattern 610. For example, the fifth trench 50*t* may intersect the fifth fin pattern 510 and the sixth fin pattern 610.

A fifth gate insulating layer 530 may be formed on the second field insulating layer 106 and the fifth fin pattern 510. The fifth gate insulating layer 530 may be formed along the upper surface of the second field insulating layer 106 and the profile of the fifth fin pattern 510.

A sixth gate insulating layer 630 may be formed on the second field insulating layer 106 and the sixth fin pattern 610. The sixth gate insulating layer 630 may be formed along the upper surface of the second field insulating layer 106 and the profile of the sixth fin pattern 610.

The fifth and sixth gate insulating layers 530 and 630 extending along a bottom surface of the fifth trench 50*t* may be formed along the profile of the fifth fin pattern 510, the upper surface of the second field insulating layer 106, and the profile of the sixth fin pattern 610.

The fifth gate electrode structure 50 may be formed on the fifth and sixth gate insulating layers 530 and 630.

The first gate electrode 520 may be formed on the fifth gate insulating layer 530 and may intersect the fifth fin pattern 510. The second gate electrode 620 may be formed on the sixth gate insulating layer 630 and may intersect the sixth fin pattern 610.

A fifth lower conductive layer 525, a fifth etch-stop layer 524, a fifth work function control layer 521, and a fifth insertion layer 522 may be formed along the profile of the fifth gate insulating layer 530.

For example, the fifth lower conductive layer 525, the fifth etch-stop layer 524, the fifth work function control layer 521, and the fifth insertion layer 522 may extend along the profile of the fifth fin pattern 510 and the upper surface of the second field insulating layer 106.

A sixth lower conductive layer 625, a sixth etch-stop layer 624, a sixth work function control layer 621, and a sixth insertion layer 622 may be formed along the profile of the sixth gate insulating layer 630.

The sixth lower conductive layer 625, the sixth etch-stop layer 624, the sixth work function control layer 621, and the sixth insertion layer 622 may extend along the profile of the sixth fin pattern 610 and the upper surface of the second field insulating layer 106.

The fifth and sixth work function control layers 521 and 621 extending along the bottom surface of the fifth trench 50*t* may extend continuously along the profile of the fifth fin pattern 510, the upper surface of the second field insulating layer 106 and the profile of the sixth fin pattern 610.

In FIG. 38, a thickness t51 of the fifth work function control layer 521 may be greater than a thickness t61 of the sixth work function control layer 621. A thickness t52 of the fifth insertion layer 522 may be substantially equal to a thickness t62 of the sixth insertion layer 622.

A thickness h1 of a fifth upper conductive layer 527 from an upper surface of an interlayer insulating film 190 to the fifth work function control layer 521 may be less than a thickness h2 of a sixth upper conductive layer 627 from the upper surface of the interlayer insulating film 190 to the sixth work function control layer 621.

Figure 39A:
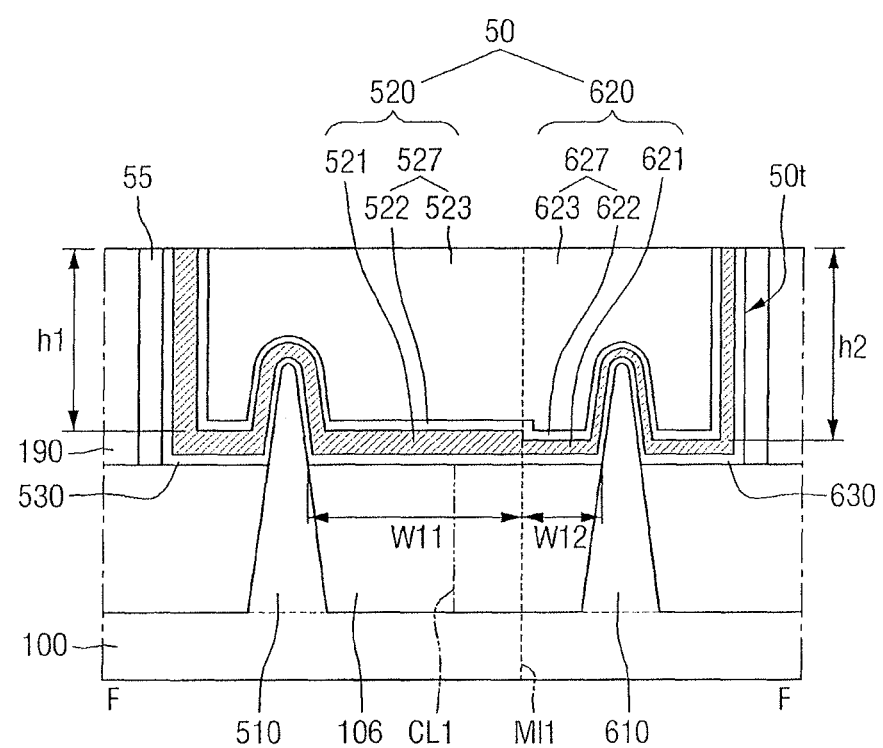
FIGS. 39A and 39B respectively illustrate views of semiconductor devices according to some embodiments.

FIG. 39A illustrates a view of a semiconductor device according to embodiments. For ease of description, differences from the semiconductor device described above with reference to FIGS. 37 and 38 will mainly be described.

Referring to FIG. 39A, in the semiconductor device according to some embodiments, a first gate electrode 520 may include a fifth work function control layer 521, a fifth insertion layer 522, and a fifth filling layer 523 formed sequentially on a fifth gate insulating layer 530.

A second gate electrode 620 may include a sixth work function control layer 621, a sixth insertion layer 622, and a sixth filling layer 623 formed sequentially on a sixth gate insulating layer 630.

The fifth work function control layer 521 may contact the fifth gate insulating layer 530. The sixth work function control layer 621 may contact the sixth gate insulating layer 630.

Figure 39B:
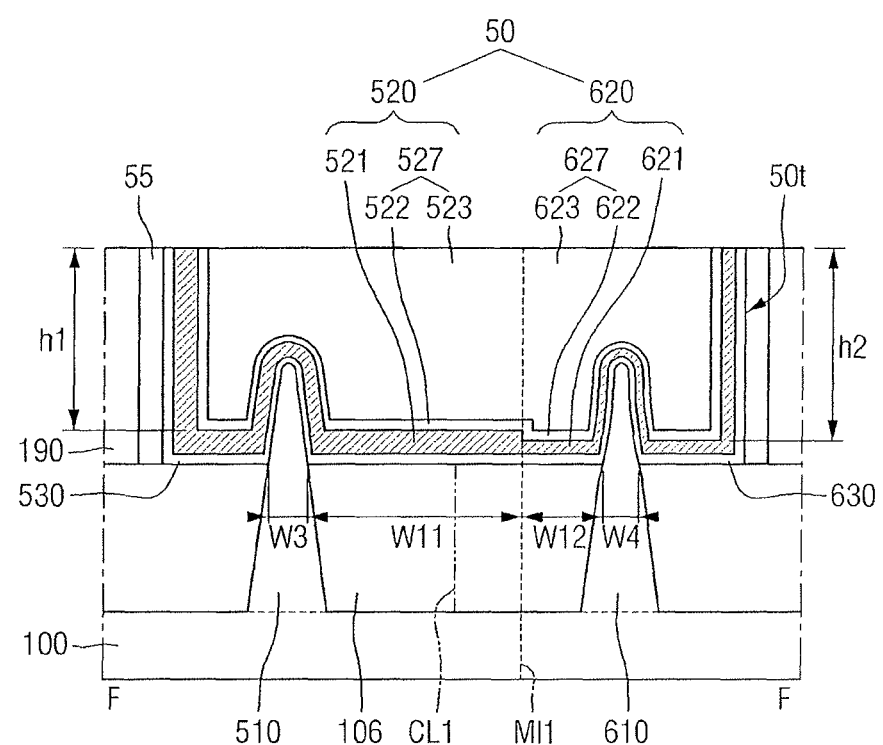

FIG. 39B illustrates a view of a semiconductor device according to embodiments. For ease of description, differences from the semiconductor device described above with reference to FIG. 39A will be mainly described.

Referring to FIG. 39B, in the semiconductor device according to some embodiments, a width W3 of a fifth fin pattern 510 may be different from a width W4 of a sixth fin pattern 610.

For example, the width W3 of the fifth fin pattern 510 may be greater than the width W4 of the sixth fin pattern 610.

The width of a fin pattern may denote the width of the fin pattern at a portion where the fin pattern meets an upper surface of a second field insulating layer 106. For example, if the number of processes for adjusting the shape of the fifth fin pattern 510 is different from the number of processes for adjusting the shape of the sixth fin pattern 610, the width of the fifth fin pattern 510 may be different from that of the sixth fin pattern 610.

In some implementations, the width W3 of the fifth fin pattern 510 may be smaller than the width W4 of the sixth fin pattern 610.

Figure 40:
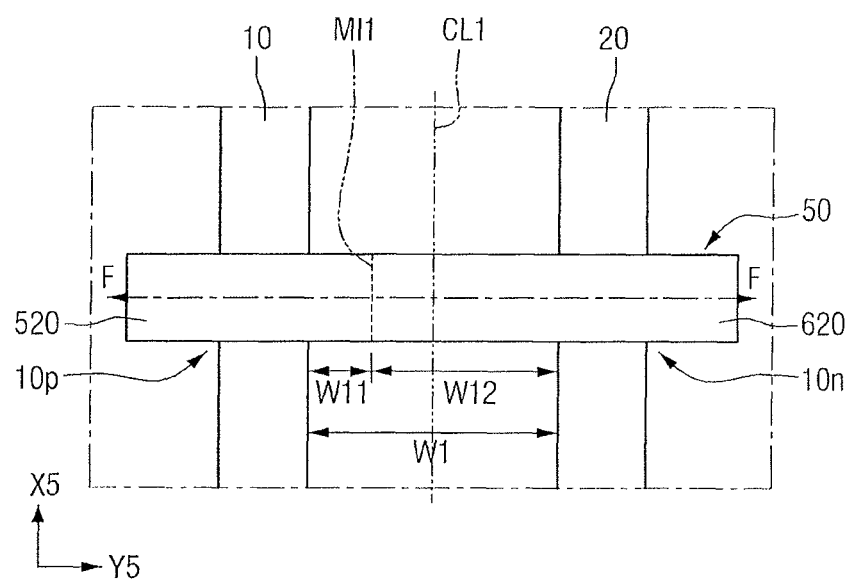
FIG. 40 illustrates a plan view of a semiconductor device according to some embodiments.
Figure 41:
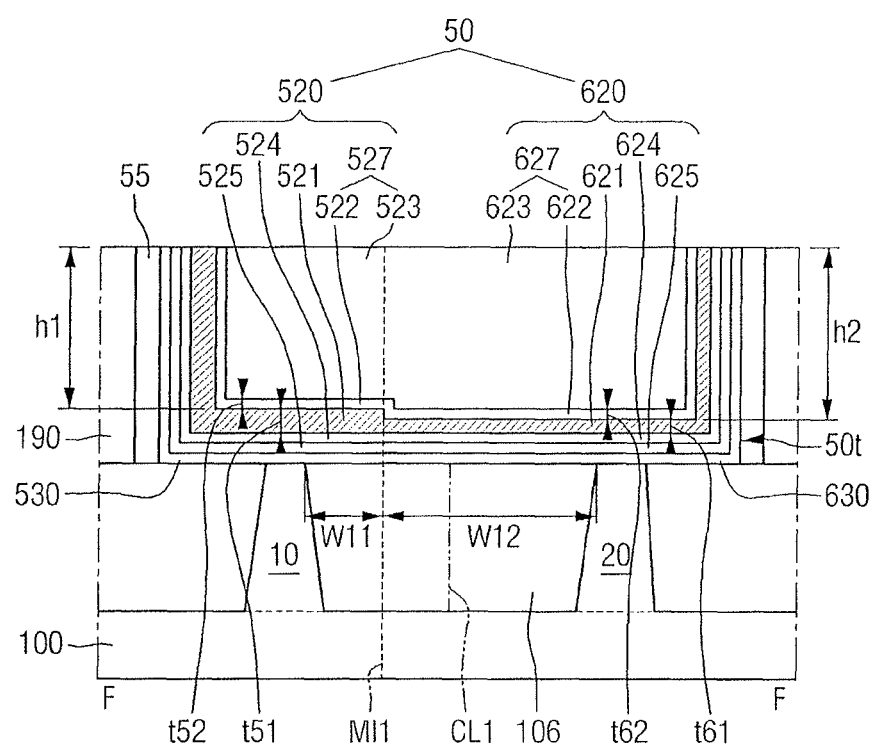
FIG. 41 illustrates a cross-sectional view taken along the line F-F of FIG. 40.

FIG. 40 illustrates a plan view of a semiconductor device according to embodiments. FIG. 41 illustrates a cross-sectional view taken along the line F-F of FIG. 40. For ease of description, differences from the semiconductor device described above with reference to FIGS. 30 through 32B will be mainly described.

In addition, in FIG. 40, a cross-sectional view taken along a first active region 10 and a second active region 20 may be substantially the same as that of FIG. 32A.

Referring to FIGS. 40 and 41, in the semiconductor device according to some embodiments, a first contact surface MI1 between a first gate electrode 520 and a second gate electrode 620 may be located closer to the first active region 10 than to the second active region 20.

The first active region 10, the first contact surface MI1, a first center line CL1, and the second active region 20 may be arranged sequentially in this order. Accordingly, the first gate electrode 520 may not overlap the first center line CL1 of a second field insulating layer 106. For example, the first contact surface MI1 may be located between the first active region 10 and the first center line CL1 of the second field insulating layer 106.

The first active region 10 may include a channel region of a p-type transistor, and the second active region 20 includes a channel region of an n-type transistor. The first contact surface MI1 between the first gate electrode 520 and the second gate electrode 620 may be located closer to the first active region 10 than to the second active region 20. Accordingly, the first contact surface MI1 may be closer to the channel region of the p-type transistor than to the channel region of the n-type transistor.

The first contact surface MI1 between the first gate electrode 520 and the second gate electrode 620 may be located closer to the first active region 10 than to the second active region 20. Accordingly, a width W11 of the first gate electrode 520 overlapping the second field insulating layer 106 may be smaller than a width W12 of the second gate electrode 620 overlapping the second field insulating layer 106.

The first gate electrode 520 may include a fifth lower conductive layer 525, a fifth etch-stop layer 524, a fifth work function control layer 521, a fifth insertion layer 522, and a fifth filling layer 523 formed sequentially on a fifth gate insulating layer 530.

The second gate electrode 620 may include a sixth lower conductive layer 625, a sixth etch-stop layer 624, a sixth work function control layer 621, a sixth insertion layer 622, and a sixth filling layer 623 formed sequentially on a sixth gate insulating layer 630.

The first contact surface MI1 between the first gate electrode 520 and the second gate electrode 620 may be located closer to the first active region 10 than to the second active region 20. Accordingly, the width W11 by which the fifth work function control layer 521 and the second field insulating layer 106 overlap each other may be smaller than the width W12 by which the sixth work function control layer 621 and the second field insulating layer 106 overlap each other.

In addition, the first active region 10, the first contact surface MI1, the first center line CL1, and the second active region 20 may be arranged sequentially in this order. Accordingly the fifth work function control layer 521 may not overlap the first center line CL1 of the second field insulating layer 106.

Figure 42:
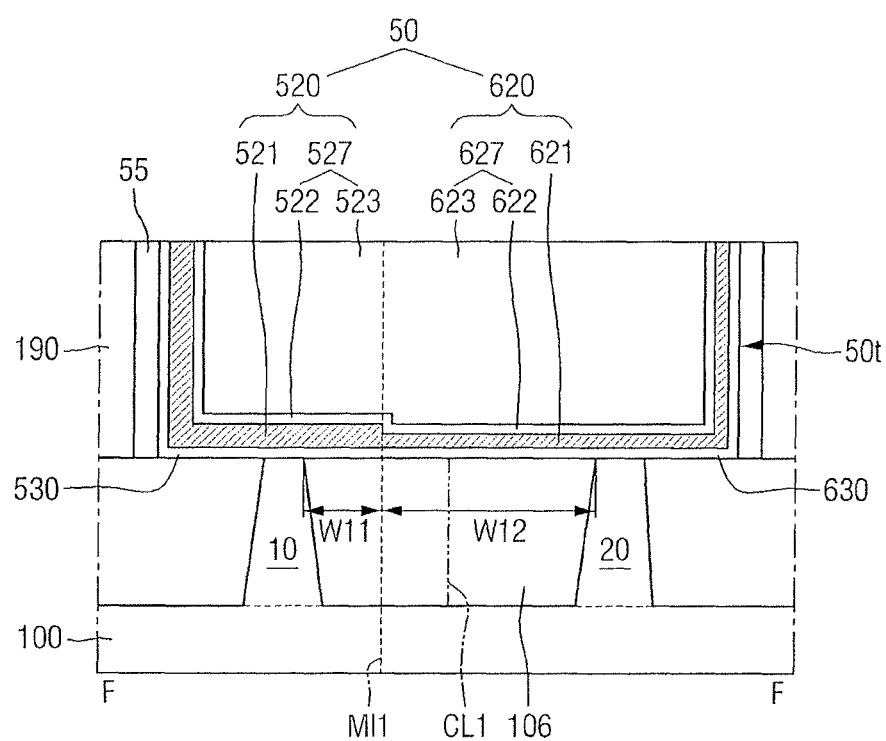
FIG. 42 illustrates a view of a semiconductor device according to some embodiments.

FIG. 42 illustrates a view of a semiconductor device according to embodiments. For ease of description, differences from the semiconductor device described above with reference to FIGS. 40 and 41 will be mainly described.

Referring to FIG. 42, in the semiconductor device according to some embodiments, a fifth work function control layer 521 may contact a fifth gate insulating layer 530, and a sixth work function control layer 621 may contact a sixth gate insulating layer 630.

Figure 43:
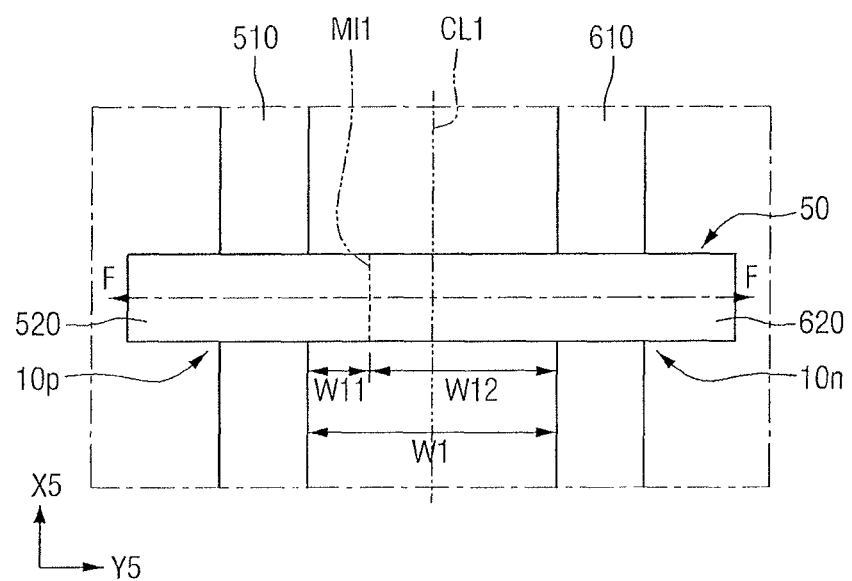
FIG. 43 illustrates a plan view of a semiconductor device according to some embodiments.
Figure 44:
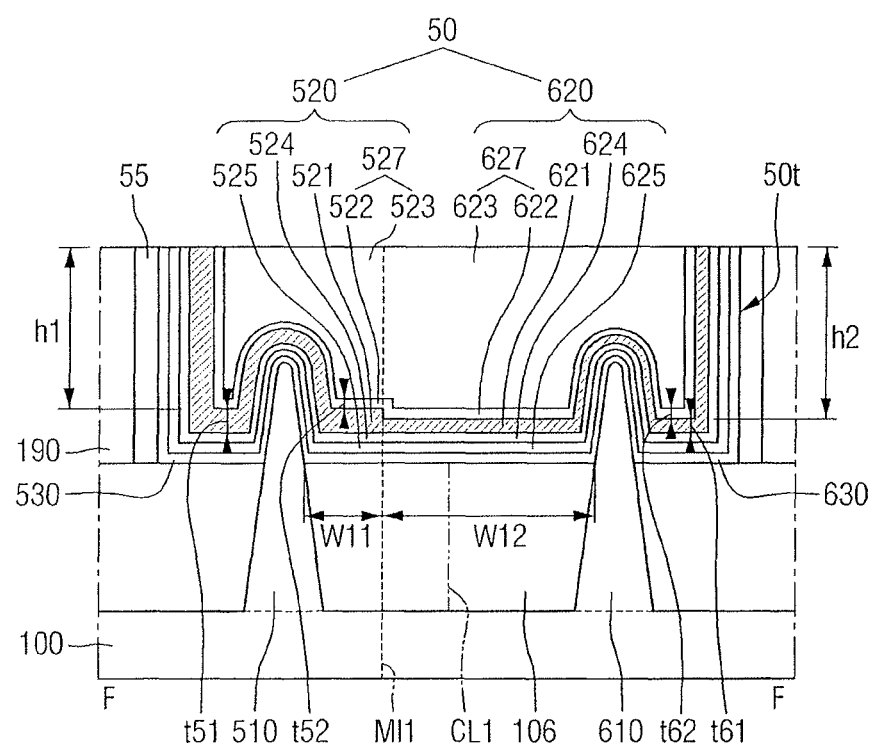
FIG. 44 illustrates a cross-sectional view taken along the line F-F of FIG. 43.

FIG. 43 illustrates a plan view of a semiconductor device according to embodiments. FIG. 44 illustrates a cross-sectional view taken along the line F-F of FIG. 43.

For ease of description, differences from the semiconductor device described above with reference to FIGS. 40 and 41 will be mainly described.

Referring to FIGS. 43 and 44, the semiconductor device according to some embodiments may include a fifth fin pattern 510 and a sixth fin pattern 610 adjacent to the fifth fin pattern 510.

A first contact surface MI1 of a fifth gate electrode structure 50, which intersects the fifth and sixth fin patterns 510 and 610, may be closer to the fifth fin pattern 510 than to the sixth fin pattern 610.

A width W11 by which a first gate electrode 520 formed on the fifth fin pattern 510 overlaps a second field insulating layer 106 may be smaller than a width W12 by which a second gate electrode 620 formed on the sixth fin pattern 610 overlaps the second field insulating layer 106.

The first contact surface MI1 of the fifth gate electrode structure 50 may be defined at a boundary between the fifth work function control layer 521 and the sixth work function control layer 621. The width W11 by which the fifth work function control layer 521 formed along the profile of the fifth fin pattern 510 overlaps the second field insulating layer 106 may be smaller than the width W12 by which the sixth work function control layer 621 formed along the profile of the sixth fin pattern 610 overlaps the second field insulating layer 106.

Figure 45:
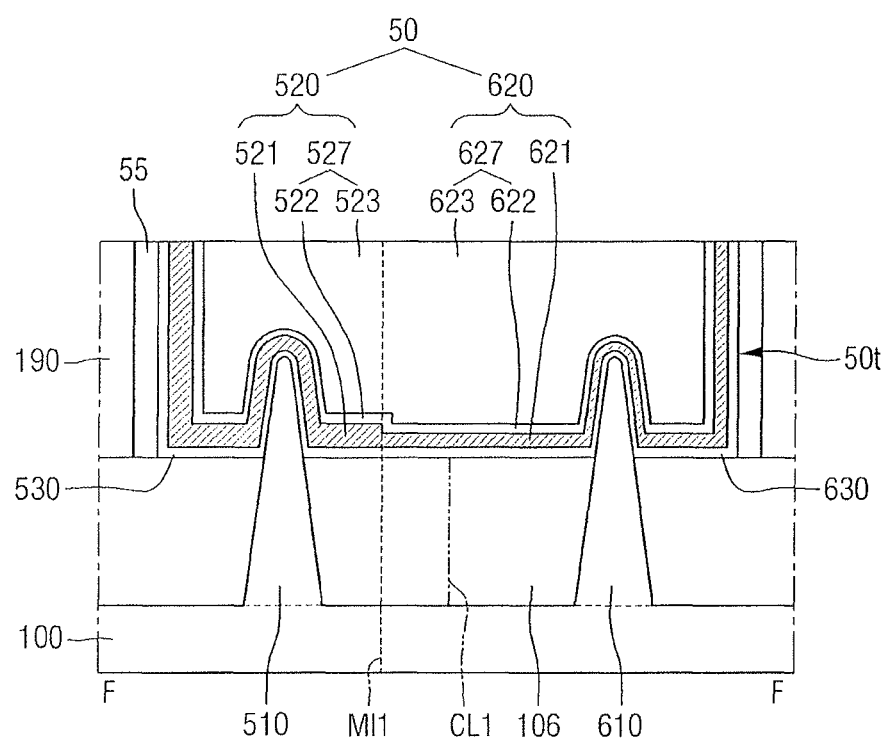
FIG. 45 illustrates a view of a semiconductor device according to some embodiments.

FIG. 45 illustrates a view of a semiconductor device according to embodiments. For ease of description, differences from the semiconductor device described above with reference to FIGS. 43 and 44 will be mainly described.

Referring to FIG. 45, in the semiconductor device according to some embodiments, a first gate electrode 520 may include a fifth work function control layer 521 formed on a fifth gate insulating layer 530 to be in contact with the fifth gate insulating layer 530, a fifth insertion layer 522 formed on the fifth work function control layer 521, and a fifth filling layer 523 formed on the fifth insertion layer 522.

A second gate electrode 620 may include a sixth work function control layer 621 formed on a sixth gate insulating layer 630 to be in contact with the sixth gate insulating layer 630, a sixth insertion layer 622 formed on the sixth work function control layer 621, and a sixth filling layer 623 formed on the sixth insertion layer 622.

Figure 46:
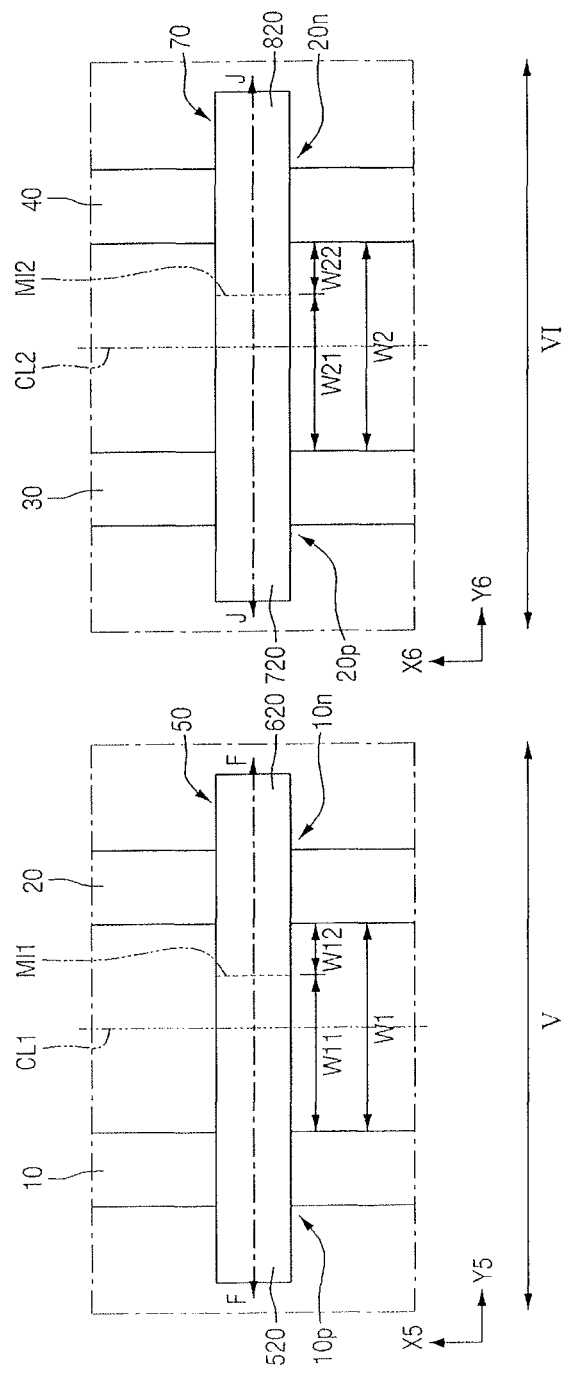
FIG. 46 illustrates a plan view of a semiconductor device according to some embodiments.
Figure 47:
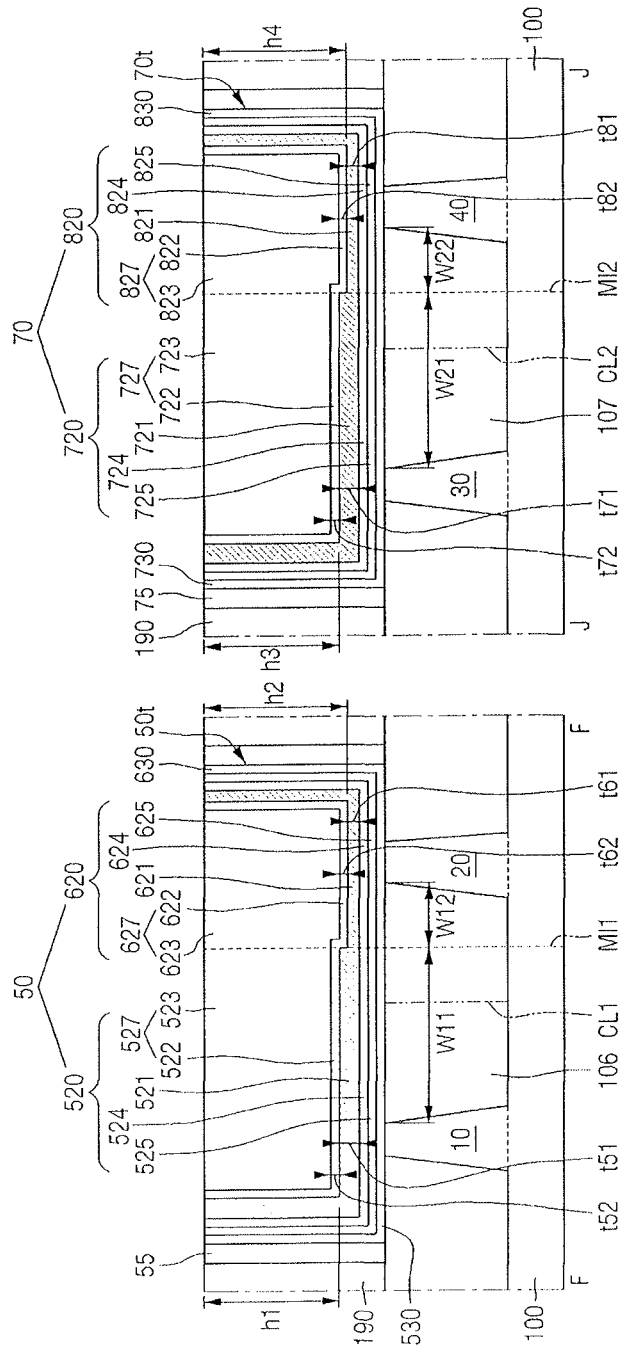
FIG. 47 illustrates a cross-sectional view taken along the lines F-F and J-J of FIG. 46.

FIG. 46 illustrates a plan view of a semiconductor device according to embodiments. FIG. 47 illustrates a cross-sectional view taken along the lines F-F and J-J of FIG. 46.

A first active region 10, a second active region 20, and a fifth gate electrode structure 50 shown in a fifth region V of FIGS. 46 and 47 may be substantially the same as those described above with reference to FIGS. 30 through 32B. Therefore, FIGS. 46 and 47 will be described, focusing on elements of a sixth region VI.

Referring to FIGS. 46 and 47, the semiconductor device according to some embodiments may include a substrate 100 including the fifth region V and the sixth region VI, the fifth gate electrode structure 50 formed in the fifth region V, and a sixth gate electrode structure 70 formed in the sixth region VI.

The substrate 100 may include the first active region 10, the second active region 20, a third active region 30, a fourth active region 40, a second field insulating layer 106, and a third field insulating layer 107.

The fifth region V and the sixth region VI may be regions in which elements having different functions are formed. For example, the fifth region V may be an SRAM region, and the sixth region VI may be a logic region or an I/O region.

The substrate 100 of the fifth region V may include the first active region 10, the second active region 20 and the second field insulating layer 106.

The substrate 100 of the sixth region VI may include the third active region 30, the fourth active region 40 and the third field insulating layer 107.

The third active region 30 and the fourth active region 40 may be defined by the third field insulating layer 107. The third active region 30 and the fourth active region 40 may be spatially separated but adjacent to each other.

Each of the third active region 30 and the fourth active region 40 may be shaped as a rectangle extending in an eleventh direction X6, as examples. The third active region 30 and the fourth active region 40 may be arranged side by side so as to be adjacent to each other in a long-side direction.

The third active region 30 may be a region in which a PMOS is formed, and the fourth active region 40 may be a region in which an NMOS is formed.

The third field insulating layer 107 may surround the third active region 30 and the fourth active region 40. In some implementations, the third field insulating layer 107 may be a portion located between the third active region 30 and the fourth active region 40.

The third field insulating layer 107 may be disposed between the third active region 30 and the fourth active region 40 and may be in direct contact with the third active region 30 and the fourth active region 40.

For example, the third field insulating layer 107 may directly contact the third active region 30 and the fourth active region 40 due to an absence of another active region between the third field insulating layer 107 and the third active region 30 and between the third field insulating layer 107 and the fourth active region 40.

A width of the third field insulating layer 107 located between the third active region 30 and the fourth active region 40 may be a second width W2. The third field insulating layer 107 may include a second center line CL2 located at a same distance from the third active region 30 and the fourth active region 40.

For example, a distance from the second center line CL2 to the third active region 30 may be equal to a distance from the second center line CL2 to the fourth active region 40 and may be half of the second width W2. The second center line CL2 of the third field insulating layer 107 may extend parallel to the third active region 30 and the fourth active region 40.

The fifth gate electrode structure 50 may be formed on the substrate 100 of the fifth region V.

The sixth gate electrode structure 70 may be formed on the substrate 100 of the sixth region VI. The sixth gate electrode structure 70 may cross the third active region 30, the fourth active region 40, and the third field insulating layer 107. The sixth gate electrode structure 70 may extend in a twelfth direction Y6.

The sixth gate electrode structure 70 may include a third gate electrode 720 and a fourth gate electrode 820. The third gate electrode 720 and the fourth gate electrode 820 may be in direct contact with each other.

The third gate electrode 720 may be a p-type metallic gate electrode and may be formed on the third active region 30 and the third field insulating layer 107. The fourth gate electrode 820 may be an n-type metal gate electrode and may be formed on the fourth active region 40 and the third field insulating layer 107.

A seventh transistor 20p may be formed in a region in which the third active region 30 and the sixth gate electrode structure 70 intersect each other. An eighth transistor 20n may be formed in a region in which the fourth active region 40 and the sixth gate electrode structure 70 intersect each other. The seventh transistor 20p may be a p-type transistor, and the eighth transistor 20n may be an n-type transistor.

The third gate electrode 720 may extend onto the third field insulating layer 107. The third gate electrode 720 may overlap not only the third active region 30 but also a portion of the third field insulating layer 107.

The fourth gate electrode 820 may be in direct contact with the third gate electrode 720. The fourth gate electrode 820 may overlap not only the fourth active region 40 but also the other portion of the third field insulating layer 107 that is not overlapped by the third gate electrode 720.

The sixth gate electrode structure 70 may include a second contact surface MI2 at which the third gate electrode 720 and the fourth gate electrode 820 contact each other. The second contact surface MI2 at which the third gate electrode 720 and the fourth gate electrode 820 contact each other may be located on the third field insulating layer 107.

In FIG. 46, a first contact surface MI1 between a first gate electrode 520 and a second gate electrode 620 may not coincide with a first center line CL1 of the second field insulating layer 106. In addition, the second contact surface MI2 between the third gate electrode 720 and the fourth gate electrode 820 may not coincide with the second center line CL2 of the third field insulating layer 107.

The first contact surface MI1 between the first gate electrode 520 and the second gate electrode 620 may be located closer to the second active region 20 than to the first active region 10. The second contact surface MI2 between the third gate electrode 720 and the fourth gate electrode 820 may be located closer to the fourth active region 40 than to the third active region 30.

The second gate electrode 620 may not overlap the first center line CL1 of the second field insulating layer 106. The fourth gate electrode 820 may not overlap the second center line CL2 of the third field insulating layer 107.

The third active region 30 may include a channel region of a p-type transistor. The fourth active region 40 may include a channel region of an n-type transistor. The second contact surface MI2 between the third gate electrode 720 and the fourth gate electrode 820 may be located closer to the fourth active region 40 than to the third active region 30. Accordingly, the second contact surface MI2 may be closer to the channel region of the n-type transistor than to the channel region of the p-type transistor.

A width of a portion of the third gate electrode 720 that extends on the third field insulating layer 107 may be a third overlapping width W21. The width of the third gate electrode 720 from the second contact surface MI2 to a boundary of the third active region 30 may be the third overlapping width W21.

A width of a portion of the fourth gate electrode 820 that extends on the third field insulating layer 107 may be a fourth overlapping width W22. The width of the fourth gate electrode 820 from the second contact surface MI2 to a boundary of the fourth active region 40 may be the fourth overlapping width W42.

In FIG. 46, the first contact surface MI1 between the first gate electrode 520 and the second gate electrode 620 may be located closer to the second active region 20 than to the first active region 10. Accordingly, the first overlapping width W11 may be greater than second overlapping width W12. The second contact surface MI2 between the third gate electrode 720 and the fourth gate electrode 820 may be located closer to the fourth active region 40 than to the third active region 30. Accordingly, the third overlapping width W21 may be greater than the fourth overlapping width W22.

The width W11 of the first gate electrode 520 overlapping the second field insulating layer 106 may be greater than the width W12 of the second gate electrode 620 overlapping the second field insulating layer 106. The width W21 of the third gate electrode 720 overlapping the third field insulating layer 107 may be greater than the width W22 of the fourth gate electrode 820 overlapping the third field insulating layer 107.

The structures of the third gate electrode 720 and the fourth gate electrode 820 will be described in detail below.

An interlayer insulating film 190 may include a fifth trench 50t formed in the fifth region V and a sixth trench 70t included in the sixth region VI.

The sixth trench 70t may cross the third active region 30, the third field insulating layer 107, and the fourth active region 40. For example, the sixth trench 70t may intersect the third active region 30 and the fourth active region 40. The sixth trench 70t may extend in the twelfth direction Y6.

Fifth gate spacers 55 formed in the fifth region V may define the fifth trench 50t. Sixth gate spacers 75 formed in the sixth region VI may define the sixth trench 70t. The sixth gate spacers 75 may be formed on the substrate 100. The sixth gate spacers 75 may be formed on sidewalls of the sixth gate electrode structure 70.

The sixth gate electrode structure 70 may extend in the twelfth direction Y6. Accordingly, the sixth gate electrode structure 70 may include long sides extending in the twelfth direction Y6 and short sides extending in the eleventh direction X6.

The sixth gate spacers 75 are shown as being formed on sidewalls including the long sides of the sixth gate electrode structure 70 and sidewalls including the short sides of the sixth gate electrode structure 70, as examples.

A description of the sixth gate spacers 75 may be substantially the same as the description of the fifth gate spacers 55 and thus will not be repeated.

A seventh gate insulating layer 730 and an eighth gate insulating layer 830 may be formed on the substrate 100. The seventh gate insulating layer 730 may be formed on the third active region 30 and the third field insulating layer 107. The eighth gate insulating layer 830 may be formed on the fourth active region 40 and the third field insulating layer 107.

The seventh gate insulating layer 730 and the eighth gate insulating layer 830 may extend along sidewalls and a bottom surface of the sixth trench 70t. The seventh and eighth gate insulating layers 730 and 830 extending along the bottom surface of the sixth trench 70t may traverse the third active region 30, the third field insulating layer 107 and the fourth active region 40.

The seventh gate insulating layer 730 and the eighth gate insulating layer 830 may be separated by the second contact surface MI2 of the sixth gate electrode structure 70. The fifth through eighth gate insulating layers 530 through 830 may be formed at a same level.

Each of the seventh gate insulating layer 730 and the eighth gate insulating layer 830 may include a high-k insulating layer.

The sixth gate electrode structure 70 may be formed on the seventh gate insulating layer 730 and the eighth gate insulating layer 830. The seventh gate insulating layer 730 and the eighth gate insulating layer 830 may be formed between the sixth gate electrode structure 70 and the substrate 100. The seventh gate insulating layer 730 and the eighth gate insulating layer 830 may be formed under the sixth gate electrode structure 70.

The sixth gate electrode structure 70 may fill the sixth trench 70t. An upper surface of the sixth gate electrode structure 70 may lie in the same plane with upper surfaces of the sixth gate spacers 75 and an upper surface of the interlayer insulating film 190.

The third gate electrode 720 may include a seventh lower conductive layer 725, a seventh etch-stop layer 724, a seventh work function control layer 721, a seventh insertion layer 722, and a seventh filling layer 723 formed sequentially on the seventh gate insulating layer 730.

The fourth gate electrode 820 may include an eighth lower conductive layer 825, an eighth etch-stop layer 824, an eighth work function control layer 821, an eighth insertion layer 822, and an eighth filling layer 823 formed sequentially on the eighth gate insulating layer 830.

The seventh lower conductive layer 725 and the eighth lower conductive layer 825 may be formed on the seventh and eighth gate insulating layers 730 and 830. The seventh lower conductive layer 725 may contact the seventh gate insulating layer 730, and the eighth lower conductive layer 825 may contact the eighth gate insulating layer 830.

The seventh lower conductive layer 725 may be formed on the third active region 30 and the third field insulating layer 107. The eighth lower conductive layer 825 may be formed on the fourth active region 40 and the third field insulating layer 107.

The seventh lower conductive layer 725 and the eighth lower conductive layer 825 may extend along the sidewalls and bottom surface of the sixth trench 70t. The seventh lower conductive layer 725 may extend along the profile of the seventh gate insulating layer 730, and the eighth lower conductive layer 825 may extend along the profile of the eighth gate insulating layer 830.

The seventh lower conductive layer 725 and the eighth lower conductive layer 825 may be separated by the second contact surface MI1 of the sixth gate electrode structure 70.

The fifth through eighth lower conductive layers 525 through 825 may include the same material.

The seventh etch-stop layer 724 and the eighth etch-stop layer 824 may be formed on the seventh and eighth lower conductive layers 725 and 825. The seventh etch-stop layer 724 may be formed on the third active region 30 and the third field insulating layer 107. The eighth etch-stop layer 824 may be formed on the fourth active region 40 and the third field insulating layer 107.

The seventh etch-stop layer 724 and the eighth etch-stop layer 824 may extend along the sidewalls and bottom surface of the sixth trench 70t. The seventh etch-stop layer 724 may extend along the profile of the seventh lower conductive layer 725, and the eighth etch-stop layer 824 may extend along the profile of the eighth lower conductive layer 825.

The seventh etch-stop layer 724 and the eighth etch-stop layer 824 may be separated by the second contact surface MI2 of the sixth gate electrode structure 70. The fifth through eighth etch-stop layers 524 through 824 may be formed at the same level. The fifth through eighth etch-stop layers 524 through 824 may have, for example, substantially the same thickness.

The fifth through eighth etch-stop layers 524 through 824 may include the same material.

The seventh work function control layer 721 and the eighth work function control layer 821 may be formed on the seventh and eighth etch-stop layers 724 and 824. The seventh work function control layer 721 may contact the seventh etch-stop layer 724, and the eighth work function control layer 821 may contact the eighth etch-stop layer 824.

The seventh work function control layer 721 may be formed on the third active region 30 and the third field insulating layer 107. The eighth work function control layer 821 may be formed on the fourth active region 40 and the third field insulating layer 107. The seventh work function control layer 721 and the eighth work function control layer 821 may be in direct contact with each other.

The seventh work function control layer 721 and the eighth work function control layer 821 may extend along the sidewalls and bottom surface of the sixth trench 70t. The seventh work function control layer 721 may extend along the profile of the seventh gate insulating layer 730 and the seventh etch-stop layer 724, and the eighth work function control layer 821 may extend along the profile of the eighth gate insulating layer 830 and the eighth etch-stop layer 824.

The fifth through eighth work function control layers 521 through 821 may include the same material. For example, the fifth through eighth work function control layers 521 through 821 may be the same material layer.

A thickness t71 of the seventh work function control layer 721 may be different from a thickness t81 of the eighth work function control layer 821. For example, the thickness t71 of the seventh work function control layer 721 may be greater than the thickness t81 of the eighth work function control layer 821.

The thickness t71 of the seventh work function control layer 721 included in a p-type gate electrode may be greater than the thickness t81 of the eighth work function control layer 821 included in an n-type gate electrode. For example, the thickness t71 of the seventh work function control layer 721 may be a thickness on the third active region 30, and the thickness t81 of the eighth work function control layer 821 may be a thickness on the fourth active region 40.

In the semiconductor device according to some embodiments, a difference between the thickness t71 of the seventh work function control layer 721 and the thickness t81 of the eighth work function control layer 821 may be greater than or equal to a difference between a thickness t51 of the fifth work function control layer 521 and a thickness t61 of the sixth work function control layer 621.

The second contact surface MI2 between the third gate electrode 720 and the fourth gate electrode 820 may be defined between the seventh and eighth work function control layers 721 and 821 having different thicknesses. For example, if the sixth gate electrode structure 70 were to be cut along a normal to the substrate 100 based on a boundary between the seventh work function control layer 721 and the eighth work function control layer 821 extending on the third field insulating layer 107, the second contact surface MI2 between the third gate electrode 720 and the fourth gate electrode 820 would be formed.

In FIG. 47, the first contact surface MI1 between the first gate electrode 520 and the second gate electrode 620 may be located closer to the second active region 20 than to the first active region 10. Accordingly a width W11 by which the fifth work function control layer 521 and the second field insulating layer 106 overlap each other may be greater than a width W12 by which the sixth work function control layer 621 and the second field insulating layer 106 overlap each other.

In addition, the second contact surface MI2 between the third gate electrode 720 and the fourth gate electrode 820 may be located closer to the fourth active region 40 than to the third active region 30. Accordingly, the width W21 by which the seventh work function control layer 721 and the third field insulating layer 107 overlap each other may be greater than the width W22 by which the eighth work function control layer 821 and the third field insulating layer 107 overlap each other.

Further, the first active region 10, the first center line CL1, the first contact surface MI1 and the second active region 20 may be arranged sequentially in this order. Accordingly the sixth work function control layer 621 may not overlap the first center line CL1 of the second field insulating layer 106. In addition, the third active region 30, the second center line CL2, the second contact surface MI2 and the fourth active region 40 may be arranged sequentially in this order. Accordingly, the eighth work function control layer 821 may not overlap the second center line CL2 of the third field insulating layer 107.

The seventh insertion layer 722 and the eighth insertion layer 822 may be formed on the seventh and eighth work function control layers 721 and 821. The seventh insertion layer 722 and the eighth insertion layer 822 may be in direct contact with each other.

The seventh insertion layer 722 may be formed on the third active region 30 and the third field insulating layer 107. The eighth insertion layer 822 may be formed on the fourth active region 40 and the third field insulating layer 107.

The seventh insertion layer 722 and the eighth insertion layer 822 may extend along the sidewalls and bottom surface of the sixth trench 70t. The seventh insertion layer 722 and the eighth insertion layer 822 may extend along the profile of the seventh and eighth work function control layers 721 and 821 which are in direct contact with each other.

The seventh insertion layer 722 and the eighth insertion layer 822 may be separated by the second contact surface MI2 of the sixth gate electrode structure 70. The fifth through eighth insertion layers 522 through 822 may be formed at the same level.

A thickness t52 of the fifth insertion layer 522 may be substantially equal to a thickness t62 of the sixth insertion layer 622. A thickness t72 of the seventh insertion layer 722 may be substantially equal to a thickness t82 of the eighth insertion layer 822. The thickness t52 of the fifth insertion layer 522 may be substantially equal to the thickness t72 of the seventh insertion layer 722.

The fifth through eighth insertion layers 522 through 822 may include the same material.

In the semiconductor device according to some embodiments, the fifth through eighth insertion layers 522 through 822 may be described as layers containing TiAl.

The seventh and eighth filling layers 723 and 823 may be formed on the seventh and eighth insertion layers 722 and 822. The seventh filling layer 723 and the eighth filling layer 823 may be in direct contact with each other.

The seventh filling layer 723 may be formed on the third active region 30 and the third field insulating layer 107. The eighth filling layer 823 may be formed on the fourth active region 40 and the third field insulating layer 107.

The seventh filling layer 723 and the eighth filling layer 823 may be separated by the second contact surface MI2 of the sixth gate electrode structure 70. The fifth through eighth filling layers 523 through 823 may be formed at the same level.

The fifth through eighth filling layers 523 through 823 may include the same material.

The seventh insertion layer 722 and the seventh filling layer 723 on the seventh work function control layer 721 may be a seventh upper conductive layer 727. The eighth insertion layer 822 and the eighth filling layer 823 on the eighth work function control layer 821 may be an eighth upper conductive layer 827.

A thickness h3 of the seventh upper conductive layer 727 may be a distance from the upper surface of the interlayer insulating film 190 to the seventh work function control layer 721 on the bottom surface of the sixth trench 70t. A thickness h4 of the eighth upper conductive layer 827 may be a distance from the upper surface of the interlayer insulating film 190 to the eighth work function control layer 821 on the bottom surface of the sixth trench 70t.

The thickness h3 of the seventh upper conductive layer 727 may be different from the thickness h4 of the eighth upper conductive layer 827 on the third field insulating layer 107. For example, the thickness h3 of the seventh upper conductive layer 727 may be less than the thickness h4 of the eighth upper conductive layer 827.

Figure 48:
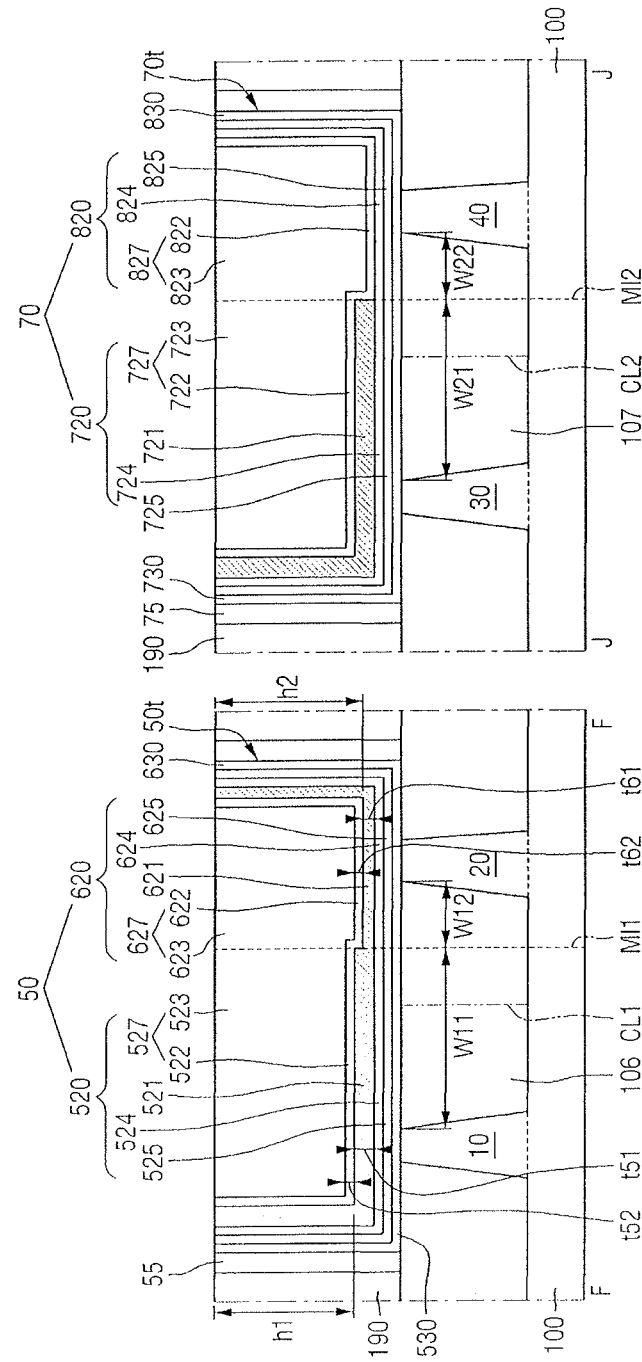
FIGS. 48 and 49 respectively illustrate views of semiconductor devices according to some embodiments.

FIG. 48 illustrates a view of a semiconductor device according to embodiments. For ease of description, differences from the semiconductor device described above with reference to FIGS. 46 and 47 will be mainly described.

Referring to FIG. 48, in the semiconductor device according to some embodiments, a fourth gate electrode 820 may include an eighth lower conductive layer 825, an eighth etch-stop layer 824, an eighth insertion layer 822, and an eighth filling layer 823 formed sequentially on an eighth gate insulating layer 830.

The eighth etch-stop layer 824 may contact the eighth insertion layer 822 disposed on the eighth etch-stop layer 824.

In addition, in a third gate electrode 720, a seventh work function control layer 721 may contact a seventh insertion layer 722 formed on the seventh work function control layer 721.

The fourth gate electrode 820 may not include a TiN-containing work function control layer between the eighth etch-stop layer 824 and the eighth insertion layer 822. Accordingly, a second contact surface MI2 between the third gate electrode 720 and the fourth gate electrode 820 may be located at an end of the seventh work function control layer 721 extending onto a third field insulating layer 107.

Figure 49:
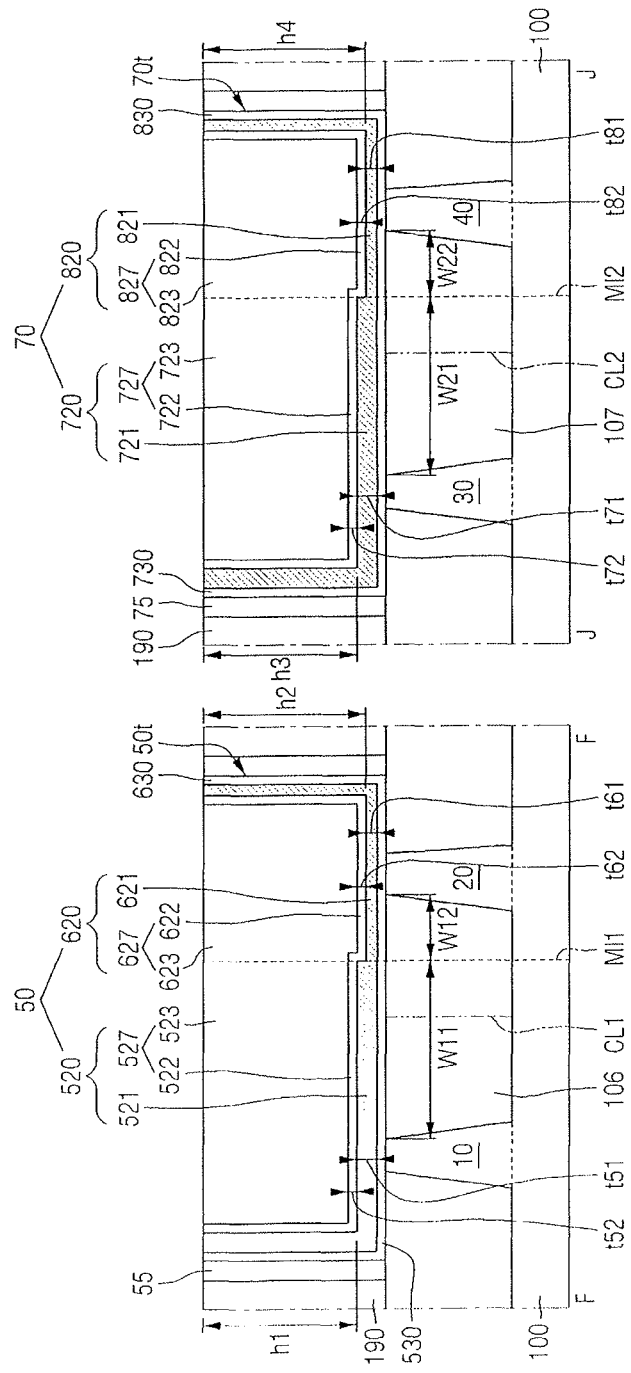

FIG. 49 illustrates a view of a semiconductor device according to embodiments. For ease of description, differences from the semiconductor device described above with reference to FIGS. 46 and 47 will be mainly described.

Referring to FIG. 49, in the semiconductor device according to some embodiments, a fifth work function control layer 521 may contact a fifth gate insulating layer 530, and a sixth work function control layer 621 may contact a sixth gate insulating layer 630.

In addition, a seventh work function control layer 721 may contact a seventh gate insulating layer 730, and an eighth work function control layer 821 may contact an eighth gate insulating layer 830.

Figure 50:
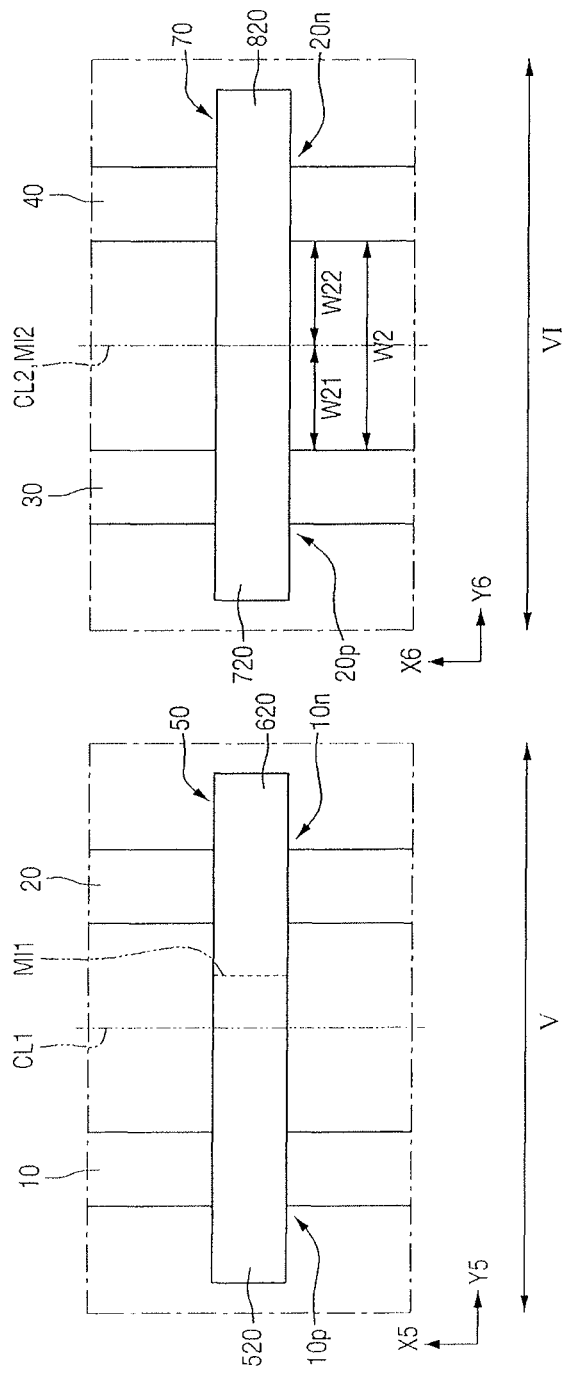
FIGS. 50 and 51 respectively illustrate plan views of semiconductor devices according to some embodiments.
Figure 51:
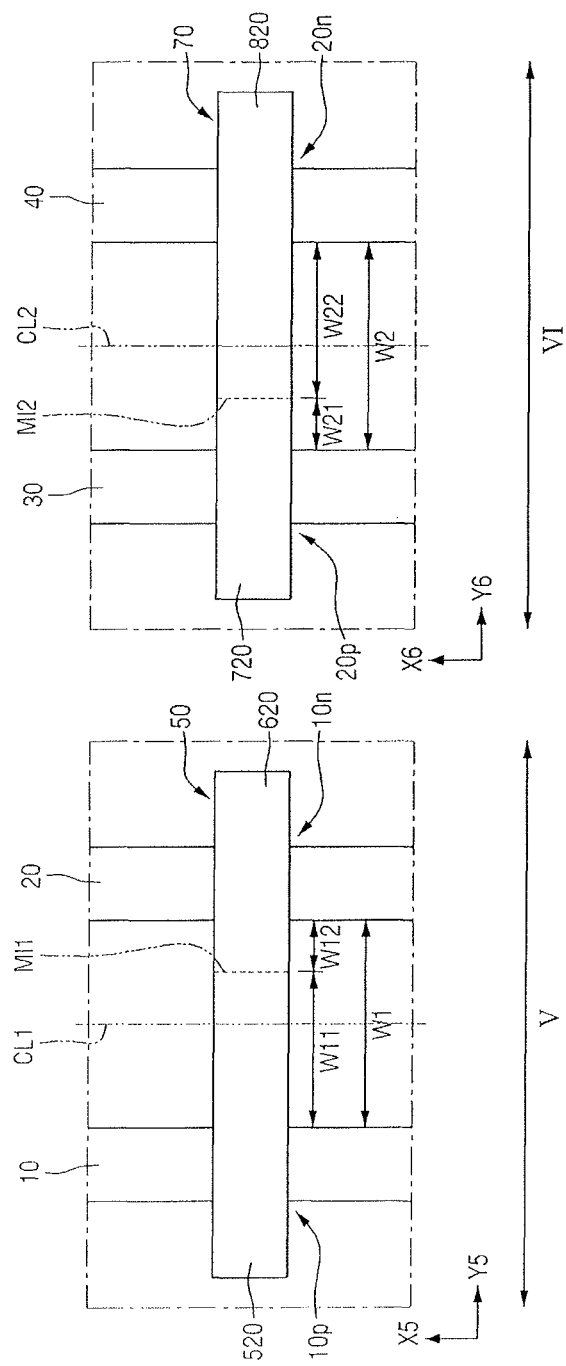

FIG. 50 illustrates a plan view of a semiconductor device according to embodiments. FIG. 51 illustrates a plan view of a semiconductor device according to embodiments. For ease of description, differences from the semiconductor device described above with reference to FIGS. 46 and 47 will be mainly described.

Referring to FIG. 50, in the semiconductor device according to some embodiments, a width W21 by which a third gate electrode 720 and a third field insulating layer 107 overlap each other may be substantially equal to a width W22 by which a fourth gate electrode 820 and the third field insulating layer 107 overlap each other.

For example, a second contact surface MI2 between the third gate electrode 720 and the fourth gate electrode 820 may coincide with a second center line CL2 of the third field insulating layer 107.

The second contact surface MI2 between the third gate electrode 720 and the fourth gate electrode 820 may be separated from a third active region 30 and a fourth active region 40 by the same distance.

Since the second contact surface MI2 between the third gate electrode 720 and the fourth gate electrode 820 is located at the same distance from the third active region 30 and the fourth active region 40, the second contact surface MI2 may be separated from a channel region of a p-type transistor and a channel region of an n-type transistor by the same distance.

Referring to FIG. 51, a width W21 by which a third gate electrode 720 and a third field insulating layer 107 overlap each other may be less than a width W22 by which a fourth gate electrode 820 and the third field insulating layer 107 overlap each other.

A second contact surface MI2 between the third gate electrode 720 and the fourth gate electrode 820 may be located closer to a third active region 30 than to a fourth active region 40.

When the second contact surface MI2 between the third gate electrode 720 and the fourth gate electrode 820 is located closer to the third active region 30 than to the fourth active region 40, the second contact surface MI2 may be closer to a channel region of a p-type transistor than to a channel region of an n-type transistor.

For example, a first contact surface MI1 between a first gate electrode 520 and a second gate electrode 620 in a fifth region V may be closer to a channel region of an n-type transistor than to a channel region of a p-type transistor. The second contact surface MI2 between the third gate electrode 720 and the fourth gate electrode 820 in a sixth region VI may be closer to the channel region of the p-type transistor than to the channel region of the n-type transistor.

Figure 52:
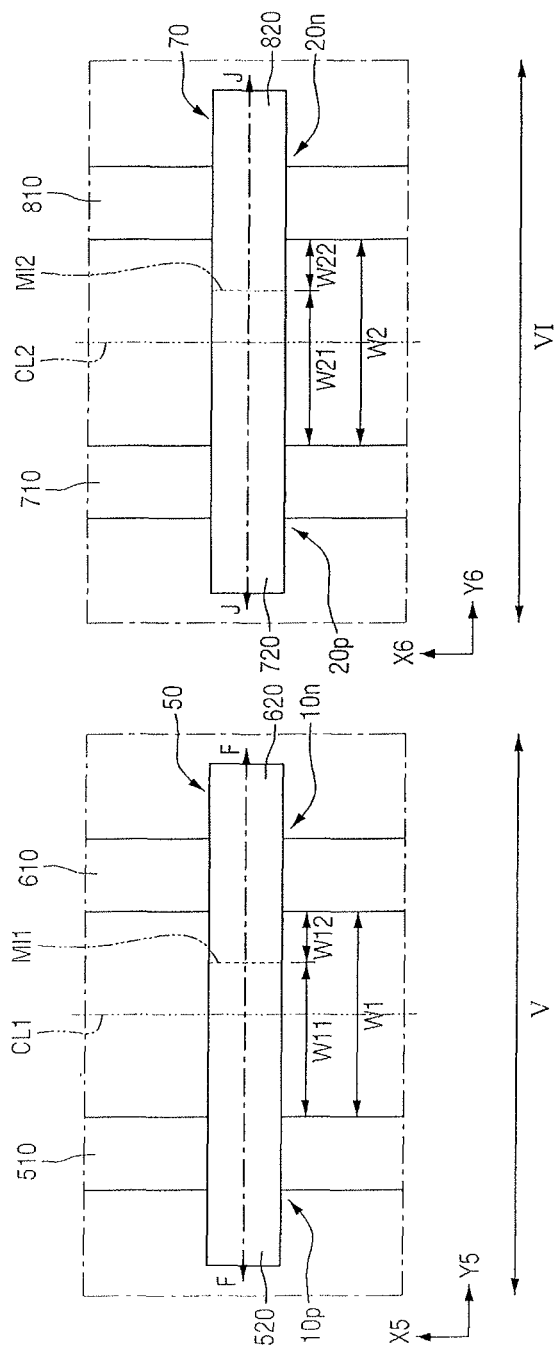
FIG. 52 illustrates a plan view of a semiconductor device according to some embodiments.
Figure 53:
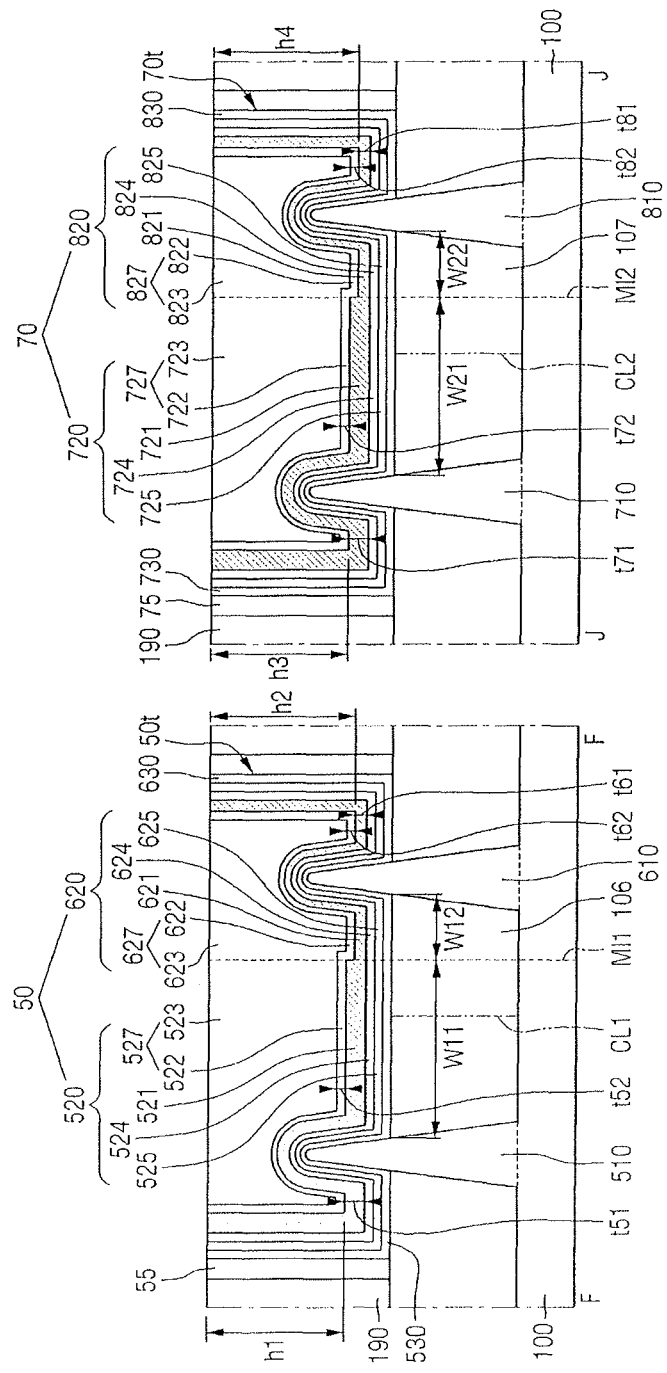
FIG. 53 illustrates a cross-sectional view taken along the lines F-F and J-J of FIG. 52.

FIG. 52 illustrates a plan view of a semiconductor device according to embodiments. FIG. 53 illustrates a cross-sectional view taken along the lines F-F and J-J of FIG. 52.

A fifth fin pattern 510, a sixth fin pattern 610 and a fifth gate electrode structure 50 shown in a fifth region V of FIGS. 52 and 53 may be substantially the same as those described above with reference to FIGS. 30 through 32B, 37 and 38. Therefore, FIGS. 52 and 53 will be described, focusing on elements of a sixth region VI.

A sixth gate electrode structure 70 shown in the sixth region VI may be substantially the same as that described above with reference to FIGS. 46 and 47. Therefore, a redundant description of the sixth gate electrode structure 70 will not be repeated or will be given briefly.

Referring to FIGS. 52 and 53, the semiconductor device according to some embodiments may include the fifth fin pattern 510 and the sixth fin pattern 610, which are formed in the fifth region V and adjacent to each other, and a seventh fin pattern 710 and an eighth fin pattern 810, which are formed in the sixth region VI and adjacent to each other.

For example, the fifth fin pattern 510 and the sixth fin pattern 610 may be formed in an SRAM region, and the seventh fin pattern 710 and the eighth fin pattern 810 may be formed in a logic region or an I/O region.

The seventh fin pattern 710 and the eighth fin pattern 810 may protrude from a substrate 100. The seventh fin pattern 710 and the eighth fin pattern 810 may extend in an eleventh direction X6.

The seventh fin pattern 710 may be used as a channel region of a PMOS, and the eighth fin pattern 810 may be used as a channel region of an NMOS.

The seventh fin pattern 710 and the eighth fin pattern 810 may be part of the substrate 100 or may include an epitaxial layer grown from the substrate 100.

Each of the seventh and eighth fin patterns 710 and 810 may include an elemental semiconductor material such as silicon or germanium. In addition, each of the seventh fin pattern 710 and the eighth fin pattern 810 may include a compound semiconductor such as a group IV-IV compound semiconductor or a group III-V compound semiconductor.

A third field insulating layer 107 may partially cover sidewalls of the seventh fin pattern 710 and sidewalls of the eighth fin pattern 810. Accordingly, the seventh fin pattern 710 and the eighth fin pattern 810 may protrude above an upper surface of the third field insulating layer 107 formed on the substrate 100.

A fin pattern protruding above the upper surface of the third field insulating layer 107 may not be formed between the seventh and eighth fin patterns 710 and 810.

The sixth gate electrode structure 70 may cross the seventh fin pattern 710, the eighth fin pattern 810, and the third field insulating layer 107. The sixth gate electrode structure 70 may extend in a twelfth direction Y6.

A second contact surface MI2 of the sixth gate electrode structure 70, which intersects the seventh and eighth fin patterns 710 and 810, may be closer to the eighth fin pattern 810 than to the seventh fin pattern 710.

A width W21 by which a third gate electrode 720 formed on the seventh fin pattern 710 overlaps the third field insulating layer 107 may be greater than a width W22 by which a fourth gate electrode 820 formed on the eighth fin pattern 810 overlaps the third field insulating layer 107.

A seventh gate insulating layer 730 may be formed on the third field insulating layer 107 and the seventh fin pattern 710. The seventh gate insulating layer 730 may be formed along the upper surface of the third field insulating layer 107 and the profile of the seventh fin pattern 710.

An eighth gate insulating layer 830 may be formed on the third field insulating layer 107 and the eighth fin pattern 810. The eighth gate insulating layer 830 may be formed along the upper surface of the third field insulating layer 107 and the profile of the eighth fin pattern 810.

The seventh and eighth gate insulating layers 730 and 830 extending along a bottom surface of a sixth trench 70t may be formed along the profile of the seventh fin pattern 710, the upper surface of the third field insulating layer 107, and the profile of the eighth fin pattern 810.

The sixth gate electrode structure 70 may be formed on the seventh and eighth gate insulating layers 730 and 830.

The third gate electrode 720 may be formed on the seventh gate insulating layer 730 and may intersect the seventh fin pattern 710. The fourth gate electrode 820 may be formed on the eighth gate insulating layer 830 and may intersect the eighth fin pattern 810.

A seventh lower conductive layer 725, a seventh etch-stop layer 724, a seventh work function control layer 721 and a seventh insertion layer 722 may be formed along the profile of the seventh gate insulating layer 730.

For example, the seventh lower conductive layer 725, the seventh etch-stop layer 724, the seventh work function control layer 721 and the seventh insertion layer 722 may extend along the profile of the seventh fin pattern 710 and the upper surface of the third field insulating layer 107.

An eighth lower conductive layer 825, an eighth etch-stop layer 824, an eighth work function control layer 821 and an eighth insertion layer 822 may be formed along the profile of the eighth gate insulating layer 830.

The eighth lower conductive layer 825, the eighth etch-stop layer 824, the eighth work function control layer 821 and the eighth insertion layer 822 may extend along the profile of the eighth fin pattern 810 and the upper surface of the third field insulating layer 107.

The seventh and eighth work function control layers 721 and 821 extending along the bottom surface of the sixth trench 70t may extend continuously along the profile of the seventh fin pattern 710, the upper surface of the third field insulating layer 107, and the profile of the eighth fin pattern 810.

In FIG. 53, a thickness t71 of the seventh work function control layer 721 is shown as being greater than a thickness t81 of the eighth work function control layer 821. In some implementations, a thickness t72 of the seventh insertion layer 722 may be substantially equal to a thickness t82 of the eighth insertion layer 822.

The second contact surface MI2 of the sixth gate electrode structure 70 is defined at a boundary between the seventh and eighth work function control layers 721 and 821. The width W21 by which the seventh work function control layer 721 formed along the profile of the seventh fin pattern 710 overlaps the third field insulating layer 107 may be greater than the width W22 by which the eighth work function control layer 821 formed along the profile of the eighth fin pattern 810 overlaps the third field insulating layer 107.

A thickness h3 of a seventh upper conductive layer 727 from an upper surface of an interlayer insulating film 190 to the seventh work function control layer 721 may be less than a thickness h4 of an eighth upper conductive layer 827 from the upper surface of the interlayer insulating film 190 to the eighth work function control layer 821.

Figure 54:
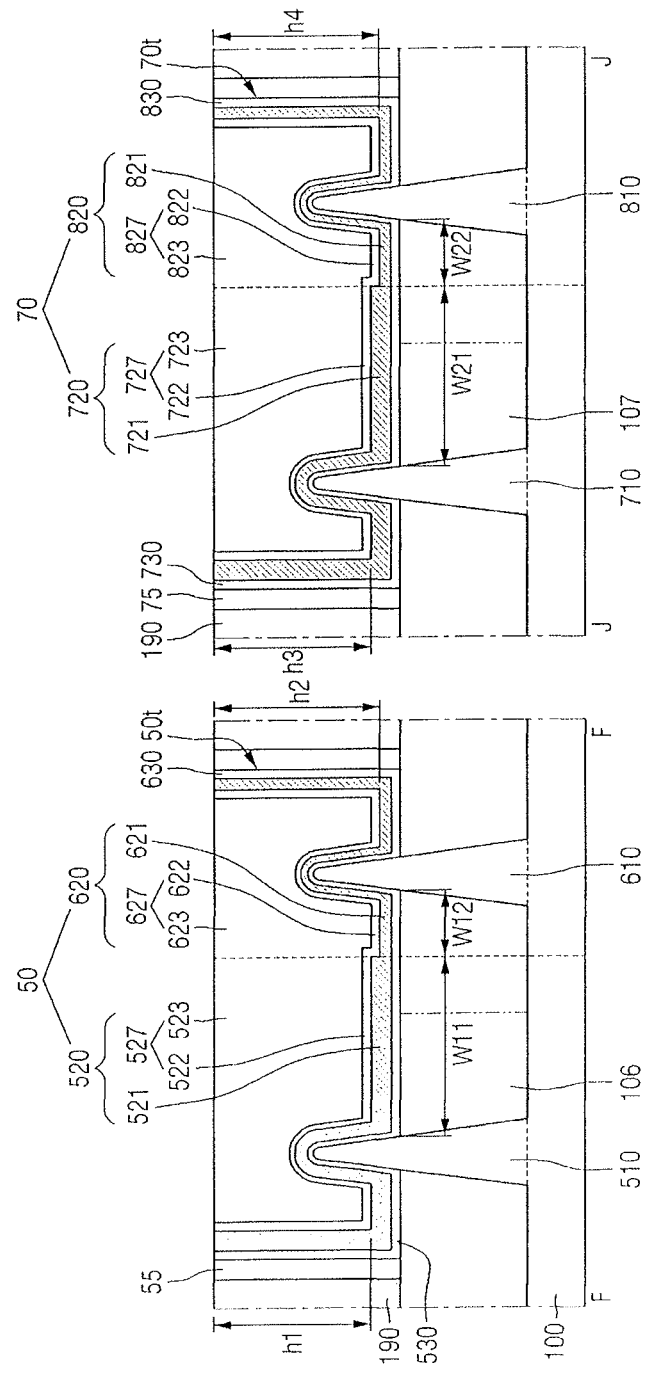
FIG. 54 illustrates a view of a semiconductor device according to some embodiments.

FIG. 54 illustrates a view of a semiconductor device according to embodiments. For ease of description, differences from the semiconductor device described above with reference to FIGS. 52 and 53 will be mainly described.

Referring to FIG. 54, a third gate electrode 720 may include a seventh work function control layer 721 formed on a seventh gate insulating layer 730 to be in contact with the seventh gate insulating layer 730, a seventh insertion layer 722 formed on the seventh work function control layer 721, and a seventh filling layer 723 formed on the seventh insertion layer 722.

A fourth gate electrode 820 may include an eighth work function control layer 821 formed on an eighth gate insulating layer 830 to be in contact with the eighth gate insulating layer 830, an eighth insertion layer 822 formed on the eighth work function control layer 821, and an eighth filling layer 823 formed on the eighth insertion layer 822.

Figure 55:
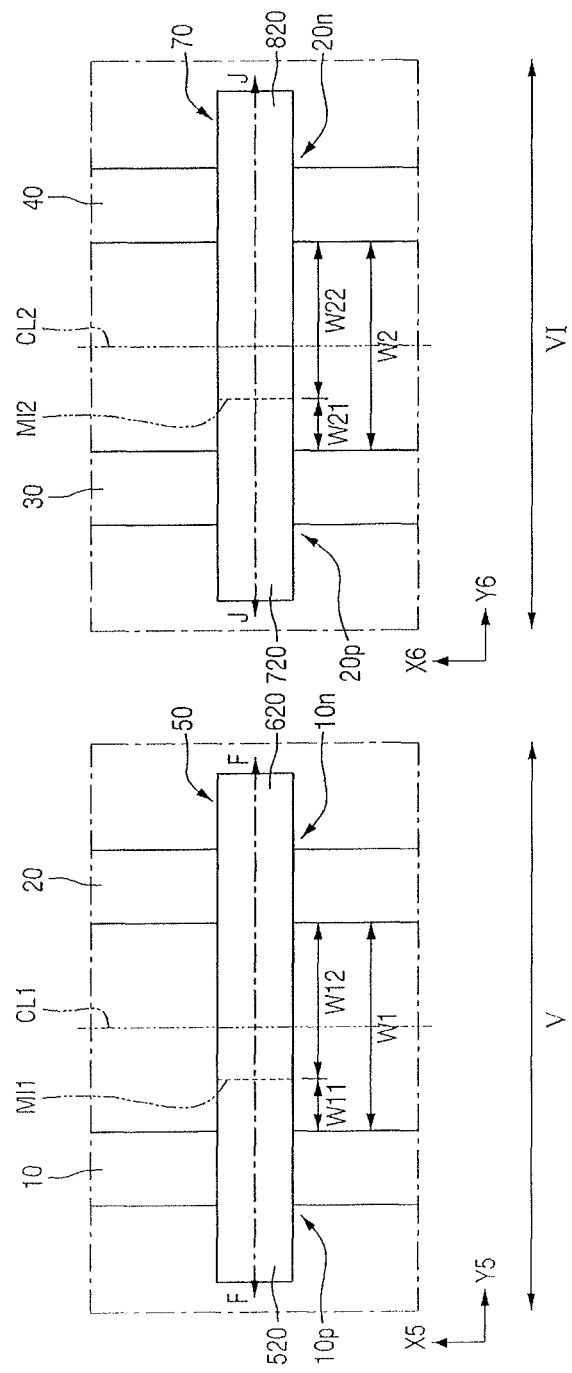
FIG. 55 illustrates a plan view of a semiconductor device according to some embodiments.
Figure 56:
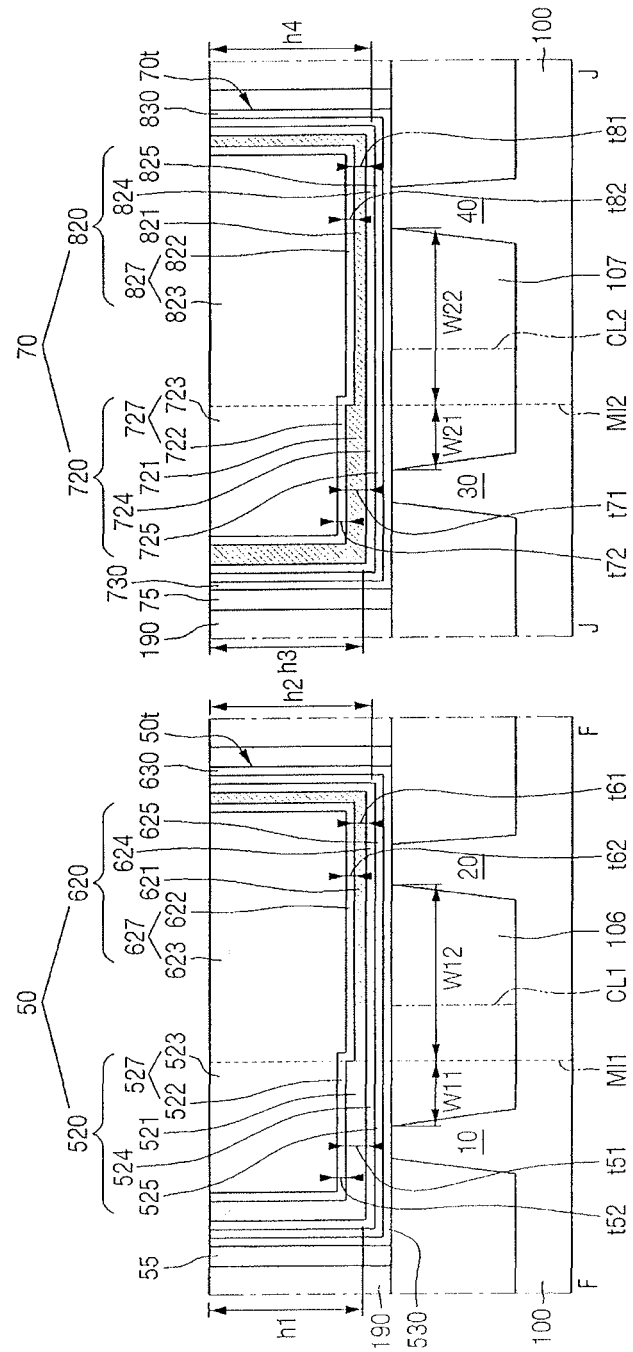
FIG. 56 illustrates a cross-sectional view taken along the lines F-F and J-J of FIG. 55.

FIG. 55 illustrates a plan view of a semiconductor device according to embodiments. FIG. 56 illustrates a cross-sectional view taken along the lines F-F and J-J of FIG. 55. For ease of description, differences from the semiconductor device described above with reference to FIGS. 40 and 41 will be mainly described.

A first active region 10, a second active region 20 and a fifth gate electrode structure 50 shown in a fifth region V of FIGS. 55 and 56 may be substantially the same as those described above with reference to FIGS. 40 and 41. Therefore, FIGS. 55 and 56 will be described, focusing on elements of a sixth region VI.

Referring to FIGS. 55 and 56, the semiconductor device according to some embodiments may include a substrate 100 including the fifth region V and the sixth region VI, the fifth gate electrode structure 50 formed in the fifth region V, and a sixth gate electrode structure 70 formed in the sixth region VI.

The substrate 100 may include the first active region 10, the second active region 20, a third active region 30, a fourth active region 40, a second field insulating layer 106, and a third field insulating layer 107.

The fifth region V and the sixth region VI may be regions in which elements having different functions are formed. For example, the fifth region V may be an SRAM region, and the sixth region VI may be a logic region or an I/O region.

The substrate 100 of the fifth region V may include the first active region 10, the second active region 20 and the second field insulating layer 106.

The substrate 100 of the sixth region VI may include the third active region 30, the fourth active region 40 and the third field insulating layer 107.

The third active region 30 may be a region in which a PMOS is formed, and the fourth active region 40 may be a region in which an NMOS is formed.

The third field insulating layer 107 may be disposed between the third active region 30 and the fourth active region 40 and may be in direct contact with the third active region 30 and the fourth active region 40. The third field insulating layer 107 may include a second center line CL2 located at the same distance from the third active region 30 and the fourth active region 40.

The sixth gate electrode structure 70 may be formed on the substrate 100 of the sixth region VI. The sixth gate electrode structure 70 may cross the third active region 30, the fourth active region 40, and the third field insulating layer 107. The sixth gate electrode structure 70 may extend in a twelfth direction Y6.

A second contact surface MI2 between a third gate electrode 720 and a fourth gate electrode 820 may be located closer to the third active region 30 than to the fourth active region 40.

The third active region 30, the second contact surface MI2, the second center line CL2 and the fourth active region 40 may be arranged sequentially in this order. Accordingly, the third gate electrode 720 may not overlap the second center line CL2 of the third field insulating layer 107.

The second contact surface MI2 between the third gate electrode 720 and the fourth gate electrode 820 may be located closer to the third active region 30 than to the fourth active region 40. Accordingly, a width W21 of the third gate electrode 720 overlapping the third field insulating layer 107 may be smaller than a width W22 of the fourth gate electrode 820 overlapping the third field insulating layer 107.

The third gate electrode 720 may include a seventh lower conductive layer 725, a seventh etch-stop layer 724, a seventh work function control layer 721, a seventh insertion layer 722, and a seventh filling layer 723 formed sequentially on a seventh gate insulating layer 730.

The fourth gate electrode 820 may include an eighth lower conductive layer 825, an eighth etch-stop layer 824, an eighth work function control layer 821, an eighth insertion layer 822, and an eighth filling layer 823 formed sequentially on an eighth gate insulating layer 830.

A description of the third gate electrode 720 and the fourth gate electrode 820 may be substantially the same as that of the first gate electrode 520 and the second gate electrode 620 and thus, a description thereof will not be repeated.

The first through fourth active regions 10 through 40 may be multi-channel active patterns such as fin patterns.

In some implementations, the second contact surface MI2 between the third gate electrode 720 and the fourth gate electrode 820 may be located closer to the fourth active region 40 than to the third active region 30. In some implementations, the second contact surface MI2 between the third gate electrode 720 and the fourth gate electrode 820 may be defined at a position separated from the third active region 30 and the fourth active region 40 by the same distance.

In FIGS. 30 through 56, fifth and sixth work function control layers 521 and 621 having different thicknesses and the seventh and eighth work function control layers 721 and 821 having different thicknesses may be formed by patterning a TiN layer at least once.

The fifth region V including the fifth work function control layer 521 and the sixth work function control layer 621 and the sixth region V including the seventh work function control layer 721 and the eighth work function control layer 821 may be regions having different functions.

For example, the fifth region V may be an SRAM region, and the sixth region VI may be a logic region.

In this case, according to a process of forming a transistor included in the fifth region V, when a boundary between an n-type gate electrode and a p-type gate electrode is close to a channel region of an n-type transistor, threshold voltages of the n-type transistor and a p-type transistor, which share different gate electrode structures, can be improved.

In some implementations, when the boundary between the n-type gate electrode and the p-type gate electrode is close to a channel region of the p-type transistor, the threshold voltages of the n-type transistor and the p-type transistor, which share different gate electrode structures, may be improved.

According to a process of forming a transistor included in the sixth region VI in which a logic device is formed, when the boundary between the n-type gate electrode and the p-type gate electrode is close to the channel region of the n-type transistor, the threshold voltage of the n-type transistor and the p-type transistor, which share different gate electrode structures, may be improved.

In some implementations, when the boundary between the n-type gate electrode and the p-type gate electrode is close to the channel region of the p-type transistor, the threshold voltages of the n-type transistor and the p-type transistor, which share different gate electrode structures, may be improved.

In some implementations, when the boundary between the n-type gate electrode and the p-type gate electrode is halfway between the channel region of the p-type transistor and the channel region of the n-type transistor, the threshold voltages of the n-type transistor and the p-type transistor, which share different gate electrode structures, may be improved.

The boundary between the n-type gate electrode and the p-type gate electrode in regions having different functions may vary according to materials contained in the n-type gate electrode and the p-type gate electrode.

In some implementations, as the distance between the channel region of the p-type transistor and the channel region of the n-type transistor increases or decreases, the boundary between the n-type gate electrode and the p-type gate electrode in the regions having different functions may vary.

In addition, the boundary between the n-type gate electrode and the p-type gate electrode in the regions having different functions may vary according to a method of manufacturing the n-type gate electrode and the p-type gate electrode.

Figure 57:
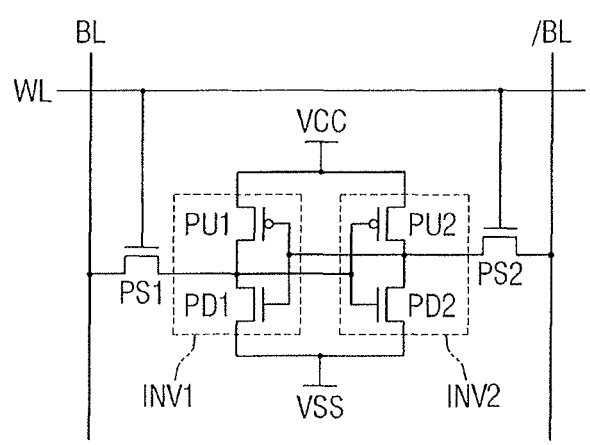
FIG. 57 illustrates a circuit diagram of a semiconductor device according to some embodiments.
Figure 58:
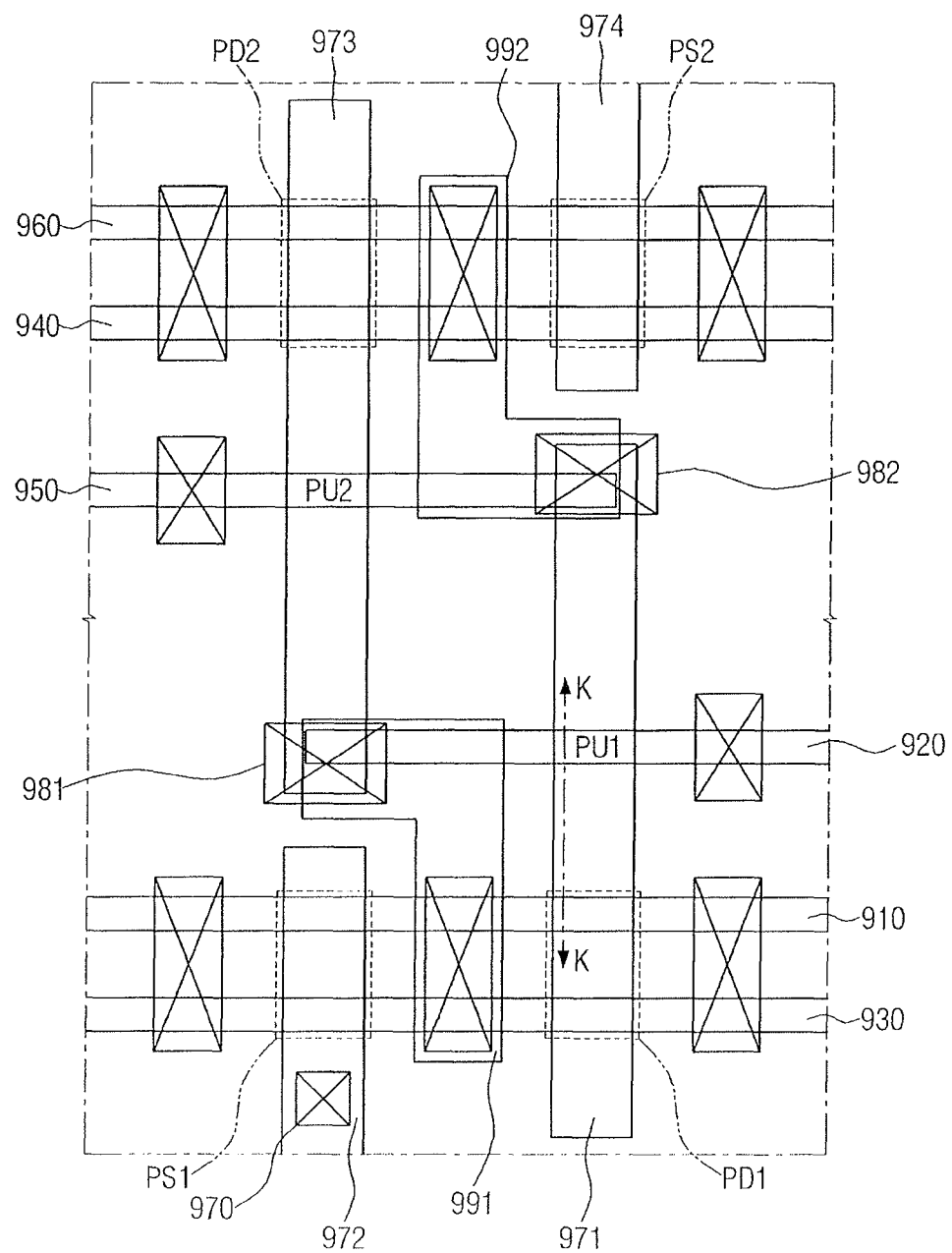
FIG. 58 illustrates a layout view of the semiconductor device of FIG. 57.
Figure 59:
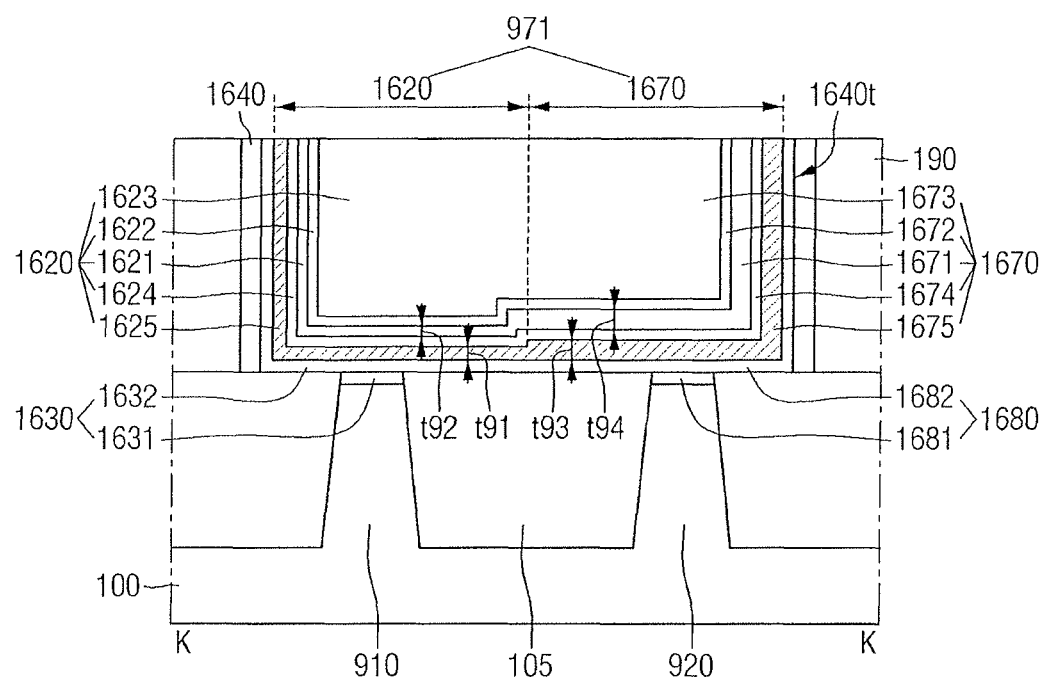
FIG. 59 illustrates a cross-sectional view taken along the line K-K of FIG. 58.

FIG. 57 illustrates a circuit diagram of a semiconductor device according to embodiments. FIG. 58 illustrates a layout view of the semiconductor device of FIG. 57. FIG. 59 illustrates a cross-sectional view taken along the line K-K of FIG. 58.

Referring to FIG. 57, the semiconductor device may include a pair of first and second inverters INV1 and INV2 connected in parallel between a power supply node Vcc and a ground node Vss and first and second pass transistors PS1 and PS2 respectively connected to output nodes of the first and second inverters INV1 and INV2. The first and second pass transistors PS1 and PS2 may be connected to a bit line BL and a complementary bit line/BL, respectively. Gates of the first and second pass transistors PS1 and PS2 may be connected to a word line WL.

The first inverter INV1 may include a first pull-up transistor PU1 and a first pull-down transistor PD1 connected in series. The second inverter INV2 may include a second pull-up transistor PU2 and a second pull-down transistor PD2 connected in series. The first and second pull-up transistors PU1 and PU2 may be p-channel field effect transistors (PFETs), and the first and second pull-down transistors PD1 and PD2 may be n-channel field effect transistors (NFETs).

In addition, an input node of the first inverter INV1 may be connected to the output node of the second inverter INV2, and an input node of the second inverter INV2 may be connected to the output node of the first inverter INV1 such that the first and second inverters INV1 and INV2 form a single latch circuit.

Referring to FIGS. 57 and 58, a fifth active region 910, a sixth active region 920, a seventh active region 930, an eighth active region 940, a ninth active region 950, and a tenth active region 960 may extend in a direction (e.g., a horizontal direction in FIG. 58) and may be spaced apart from each other. The sixth active region 920 and the ninth active region 950 may be shorter than the fifth active region 910, the seventh active region 930, the eighth active region 940, and the tenth active region 960.

In addition, a first gate line 971, a second gate line 972, a third gate line 973 and a fourth gate line 974 may extend in the other direction (e.g., a vertical direction in FIG. 58) to intersect the fifth through tenth active regions 910 through 960.

For example, the first gate line 971 may completely intersect the fifth through seventh active regions 910 through 930 and may partially overlap an end of the ninth active region 950. The third gate line 973 may completely intersect the eighth through tenth active regions 940 through 960 and may partially overlap an end of the sixth active region 920. The second gate line 972 may intersect the fifth active region 910 and the seventh active region 930. The fourth gate line 974 may intersect the eighth active region 940 and the tenth active region 960.

As illustrated in the drawings, the first pull-up transistor PU1 may be defined around a region where the first gate line 971 intersects the sixth active region 920. The first pull-down transistor PD1 may be defined around a region where the first gate line 971 intersects the fifth active region 910 and the seventh active region 930. The first pass transistor PS1 may be defined around a region where the second gate line 972 intersects the fifth active region 910 and the seventh active region 930.

The second pull-up transistor PU2 may be defined around a region where the third gate line 973 intersects the ninth active region 950. The second pull-down transistor PD2 may be defined around a region where the third gate line 973 intersects the eighth active region 940 and the tenth active region 960. The second pass transistor PS2 may be defined around a region where the fourth gate line 974 intersects the eighth active region 940 and the tenth active region 960.

Source/drain regions may be formed on both sides of each of the intersections between the first through fourth gate lines 971 through 974 and the fifth through tenth active regions 910 through 960, respectively. A plurality of contacts 970 may also be formed.

In addition, a first shared contact 981 may simultaneously connect the sixth active region 920, the third gate line 973, and a wiring layer 991. A second shared contact 982 may simultaneously connect the ninth active region 950, the first gate line 971, and a wiring layer 992.

In FIG. 58, the pull-down transistors PD1 and PD2 and the pass transistors PS1 and PS2, which may be n-type transistors, are shown as being defined around a plurality of active regions, as examples.

In FIG. 58, one of the fifth active region 910 and the seventh active region 930 may be omitted, and one of the eighth active region 940 and the tenth active region 960 may be omitted.

In FIGS. 58 and 59, a substrate 100 may include the fifth active region 910, the sixth active region 920, and a first field insulating layer 105 disposed between the fifth active region 910 and the sixth active region 920.

Seventh gate spacers 1640 may be formed on the substrate 100 and may define a seventh trench 1640t. The seventh trench 1640t may cross the fifth active region 910, the first field insulating layer 105, and the sixth active region 920.

The first gate line 971 may be formed on the substrate 100. The first gate line 971 may be formed in the seventh trench 1640t. Accordingly, the first gate line 971 may cross the fifth active region 910, the first field insulating layer 105, and the sixth active region 920.

The first gate line 971 may include a fifth gate electrode 1620 and a sixth gate electrode 1670 that are in direct contact with each other. The fifth gate electrode 1620 and the sixth gate electrode 1670 may meet each other on the first field insulating layer 105.

The first pull-down transistor PD1 may include a ninth gate insulating layer 1630 and the fifth gate electrode 1620. The first pull-up transistor PU1 may include a tenth gate insulating layer 1680 and the sixth gate electrode 1670.

The ninth gate insulating layer 1630 and the tenth gate insulating layer 1680 may be formed along sidewalls and a bottom surface of the seventh trench 1640t. The ninth gate insulating layer 1630 may extend along an upper surface of the fifth active region 910 and an upper surface of the first field insulating layer 105. The tenth gate insulating layer 1680 may extend along an upper surface of the sixth active region 920 and the upper surface of the first field insulating layer 105.

The ninth gate insulating layer 1630 may include a seventh interfacial layer 1631 and a fifth high-k insulating layer 1632. The tenth gate insulating layer 1680 may include an eighth interfacial layer 1681 and a sixth high-k insulating layer 1682.

The seventh interfacial layer 1631 and the eighth interfacial layer 1681 are shown as being formed only in the fifth active region 910 and the sixth active region 920 as examples. The fifth gate electrode 1620 may be formed on the ninth gate insulating layer 1630. The fifth gate electrode 1620 may include a ninth lower conductive layer 1625, a ninth etch-stop layer 1624, a ninth work function control layer 1621, a ninth insertion layer 1622, and a ninth filling layer 1623.

The ninth lower conductive layer 1625 may be formed on the ninth gate insulating layer 1630. The ninth lower conductive layer 1625 may contact the ninth gate insulating layer 1630. The ninth lower conductive layer 1625 may be formed along the profile of the ninth gate insulating layer 1630.

The ninth etch-stop layer 1624 may be formed on the ninth lower conductive layer 1625. The ninth etch-stop layer 1624 may be formed along the profile of the ninth lower conductive layer 1625.

The ninth work function control layer 1621 may be formed on the ninth etch-stop layer 1624. The ninth work function control layer 1621 may contact the ninth etch-stop layer 1624. The ninth work function control layer 1621 may be formed along the profile of the ninth etch-stop layer 1624.

The ninth insertion layer 1622 may be formed on the ninth work function control layer 1621. The ninth insertion layer 1622 may contact the ninth function control layer 1621. The ninth insertion layer 1622 may be formed along the profile of the ninth work function control layer 1621.

The ninth filling layer 1623 may be formed on the ninth insertion layer 1622.

The sixth gate electrode 1670 may be formed on the tenth gate insulating layer 1680. The sixth gate electrode 1670 may include a tenth lower conductive layer 1675, a tenth etch-stop layer 1674, a tenth work function control layer 1671, a tenth insertion layer 1672, and a tenth filling layer 1673.

The tenth lower conductive layer 1675 may be formed on the tenth gate insulating layer 1680. The tenth lower conductive layer 1675 may contact the tenth gate insulating layer 1680. The tenth lower conductive layer 1675 may be formed along the profile of the tenth gate insulating layer 1680.

The tenth etch-stop layer 1674 may be formed on the tenth lower conductive layer 1675. The tenth etch-stop layer 1674 may be formed along the profile of the tenth lower conductive layer 1675.

The tenth work function control layer 1671 may be formed on the tenth etch-stop layer 1674. The tenth work function control layer 1671 may contact the tenth etch-stop layer 1674. The tenth work function control layer 1671 may be formed along the profile of the tenth etch-stop layer 1674.

The tenth insertion layer 1672 may be formed on the tenth work function control layer 1671. The tenth insertion layer 1672 may contact the tenth work function control layer 1671. The tenth insertion layer 1672 may be formed along the profile of the tenth work function control layer 1671.

The tenth filling layer 1673 may be formed on the tenth insertion layer 1672.

A work function control layer, an insertion layer, and a filling layer formed on each etch-stop layer may be an upper gate electrode.

The ninth lower conductive layer 1625 and the tenth lower conductive layer 1675 may include, for example, TiN.

The ninth etch-stop layer 1624 and the tenth etch-stop layer 1674 may include the same material. The ninth etch-stop layer 1624 and the tenth etch-stop layer 1674 may include, for example, TaN.

The ninth etch-stop layer 1624 and the tenth etch-stop layer 1674 may be in direct contact with each other on the first field insulating layer 105.

The ninth work function control layer 1621 and the tenth work function control layer 1671 may include the same material. The ninth work function control layer 1621 and the tenth work function control layer 1671 may include, for example, TiN.

The ninth work function control layer 1621 and the tenth work function control layer 1671 may be in direct contact with each other on the first field insulating layer 105.

The ninth insertion layer 1622 and the tenth insertion layer 1672 may include the same material. The ninth insertion layer 1622 and the tenth insertion layer 1672 may include, for example, one of Ti, TiAl, TiAlN, TiAlC, and TiAlCN.

The ninth insertion layer 1622 and the tenth insertion layer 1672 may be in direct contact with each other on the first field insulating layer 105.

The ninth filling layer 1623 and the tenth filling layer 1673 may include the same material. The ninth filling layer 1623 and the tenth filling layer 1673 may include at least one of W, Al, Co, Cu, Ru, Ni, Pt, Ni—Pt, and TiN.

The ninth filling layer 1623 and the tenth filling layer 1673 may be in direct contact with each other on the first field insulating layer 105.

In FIG. 59, a thickness t91 of the ninth lower conductive layer 1625 may be less than a thickness t93 of the tenth lower conductive layer 1675. In addition, a thickness t92 of the ninth work function control layer 1621 may be less than a thickness t94 of the tenth work function control layer 1671.

For example, the tenth lower conductive layer 1675 and the tenth work function control layer 1671 included in a PMOS may be thicker than the ninth lower conductive layer 1625 and the ninth work function control layer 1621 included in an NMOS.

In FIG. 59, the fifth active region 910 and the sixth active region 920 are illustrated as substrate 100 having a flat upper surface. In some implementations, the fifth active region 910 and the sixth active region 920 may be also be multi-channel active patterns (such as fin patterns) including a plurality of channel regions.

A method of fabricating a semiconductor device according to embodiments will be described with reference to FIGS. 1 and 60 through 70.

FIGS. 60 through 70 illustrate views depicting stages of a method of fabricating a semiconductor device according to embodiments.

Figure 60:
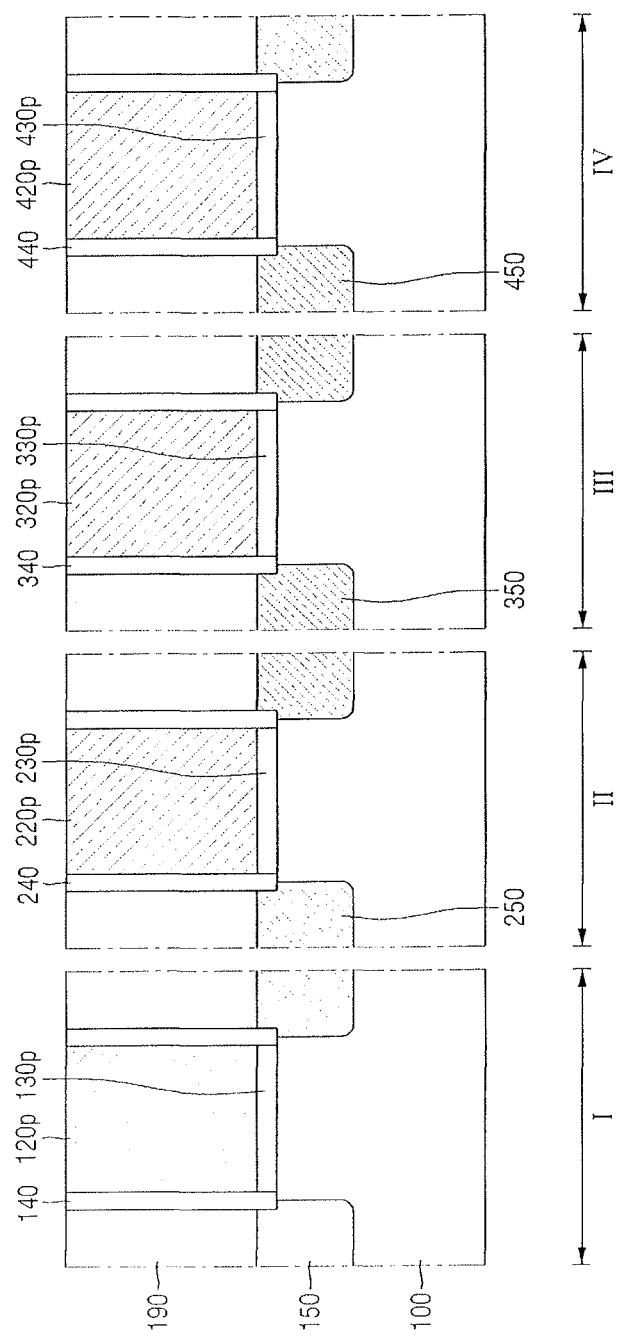
FIGS. 60 through 70 illustrate views illustrating steps of a method of fabricating a semiconductor device according to some embodiments.

Referring to FIG. 60, a first dummy gate insulating layer 130$p$ and a first dummy gate electrode 120$p$ may be sequentially stacked on a substrate 100 of a first region I. A second dummy gate insulating layer 230$p$ and a second dummy gate electrode 220$p$ may be sequentially stacked on the substrate 100 of a second region II.

In addition, a third dummy gate insulating layer 330$p$ and a third dummy gate electrode 320$p$ may be sequentially stacked on the substrate 100 of a third region III. A fourth dummy gate insulating layer 430$p$ and a fourth dummy gate electrode 420$p$ may be sequentially stacked on the substrate 100 of a fourth region IV.

The first through fourth dummy gate insulating layers 130$p$ through 430$p$ may include silicon oxide, silicon oxynitride, or a combination of the same. Each of the first through fourth dummy gate electrodes 120$p$ through 420$p$ may be silicon. For example, each may include one of polycrystalline silicon (poly Si), amorphous silicon (a-Si), and a combination of the same. The first through fourth dummy gate electrodes 120$p$ through 420$p$ may not be doped with impurities or may be doped with impurities.

First through fourth gate spacers 140 through 440 may be formed on sidewalls of the first through fourth dummy gate electrodes 120$p$ through 420$p$.

After the formation of the first through fourth gate spacers 140 through 440, first through fourth source/drain regions 150 through 450 may be formed adjacent to the first through fourth dummy gate electrodes 120$p$ through 420$p$, respectively.

An interlayer insulating film 190 may be formed on the substrate 100 to cover the first through fourth dummy gate electrodes 120$p$ through 420$p$.

The interlayer insulating film 190 may be planarized to expose upper surfaces of the first through fourth dummy gate electrodes 120$p$ through 420$p$.

Figure 61:
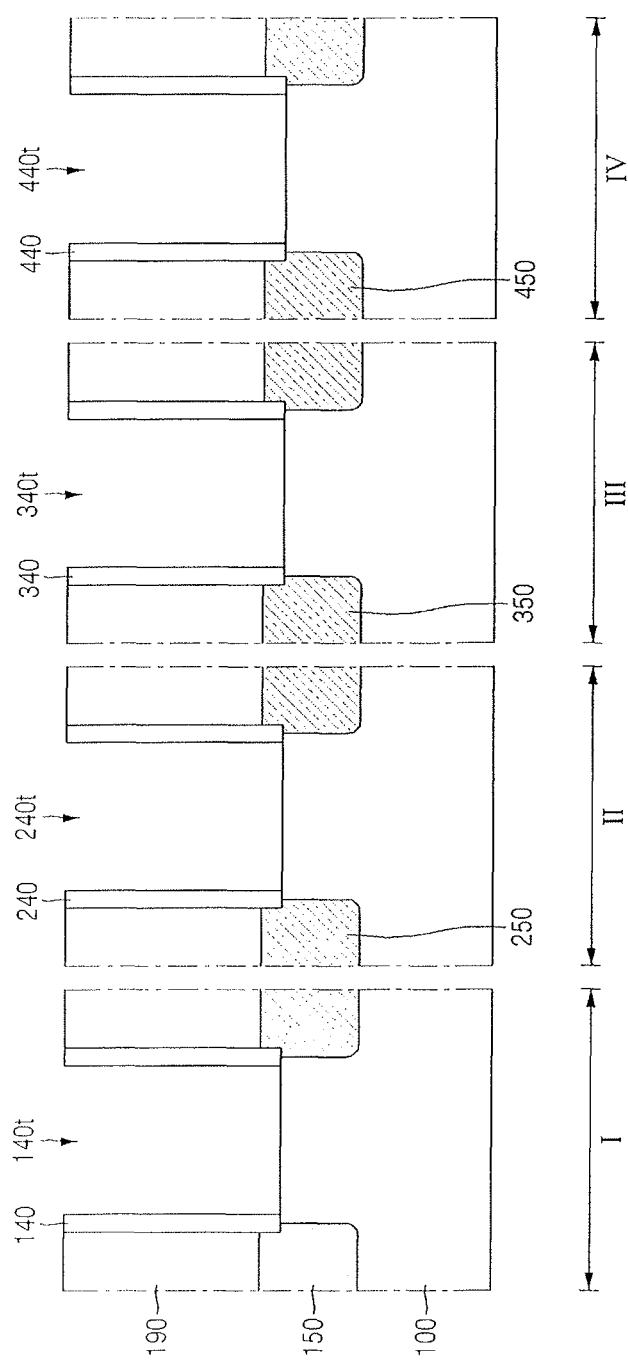

Referring to FIG. 61, the first through fourth dummy gate electrodes 120$p$ through 420$p$ may be removed.

After the removal of the first through fourth dummy gate electrodes 120$p$ through 420$p$, the first through fourth dummy gate insulating layers 130$p$ through 430$p$ may be removed. As a result, first through fourth trenches 140$t$ through 440$t$ may be formed.

The first through fourth dummy gate electrodes 120$p$ through 420$p$ may be removed using a wet-etching process or a dry-etching process. Taking wet etching as an example, the first through fourth dummy gate electrodes 120$p$ through 420$p$ may be substantially removed through exposure to an aqueous solution containing a hydroxide source at a sufficient temperature for a sufficient time. The hydroxide source may include, for example, ammonium hydroxide or tetra alkyl ammonium hydroxide, for example, tetra methyl ammonium hydroxide (TMAH).

The first through fourth dummy gate insulating layers 130$p$ through 430$p$ may be removed by wet etching, dry etching, or a combination of the same. An etchant or an etching gas may be varied according to the material of the first through fourth dummy gate insulating layers 130$p$ through 430$p$.

Figure 62:
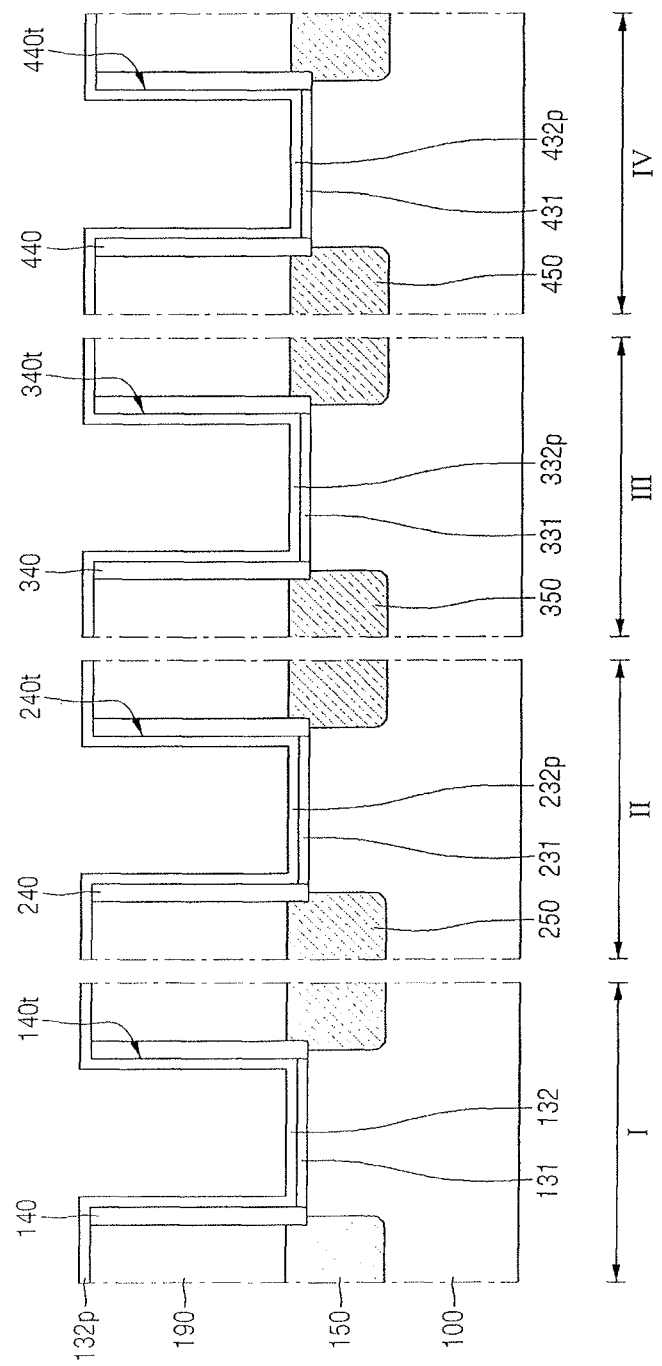

Referring to FIG. 62, first through fourth interfacial layers 131 through 431 may be formed on the substrate 100.

The first through fourth interfacial layers 131 through 431 may be formed on bottom surfaces of the first through fourth trenches 140$t$ through 440$t$.

First through fourth pre-high-k insulating layers 132$p$, 232$p$, 332$p$, 432$p$ may be formed on the first through fourth interfacial layers 131 through 431.

For example, the first pre-high-k insulating layer 132$p$ may extend along sidewalls and the bottom surface of the first trench 140$t$ and an upper surface of the interlayer insulating film 190.

Figure 63:
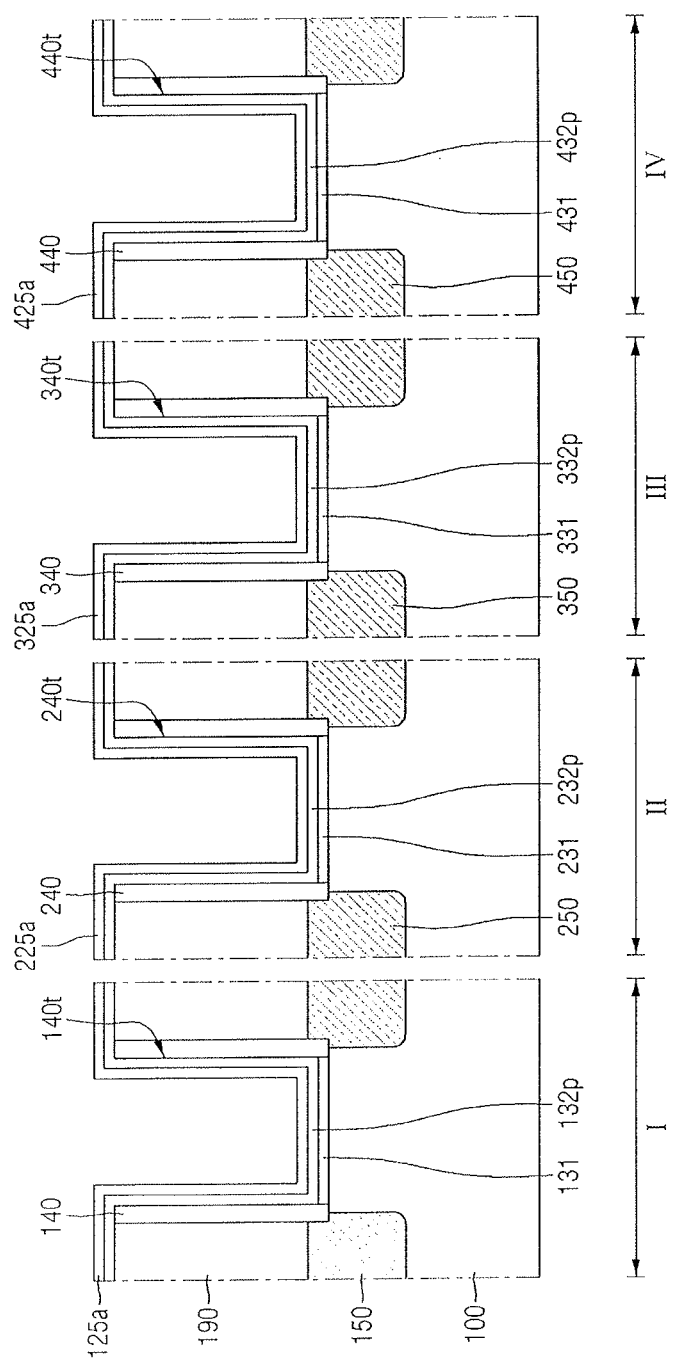

Referring to FIG. 63, first through fourth pre-TiN layers 125$a$, 225$a$, $a$325$a$, 425$a$ may be formed on the first through fourth pre-high-k insulating layers 132$p$ through 432$p$.

For example, the first pre-TiN layer 125$a$ may extend along the sidewalls and bottom surface of the first trench 140$t$ and the upper surface of the interlayer insulating film 190. The first pre-TiN layer 125$a$ may be formed along the profile of the first pre-high-k insulating layer 132$p$.

Figure 64:
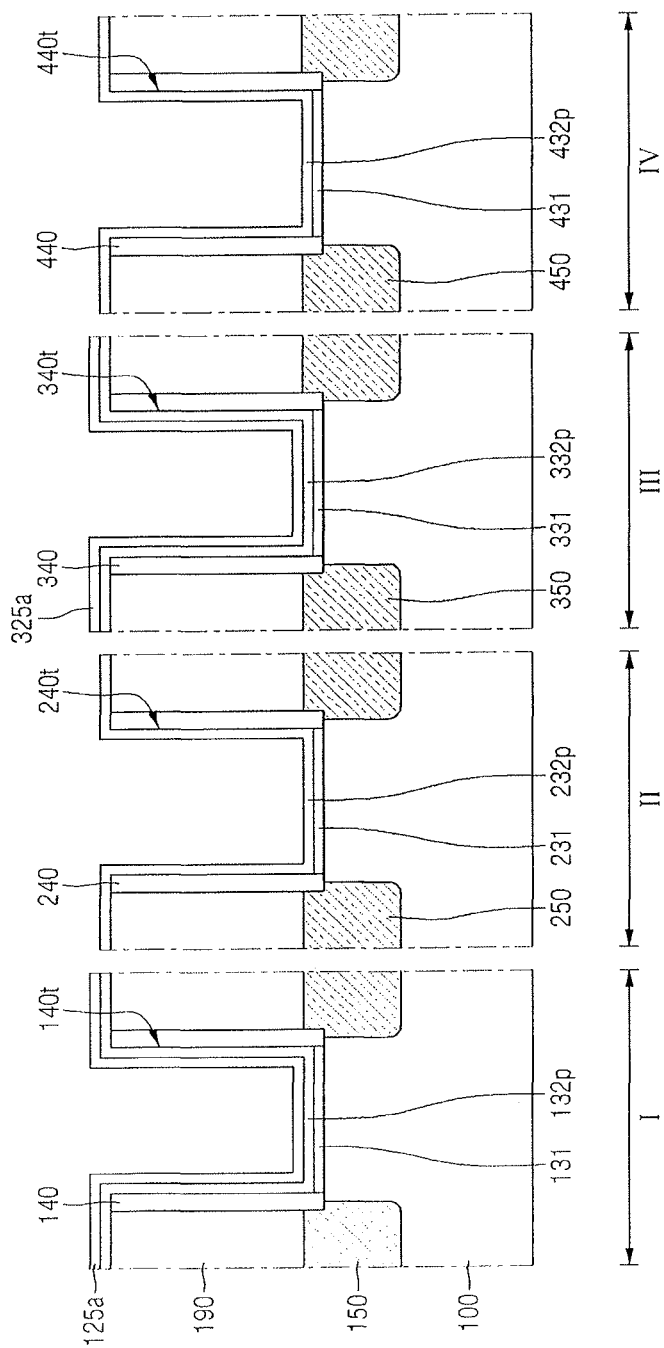

Referring to FIG. 64, the second pre-TiN layer 225$a$ of the second region II may be removed to expose the second pre-high-k insulating layer 232$p$.

The fourth pre-TiN layer 425$a$ of the fourth region IV may be removed to expose the fourth pre-high-k insulating layer 432$p$.

Figure 65:
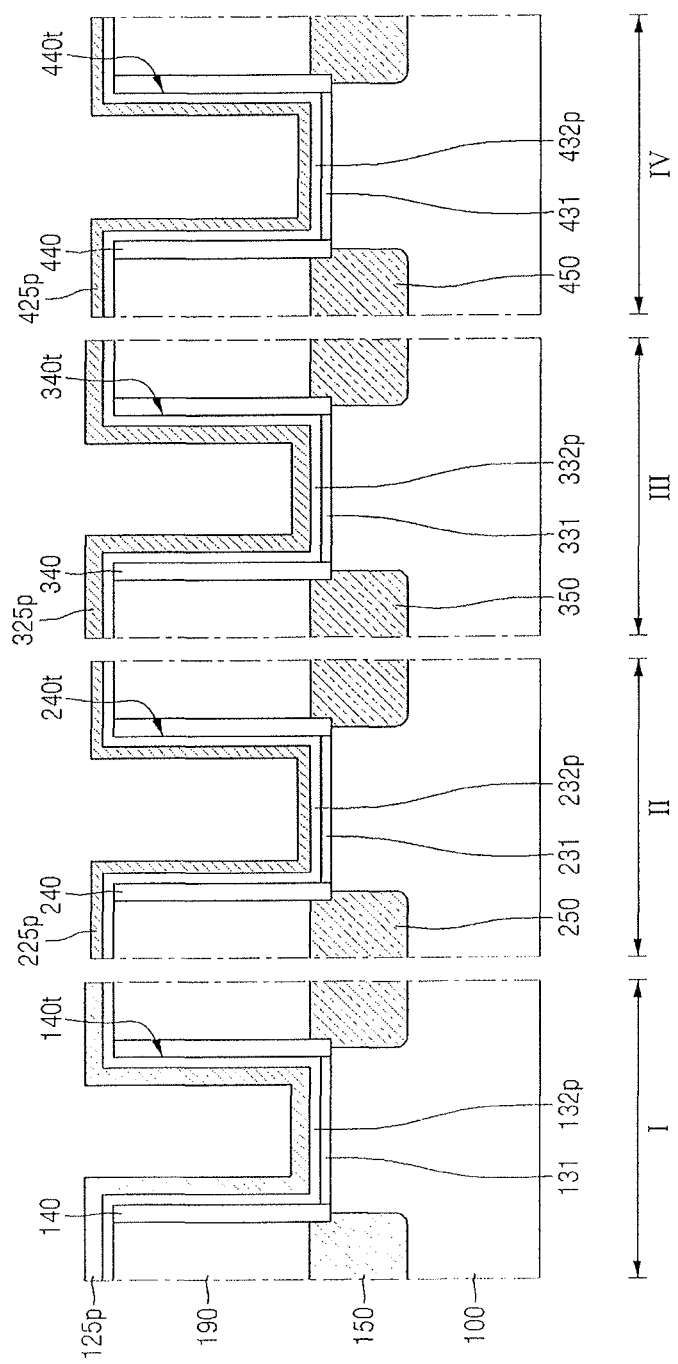

Referring to FIG. 65, an additional TiN layer may be formed along the sidewalls and bottom surfaces of the first through fourth trenches 140$t$ through 440$t$.

As a result, a first pre-lower conductive layer 125$p$ may be formed in the first region I along the sidewalls and bottom surface of the first trench 140$t$ and the upper surface of the interlayer insulating film 190.

Second through fourth pre-lower conductive layers 225$p$ through 425$p$ may also be formed in the second through fourth region II through IV.

The first pre-lower conductive layer 125$p$ may be made up of the first pre-TiN layer 125$a$ and the additional TiN layer formed on the first pre-TiN layer 125$a$. Accordingly, the first pre-lower conductive layer 125$p$ may be thicker than the second pre-lower conductive layer 225$p$.

Similarly, the third pre-lower conductive layer 325p may be thicker than the fourth pre-lower conductive layer 425p.

Figure 66:
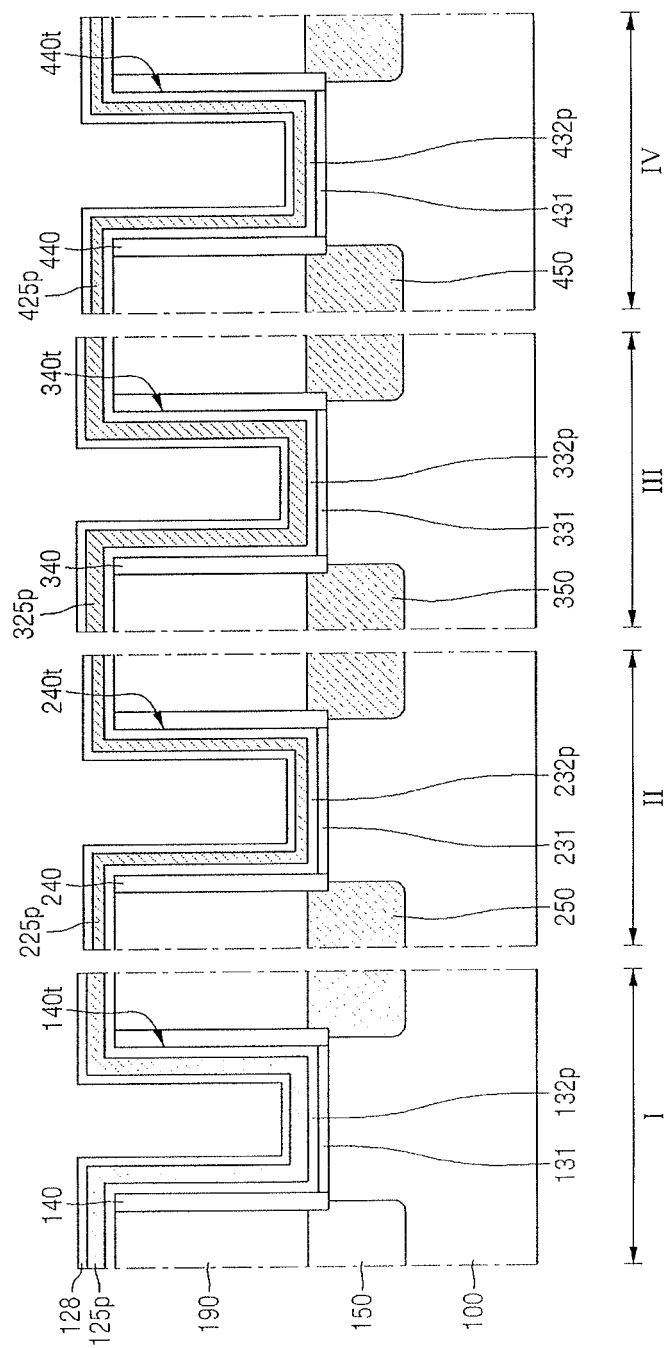

Referring to FIG. 66, a capping layer 128 may be formed on each of the first through fourth pre-lower conductive layers 125p through 425p. After the formation of the capping layer 128, a heat treatment may be performed.

The capping layer 128 may include, for example, amorphous silicon, polysilicon, or a combination of the same. During the heat treatment, the capping layer 128 may prevent thicknesses of the first through fourth interfacial layers 131 through 431 from increasing.

After the heat treatment, the capping layer 128 may be removed.

Figure 67:
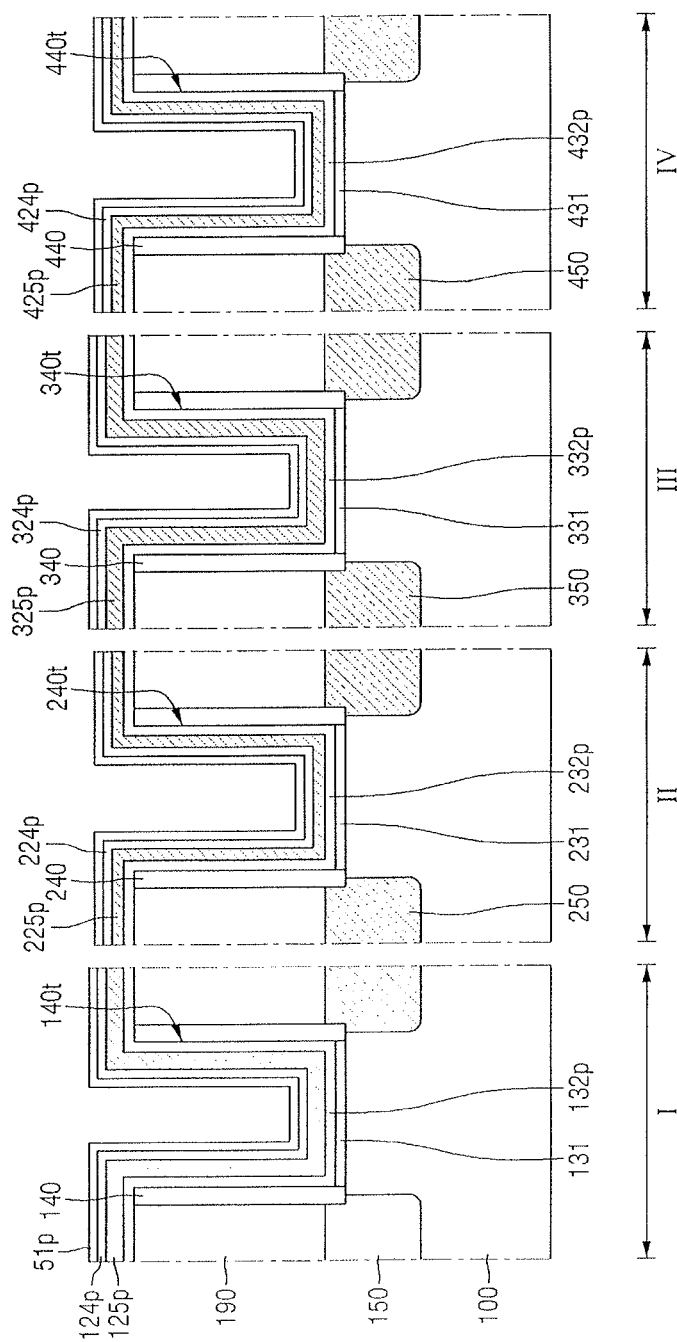

Referring to FIG. 67, first through fourth pre-etch-stop layers 124p, 224p, 324p, 424p may be formed on the first through fourth pre-lower conductive layers 125p through 425p.

For example, the first pre-etch-stop layer 124p may extend along the sidewalls and bottom surface of the first trench 140t and the upper surface of the interlayer insulating film 190. The first pre-etch-stop layer 124p may be formed along the profile of the first pre-lower conductive layer 125p.

Next, a pre-conductive layer 51p may be formed on the first through fourth pre-etch-stop layers 124p through 424p.

The pre-conductive layer 51p may be formed along the profile of each of the first through fourth pre-etch-stop layers 124p through 424p.

The pre-conductive layer 51p may include, for example, a TiN layer.

Figure 68:
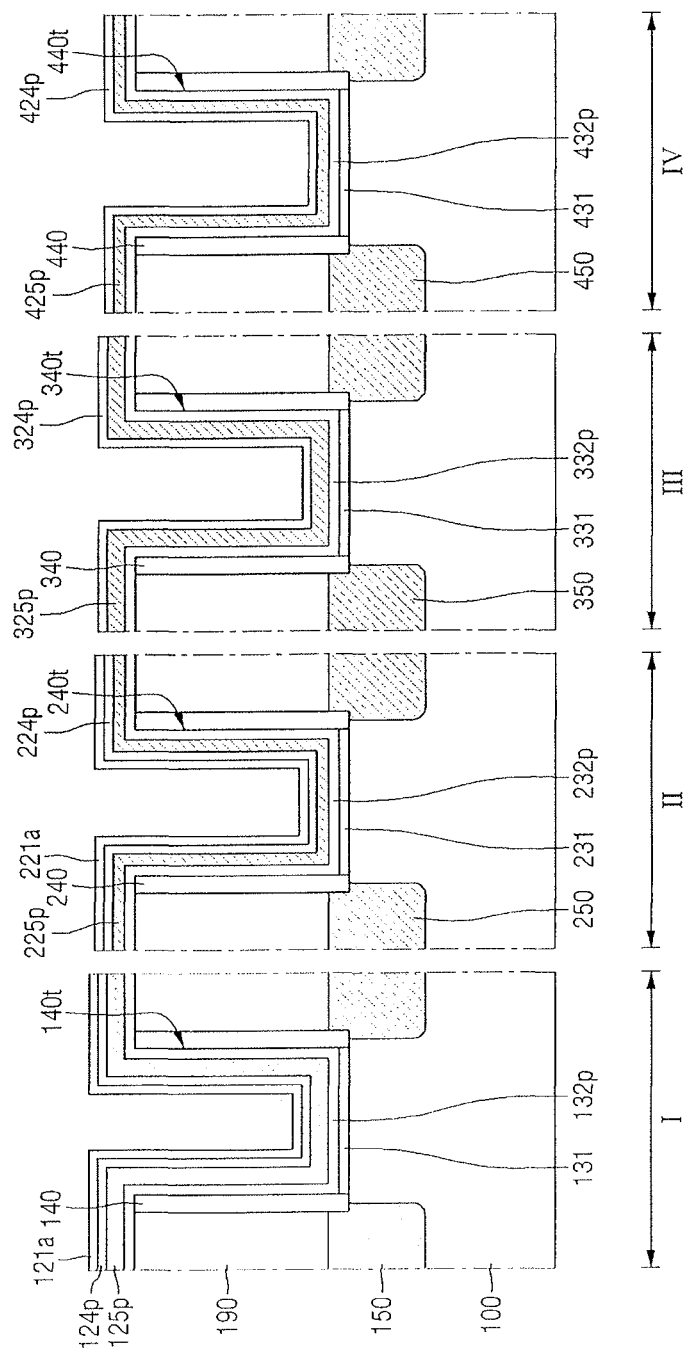

Referring to FIG. 68, the pre-conductive layer 51p on the third and fourth pre-etch-stop layers 324p and 424p may be removed to expose the third and fourth pre-etch-stop layers 324p and 424p.

The removal of the pre-conductive layer 51p disposed on the third and fourth pre-etch-stop layers 324p and 424p may result in the formation of a first pre-upper TiN layer 121a on the first pre-etch-stop layer 124p and the formation of a second pre-upper TiN layer 221a on the second pre-etch-stop layer 224p.

Figure 69:
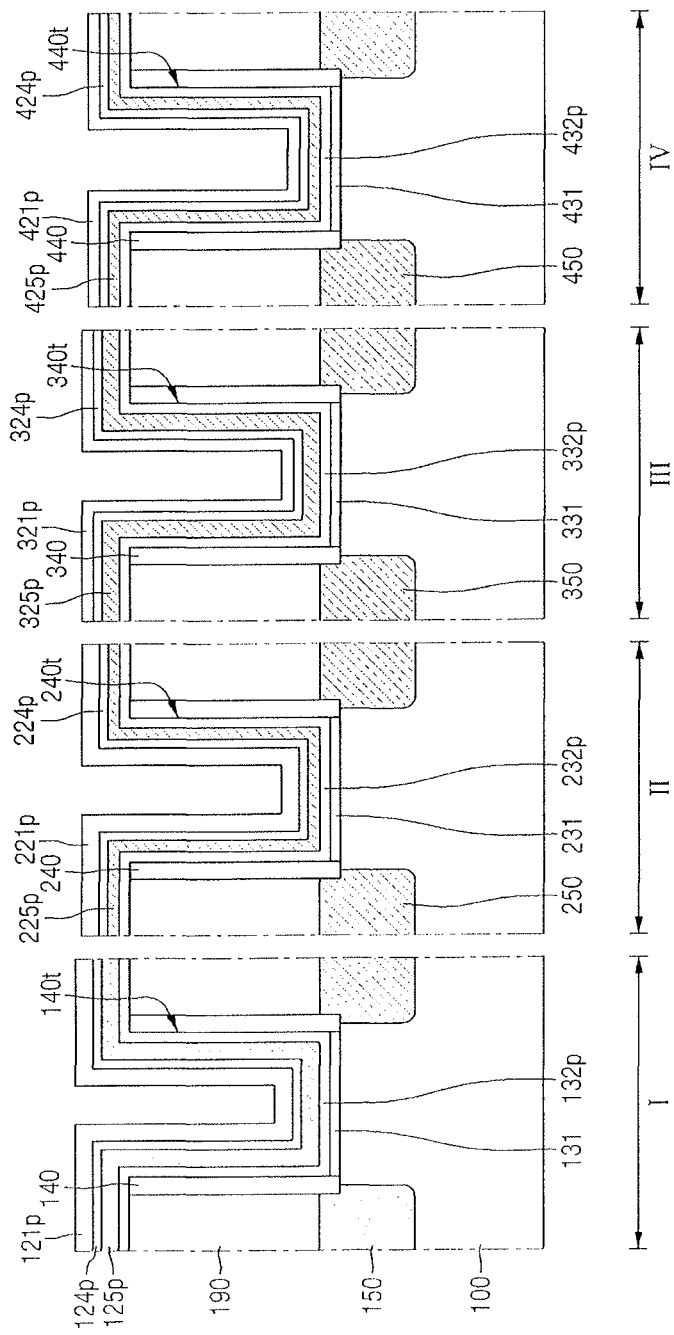

Referring to FIG. 69, an additional TiN layer may be formed along the sidewalls and bottom surfaces of the first through fourth trenches 140t through 440t.

As a result, a first pre-work function control layer 121p may be formed along the sidewalls and bottom surface of the first trench 140t and the upper surface of the interlayer insulating film 190 in the first region I.

Second through fourth pre-work function control layers 221p through 421p may also be formed in the second through fourth regions II through IV.

The first pre-work function control layer 121p may be made of the first pre-upper TiN layer 121a and the additional TiN layer formed on the first pre-upper TiN layer 121a. Accordingly, the first pre-work function control layer 121p may be thicker than the third pre-work function control layer 321p and the fourth pre-work function control layer 421p.

Similarly, the second pre-work function control layer 221p may be thicker than the third pre-work function control layer 321p and the fourth pre-work function control layer 421p.

Figure 70:
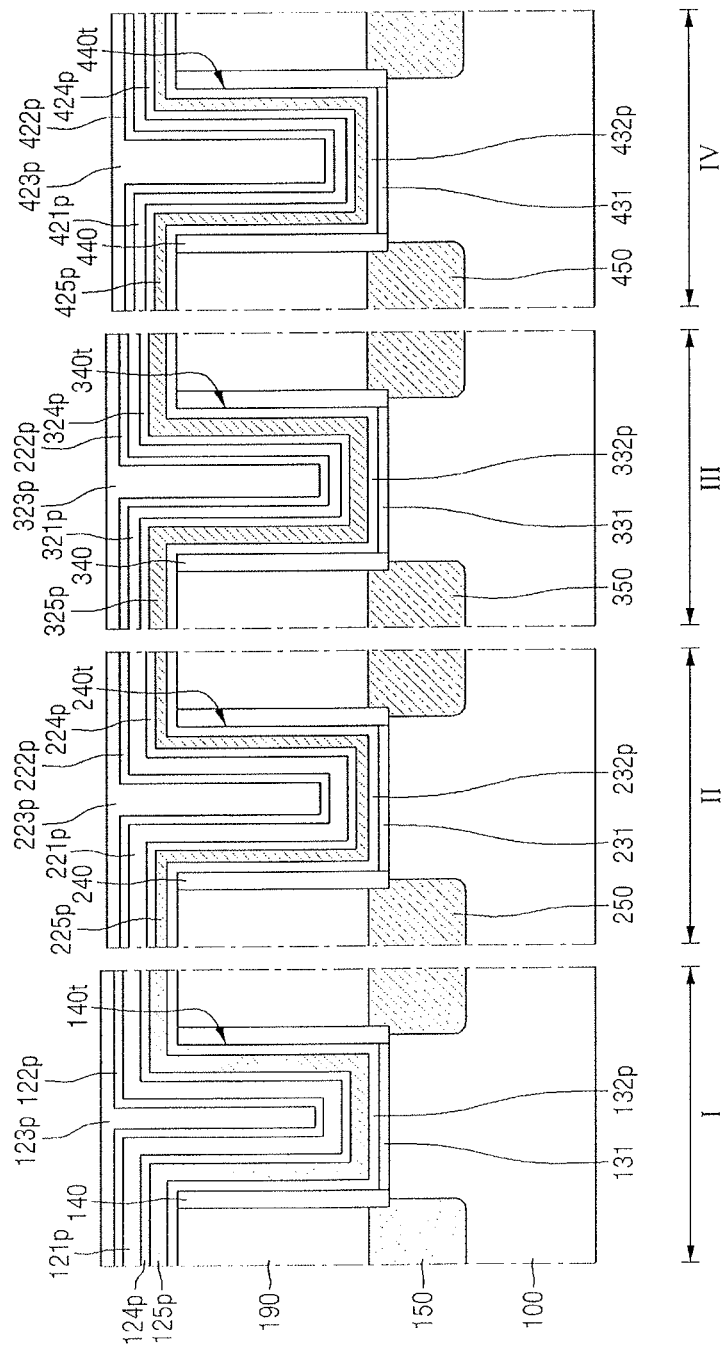

Referring to FIG. 70, first through fourth pre-insertion layers 122p, 222p, 322p, 422p may be formed on the first through fourth pre-work function control layers 121p through 421p.

For example, the first pre-insertion layer 122p may extend along the sidewalls and bottom surface of the first trench 140t and the upper surface of the interlayer insulating film 190. The first pre-insertion layer 122p may be formed along the profile of the first pre-work function control layer 121p.

First through fourth pre-filling layers 123p, 223p, 323p, 423p may be formed on the first through fourth pre-insertion layers 122p through 422p to fill the first through fourth trenches 140t through 440t.

Referring to FIG. 1, the first through fourth pre-filling layers 123p through 423p, the first through fourth pre-insertion layers 122p through 422p, the first through fourth pre-work function control layers 121p through 421p, the first through fourth pre-etch-stop layers 124p through 424p, and the first through fourth pre-lower conductive layers 125p through 425p formed on the upper surface of the interlayer insulating film 190 may be removed to form first through fourth gate electrode structures 120 through 420 and first through fourth gate insulating layers 130 through 430.

Figure 71:
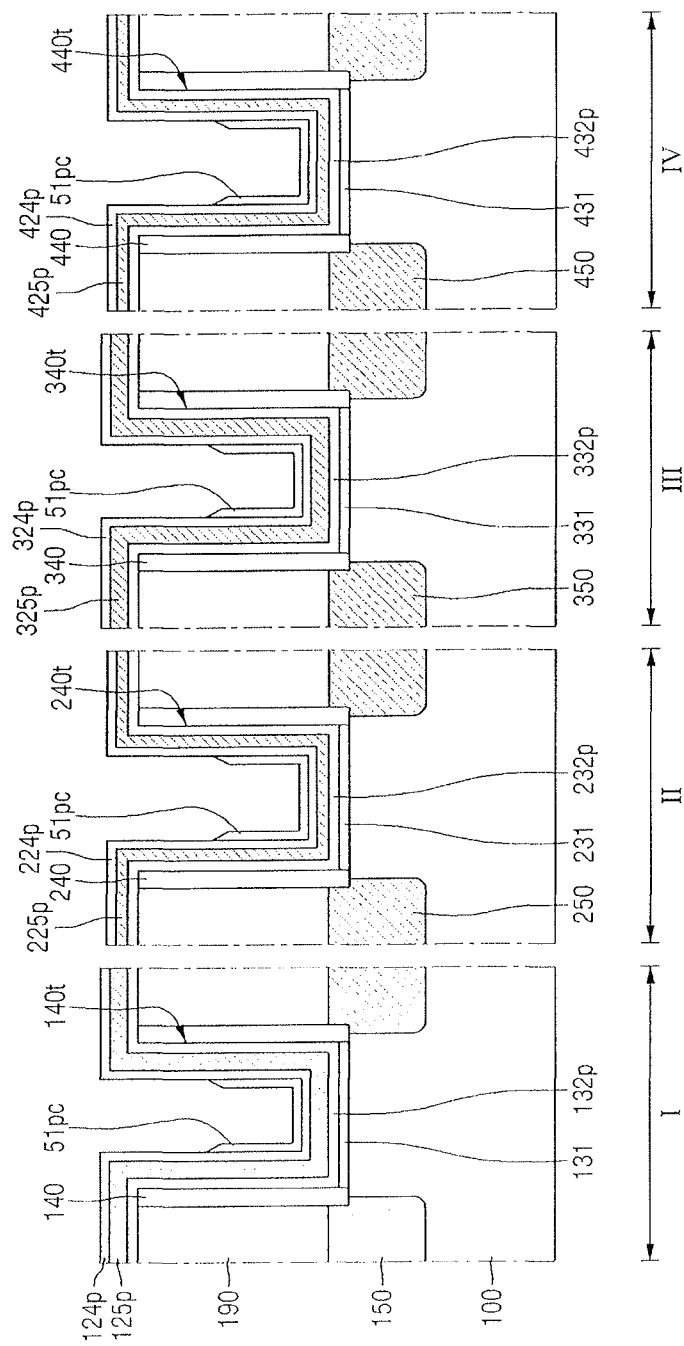
FIG. 71 illustrates a view illustrating a step of a method of fabricating a semiconductor device according to some embodiments.

FIG. 71 illustrates a view depicting a stage of a method of fabricating a semiconductor device according to embodiments.

For reference, FIG. 71 may be a process performed after the process illustrated in FIG. 67.

Referring to FIG. 71, a pre-conductive layer 51p formed on sidewalls of first through fourth trenches 140t through 440t may be partially removed to form a chamfered pre-conductive layer 51pc on each of first through fourth pre-etch-stop layers 124p through 424p.

In some implementations, while the chamfered pre-conductive layer 51pc is being formed, the pre-conductive layer 51p formed on an upper surface of an interlayer insulating film 190 may also be removed.

Figure 72:
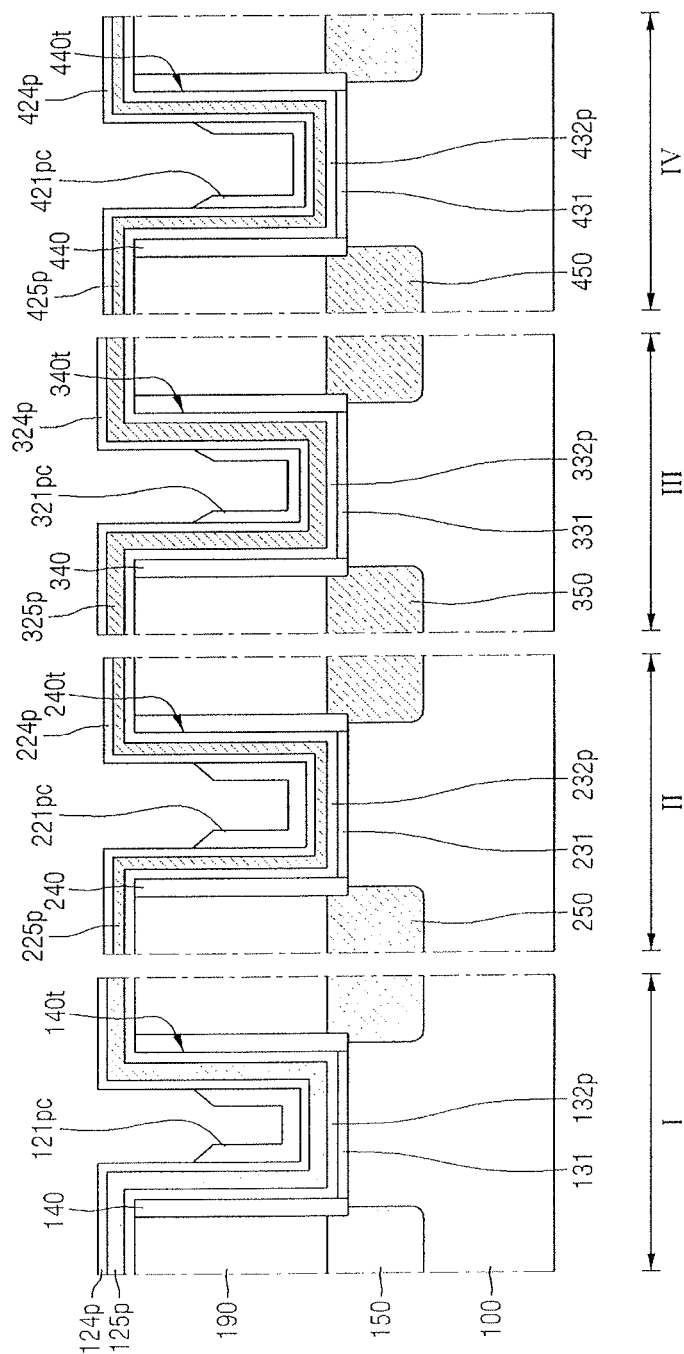
FIG. 72 illustrates a view illustrating a step of a method of fabricating a semiconductor device according to some embodiments.

FIG. 72 illustrates a view depicting a stage of a method of fabricating a semiconductor device according to embodiments.

For reference, FIG. 72 may be a process performed after the process illustrated in FIG. 69.

Referring to FIG. 72, first through fourth pre-work function control layers 121p through 421p formed on sidewalls of first through fourth trenches 140t through 440t may be partially removed.

As a result, chamfered first through fourth pre-work function control layers 121pc, 221pc, 321pc, 421pc may be formed on first through fourth pre-etch-stop layers 124p through 424p, respectively.

In some implementations, while the chamfered first through fourth pre-work function control layers 121pc through 421pc are being formed, the first through fourth pre-work function control layers 121p through 421p formed on an upper surface of an interlayer insulating film 190 may be removed.

FIGS. 73 through 83 are views illustrating stages of a method of fabricating a semiconductor device according to embodiments.

Figure 73:
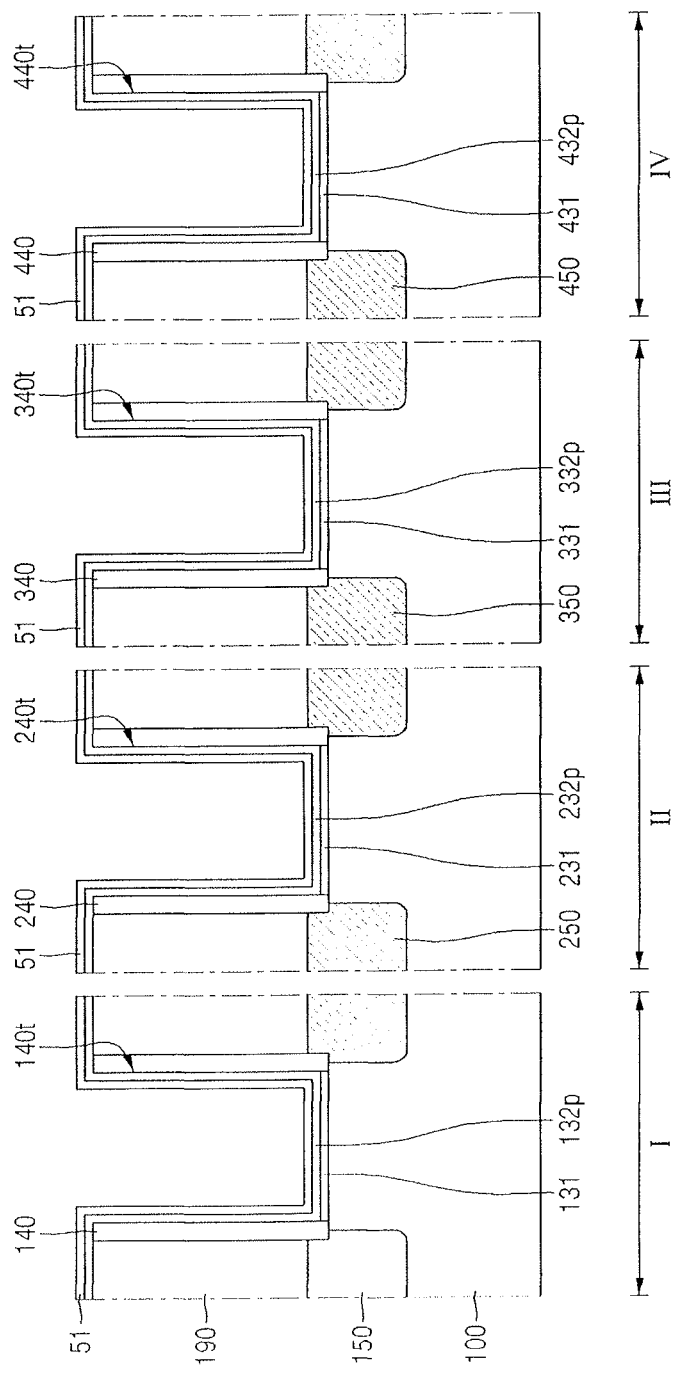
FIGS. 73 through 83 illustrate views illustrating steps of a method of fabricating a semiconductor device according to some embodiments.

For reference, FIG. 73 may be a process performed after the process illustrated in FIG. 62.

Referring to FIG. 73, a first conductive layer 51 may be formed on first through fourth pre-high-k insulating layers 132p through 432p.

For example, the first conductive layer 51 may extend along sidewalls and bottom surfaces of first through fourth trenches 140t through 440t and an upper surface of an interlayer insulating film 190.

The first conductive layer 51 may contact the first through fourth pre-high-k insulating layers 132p through 432p. The first conductive layer 51 may include, for example, TiN.

Figure 74:
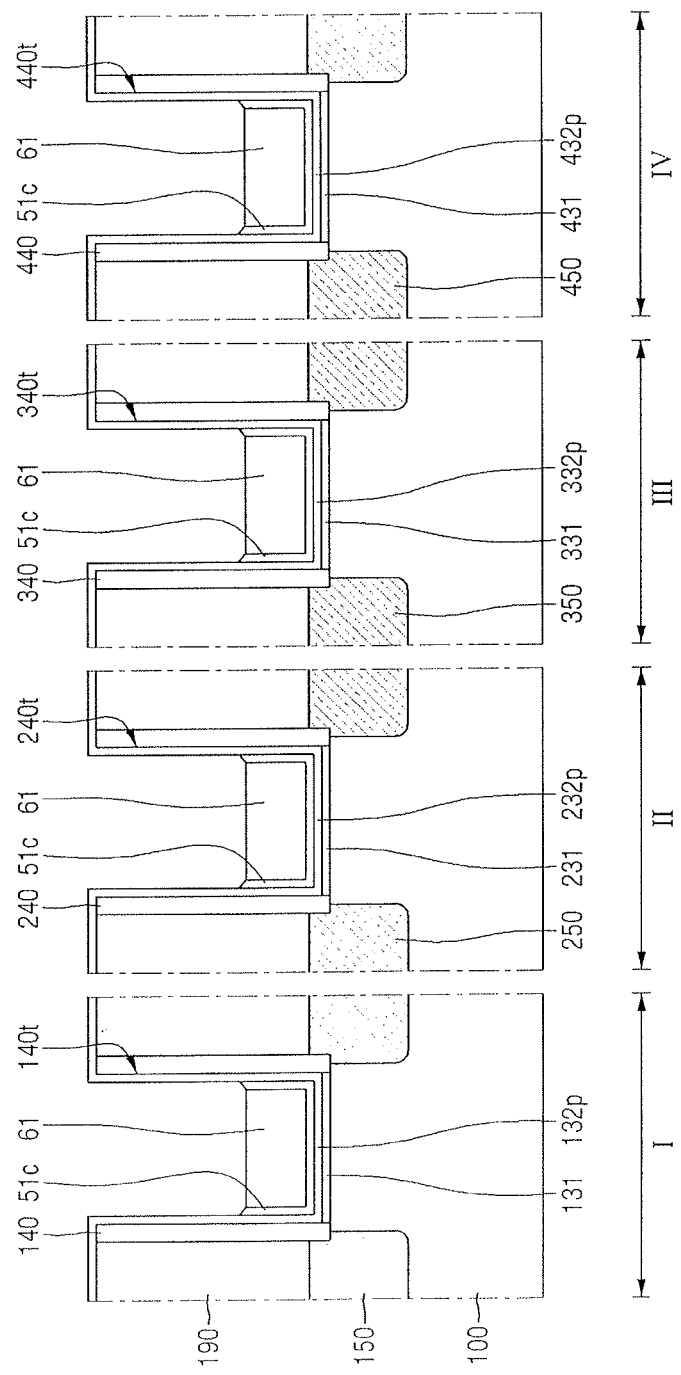

Referring to FIG. 74, a first sacrificial pattern 61 may be formed on the first conductive layer 51 to partially fill each of the first through fourth trenches 140t through 440t.

For example, a first sacrificial layer may be formed on the first conductive layer 51 to fill the first through fourth trenches 140t through 440t. The first sacrificial layer may also be formed on the upper surface of the interlayer insulating film 190. The first sacrificial layer formed on the upper surface of the interlayer insulating film 190 and part of the first sacrificial layer filling the first through fourth trenches 140t through 440t may be removed to form the first sacrificial pattern 61.

The first conductive layer 51 formed on the sidewalls of the first through fourth trenches 140t through 440t may be partially exposed by the first sacrificial pattern 61.

Next, the first conductive layer 51 formed on the sidewalls of the first through fourth trenches 140t through 440t may be partially removed using the first sacrificial pattern 61 as a mask.

As a result, a chamfered first conductive layer 51c may be formed in each of the first through fourth trenches 140t through 440t.

Then, the first sacrificial pattern 61 formed in the first through fourth trenches 140t through 440t may be removed.

Figure 75:
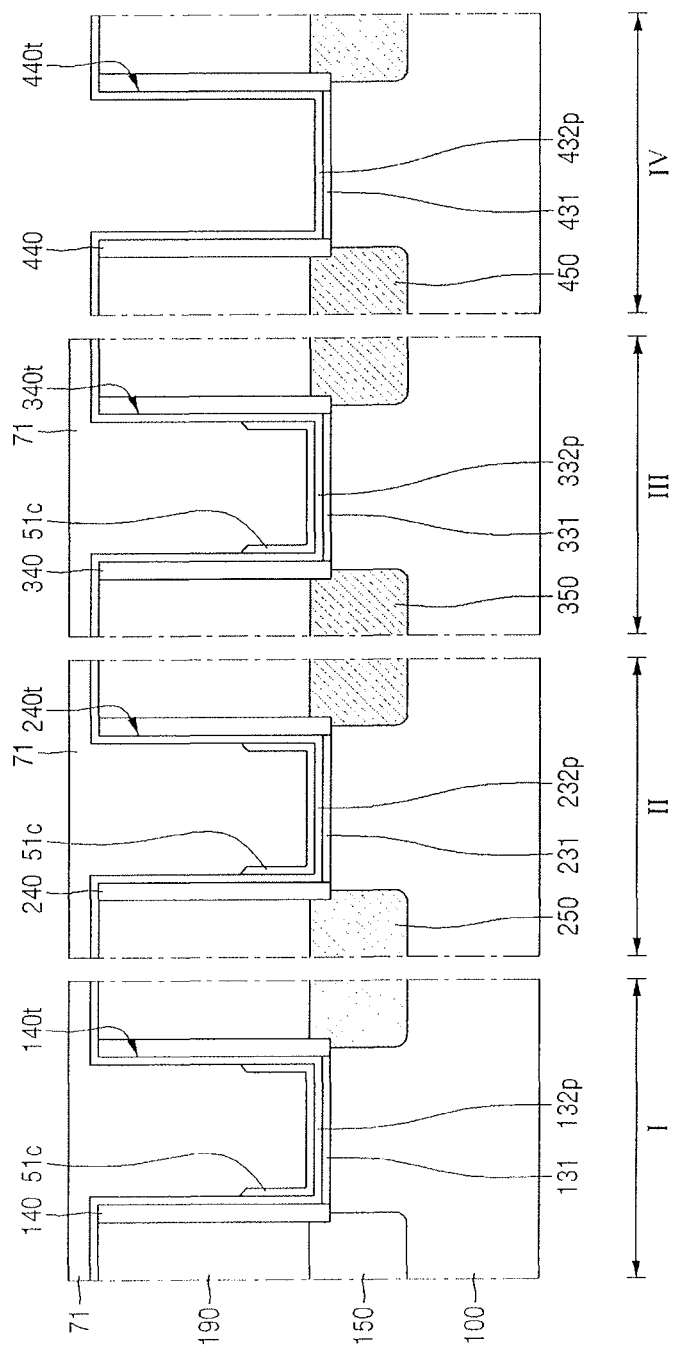

Referring to FIG. 75, a first mask pattern 71 may be formed on the chamfered first conductive layer 51c.

The first mask pattern 71 may be formed on a substrate 100 of first through third region I through III and may not be formed on the substrate 100 of a fourth region IV.

The first mask pattern 71 may cover the first through third pre-high-k insulating layers 132p through 332p and the chamfered first conductive layer 51c formed in the first through third trenches 140t through 340t. The fourth pre-high-k insulating layer 432p and the chamfered first conductive layer 51c formed in the fourth trench 440t may be exposed by the first mask pattern 71.

The chamfered first conductive layer 51c formed in the fourth trench 440t may be removed using the first mask pattern 71 as a mask.

Then, the first mask pattern 71 may be removed.

In some implementations, the first conductive layer 51 formed in the fourth region IV may be removed using the first mask pattern 71 as a mask without performing a chamfering process on the first conductive layer 51.

Figure 76:
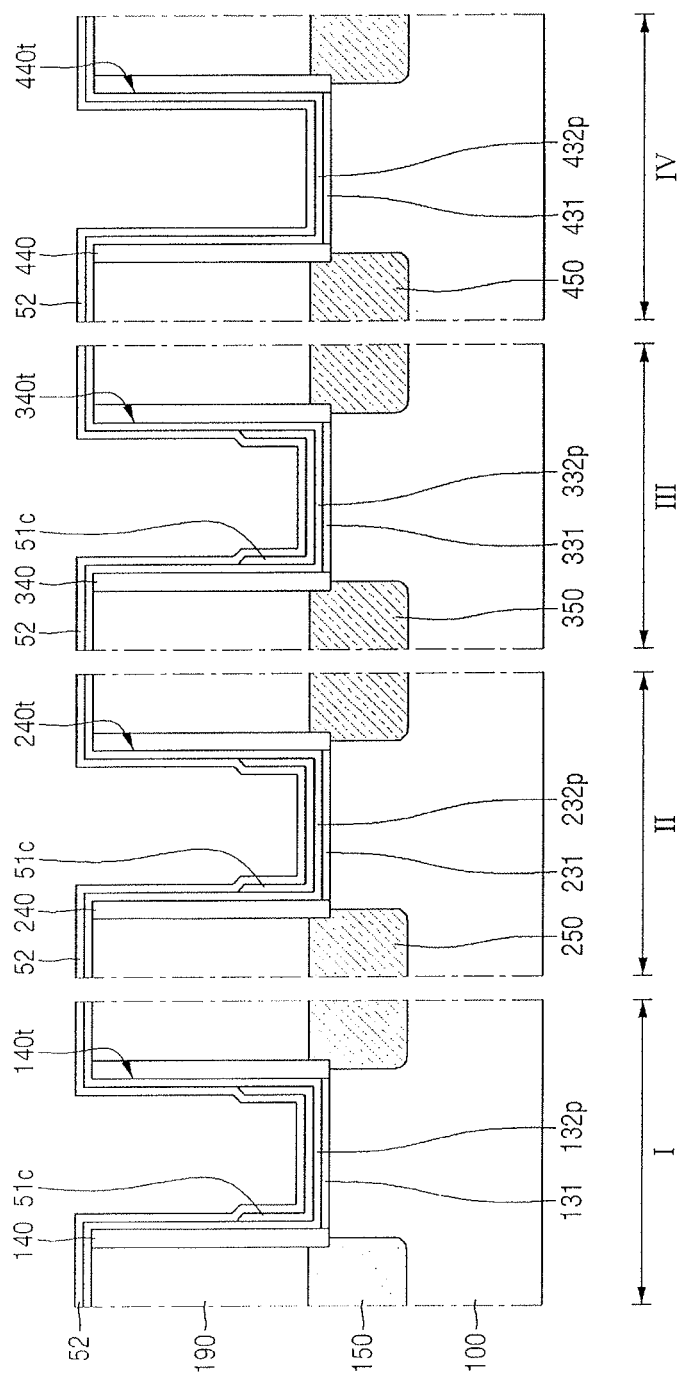

Referring to FIG. 76, a second conductive layer 52 may be formed on the first through fourth pre-high-k insulating layers 132p through 432p and the chamfered first conductive layer 51c.

For example, the second conductive layer 52 may extend along the sidewalls and bottom surfaces of the first through fourth trenches 140t through 440t and the upper surface of the interlayer insulating film 190.

The second conductive layer 52 may contact the first through fourth pre-high-k insulating layers 132p through 432p and the chamfered first conductive layer 51c. The second conductive layer 52 may include, for example, TiN.

Figure 77:
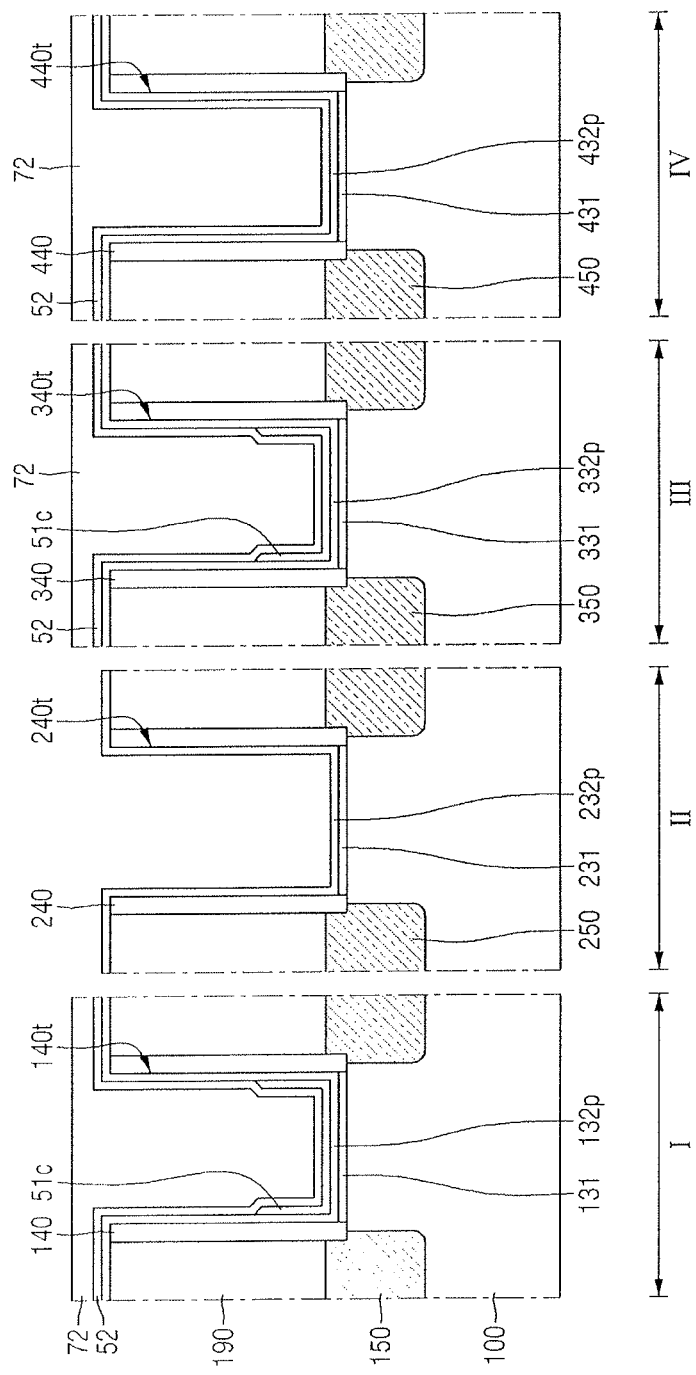

Referring to FIG. 77, a second mask pattern 72 may be formed on the second conductive layer 52.

The second mask pattern 72 may be formed on the substrate 100 of the first region I, the third region III and the fourth region IV and may not be formed on the substrate 100 of the second region II.

The second mask pattern 72 may cover the second conductive layer 52 formed in the first region I, the third region III and the fourth region IV. The second conductive layer 52 formed in the second region II may be exposed by the second mask pattern 72.

Next, the chamfered first conductive layer 51c formed in the second trench 240t and the second conductive layer 52 extending along the sidewalls and bottom surface of the second trench 240t may be removed using the second mask pattern 72 as a mask.

Then, the second mask pattern 72 may be removed.

Figure 78:
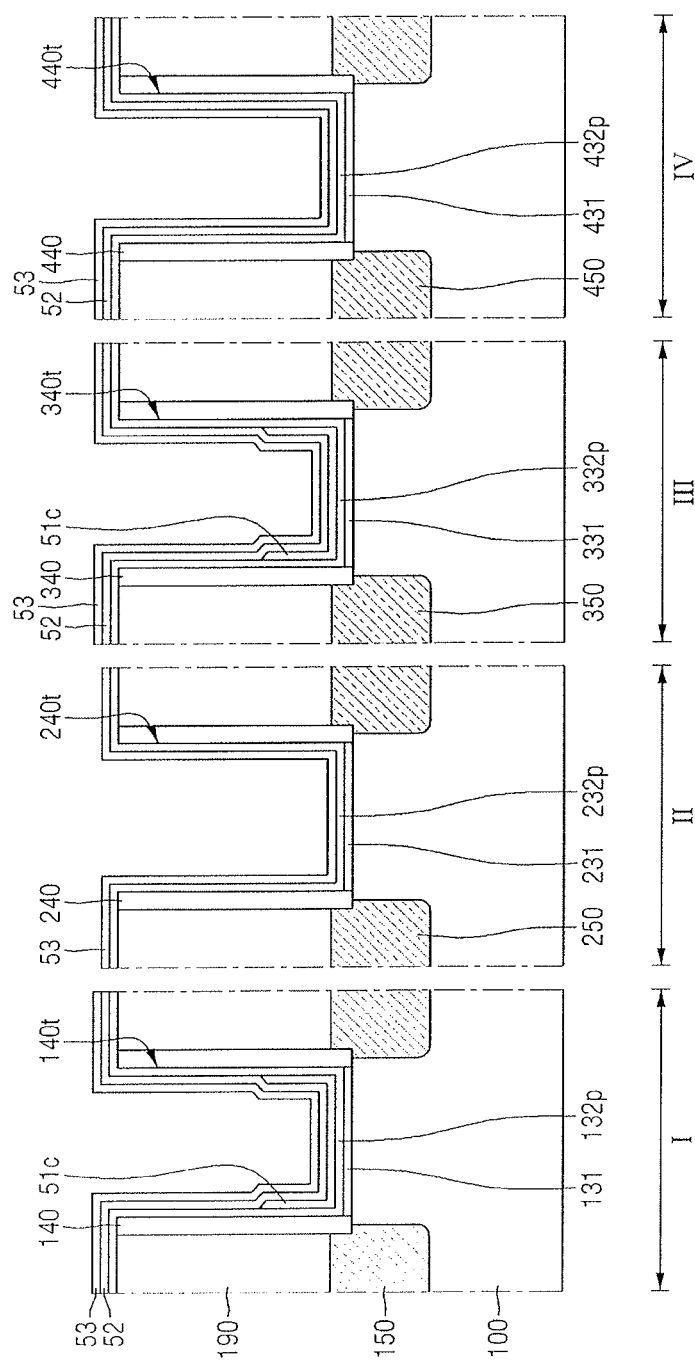

Referring to FIG. 78, a third conductive layer 53 may be formed to extend along the profile of the second conductive layer 52 formed in the first region I, the third region III and the fourth region IV and along the sidewalls and bottom surface of the second trench 240t.

The third conductive layer 53 may contact the second conductive layer 52 formed in the first region I, the third region III and the fourth region IV and contact the second pre-high-k insulating layer 232p. The third conductive layer 53 may include, for example, TiN.

Figure 79:
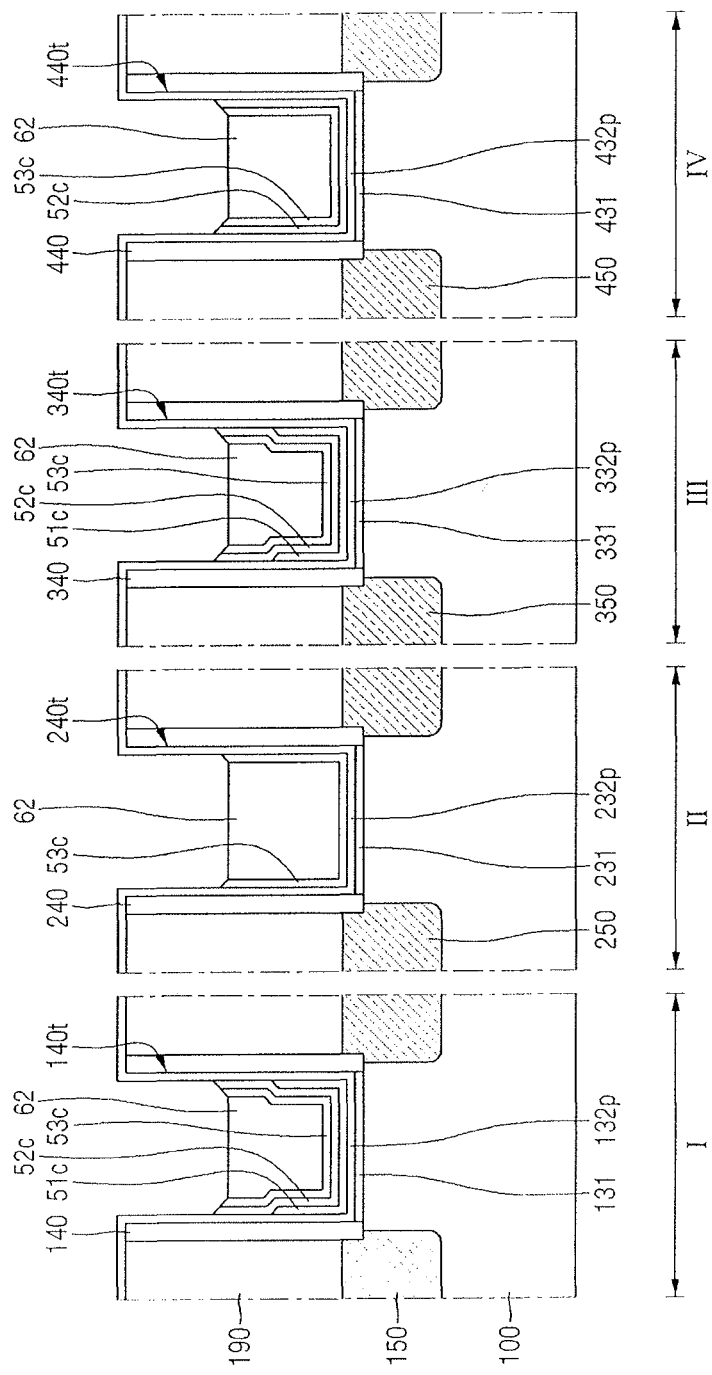

Referring to FIG. 79, a second sacrificial pattern 62 may be formed on the third conductive layer 53 to partially fill the first through fourth trenches 140t through 440t.

For example, a second sacrificial layer may be formed on the third conductive layer 53 to fill the first through fourth trenches 140t through 440t. The second sacrificial layer may also be formed on the upper surface of the interlayer insulating film 190. The second sacrificial layer formed on the upper surface of the interlayer insulating film 190 and part of the second sacrificial layer filling the first through fourth trenches 140t through 440t may be removed to form the second sacrificial pattern 62.

The third conductive layer 53 formed on the sidewalls of the first through fourth trenches 140t through 440t may be partially exposed by the second sacrificial pattern 62.

As shown in FIG. 79, in some implementations, an upper surface of the second sacrificial pattern 62 formed in the first region I and the third region III may be higher than an uppermost portion of the chamfered first conductive layer 51c formed in the first trench 140t and the third trench 340t.

Next, the second conductive layer 52 and the third conductive layer 53 formed on the sidewalls of the first through fourth trenches 140t through 440t may be partially removed using the second sacrificial pattern 62 as a mask.

As a result, a chamfered second conductive layer 52c and a chamfered third conductive layer 53c may be formed in the first trench 140t, the third trench 340t and the fourth trench 440t. In addition, the chamfered third conductive layer 53c may be formed in the second trench 240t.

The chamfered first through third conductive layers 51c through 53c sequentially formed on the substrate 100 may be disposed in the first trench 140t and the third trench 340t. The chamfered second and third conductive layers 52c and 53c sequentially formed on the substrate 100 may be disposed in the fourth trench 440t.

Next, the second sacrificial pattern 62 formed in the first through fourth trenches 140t through 440t may be removed.

Figure 80:
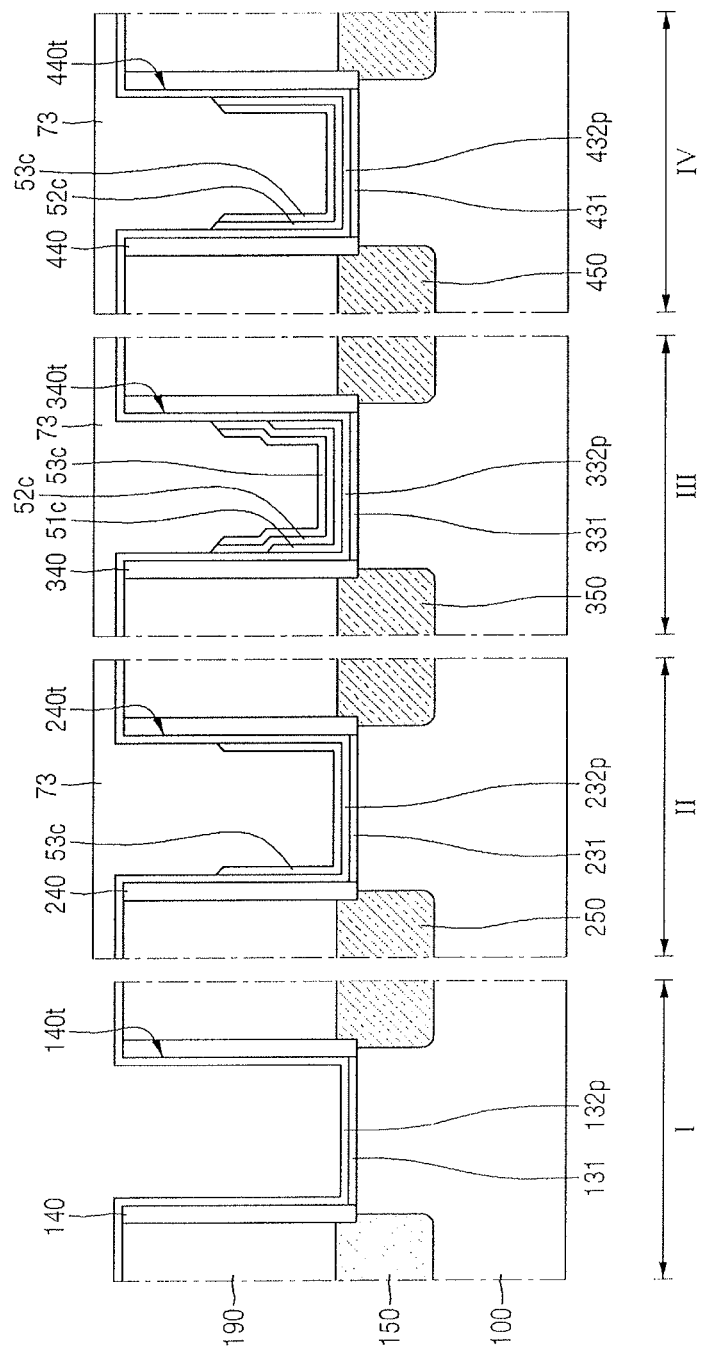

Referring to FIG. 80, a third mask pattern 73 may be formed on the chamfered third conductive layer 53c.

The third mask pattern 73 may be formed on the substrate 100 of the second through fourth regions II through IV and may not be formed on the substrate 100 of the first region I.

The third mask pattern 73 may cover the second through fourth pre-high-k insulating layers 232p through 432p and the chamfered third conductive layer 53c formed in the second through fourth trenches 240t through 440t. The first pre-high-k insulating layer 132 and the chamfered first through third conductive layers 51c through 53c formed in the first trench 140t may be exposed by the third mask pattern 73.

Next, the chamfered first through third conductive layers 51c through 53c formed in the first trench 140t may be removed using the third mask pattern 73 as a mask.

Then, the third mask pattern 73 may be removed.

In some implementations, the chamfered first conductive layer 51c and the second and third conductive layers 52 and 53 formed in the first region may be removed using the third mask pattern 73 as a mask without performing a chamfering process on the second conductive layer 52 and the third conductive layer 53.

Figure 81:
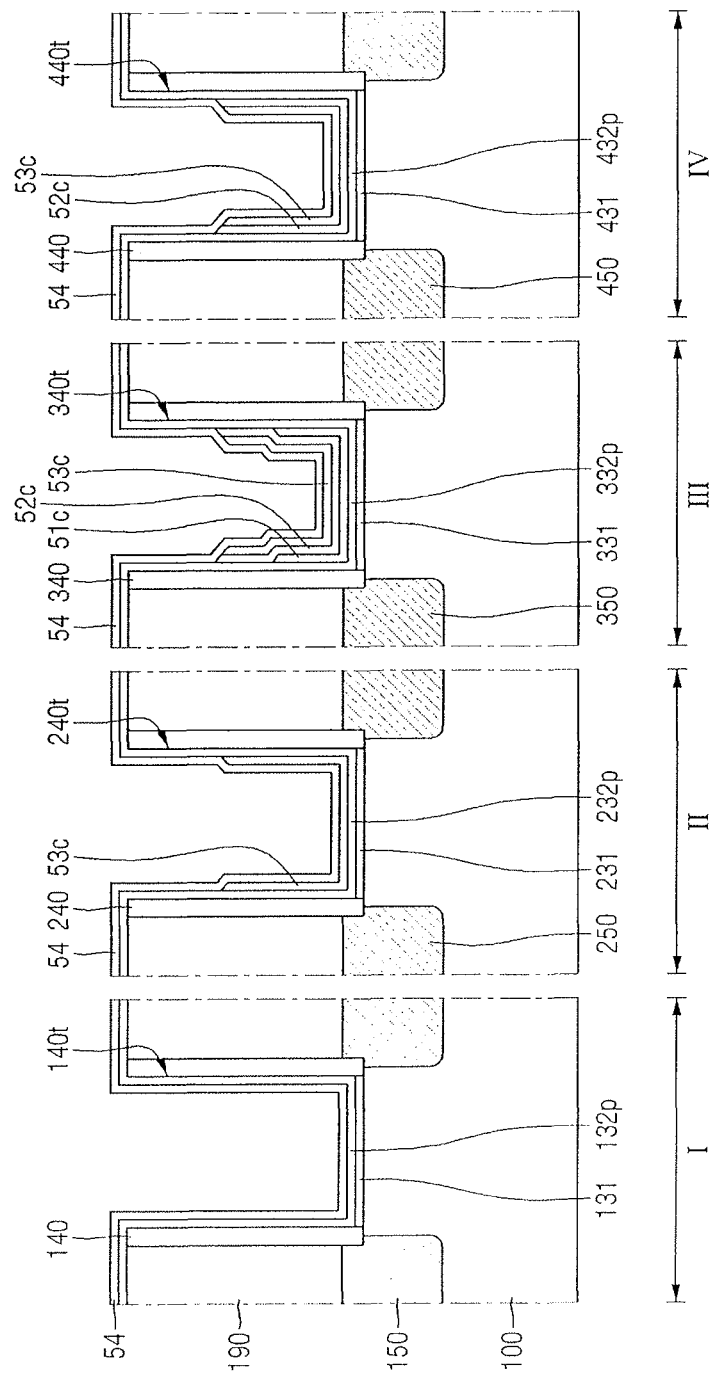

Referring to FIG. 81, a fourth conductive layer 54 may be formed on the first through fourth pre-high-k insulating layers 132p through 432p and the chamfered first through third conductive layers 51c through 53c.

For example, the fourth conductive layer 54 may extend along on the exposed sidewalls of the first through fourth trenches 140t through 440t, the profile of the chamfered third conductive layer 53c, and the upper surface of the interlayer insulating film 190.

The fourth conductive layer 54 may contact the first through fourth pre-high-k insulating layers 132p through 432p and the chamfered second and third conductive layers 52c and 53c. The fourth conductive layer 54 may include, for example, TiN.

Figure 82:
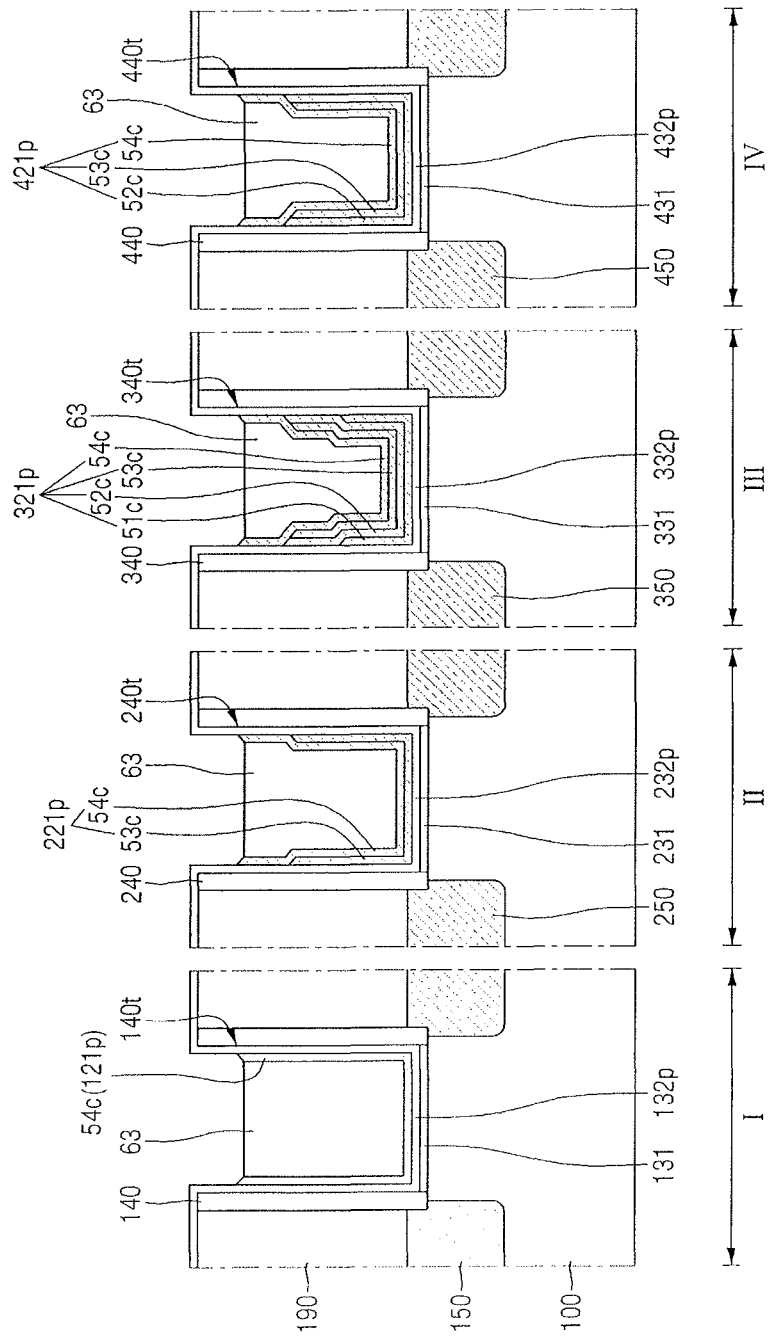

Referring to FIG. 82, a third sacrificial pattern 63 may be formed on the fourth conductive layer 54 to partially fill the first through fourth trenches 140t through 440t.

For example, a third sacrificial layer may be formed on the fourth conductive layer 54 to fill the first through fourth trenches 140t through 440t. The third sacrificial layer may also be formed on the upper surface of the interlayer insulating film 190. The third sacrificial layer formed on the upper surface of the interlayer insulating film 190 and part of the third sacrificial layer filling the first through fourth trenches 140t through 440t may be removed to form the third sacrificial pattern 63.

The fourth conductive layer 54 formed on the sidewalls of the first through fourth trenches 140t through 440t may be partially exposed by the third sacrificial pattern 63.

As illustrated in FIG. 82, in some implementations, an upper surface of the third sacrificial pattern 63 formed in the second through fourth regions II through IV may be higher than an uppermost portion of the chamfered second conductive layer 52c and/or an uppermost portion of the chamfered third conductive layer 53c formed in the second through fourth trenches 240t through 440t.

Next, the fourth conductive layer 54 formed on the sidewalls of the first through fourth trenches 140t through 440t may be partially removed using the third sacrificial pattern 63 as a mask.

Accordingly, a chamfered fourth conductive layer 54c may be formed in the first through fourth trenches 140t through 440t.

Consequently, a first pre-work function control layer 121p including the chamfered fourth conductive layer 54c may be formed in the first trench 140t. A second pre-work function control layer 221p including the chamfered third and fourth conductive layers 53c and 54c sequentially formed on the substrate 100 may be formed in the second trench 240t. A third pre-work function control layer 321p including the chamfered first through fourth conductive layers 51c through 54c sequentially formed on the substrate 100 may be formed in the third trench 340t. A fourth pre-work function control layer 421p including the chamfered second through fourth conductive layers 52c through 54c sequentially formed on the substrate 100 may be formed in the fourth trench 440t.

Figure 83:
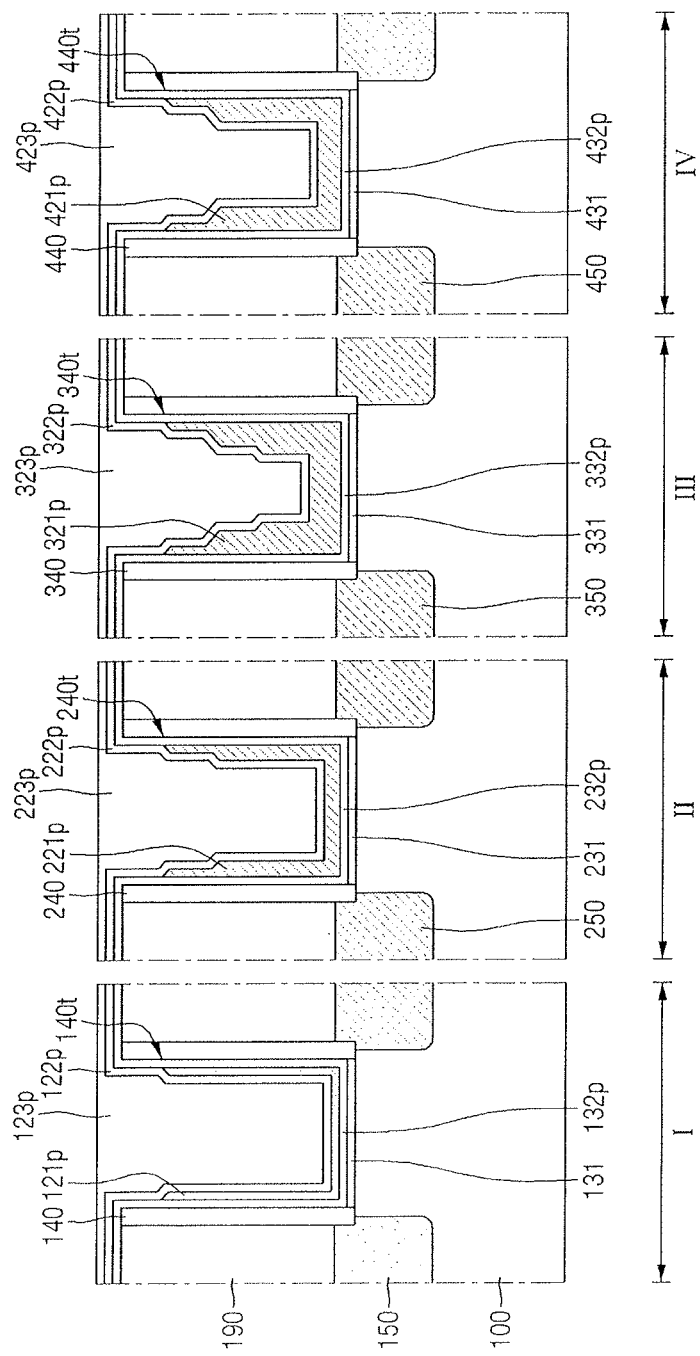

Referring to FIG. 83, first through fourth pre-insertion layers 122p through 422p may be formed on the first though fourth pre-work function control layers 121p through 421p.

For example, the first pre-insertion layer 122p may extend along the sidewalls and bottom surface of the first trench 140t and the upper surface of the interlayer insulating film 190. The first pre-insertion layer 122p may be formed along the profile of the first pre-work function control layer 121p. The second through fourth pre-insertion layers 222p through 422p may be formed similarly to the first pre-insertion layer 122p.

Next, first through fourth pre-filling layers 123p through 423p may be formed on the first through fourth pre-insertion layers 122p through 422p to fill the first through fourth trenches 140t through 440t.

In some implementations, the first through fourth pre-insertion layers 122p through 422p and the first through fourth pre-filling layers 123p through 423p may be formed without performing a chamfering process on the fourth conductive layer 54.

Referring to FIG. 19B, the first through fourth pre-filling layers 123p through 423p, the first through fourth pre-insertion layers 122p through 422p and the first through fourth pre-high-k insulating layers 132p through 432p formed on the upper surface of the interlayer insulating film 190 may be removed to form first through fourth gate electrodes 120 through 420 and first through fourth gate insulating layers 130 through 430.

In the method of fabricating a semiconductor device according to some embodiments, at least one chamfering process may be performed during the formation of the first through fourth pre-work function control layers 121p through 421p.

By way of summation and review, Aspects provide a semiconductor device including a plurality of transistors having different threshold voltages.

Aspects also provide a semiconductor device including a plurality of transistors having different threshold voltages and capable of improving gap-fill characteristics of a metallic gate electrode.

Aspects also provide a semiconductor device capable of improving threshold voltages of transistors.

Aspects also provide a method of fabricating a semiconductor device which can vary threshold voltages of a plurality of transistors.

Aspects also provide a method of fabricating a semiconductor device which can vary threshold voltages of a plurality of transistors while improving gap-fill characteristics of a metallic gate electrode.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof the present invention as set forth in the following claims.

What is claimed is:

1. A semiconductor device, comprising:
   a substrate including first through fourth regions;
   an interlayer insulating film on the substrate, the interlaying insulating film including first through fourth trenches in the first through fourth regions, respectively; and first through fourth transistors of the same conductivity type located in the first through fourth trenches, respectively, in the first through fourth regions, wherein each of the first through fourth transistor includes:

at least one insulating layer on a bottom and sides of a respective trench of the first through fourth trenches, an etch-stop layer conforming to a bottom and sides of the trench, a lower conductive layer on the at least one insulating layer conforming to the bottom and sides of the trench, the lower conductive layer being between the at least one insulating layer and the etch-stop layer, a work function layer including TiN, the work function layer directly contacting and conforming to a bottom and at least a portion of sides of the etch-stop layer, an insertion layer including TiAl, the insertion layer conforming to a bottom and sides of the work function layer, the insertion layer being directly on the work function layer and directly contacting the etch-stop layer, and a filling layer directly on the insertion layer and filling a remaining space of the trench, wherein, in at least one of the first through fourth transistors, the work function layer is chamfered, wherein, in at least two of the first through fourth transistors, the work function layers have different thicknesses from each other, and wherein, in the at least two of the first through fourth transistors in which the work function layers have different thicknesses from each other, also the lower conductive layers have different thicknesses from each other.

2. The semiconductor device as claimed in claim 1, wherein, in a lower portion of the at least one of the first through fourth transistors in which the work function layer is chamfered, the work function layer directly contacts the etch-stop layer, and, in an upper portion of the at least one of the first through fourth transistors in which the work function layer is chamfered, the insertion layer directly contacts the etch-stop layer.

3. The semiconductor device as claimed in claim 2, wherein, in the at least one of the first through fourth transistors in which the work function layer is chamfered, an upper surface of the work function layer is in a form of a first inclined surface forming a first acute angle with respect to a sidewall of the trench.

4. The semiconductor device as claimed in claim 3, wherein, in the at least one of the first through fourth transistors in which the work function layer is chamfered, the work function layer includes a first portion including the upper surface and a second portion, the second portion being between the first portion and a bottom of the work function layer, the second portion being thicker than the first portion and including a second inclined surface between the second portion and the first portion, the second inclined surface forming a second acute angle with respect to a sidewall of the trench.

5. The semiconductor device as claimed in claim 4, wherein, in the at least one of the first through fourth transistors in which the work function layer is chamfered, the work function layer includes a third portion between the second portion and a bottom of the work function layer, the third portion being thicker than the first and second portions and including a third inclined surface between the third portion and the second portion, the third inclined surface forming a third acute angle with respect to a sidewall of the trench.

6. The semiconductor device as claimed in claim 1, wherein, in the at least two of the first through fourth transistors, the work function layers are chamfered.

7. The semiconductor device as claimed in claim 2, wherein, in the at least one of the first through fourth transistors in which the work function layer is chamfered, a length of surface contact between the work function layer and the sides of the etch-stop layer is longer than a length of surface contact between the insertion layer and the sides of the etch-stop layer.

8. The semiconductor device as claimed in claim 1, wherein the insertion layer includes one of TiAl, TiAlN, TiAlC, and TiAlCN.

9. A semiconductor device, comprising:

a substrate including first through fourth regions;

an interlayer insulating film on the substrate, the interlaying insulating film including first through fourth trenches in the first through fourth regions, respectively; and first through fourth transistors of the same conductivity type located in the first through fourth trenches, respectively, in the first through fourth regions, wherein each of the first through fourth transistor includes:

at least one insulating layer on a bottom and sides of a respective trench of the first through fourth trenches, an etch-stop layer conforming to the bottom and sides of the respective trench, a lower conductive layer conforming to the bottom and sides of the respective trench, the lower conductive layer being between the at least one insulating layer and the etch-stop layer, a work function layer including TiN, the work function layer directly contacting and conforming to a bottom and at least a portion of sides of the etch-stop layer, an insertion layer including TiAl, the insertion layer conforming to a bottom and sides of the work function layer, the insertion layer being directly on the work function layer and directly contacting the etch-stop layer, and a filling layer directly on the insertion layer and filling a remaining space of the respective trench, wherein, in at least two of the first through fourth transistors, the work function layer is chamfered, wherein, in at least two of the first through fourth transistors, the work function layers have different thicknesses from each other, wherein, in at least two of the first through fourth transistors in which the work function layers have different thicknesses from each other, also the lower conductive layers have different thicknesses from each other, and wherein, in at least two of the first through fourth transistors in which the work function layer is chamfered, upper surfaces of the work function layers have different height from each other.

* * * * *